(12) United States Patent
Kadota et al.

(10) Patent No.: US 6,575,230 B1
(45) Date of Patent: Jun. 10, 2003

(54) COOLING APPARATUS USING BOILING AND CONDENSING REFRIGERANT

(75) Inventors: Shigeru Kadota, Hekinan (JP); Kiyoshi Kawaguchi, Toyota (JP); Tetsuya Takeuti, Obu (JP); Kazuo Kobayashi, Kariya (JP); Takahide Ohara, Okazaki (JP); Masahiko Suzuki, Hoi-gun (JP); Hajime Sugito, Nagoya (JP); Junichi Semura, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/467,003

(22) Filed: Dec. 20, 1999

Related U.S. Application Data

(62) Division of application No. 08/790,015, filed on Jan. 28, 1997.

(30) Foreign Application Priority Data

| Jan. 29, 1996 | (JP) | 8-12410 |
| Mar. 29, 1996 | (JP) | 8-75692 |
| Mar. 29, 1996 | (JP) | 8-75906 |
| Mar. 29, 1996 | (JP) | 8-76631 |
| Mar. 29, 1996 | (JP) | 8-77157 |
| Apr. 3, 1996 | (JP) | 8-81452 |
| Jun. 12, 1996 | (JP) | 8-150870 |
| Aug. 29, 1996 | (JP) | 8-228274 |
| Dec. 13, 1996 | (JP) | 8-334092 |

(51) Int. Cl.$^7$ ............................................. F28D 15/00
(52) U.S. Cl. ..................... 165/104.33; 165/104.34; 165/104.21; 361/700; 257/715
(58) Field of Search ...................... 165/104.33, 104.32, 165/104.34, 104.2; 361/700, 687; 257/714, 715

(56) References Cited

U.S. PATENT DOCUMENTS 4,173,996 A 11/1979 Pierce
4,821,531 A 4/1989 Yamauchi et al.
5,360,056 A 11/1994 Forsberg (List continued on next page.)

FOREIGN PATENT DOCUMENTS

| EP | 0057411 | 8/1982 |
| EP | 245848 | 11/1987 |
| EP | 0408092 | 1/1991 |

(List continued on next page.)

OTHER PUBLICATIONS

U.S. patent application Ser. No. 08/504,025, Osakabe.
U.S. patent application Ser. No. 08/524,437, Osakabe.

(List continued on next page.)

*Primary Examiner*—Christopher Atkinson
(74) *Attorney, Agent, or Firm*—Harness, Dickey & Pierce, PLC

(57) ABSTRACT

According to the present invention, a cooling apparatus using boiling and condensing refrigerant, includes a fluid separating plate for separating a high-temperature fluid from a low-temperature fluid, a refrigerant tank disposed on the side of the high-temperature fluid from the fluid separating plate, a refrigerant sealed into the refrigerant tank, a pair of communication pipes, one end of which is communicated with the refrigerant tank hermetically, a condensing portion communicated with the other end of the communication pipes and disposed on the side of the low-temperature fluid from the fluid separating plate, and a heat insulating material as a high-temperature portion-side heat insulating material coated on the outer periphery of the high-temperature-side communication pipe. In this way, it is possible to suppress a heat conduction from a high-temperature portion (high-temperature air) to the high-temperature-side communication pipe. As a result, it is possible to prevent the descending refrigerant which has been condensed and liquefied in the radiator from receiving heat from the high-temperature portion through the high-temperature-side communication pipe to receive an ascending force in the high-temperature-side communication pipe.

9 Claims, 70 Drawing Sheets

U.S. PATENT DOCUMENTS

| | | | |
|---|---|---|---|
| 5,613,552 A | 3/1997 | Osakabe et al. | |
| 5,713,413 A | 2/1998 | Osakabe et al. | |
| 5,806,583 A | 9/1998 | Suzuki et al. | |
| 5,823,248 A | 10/1998 | Kadota et al. | |

FOREIGN PATENT DOCUMENTS

| | | | | |
|---|---|---|---|---|
| GB | 1602719 | | 11/1981 | |
| GB | 2156505 | | 10/1985 | |
| GB | 2202681 | | 9/1988 | |
| JP | 53-109249 | | 9/1978 | |
| JP | 0035843 | * | 3/1980 | 165/104.26 |
| JP | 55-140092 | | 11/1980 | |
| JP | 56-147457 | | 11/1981 | |
| JP | 0152150 | * | 9/1982 | 165/104.33 |
| JP | 0131755 | * | 8/1983 | 165/104.33 |
| JP | 59-29986 | | 2/1984 | |
| JP | 60-194289 | | 10/1985 | |
| JP | 62-162847 | | 10/1987 | |
| JP | 1-263491 | | 10/1989 | |
| JP | 1-305275 | | 12/1989 | |
| JP | 2-3320 | | 1/1990 | |
| JP | 2-93270 | | 4/1990 | |
| JP | 2-233993 | | 9/1990 | |
| JP | 2-251187 | | 10/1990 | |
| JP | 4-6240 | | 2/1992 | |
| JP | 4-19338 | | 4/1992 | |
| JP | 4-174294 | | 6/1992 | |
| JP | 4-267593 | | 9/1992 | |
| JP | 5-60476 | | 3/1993 | |
| JP | 5-102687 | | 4/1993 | |
| JP | 5-141811 | | 6/1993 | |
| JP | 5-87995 | | 11/1993 | |
| JP | 6-12554 | | 1/1994 | |
| JP | 7-30023 | | 1/1995 | |
| JP | 7-39895 | | 5/1995 | |
| JP | 7-113589 | | 5/1995 | |
| JP | 8-264692 | | 11/1996 | |
| JP | 9-102691 | | 4/1997 | |

OTHER PUBLICATIONS

U.S. patent application Ser. No. 08/497,950, Osakabe.

U.S. patent application Ser. No. 08/503,862, Osakabe.

U.S. patent application Ser. No. 08/674,821, Osakabe.

* cited by examiner

FIG. 33
FIG. 34
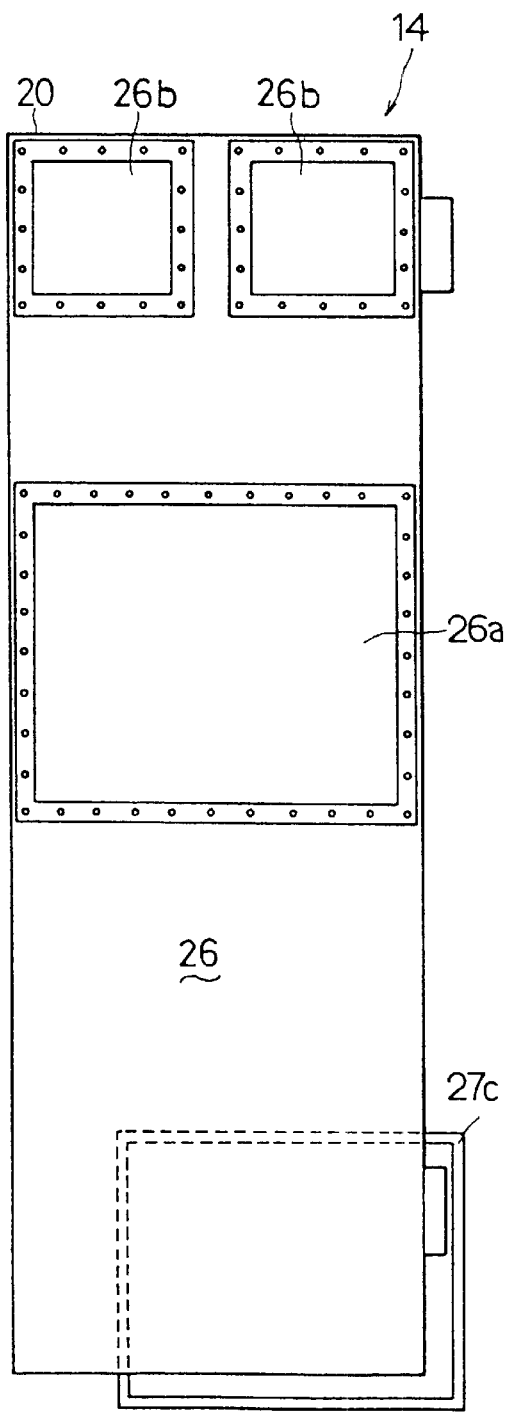
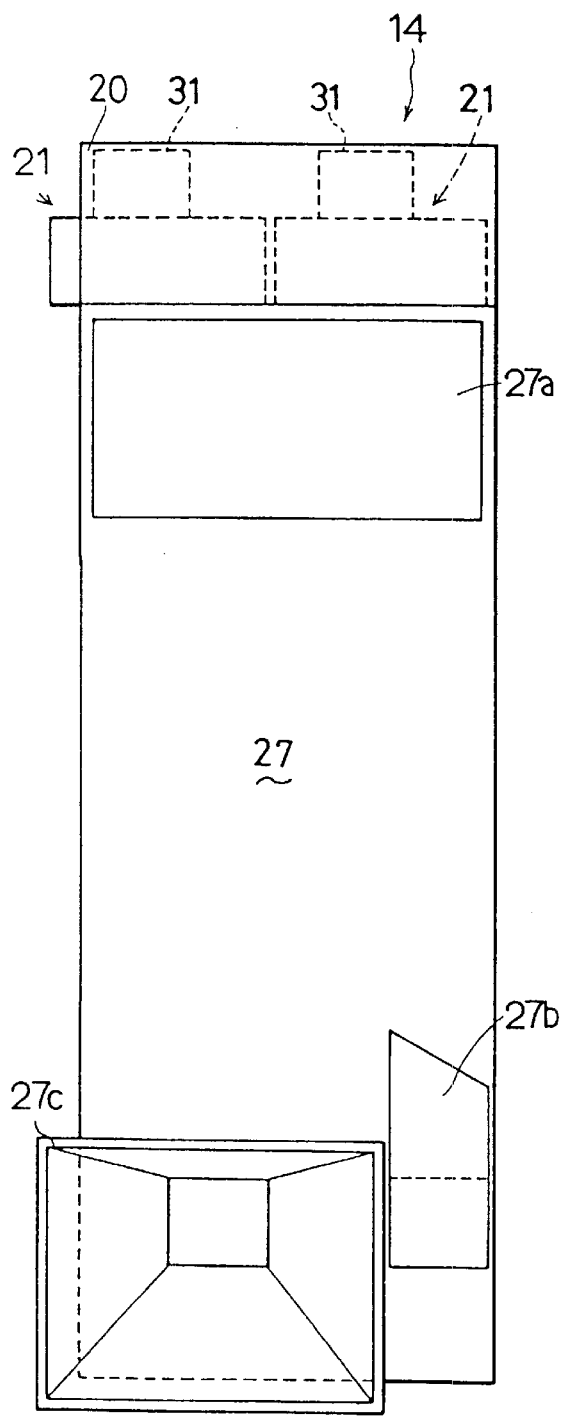

LOW-TEMP. AIR

HIGH-TEMP. AIR

LOW-TEMP. AIR

HIGH-TEMP. AIR

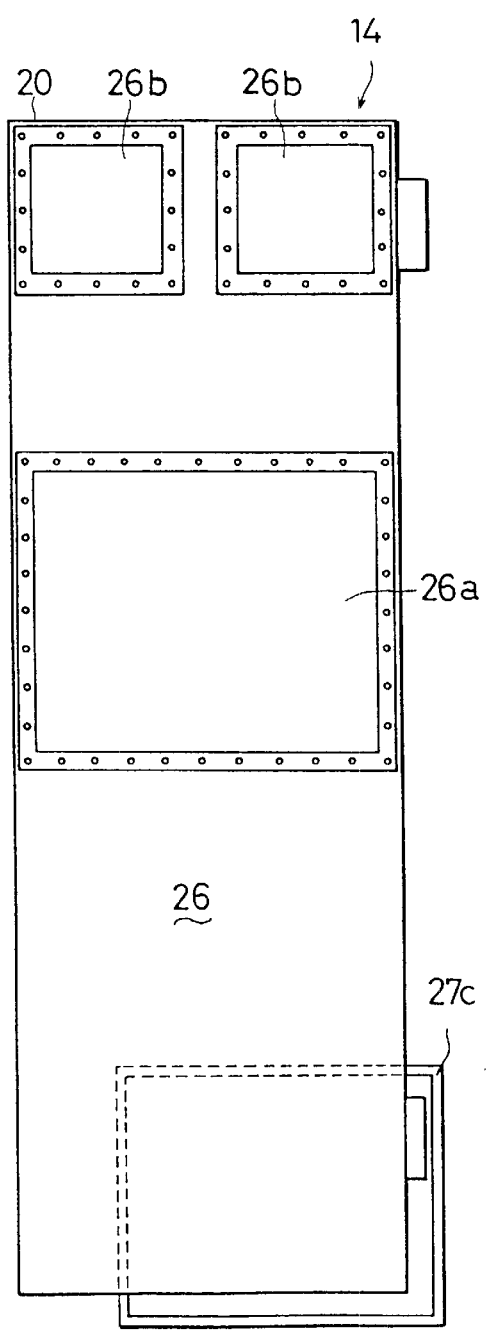
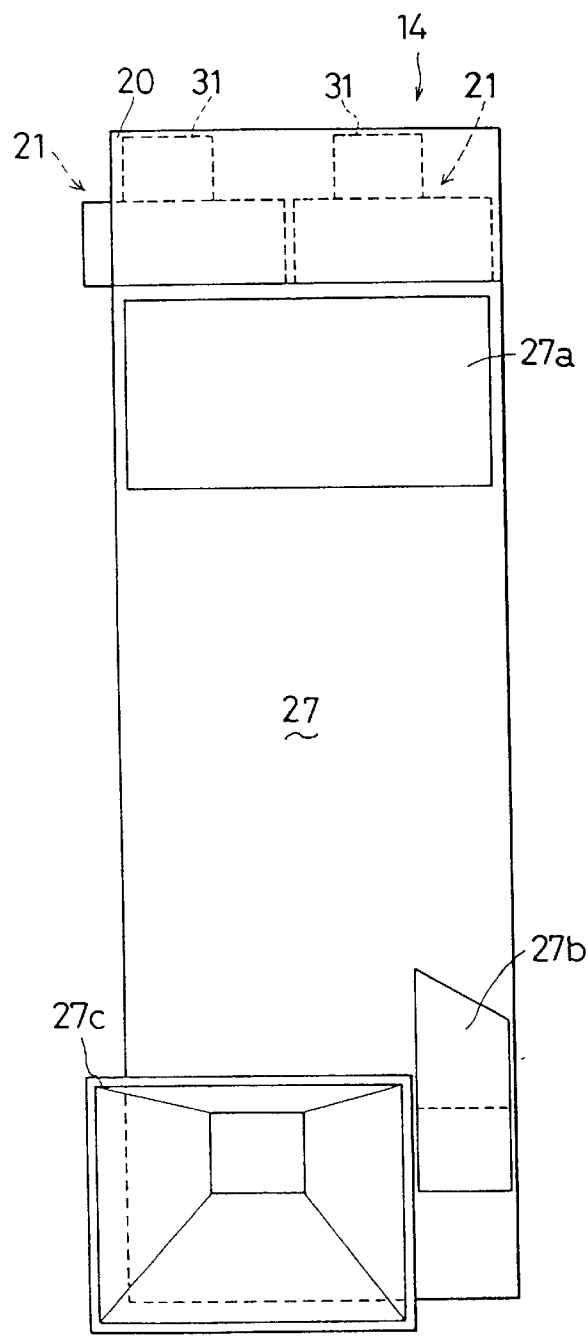

COOLING APPARATUS USING BOILING AND CONDENSING REFRIGERANT

This is a continuation division of application Ser. No. 08/790,015, filed Jan. 28, 1997.

CROSS REFERENCE TO THE RELATED APPLICATIONS

This application is based on and claims priority of Japanese Patent Application Nos. Hei. 8-12410 filed on Jan. 29, 1996, Hei. 8-76631 filed on Mar. 29, 1996, Hei. 8-75906 filed on Mar. 29, 1996, Hei. 8-75692 filed on Mar. 29, 1996, Hei. 8-77157 filed on Mar. 29, 1996, Hei. 8-81452 filed on Apr. 3, 1996, Hei. 8-150870 filed on Jun. 12, 1996, Hei. 8-228274 filed on Aug. 29, 1996, and Hei. 8-334092 filed on Dec. 13, 1996, the contents of which are incorporated herein by reference.

BACKGROUND OF THE INVENTION

1. Field of the Invention

The present invention relates to a cooling apparatus using boiling and condensing refrigerant, in which refrigerant is boiled by heat of a high temperature medium and is then condensed so as to radiate heat of the high temperature refrigerant, such as a cooling apparatus having a thermosyphon type heat exchanger.

2. Description of the Prior Art

Conventionally, heating elements such as electronic parts are occasionally housed in a closed housing. In this case, as a method for cooling the heating elements, there has been employed a method in which heat exchange is performed between air inside the housing and air outside the housing, because the outside air cannot be directly taken into the housing so as to ventilate the interior of the housing. As a method for obtaining a small number of parts and a large amount of heat movement, there has been known a method using heat pipes (in which a refrigerant is sealed) disposed so as to pass through a housing, as disclosed in JP-B2-2-3320.

In the heat pipe as disclosed in JP-B2-2-3320, the inside refrigerant is boiled by the high-temperature air in the housing, the refrigerant is condensed by the radiating portion disposed outside the housing so as to radiate the heat, and the condensed refrigerant again drops into the heat absorbing portion disposed within the housing.

However, in the heat pipe as disclosed in JP-B2-2-3320, vaporized refrigerant which has been boiled and rises and condensed refrigerant which has been condensed descends within the same pipe. Therefore, the flowing directions of the refrigerants are opposed to each other, and there may cause a problem in that the entire refrigerant does not circulate efficiently.

In view of the foregoing, there has been also known a cooling apparatus using boiling and condensing refrigerant in which the heat can be efficiently radiated by circulating the refrigerant, as in JP-U-62-162847. According to the cooling apparatus disclosed in JP-U-62-162847, a heating element is secured to a refrigerant tank, heat generated by the heating element is absorbed by a refrigerant sealed in the refrigerant tank, the refrigerant boiled and vaporized by the heat absorption is condensed and liquefied by a radiator disposed on the refrigerant tank, and the condensed and liquefied refrigerant is returned to the refrigerant tank through a refrigerant return pipe inserted into the refrigerant tank.

However, in the cooling apparatus disclosed in JP-U-62-162847, since the refrigerant return pipe for returning the refrigerant condensed by the radiator to the refrigerant tank is inserted into the refrigerant, the refrigerant may be heated within the refrigerant return pipe before returning back into the refrigerant tank, the buoyancy in the upward direction is exerted on the refrigerant, and the refrigerant does not return back into the refrigerant tank efficiently. As a result, there occurs a problem in that the refrigerant circulates slowly and the radiating performance deteriorates.

Further, in the case where a passage for communicating between the refrigerant tank and the radiator is cooled when the refrigerant boiled and vaporized from the refrigerant tank rises to the upper radiator, the boiled and vaporized refrigerant is condensed in the passage and drops down before moving to the radiator. As a result, there occurs a problem in that the refrigerant circulates slowly and the radiating performance deteriorates.

Further, by the deterioration of the radiating characteristics, the cooling apparatus becomes large-sized.

The present invention has been accomplished on the basis of the aforementioned circumstances. A first object of the present invention is to downsize the cooling apparatus by employing a new construction.

A second object of the present invention is to provide a cooling apparatus, capable of preventing the circulation of the refrigerant from being impeded.

A third object of the present invention is to provide a cooling apparatus, having a low-temperature-side communication pipe for returning refrigerant condensed by a radiator to a refrigerant tank and capable of preventing an occurrence of an ascending force of the condensed refrigerant within the low-temperature-side communication pipe when the heating of the low-temperature-side communication pipe is heated.

A fourth object of the present invention is to provide a cooling apparatus, having a high-temperature-side communication pipe for sending refrigerant boiled by a refrigerant tank to a radiator and capable of preventing vaporized refrigerant from being condensed within the high-temperature-side communication pipe when the cooling of the high-temperature-side communication pipe is cooled.

SUMMARY OF THE INVENTION

According to an aspect of the present invention, a refrigerant sealed in a refrigerant tank receives heat of a high-temperature portion and becomes boiled and vaporized. The boiled and vaporized refrigerant ascends and flows into a radiator. In the radiator, heat of the vaporized refrigerant is radiated to a low-temperature portion to condense and liquefy the refrigerant. The condensed and liquefied refrigerant returns to the refrigerant tank through a communication pipe and receives heat again. In the present invention, the circulation of the refrigerant is prevented from being impeded in order that a heat conduction between either one of the refrigerant tank, the radiator, the high temperature portion and the lower temperature portion, and the heat conduction to the communication pipe is suppressed by heat conduction suppressing means.

That is, when the heat conduction suppressing means suppresses the heat conduction between the refrigerant tank and the communication pipe, the descending refrigerant which has been condensed and liquefied by the radiator absorbs high-temperature heat from the refrigerant tank through the communication pipe to prevent from receiving the ascending force within the communication pipe. When the heat conduction suppressing means suppresses the heat conduction between the high temperature portion and the communication pipe, the descending refrigerant which has been condensed and liquefied by the radiator absorbs heat from the high-temperature portion through the communication pipe to prevent from receiving the ascending force within the communication pipe.

Further, when the heat conduction suppressing means suppresses the heat conduction between the radiator and the communication pipe, the ascending refrigerant which has been boiled and vaporized in the refrigerant tank can be prevented from descending within the communication pipe by radiating heat to the low-temperature radiator through the communication pipe. Further, when the heat conduction suppressing means suppresses the heat conduction between the low temperature portion and the communication pipe, the ascending refrigerant which has been boiled and vaporized in the refrigerant tank can be prevented from descending within the communication pipe by radiating heat to the low-temperature portion through the communication pipe.

As a result, since the radiation can be performed efficiently, the cooling apparatus can be downsized.

According to another aspect of the invention, the refrigerant sealed into the refrigerant tank receives heat of a high-temperature fluid and becomes boiled and vaporized. The boiled and vaporized refrigerant is delivered to a radiator disposed away from a fluid separating plate. In the radiator, heat of the refrigerant is radiated to a low-temperature fluid so as to be condensed and liquefied of a refrigerant. The condensed and liquefied refrigerant returns to the refrigerant tank through the communication pipe and receives heat again. In this way, it is possible to prevent the circulation of the refrigerant from being impeded, since the heat conduction between either one of the refrigerant tank, the radiator, the high-temperature portion and the low-temperature portion,and the communication pipe is suppressed by the heat conduction suppressing means.

The heat conduction suppressing means may be a refrigerant tank-side heat insulating material disposed between the refrigerant- tank and the low-temperature-side communication pipe and formed of a heat insulating material. In this way, the heat conduction from the refrigerant tank to the low-temperature-side communication pipe can be suppressed. As a result, it is possible to prevent the descending refrigerant which has been condensed and liquefied by the radiator from absorbing heat from the high-temperature refrigerant tank through the communication pipe and receiving the ascending force in the low-temperature-side communication pipe. Accordingly, it is possible to prevent the circulation of refrigerant from being impeded, and the cooling apparatus can be downsized.

The heat conduction suppressing means may be a radiator-side heat insulating material disposed between the radiator and the high-temperature-side communication pipe and formed of a heat insulating material. In this way, it is possible to prevent the ascending refrigerant which has been boiled and liquefied in the refrigerant tank from radiating heat to the low-temperature radiator through the communication pipe and descending in the communication pipe. Further, it is possible to prevent the circulation of refrigerant from being impeded, and the apparatus can be downsized.

The heat conduction suppressing means may be a high-temperature portion-side heat insulating material covered on an outer periphery of the low-temperature-side communication pipe and formed of a heat insulating material. In this way, it is possible to suppress the heat conduction from the high-temperature portion to the low-temperature-side communication pipe. As a result, it is possible to prevent the descending refrigerant which has been condensed and liquefied in the radiator from absorbing heat from the high-temperature portion through the low-temperature-side communication pipe and receiving the ascending force in the low-temperature-side communication pipe. Further, it is possible to prevent the circulation of refrigerant from being impeded, and the cooling apparatus can be downsized.

The heat conduction suppressing means may be a low temperature portion-side heat insulating material covered on an outer periphery of the high-temperature-side communication pipe and formed of a heat insulating material coated. In this way, it is possible to prevent the ascending refrigerant which has been boiled and vaporized in the refrigerant tank from radiating heat to the low-temperature portion through the high-temperature-side communication pipe and descending in the high-temperature-side communication pipe. Further, it is possible to prevent the circulation of refrigerant from being impeded, and the cooling apparatus can be downsized.

Further, the above heat insulating material may cover at least a part of the outer periphery of the low-temperature-side communication pipe or the high-temperature-side communication pipe. In this way, it is possible to prevent the circulation of refrigerant from being impeded, and the cooling apparatus can be downsized as compared with prior art.

Still further, the above heat insulating material may cover the entire outer periphery of the low-temperature-side communication pipe or the high-temperature-side communication pipe. In this way, it is possible to further prevent the circulation of refrigerant from being impeded, and the cooling apparatus can be downsized as compared with the prior art.

Further, the heat insulating material may be formed of a foaming resin; and therefore, heat insulation can be performed efficiently.

The heat conduction suppressing means may include a high-temperature-side partition member for partitioning a high-temperature passage with the fluid separating plate so that the low-temperature-side communication pipe is separated to a region, a temperature of which is lower than that in the high-temperature-side passage. It is possible to suppress the heat conduction from the high-temperature passage to the low-temperature-side communication pipe. As a result, it is possible to prevent the descending refrigerant which has been condensed and liquefied in the radiator from absorbing heat from the high-temperature passage through the low-temperature-side communication pipe and receiving the ascending force in the low-temperature-side communication pipe. In this way, it is possible to prevent the circulation of refrigerant from being impeded, and the cooling apparatus can be downsized.

Further, the heat conduction suppressing means may include a low-temperature-side partition member for partitioning a low temperature passage with the fluid separating plate so that the high-temperature-side communication pipe is separated to a region, a temperature of which is higher than that in the low-temperature-side passage. In this way, it is possible to prevent the ascending refrigerant which has been boiled and liquefied in the refrigerant tank from radiating heat to the low-temperature passage through the high-temperature-side communication pipe and descending in the high temperature-side communication pipe. In this way, it is possible to prevent the circulation of refrigerant from being impeded, and the cooling apparatus can be downsized.

Further, a plurality of boiling and cooling units are disposed so that refrigerant tanks are disposed in parallel with each other and radiators are disposed in parallel with each other. In addition, there may be provided a high-temperature-side partition member for partitioning a high-temperature passage with the fluid separating plate and a low-temperature-side partition member for partitioning a low-temperature passage with the fluid separating plate, and the low-temperature-side communication pipe is separated to a region,t a temperature of which is lower than that in the high-temperature passage by the high-temperature-side partition member and the low-temperature-side partition member and the high-temperature-side communication pipe is separated to a region, a temperature of which is higher than that in the low temperature passage. In this way, the heat transfer from the high temperature passage to the low-temperature-side communication pipe and the heat transfer from the high-temperature-side communication pipe to the low temperature passage can be suppressed, respectively.

As a result, it is possible to prevent the descending refrigerant which has been condensed and liquefied in the radiator from absorbing heat from the high-temperature passage through the low-temperature-side communication pipe and receiving the ascending force in the low-temperature-side communication pipe, and it is also possible to prevent the refrigerant which has been boiled and vaporized in the refrigerant tank from radiating heat to the low-temperature passage through the high-temperature-side communication pipe and descending in the high-temperature-side communication pipe.

Accordingly, it is possible to prevent the circulation of refrigerant from being impeded, and the cooling apparatus can be downsized.

The low-temperature-side communication pipe may be disposed substantially in parallel with the heat absorbing pipe so as to communicate a heat absorbing-side lower communication portion with a radiating-side lower communication portion, and the high-temperature-side communication pipe may be disposed substantially in parallel with the radiating pipe so as to communicate a heat absorbing-side upper communication portion with a radiating-side upper communication portion. Since the heat conduction suppressing means may be provided on the low-temperature-side communication pipe or the high-temperature-side communication pipe, it is possible to suppress the heat conduction from the refrigerant tank to the low-temperature-side or the heat conduction from the high-temperature-side communication pipe to the radiator. As a result, it is possible to prevent the descending refrigerant which has been condensed and liquefied in the radiator from absorbing heat from the high-temperature refrigerant tank through the communication pipe and receiving the ascending force in the low-temperature-side communication pipe. It is possible to prevent the ascending refrigerant which has been boiled and vaporized in the refrigerant tank from radiating heat to the low-temperature radiator through the communication pipe and descending in the communication pipe.

In this way, it is possible to prevent the circulation of refrigerant from being impeded, and the cooling apparatus can be downsized.

BRIEF DESCRIPTION OF THE DRAWINGS

Additional objects and advantages of the present invention will be more readily apparent from the following detailed description of preferred embodiments thereof when taken together with the accompanying drawings in which:

FIG. 33 is a front view showing a structure of the cooling apparatus according to the eleventh embodiment.

FIG. 34 is a rear view showing a structure of the cooling apparatus according to the eleventh embodiment;

FIG. 63 is a front view showing a detailed structure of a cooling apparatus according to the eighteenth embodiment;

FIG. 64 is a rear view showing a detailed structure of a cooling system according to the eighteenth embodiment;

DETAILED DESCRIPTION OF THE PREFERRED EMBODIMENTS

A first embodiment of the present invention will be described.

Figure 1:
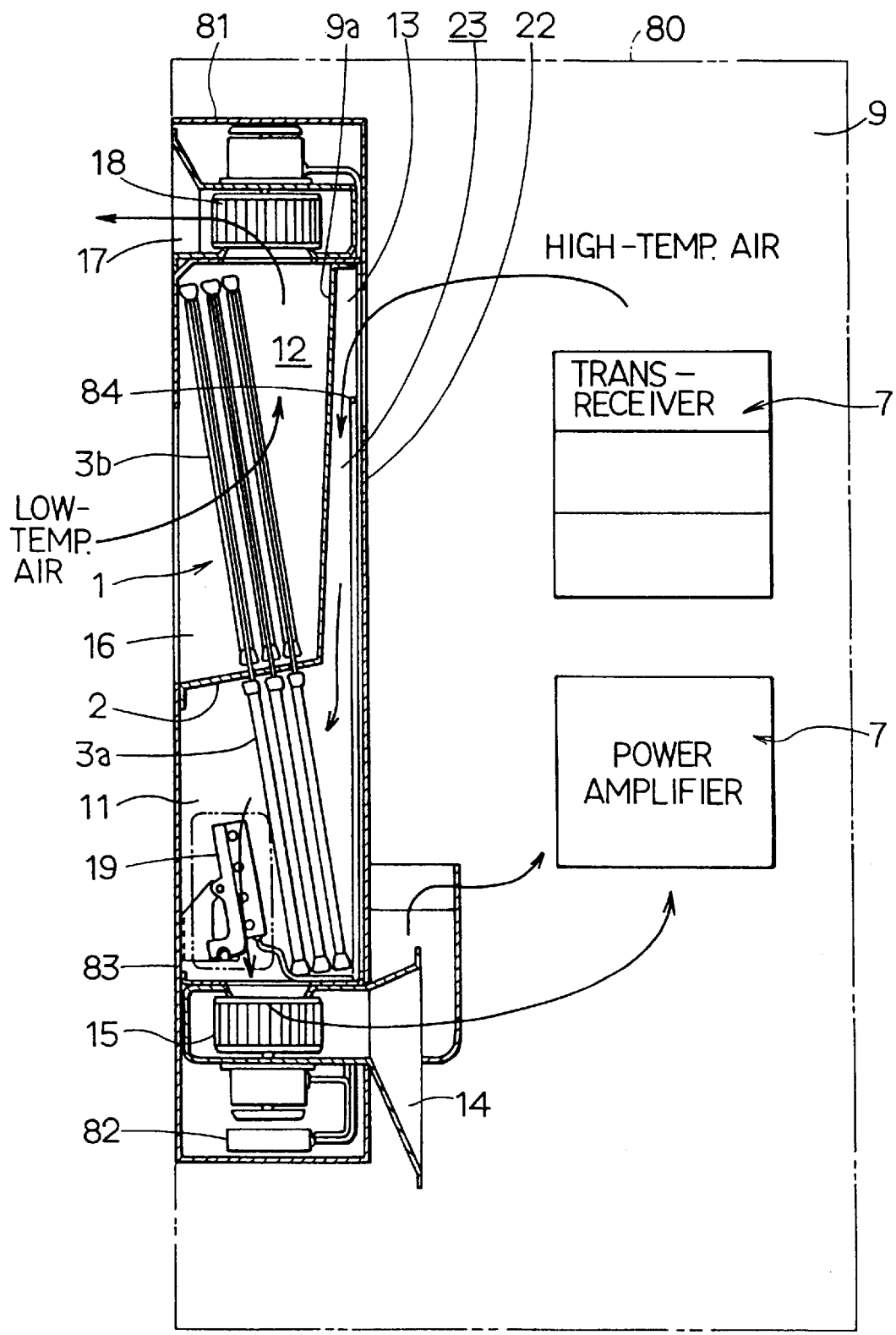
FIG. 1 is a side view of a casing cooling apparatus used for a cooling apparatus using boiling and condensing refrigerant according to a first embodiment.
Figure 2:
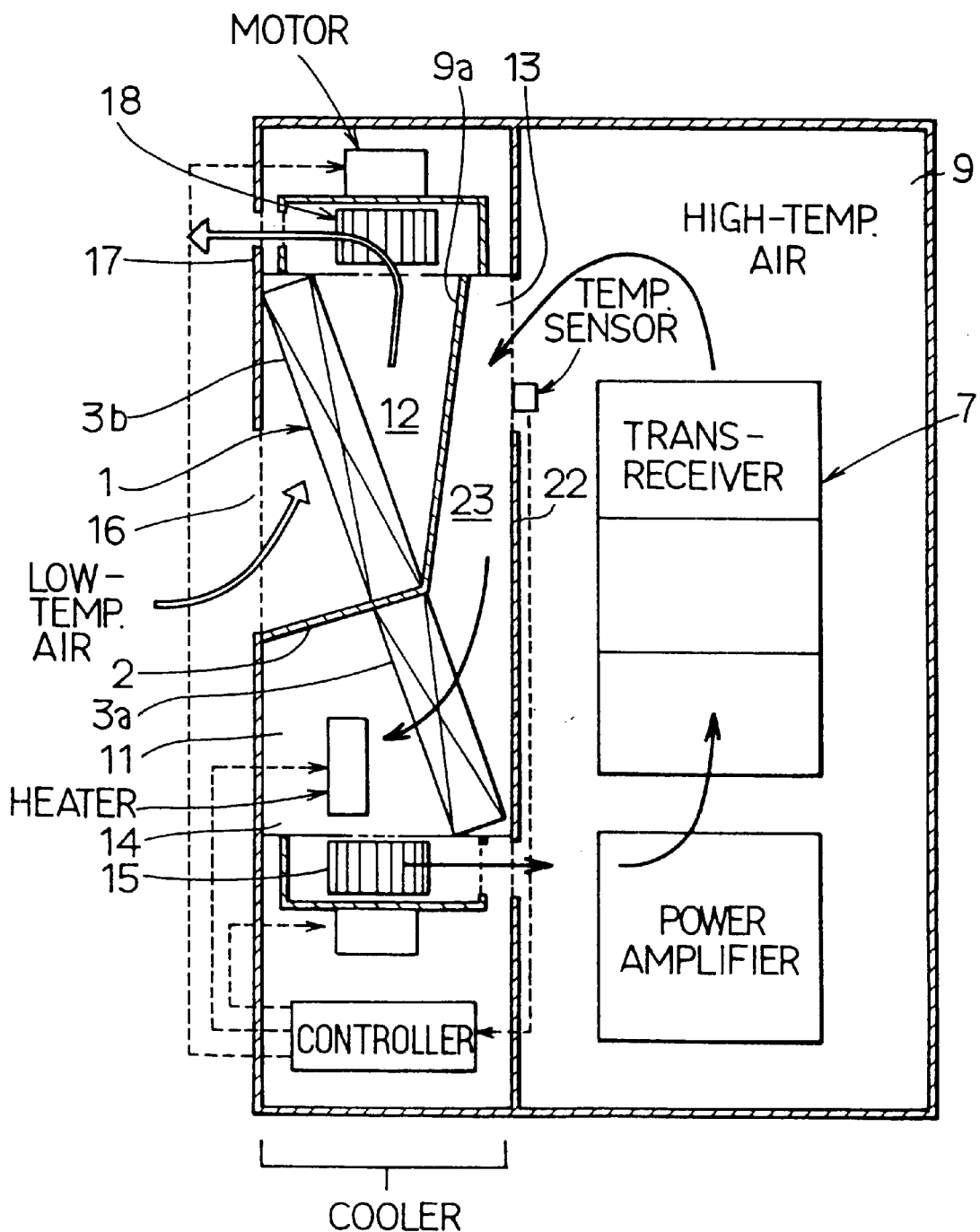
FIG. 2 is an explanatory schematic view of the cooling apparatus shown in FIG. 1.

FIG. 1 is a side view in which a cooling apparatus 1 using boiling and condensing refrigerant is applied to a box-shaped cooling apparatus, and FIG. 2 is an explanatory schematic view of FIG. 1.

In this embodiment, as shown in FIGS. 1 and 2, a closed space 9 is a space formed by a casing 80. In the closed space 9, there are accommodated a heating element 7 (for example, a trans-receiver for communication equipment, and a power amplifier for actuating the trans-receiver). The closed space 9 is provided (at upper and lower portions) with openings communicated with coolers 81. The cooler 81 is formed with a vent port 13 which is communicated with the upper portion of the closed space 9 in order to introduce gas of the closed space 9 into a heat transfer space 11 on the high-temperature side. More specifically, one side wall surface 9a forming the closed space 9 and a partitioning wall 22 provided within the closed space 9 form an air passage 23 vertically extending into the closed space 9, and the upper end of the air passage 23 is opened to the upper portion in the closed space 9 (above a fluid separating plate 2) as the vent port 13.

In this way, the gas having a high temperature, heated by the heating element 7, is introduced from the vent port 13 into the air passage 23 and led into a refrigerant tank 3a smoothly, and a temperature in the closed space 9 can be maintained uniform. That is, since the gas having a high temperature, due to the heat generated from the heating element 7, moves upward within the closed space 9 by convection, in order to improve the cooling efficiency in the closed space 9, it is preferable for the vent portion 13 to be provided at the upper part of the closed space 9. In other words, when the vent port 13 is located lower than the fluid separating plate 2, a relatively low-temperature gas in the closed space 9 is introduced from the vent port 13 into the air passage 23 and led to the refrigerant tank 3a, and the cooling efficiency in the closed space 9 is not sufficient.

Further, the high-temperature fluid uniformly flows into the refrigerant tank 3a by forming the air passage 23. In the case where the air passage 23 is not provided, a flow becomes concentrated in the vicinity of the lower portion of the refrigerant tank 3a, which is the closest to an internal fan 15, and the heat absorbing efficiency deteriorates.

However, the high-temperature air easily passes through the upper portion of the refrigerant tank 3a by forming the air passage 23.

Further, in the this embodiment, the entire cooling apparatus 1 is disposed so as to be inclined in a lateral direction (the left and right direction in FIG. 2) so that the gas passing through the refrigerant tank 3a and a radiator 3b within the heat transfer spaces 11 and 12 on the high- and low-temperature-sides smoothly flow from the vent ports 12 and 16 on the suction side toward the vent ports 14 and 17 on the discharge side. In this way, the change in flow direction of the gas flowing through the refrigerant tank 3a and the radiator 3b can be slackened so that the loss of the air flow in the narrow space can be reduced. As a result, the internal fan 15 within the closed space 9 can be downsized, and the heating amount generated by the internal fan 15 can be reduced so that the same amount of heat generated by the heating element 7 can be increased (that is, when the internal fan 15 becomes large-sized to improve the cooling performance, the heating amount generated by the internal fan 15 increases, and as a result the heating amount the heating element 7 cannot be increased).

A controller 82 controls the rotational speed, operating time and operating pattern or the like of the internal fan 15 on the basis of a temperature of air flowing into the vent port 13, which is detected by a temperature sensor 84. When the closed space 9 is at a high temperature, the internal fan 15 and an external fan 18 are actuated to lower the temperature in the closed space 9, while when the closed space 9 is at a low temperature (in cold season), the internal fan 15 and a heater 19 secured to a cooler wall 83 are actuated to adequately control the temperature in the closed space 9.

Figure 3:
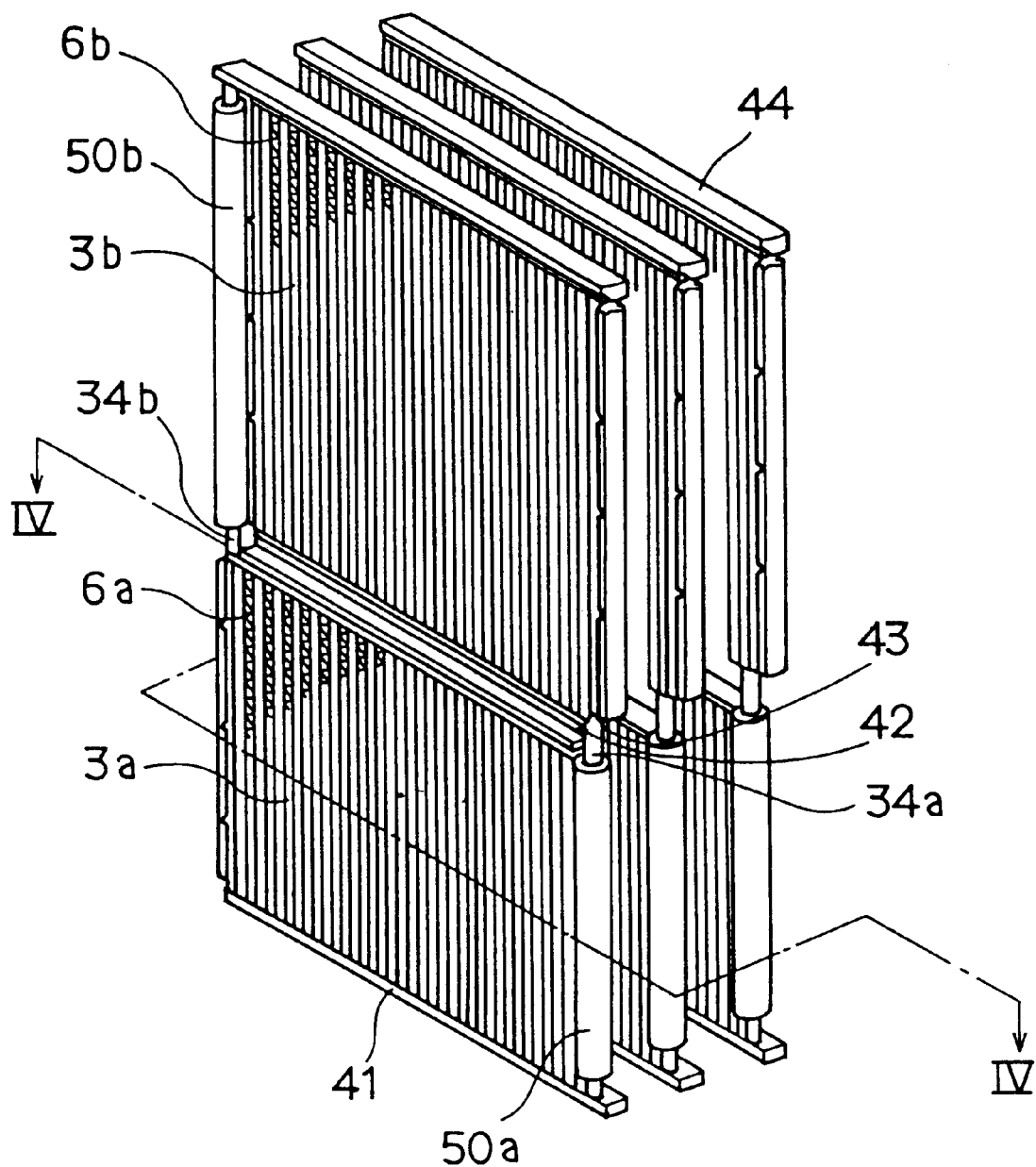
FIG. 3 is a perspective view showing the cooling apparatus according to the first embodiment.
Figure 4:
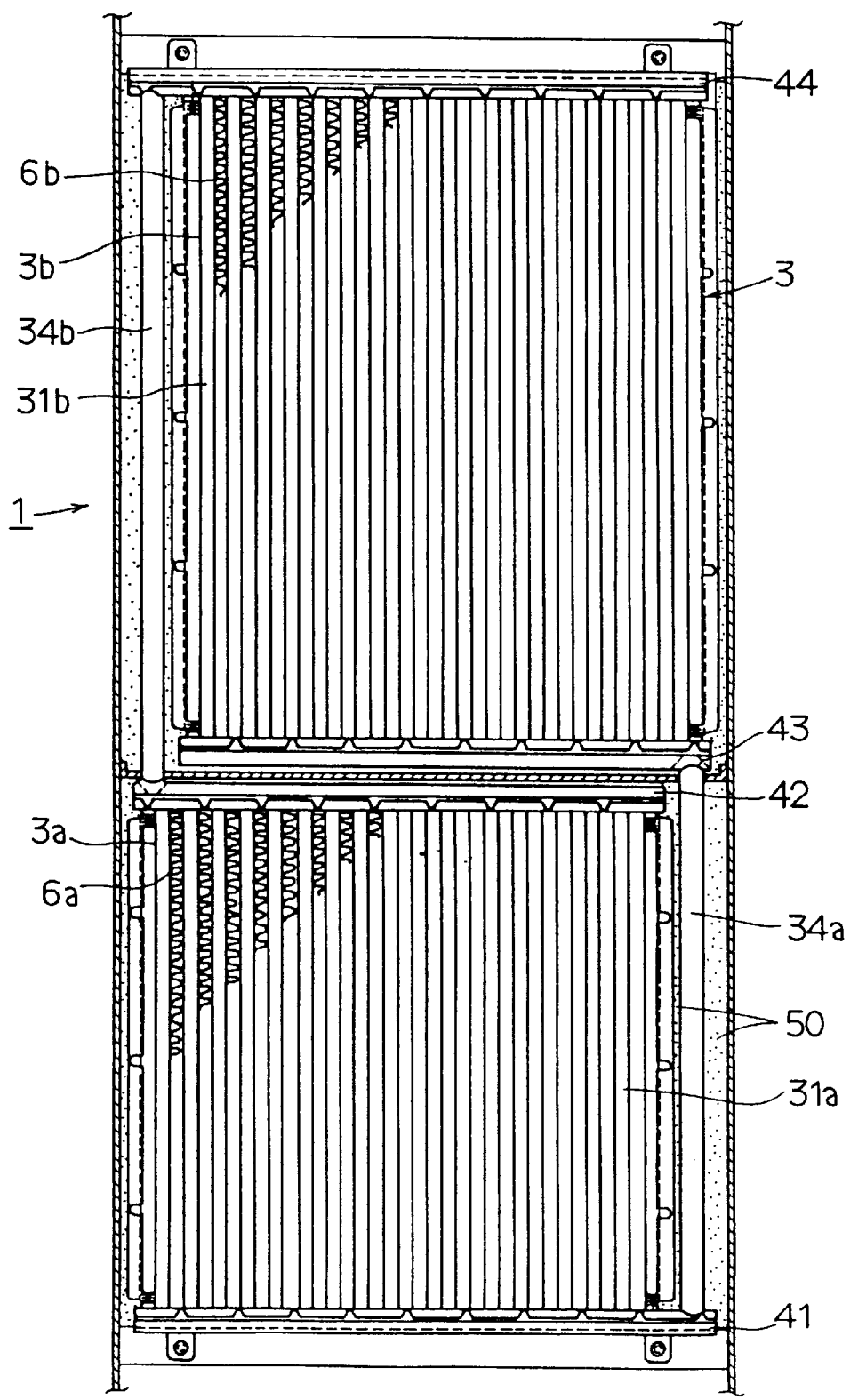
FIG. 4 is a front view of the cooling apparatus shown in FIG. 3.

FIG. 3 is a perspective view showing the cooling apparatus. FIG. 4 is a front view of the cooling apparatus shown in FIG. 3, FIG. 5 is an explanatory schematic view of FIG. 4, and FIG. 6 is a cross sectional view taken along the line VI—VI of FIG. 3.

In this embodiment, as shown in FIG. 3, a plurality of cooling apparatuses using boiling and condensing refrigerant are stacked in flowing directions of high-temperature fluids and low-temperature fluids.

Figure 5:
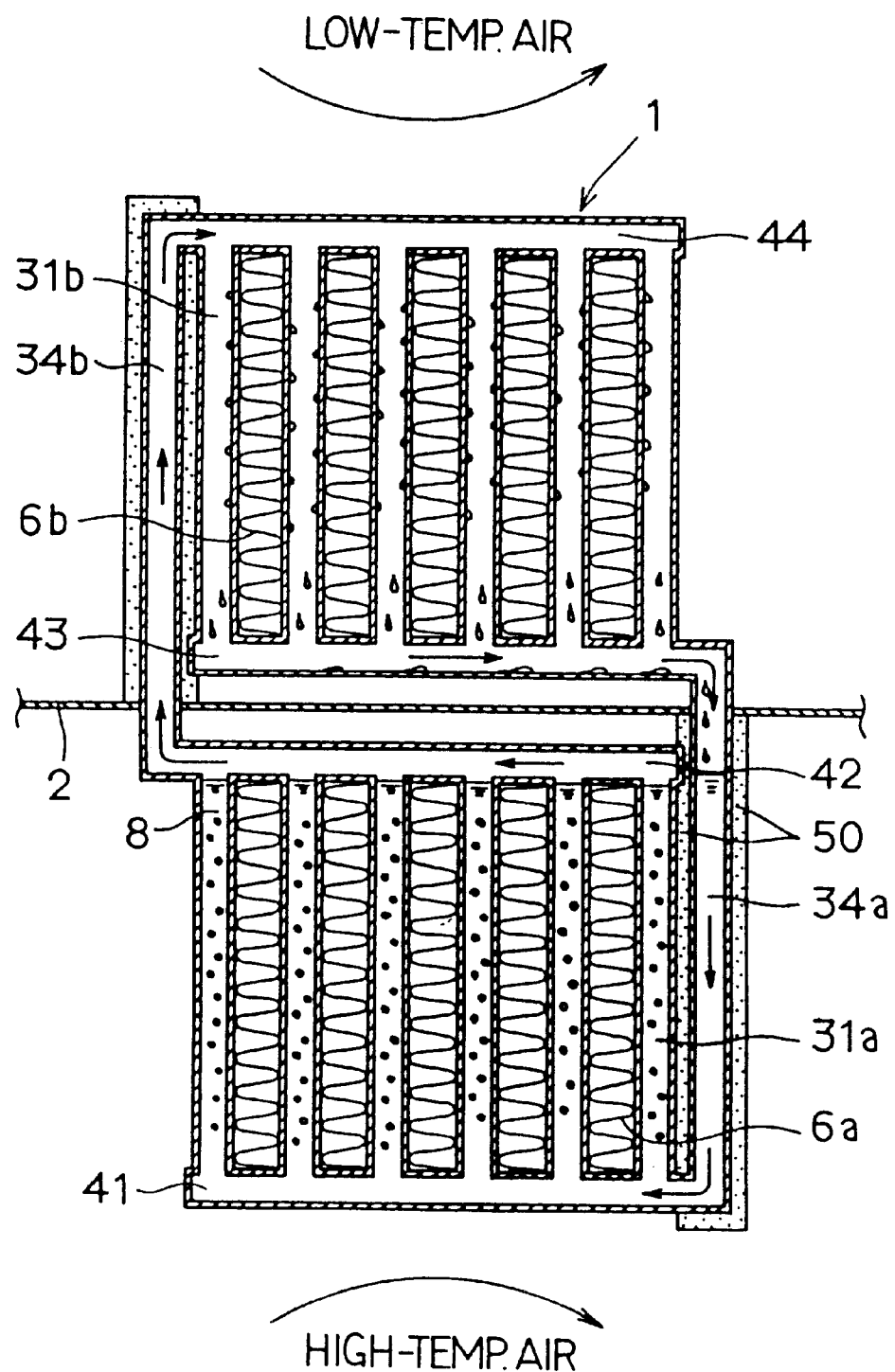
FIG. 5 is an explanatory schematic view of the cooling apparatus shown in FIG. 4.
Figure 6:
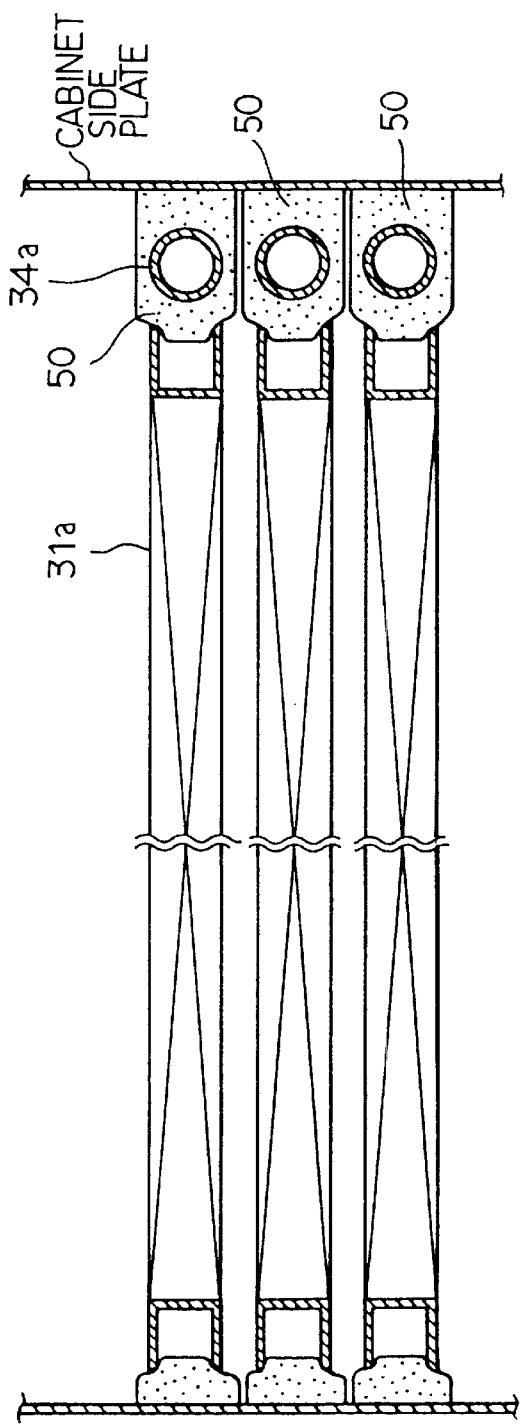
FIG. 6 is a cross sectional view taken along the line VI—VI of FIG. 3.
Figure 7:
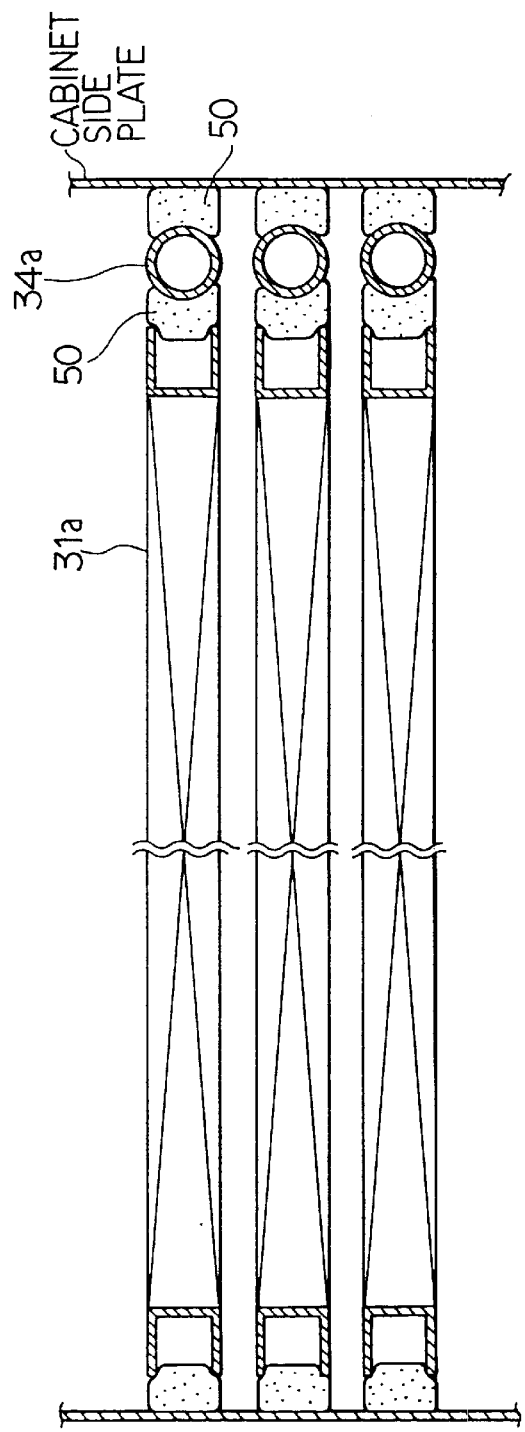
FIG. 7 is a cross sectional view showing a modified example of the cooling apparatus shown in FIG. 6.

As shown in FIG. 5, the cooling apparatus 1 includes a fluid separating plate 2 for separating a high-temperature fluid (for example, high-temperature air) from a low-temperature fluid (for example, low-temperature air); a refrigerant tank 3a composed of a plurality of heat absorbing pipes 31a disposed on the high-temperature fluid side from the fluid separating plate 2; a refrigerant sealed into the heat absorbing pipes 31a to receive heat from the high-temperature fluid so as to be boiled and vaporized; a pair of low-temperature-side communication pipes 34a, one of which is communicated with the refrigerant tank 3a hermetically while the other being passed through the fluid separating plate 2 and extended to the low-temperature fluid side; a communication pipe 34b; a low-temperature side communication pipe 34a; a radiator 3b communicated with the other of the high-temperature side communication pipe 34b hermetically and composed of a plurality of radiating pipes 31b disposed on the low-temperature fluid side from the fluid separating plate 2; a heat receiving fin 6a joined in a fused state (for example, in a brazed state) between the heat absorbing pipes 31a of the refrigerant tank 3a; a radiating fin 6b joined in a fused state (for example, in a brazed state) between the radiating pipes 31b of the radiator 3b; and a heat insulating material 50 (for example, urethane foam which is a foaming resin) as a heat conduction suppressing means embedded between the refrigerant tank 3a and the low-temperature-side communication pipe 34a and between the radiator 3b and the communication pipe 34b to suppress the heat movement from the refrigerant tank 3a to the low-temperature-side communication pipe 34a and the heat movement from the radiator 3b to the communication pipe 34b.

In FIG. 5, the air flow direction of the low-temperature fluid and the high-temperature fluid is indicated in the lateral direction on paper for the sake of convenience, however, actually air flows in the laminating direction in FIG. 3.

The fluid separating plate 2 constitutes, for example, one wall surface of the closed space, an interior of which is at a high temperature, and is formed of metal material such as aluminum and joined integrally (for example, brazed) to the low-temperature-side communication pipe 34a and the high-temperature-side communication pipe 34b. The fluid separating plate 2 is bored with an elongated insert hole through which the low-temperature-side communication pipe 34a and the high-temperature-side communication pipe 34b extend. A resin such as rubber for suppressing the heat movement may be held between the fluid separating plate 2 and each communication pipe. Further, the fluid separating plate 2 may be heat-insulated from the periphery (at least one of the low-temperature fluid or the high-temperature fluid) by the heat insulating material formed of a foaming resin such as urethane foam.

The refrigerant tank 3a includes a plurality of heat absorbing pipes 31a disposed substantially in parallel, a heat absorbing-side lower communication portion 41 disposed below the heat absorbing pipes 31a communicated with these heat absorbing pipes 31a at the lower portions thereof, and a heat absorbing-side upper communication portion 42 disposed above the heat absorbing pipes 31a communicated with these heat absorbing pipes 31a at the upper portions thereof. The heat absorbing pipe 31a is in the form of a flat pipe having an elongated rectangular (or an oval) cross section and is made of a metal material (for example, aluminum or copper) which is superior in heat transfer characteristics.

The radiator 3b includes a plurality of radiating pipes 31b disposed substantially in parallel with each other, a radiating-side lower communication portion 43 disposed below the radiating pipes 31b and communicated with the radiating pipes 31b at the lower portions thereof, and a radiating-side upper communication portion 44 disposed above the radiating pipes 31b and communicated with the radiating pipes 31b at the upper portions thereof. The radiating pipe 31b is also in the form of a flat pipe having an elongated rectangular (or an oval) cross section and is made of a metal material (for example, aluminum or copper) which is superior in heat transfer characteristics.

The high-temperature side communication pipe 34b is communicated with the heat absorbing-side upper communication portion 42 of the refrigerant tank 3a and the radiating-side upper communication portion 44 of the radiator 3b to deliver the refrigerant 8 boiled and vaporized in the refrigerant tank 3a to the radiator 3b. The high-temperature side communication pipe 34b is disposed substantially in parallel with the radiating pipes 31b and in a fixed spacing relation (preferably, in a spacing larger than the distance between the radiating pipes 31b, more preferably in a spacing more than twice of the spacing therebetween).

The low-temperature-side communication pipe 34a is communicated with the radiating-side lower communication portion 43 of the radiator 3b and the heat absorbing-side lower communication portion 41 of the refrigerant tank 3a to return the refrigerant 8 cooled and liquefied in the radiator 3b to the refrigerant tank 3a. The low-temperature-side communication pipe 34a is disposed substantially parallel to the heat absorbing pipes 31a with a predetermined interval (preferably, in an interval larger than the distance between the heat absorbing pipes 31a, more preferably in an interval more than twice of the interval therebetween).

The refrigerant 8 is composed of HFC-134a (chemical formula: $CH_2FCF_3$) or water and is set in a range where the internal pressure of the tank is not so high (in the case of HFC-134a, for example, pressure less than scores of atmospheric pressure), that is, to be condensed by the low-temperature fluid and boiled by the high-temperature fluid. More specifically, the refrigerant is selected to be boiled at 100° C. Here, the refrigerant may be a mixture of refrigerants having a plurality of compositions or a refrigerant including mainly a single composition. The refrigerant 8 is sealed up to the amount in which a liquid level lowers slightly below the heat absorbing-side upper communication portion 42 of the refrigerant 3a. Preferably, the amount of refrigerant may be set such that a liquid level does not reaches the radiating pipe 31b during the operation. The refrigerant 8 is sealed after the heat absorbing fins 6a and the radiating fins 6b have been brazed and joined to the heat absorbing pipes 31a and the radiating pipes 31b.

The heat receiving fin 6a is disposed between the heat absorbing pipes 31a, and the radiating fin 6b is disposed between the radiating pipes 31b. The heat receiving fin 6a and the radiating fin 6b are corrugating fins in which metal (for example, aluminum) sheets (thickness: about 0.02 to 0.5 mm) having a superior heat transfer characteristics are alternately bent in a wavy shape, and are brazed to the flat outer wall surface of the radiating pipe 31b (that is, being joined in a fused state). The heat receiving fins 6a are provided to facilitate the transfer of the heat on the high-temperature fluid side to the refrigerant 8 and to improve the strength of the heat absorbing pipes 31a as well. The radiating fins 6b are provided to facilitate transfer of the heat of the refrigerant to the low-temperature fluid side and to improve the strength of the radiating pipes 31b as well.

The heat insulating material 50 as the heat conduction suppressing means is formed of, for example, a foaming resin, more specifically, urethane foam, and is disposed between the refrigerant tank 3a and the low-temperature-side communication pipe 34a, and between the radiator 3b and the high-temperature-side communication pipe 34b. The heat insulating material 50 suppresses the heat movement from the refrigerant tank 3a to the low-temperature-side communication pipe 34a, and the heat movements from the high-temperature-side communication pipe 34b to the radiator 3b.

The heat insulating material 50 is not only disposed between the refrigerant tank 3a and the low-temperature-side communication pipe 34a, and between the radiator 3b and the high-temperature-side communication pipe 34b but covers the outer periphery of the low-temperature-side communication pipe 34a and the high-temperature side communication pipe 34b. This covering may be directed to the entire outer periphery of the low-temperature-side communication pipe 34a and the high-temperature side communication pipe 34b or to a part (a vertical part). The heat insulating material 50 may not cover the entire outer periphery of the communication pipes 34a and 34b as shown in FIG. 6 but may be disposed between the refrigerant tank 3a and the low-temperature-side communication pipe 34a, and between the radiator 3b and the high-temperature side communication pipe 34b.

In the above cooling apparatus, the refrigerant tanks disposed in parallel with each other, and the radiators disposed in parallel with each other.

An operation of this embodiment will be described hereinafter.

The refrigerant 8 sealed into each heat absorbing pipe 31a of the refrigerant tank 3a receives heat transmitted from the high-temperature fluid through the heat receiving fin 6a so that the refrigerant is boiled and vaporized. The vaporized refrigerant is exposed to the low-temperature fluid and becomes condensed and liquefied on the inner wall surface of the radiating pipe 31b of the low-temperature radiator 3b, and the condensed latent heat is transmitted to the low-temperature fluid through the radiating fin 6b. The refrigerant 8 condensed and liquefied in the radiator 3b moves along the inner wall surface due to its own weight and drops onto the heat absorbing-side lower communication portion 41 of the refrigerant tank 3a. By repeating the boiling and the condensation and liquefaction of the refrigerant 8, the high-temperature fluid and the low-temperature fluid are not mixed, and the heat of the high-temperature fluid can be moved to the low-temperature fluid efficiently.

An effect of this embodiment will be described below.

In this embodiment, as the heat conduction suppressing means, there is provided the heat insulating material 50a as the refrigerant tank-side heat insulating material between the refrigerant tank 3a and the low-temperature-side communication pipe 34a. In this way, it is possible to prevent the condensed refrigerant which is condensed and liquefied and moves down from absorbing heat from the high-temperature refrigerant tank 3a through the low-temperature-side communication pipe 34a to receive the ascending force in the low-temperature-side communication pipe 34a.

Accordingly, it is possible to prevent the circulation of the refrigerant from being impeded, and the cooling apparatus can be downsized.

As the heat conduction suppressing means, there is provided a heat insulating material 50 between the radiator and the high-temperature-side communication pipe 34b as the radiator-side heat insulating material. In this way, it is possible to prevent the ascending refrigerant which has been boiled and vaporized in the refrigerant tank 3a from radiating heat to the low-temperature radiator 3b through the communication pipe 34b and descending in the communication pipe 34b.

As the heat conduction suppressing means, there is provided a heat insulating material 50 coated on the outer periphery of the low-temperature-side communication pipe 34a as a high-temperature portion-side heat insulating material. In this way, it is possible to suppress the heat conduction from the high-temperature portion (high-temperature air as high-temperature fluid) to the low-temperature-side communication pipe 34a. As a result, it is possible to prevent the descending refrigerant which has been condensed and liquefied in the radiator 3b from absorbing heat from the high-temperature portion through the low-temperature-side communication pipe 34a so as to receive the ascending force in the low-temperature-side communication pipe 34a. In this way, it is possible to prevent the circulation of refrigerant from being impeded, and the cooling apparatus can be downsized.

As the heat conduction suppressing means, there is provided a heat insulating material 50 coated on the outer periphery of the high-temperature-side communication pipe 34b as a low-temperature portion-side heat insulating material. In this way, it is possible to prevent the ascending refrigerant which has been boiled and vaporized in the refrigerant tank 3a from radiating heat to the low-temperature portion (low-temperature air as low-temperature fluid) through the high-temperature-side communication pipe 34b and descending in the high-temperature-side communication pipe 34b. Accordingly, it is possible to prevent the circulation of refrigerant from being impeded, and the cooling apparatus can be downsized.

Since the heat insulating materials 50a and 50b cover at least a part of the outer periphery of the low-temperature-side communication pipe 34a or the high-temperature-side communication pipe 34b, it is possible to prevent the circulation of refrigerant from being impeded as compared with prior art. Further, since the heat insulating materials 50a and 50b cover the entire outer periphery of the low-temperature-side communication pipe 34a or the high-temperature-side communication pipe 34b, it is possible to further prevent the circulation of refrigerant from being and the cooling apparatus can be downsized.

Since the heat insulating material is made of a foaming resin, heat insulation can be performed efficiently.

The refrigerant tank 3a includes a plurality of heat absorbing pipes 31a disposed substantially in parallel with each other, a heat absorbing-side lower communication portion 41 disposed below the plurality of heat absorbing pipes 31a to communicate a plurality of heat absorbing pipes 31a with each other, and a heat absorbing-side upper communication portion 42 disposed above the plurality of heat absorbing pipes 31a to communicate a plurality of heat absorbing pipes 31a with each other. The communication pipes are disposed substantially in parallel with the heat absorbing pipes 31a and communicated with the heat absorbing-side lower communication portion 41, thus downsizing the cooling apparatus.

Since the heat receiving fin 6a and the radiating fin 6b are joined in a state fused with the refrigerant tank 3a and the radiator 3b, the thermal resistance between the fins can be reduced as compared with the case where the heat receiving fin 6a and the radiating fin 6b are mechanically mounted on the refrigerant tank 3a and the radiator 3b. Therefore, the entire cooling apparatus can be further downsized than the case where the heat receiving fin 6a and the radiating fin 6b are mechanically mounted on the refrigerant tank 3a and the radiator 3b.

Further, since the high-temperature fluid and low-temperature fluid flow opposedly with each other and a plurality of cooling apparatuses using boiling and condensing refrigerant are laminated in the flowing direction of the high-temperature fluid and low-temperature fluid, the heat of the high-temperature fluid can be radiated toward the low-temperature fluid.

A second embodiment of the present invention will be described.

Figure 8:
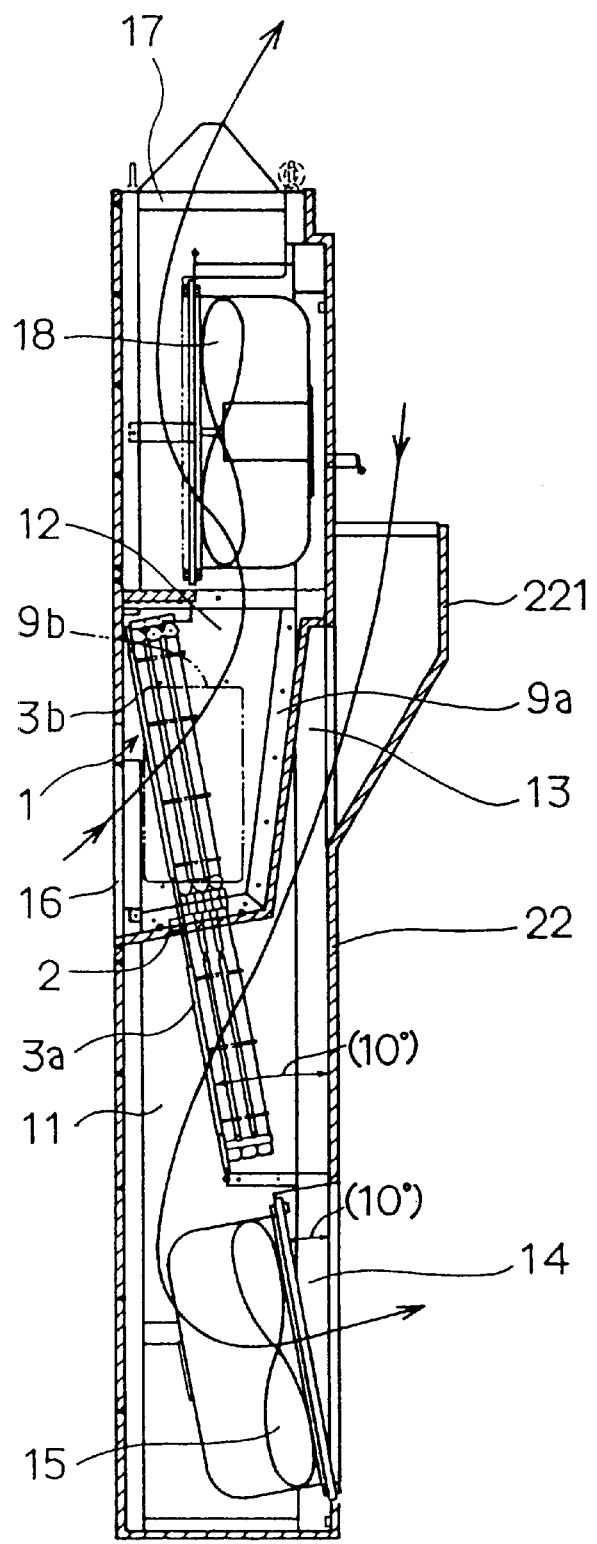
FIG. 8 is a side view of a cooler using the cooling apparatus according to a second embodiment.
Figure 9:
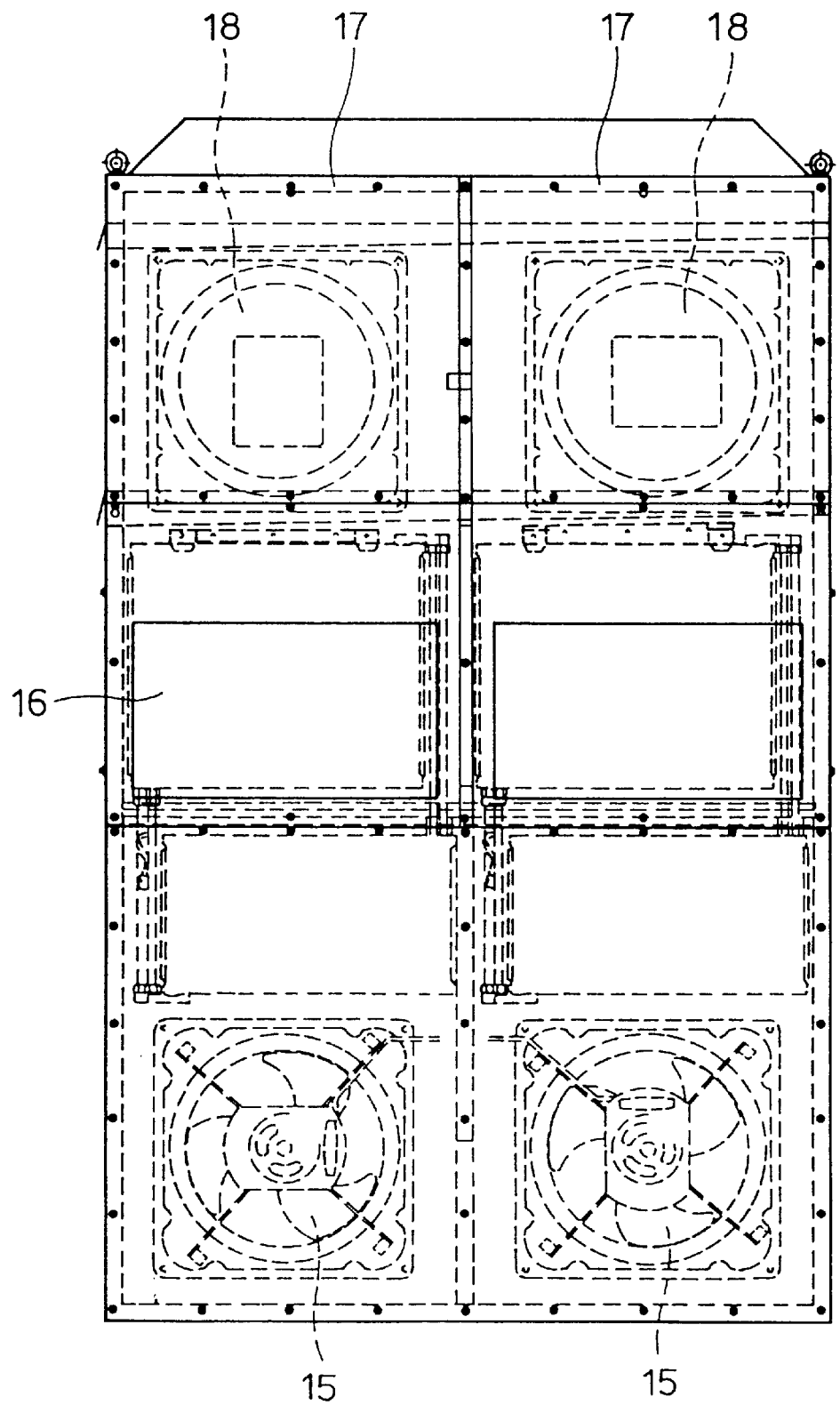
FIG. 9 is a front view of the cooler according to the second embodiment shown in FIG. 8.
Figure 10:
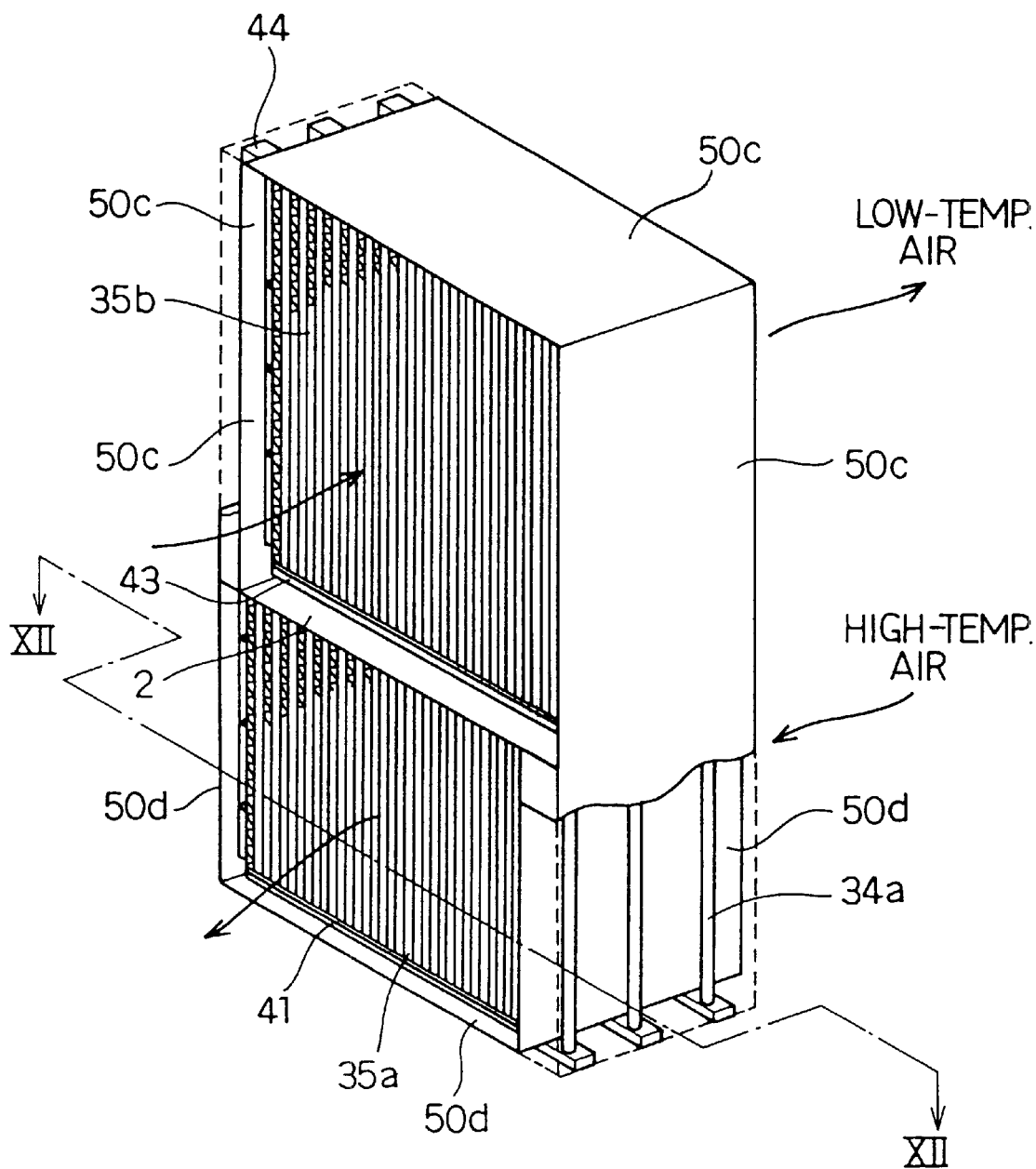
FIG. 10 is a perspective view showing the cooling apparatus according to the second embodiment.
Figure 11:
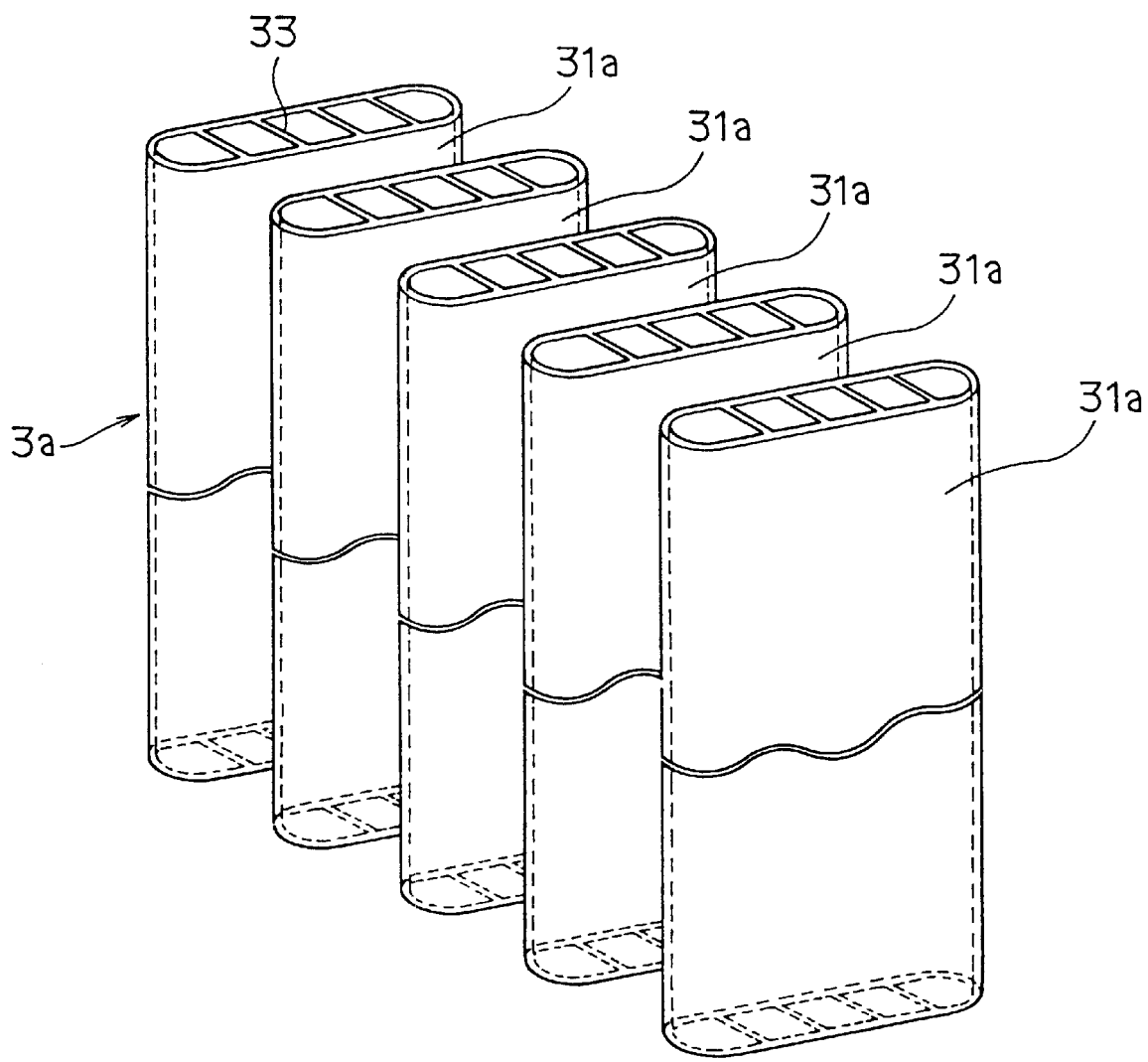
FIG. 11 is an enlarged view of a heat absorbing pipe of the cooling apparatus shown in FIG. 10.

FIG. 8 is a side view in which a cooler according to the second embodiment is applied to the box-shaped cooling apparatus; and FIG. 9 is a plane view as viewed from the outside of FIG. 8 (that is, as viewed from the left side on paper). FIG. 10 is a perspective view of the cooling apparatus 1 according to the second embodiment; and FIG. 11 is a cross sectional view taken along the line XI—XI of FIG. 10.

The cooler according to this embodiment is mounted within the closed space 9 in the same manner as in the first embodiment shown in FIGS. 1 and 2. In the closed space 9, there are disposed a heating element (not shown), for example, a trans-receiver for communication equipment, and a power amplifier for actuating the trans-receiver.

As shown in FIGS. 8 and 9, the cooler is provided at its upper and lower part with openings 13 and 14 communicated with the closed space 9. The cooler is formed with a vent port 13 as an opening in communication with the upper part of the closed space 9 in order to take gases of the closed space 9 into a heat transfer space 11 on the high-temperature side. More specifically, one side wall surface 9a and a partitioning wall 22 form an air passage 23 vertically extending through the cooler, and the upper end of the air passage 23 is opened to the upper part (above the fluid separating plate 2) within the closed space 9 as the vent port 13. The vent port 13 is formed at its outlet portion with an introducing port 221 opened to the upper part of the closed space 9 so as to suppress the introduction of cool air from the lower part of the closed space 9 and to positively introduce high-temperature air from the upper part of the closed space 9.

In this way, the gas having a high temperature, heated by the heating element 7, is introduced from the vent port 13 into the air passage 23 and led to the refrigerant tank 3a smoothly, and therefore the temperature in the closed space 9 can be maintained uniform. That is, since the gas having a high temperature, due to the heat generated from the heating element 7, moves upward within the closed space 9 by convection, in order to improve the cooling efficiency in the closed space 8, it is preferable that the vent port 13 is provided at the upper part of the closed space 9. In other words, when the vent port 13 is located lower than the fluid separating plate 2, a relatively low-temperature gas in the closed space 9 is introduced from the vent port 13 into the air passage 23 and led to the refrigerant tank 3a, and the cooling efficiency in the closed space 9 is not sufficient.

Further, the entire cooling apparatus 1 is disposed so as to be inclined in a lateral direction (the left and right direction in FIG. 8) so that the gases passing through the refrigerant tank 3a and a radiator 3b within the heat transfer spaces 11 and 12 on the high and low-temperature-sides smoothly flow from the vent ports 13 and 16 on the intake side toward the vents ports 14 and 17 on the discharge side. In this way, the change in flow direction of the gases flowing through the refrigerant tank 3a and the radiator 3b can be slackened so that the loss of the air flow in the narrow space can be reduced. As a result, the internal fan 15 within the closed space 9 can be downsized, and the heating amount generated by the internal fan 15 can be reduced so that the same amount of heat generated by the heating element 7 can be increased (that is, when the internal fan 15 becomes large-sized to improve the cooling performance, the heating amount generated by the internal fan 15 increases, and as a result the heating amount the heating element 7 cannot be increased).

The internal fan 15 as an internal circulation fan is made up of an axial fan, and sucks the air so that high-temperature air (high-temperature air as a high-temperature fluid) introduced into the vent port 13 through the introducing port 221 is introduced between the heat absorbing pipes 31a of the refrigerant tank 3a. The internal fan 15 is inclined so as to be parallel to the heat absorbing pipe 31a of the refrigerant tank 3a. The internal fan 15 may be inclined with respect to the heat absorbing pipe 31a of the refrigerant tank 3a.

The external fan 18 as an external circulation fan is made up of an axial fan, and sucks the air so that low-temperature air (low-temperature air as a low-temperature fluid) introduced into the vent port 16 through the introducing port 221 is introduced between the radiating pipes 31b of the radiator 3b. The external fan 18 is inclined with respect to the radiating pipe 31b of the radiator 3b. On the discharge side of the external fan 18 is disposed a deflecting for deflecting air from the external fan 18 upward. Air from the external fan 18 passes through the vent port 17 opened to the upper surface of the cooler by the deflecting plate 181 and is discharged outside.

A maintenance lid 9b for maintaining the radiator 3b is provided on the side of the radiator 3b of the cooler shown in FIG. 8. Since the radiator 3b introduces external air, dust or foreign material contained in external air may clog between the radiating pipes 31b. However, these can be easily removed by means of the maintenance lid 9b. The maintenance lid 9b is fixed to the cooler during the operation and is opened during the cleaning.

FIG. 10 is a perspective view showing the cooling apparatus. Also in this embodiment, a plurality of cooling apparatuses using boiling and condensing refrigerant are laminated in the flowing direction of the high-temperature fluid and low-temperature fluid. The details of the cooling apparatus are similar to that shown in FIG. 4 except that the heat insulating material 50 is not provided and will be described partially with reference to FIG. 4.

As shown in FIGS. 4 and 10, the cooling apparatus 1 includes a fluid separating plate 2 for separating a high-temperature fluid (for example, high-temperature air) from a low-temperature fluid (for example, low-temperature air); a refrigerant tank 3a composed of a plurality of heat absorbing pipes 31a disposed on the high-temperature fluid side from the fluid separating plate 2; a refrigerant 8 sealed into the heat absorbing pipes 31a to receive heat from the high-temperature fluid so as to be boiled and vaporized; a pair of low-temperature-side communication pipes 34a, one of which is communicated with the refrigerant tank 3a hermetically while the other of which passes through the fluid separating plate 2 and is extended to the low-temperature fluid side; a communication pipe 34b; a low-temperature-side communication pipe 34a; a radiator 3b communicated with the other of the high-temperature-side communication pipe 34b hermetically and composed of a plurality of radiating pipes 31b disposed on the low-temperature fluid side from the fluid separating plate 2; a heat receiving fin 6a joined in a fused state (for example, in a brazed state) between the heat absorbing pipes 31a of the refrigerant tank 3a; a radiating fin 6b joined in a fused state (for example, in a brazed state) between the radiating pipes 31b of the radiator 3b; and a heat insulating material 50 (for example, urethane foam which is a foaming resin) as a heat conduction suppressing means embedded between the refrigerant tank 3a and the low-temperature-side communication pipe 34a and between the radiator 3b and the communication pipe 34b to suppress the heat movement from the refrigerant tank 3a to the low-temperature-side communication pipe 34a and the heat movement from the radiator 3b to the communication pipe 34b.

The fluid separating plate 2 constitutes, for example, one wall surface of the closed space, an interior of which is at a high-temperature, and is made of metal material such as aluminum and joined integrally (for example, brazed) to the low-temperature-side communication pipe 34a and the high-temperature-side communication pipe 34b. The fluid separating plate 2 is bored with an elongated insert hole through which the low-temperature-side communication pipe 34a and the high-temperature-side communication pipe 34b extend.

The refrigerant tank 3a includes a plurality of heat absorbing pipes 31a disposed substantially in parallel with each other, a heat absorbing-side lower communication portion 41 disposed below the heat absorbing pipes 31a communicated with these heat absorbing pipes 31a at the lower portions thereof, and a heat absorbing-side upper communication portion 42 disposed above the heat absorbing pipes 31a communicated with these heat absorbing pipes 31a at the upper portions thereof. The heat absorbing pipe 31a is in the form of a flat pipe having an oval (or an elongated rectangular) cross section and is formed of a metal material (for example, aluminum or copper) which is superior in heat transfer characteristics. FIG. 11 is a partial cross sectional view showing the heat absorbing pipe 31a. In this figure, the heat receiving fin 6a is omitted. As shown, the heat absorbing pipe 31a is a flat pipe having an oval cross section, which is internally formed with a plurality of internal partitioning plates 33 over the vertical direction (eye-shaped cross section). In this way, the pressure resistance performance is improved, and the heat absorbing efficiency resulting from an enlargement of a contact area with the refrigerant is improved. The heat absorbing pipe 31a can be easily formed by extruding.

The radiator 3b includes a plurality of radiating pipes 31b disposed substantially in parallel with each other, a radiating-side lower communication portion 43 disposed below the radiating pipes 31b and communicated with the radiating pipes 31b at the lower portions thereof, and a radiating-side upper communication portion 44 disposed above the radiating pipes 31b and communicated with the radiating pipes 31b at the upper portions thereof. The radiating pipe 31b is also in the form of a flat pipe having an oval (or an elongated rectangular) cross section and is formed of a metal material (for example, aluminum or copper) which is superior in heat transfer characteristics. The radiating pipe 31b is likewise in the form of a flat pipe having an oval shape in section similar to the heat absorbing pipe 31a shown in FIG. 11, which is internally formed with a plurality of internal partitioning plates 33 over the vertical direction (not shown). This brings forth the effect of improving the pressure resistance performance and the heat absorbing efficiency resulting from an enlargement of a contact area with the refrigerant. The radiating pipe 31b can be easily formed by extrusion molding.

The high-temperature-side communication pipe 34b is communicated with the heat absorbing-side upper communication portion 42 of the refrigerant tank 3a and the radiating-side upper communication portion 44 of the radiator 3b to deliver the refrigerant 8 boiled and vaporized in the refrigerant tank 3a to the radiator 3b. The high-temperature-side communication pipe 34b is disposed substantially parallel to the radiating pipes 31b with a predetermined interval (preferably, in an interval larger than the distance between the radiating pipes 31b, more preferably in an interval more than twice of the interval therebetween).

The low-temperature-side communication pipe 34a is communicated with the radiating-side lower communication portion 43 of the radiator 3b and the heat absorbing-side lower communication portion 41 of the refrigerant tank 3a to return the refrigerant 8 cooled and liquefied in the radiator 3b to the refrigerant tank 3a. The low-temperature-side communication pipe 34a is disposed substantially parallel to the heat absorbing pipes 31a at a predetermined -interval (preferably, at an interval larger than the distance between the heat absorbing pipes 31a, more preferably at an interval more than twice of the interval therebetween).

The refrigerant 8 is formed of HFC-134a (chemical equation: CH2FCF3) or water and is set in a range where internal pressure of the tank is not so high (in case of HFC-134a, for example, pressure less than scores of atmospheric pressure), that is, to be condensed by the low-temperature fluid boiled by the high-temperature fluid. More specifically, the refrigerant is selected to be boiled at 100° C. Here, the refrigerant may be a mixture of refrigerants having a plurality of compositions or a refrigerant including mainly a single composition. The refrigerant 8 is sealed up to the amount in which a liquid level lowers slightly below the heat absorbing-side upper communication portion 42 of the refrigerant 3a. Preferably, the amount of refrigerant is set such that a liquid level does not reaches the radiating pipe 31b during the operation. The refrigerant 8 is sealed after the heat absorbing fins 6a and the radiating fins 6b have been brazed and joined to the heat absorbing pipes 31a and the radiating pipes 31b.

The heat receiving fin 6a is disposed between the heat absorbing pipes 31a, and the radiating fin 6b is disposed between the radiating pipes 31b. The heat receiving fin 6a and the radiating fin 6b are corrugating fins in which metal (for example, aluminum) sheets (thickness: about 0.02 to 0.5 mm) which is superior in heat transfer characteristics are alternately bent in a wavy shape, and are brazed to the flat outer wall surface of the radiating pipe 31b (that is, being joined in a fused state). The heat receiving fins 6a are provided to facilitate the heat transfer on the high-temperature fluid side to the refrigerant 8 and to improve the strength of the heat absorbing pipes 31a as well. The radiating fins 6b are provided to facilitate heat transfer of the refrigerant to the low-temperature fluid side and to improve the strength of the radiating pipes 31b as well.

In this embodiment, the high-temperature portion is formed with a high-temperature passage 35a through which high-temperature air as a high-temperature fluid flows, and the low-temperature portion is formed with a low-temperature passage 35b through which low-temperature air as a low-temperature fluid flows.

In this embodiment, as the heat conduction suppressing mean, there is employed a plate-like member disposed at least between the refrigerant tank 3a and the low-temperature-side communication pipe 34a and between the radiator 3b and the high-temperature-side communication pipe 34b.

Figure 12:
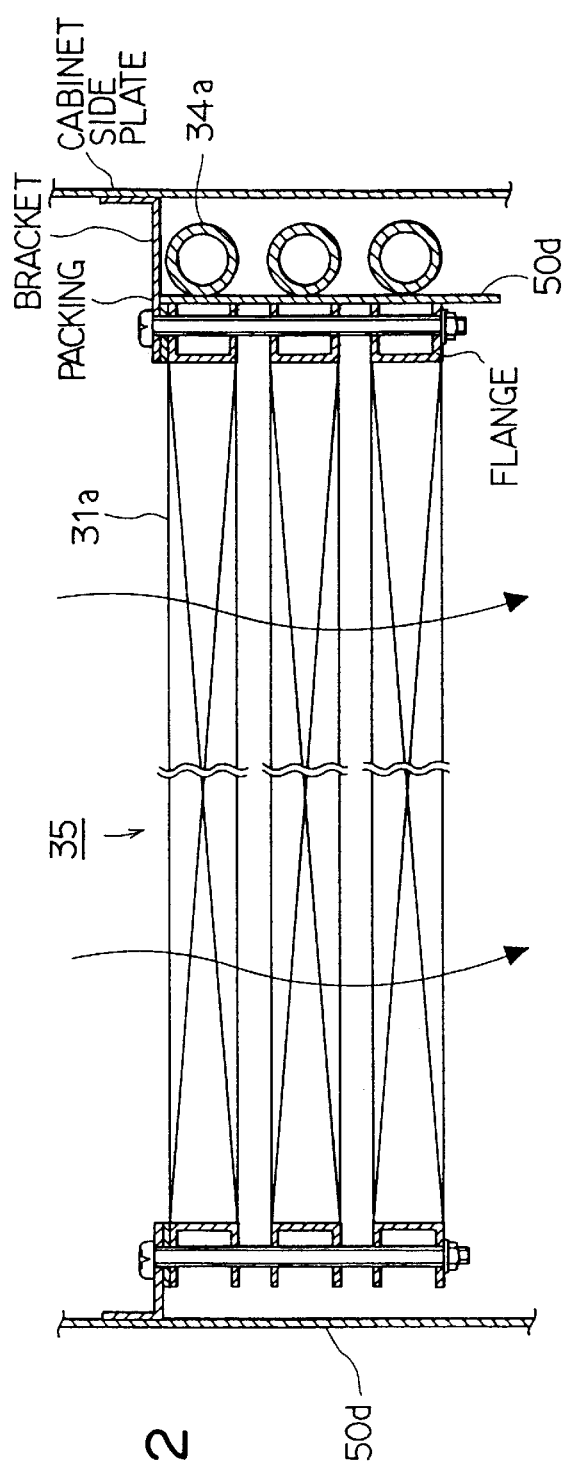
FIG. 12 is a cross sectional view taken along the line XII—XII of FIG. 10.

The high-temperature-side passage 35a is constructed by a fluid separating plate 2 and a high-temperature-side dividing member 50d formed from a plate-like member surrounding the outer periphery of the refrigerant tank 3a. The refrigerant tank 3a is disposed in the high-temperature passage 35a, and the low-temperature-side communication pipe 34a is separated from the high-temperature passage 35a so as to be in a lower temperature region That is, as shown in FIG. 12, the low-temperature-side communication pipe 34a is disposed outside the high-temperature-side dividing member 50d. A bracket is disposed on the whole surface of the low-temperature-side communication pipe 34a at the upstream portion where high-temperature air flows to prevent high-temperature air from flowing into the space where the low-temperature-side communication pipe 34a is disposed.

In the same manner, the high-temperature-side passage 35b includes a fluid separating plate 2 and a high-temperature-side dividing member 50c formed from a plate-like member surrounding the outer periphery of the radiator 3b. The radiator 3b is disposed in the low-temperature passage 35a, and the high-temperature-side communication pipe 34b is separated from the low-temperature passage 35b so as to be in a higher temperature region. That is, the high-temperature-side communication pipe 34b is disposed outside the high-temperature-side dividing member 50c.

The flange fixes the cooling apparatus, and functions to maintain a predetermined space between the refrigerant tank 31a and the low-temperature-side communication pipe 34a and between the radiator 31b and the high-temperature-side communication pipe 34b.

In this embodiment, as the heat conduction suppressing means, the fluid separating plate 2 and the high-temperature-side dividing member 50d for dividing the high-temperature passage 35a are provided between the low-temperature-side communication pipe 34a and the radiating pipe 31a, and the low-temperature-side communication pipe 34a is separated by the high-temperature-side dividing member 50d so as to be in a region where the temperature is lower than that in the high-temperature passage 35a. In this way, the heat conduction from the high-temperature passage to the low-temperature-side communication pipe 34a can be suppressed. As a result, it is possible to prevent the descending refrigerant which has been condensed and liquefied in the radiator 3b from absorbing heat from the high-temperature passage through the low-temperature-side communication pipe 34a and receiving the ascending force in the low-temperature-side communication pipe 34a. In this way, it is possible-to prevent the circulation of refrigerant from being impeded, and the cooling apparatus can be downsized. Further, as the heat conduction suppressing means, the fluid separating plate 2 and the high-temperature-side dividing member 50c for dividing the low-temperature passage 35b are provided between the high-temperature-side communication pipe 34b and the heat absorbing pipe 31b, and the high-temperature-side communication pipe 34b is separated by the high-temperature-side dividing member 50c so as to be in a region where the temperature is higher than that in the low-temperature passage 35a. In this way, the heat conduction from the low-temperature-side communication pipe 34a to the low-temperature passage 35b can be suppressed. As a result, it is possible to prevent the ascending refrigerant which has been boiled and vaporized in the refrigerant tank 3a from radiating heat to the low-temperature passage through the high-temperature-side communication pipe 34b and descending in the high-temperature-side communication pipe 34b. In this way, it is possible to prevent the circulation of refrigerant from being impeded, and the cooling apparatus can be downsized.

Further, in the multi-stage cooling apparatus shown in FIG. 10, each low-temperature-side communication pipe 34a is separated from the high-temperature passage 35a and each high-temperature-side communication pipe 34b is separated from the low-temperature passage 35b, and therefore the temperature efficiency when the fluid flows can be improved.

The cooling apparatus according to this embodiment can be divided into a portion where air can be blown (a fin portion) and portions where air cannot be blown (the low-temperature-side communication pipe 34a, the high-temperature-side communication pipe 34b). When air is simply blown by a fan (not shown) to the multi-stage cooling apparatus as in this embodiment, the air is contracted when flowing into the fin portion, and is expanded after passing through the fin portion, and as a result pressure loss may occur. However, in this embodiment, the high-temperature passage 35a is divided by the fluid separating plate 2 and the high-temperature-side dividing member 50d, and the low-temperature passage 35b is divided by the fluid separating plate 2 and the high-temperature-side dividing member 50c. Therefore, air flowing through the passages 35a and 35b flows linearly so that the pressure loss can be reduced. In this way, the consumed power of the fan and the noise of the air flow can be reduced. Further, since the cross section where the air is blown is restricted as-compared with the case of non-division, the flow amount of the fin portion can be increased.

Since the high-temperature-side communication pipe 34b is disposed substantially parallel to the heat absorbing pipe 31b at a predetermined interval (preferably, an interval larger than the distance between the heat absorbing pipes 31b, more preferably an interval as twice as the interval or more), it is possible to prevent the ascending refrigerant which has been boiled and vaporized in the refrigerant tank 3a from radiating heat to the low-temperature radiator 3b through the high-temperature-side communication pipe 34b and descending in the high-temperature-side communication pipe 34b. The low-temperature-side communication pipe 34a is communicated with the radiating-side lower communication portion 43 of the radiator 3b and the heat absorbing-side lower communication portion 41 of the refrigerant tank 3a to return the refrigerant 8 cooled and liquefied by the radiator 3b to the refrigerant tank 3a. Further, since the low-temperature-side communication pipe 34a is disposed substantially parallel to the radiating pipe 31a at a predetermined interval (preferably, an interval larger than the distance between the radiating pipes 31a, more preferably an interval as twice as the interval or more), it is possible to prevent the descending refrigerant which has been condensed and liquefied in the radiator 3b from absorbing heat from the high-temperature refrigerant tank 3a through the low-temperature-side communication pipe 34a and receiving the ascending force in the low-temperature-side communication pipe 34a.

In the aforementioned first and second embodiments, in the refrigerant tank 3a, heat can be received by the plurality of heat absorbing pipes 31a, and therefore the heat absorbing efficiency is improved. The refrigerants boiled and vaporized by absorbing heat are collected at the heat absorbing-side upper communication portion 42, and the refrigerant is delivered to the radiator 3b by the high-temperature-side communication pipe 31b. Therefore, the number of pipes for communicating between the radiator 3b and the refrigerant tank 3a can be reduced, and the fluid separating plate 2 can be easily machined. Further, in the radiator 3b, heat is radiated by the plurality of heat absorbing pipes 31b, and therefore the radiating efficiency is improved. The refrigerants condensed and liquefied are collected at the radiating-side lower communication portion 43, and the refrigerant is delivered to the refrigerant tank 3a by the low-temperature-side communication pipe 34a. Therefore, the number of pipes for communicating between the radiator 3b and the refrigerant tank 3a can be reduced, and the fluid separating plate 2 can be easily machined.

Figure 13:
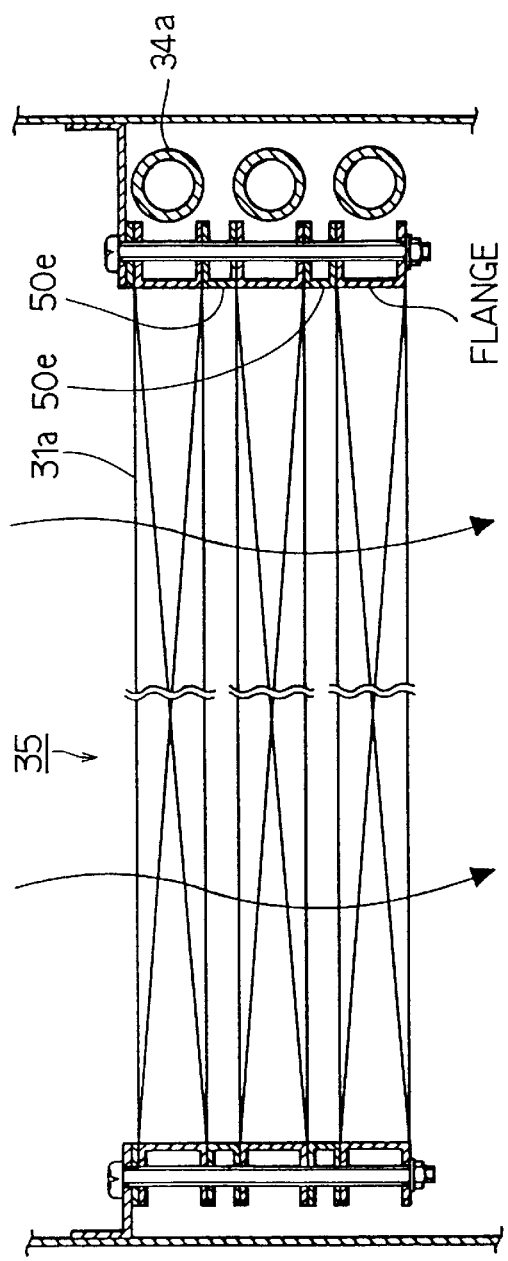
FIG. 13 is a cross sectional view showing a modification of the cooling apparatus shown in FIG. 12.

The high-temperature-side dividing member 50d need not be constituted by the plate-like member disposed between the flange and the high-temperature-side passage 34a, as shown in FIG. 12, but may be of an interpolation flange 50e held between the flanges, as shown in FIG. 13. Similarly, the high-temperature-side dividing member 50c need not be constituted by the plate-like member disposed between the flange and the high-temperature-side passage 34b but may be of an interpolation flange 50e held between the flanges. In this case, air is blown more smoothly.

In FIGS. 12 and 13, since the bracket is disposed at the upstream side of the region where air is blown, high-temperature air does not collide with the low-temperature-side communication pipe 34a, and the low-temperature-side communication pipe 34a can be prevented from being heated by the high-temperature air. However, even in the case of the opposite direction of the air flowing direction shown in FIG. 12 (the bracket is disposed at the downstream side), air stagnates in a region surrounded by the cabinet side plate, the bracket and the high-temperature-side dividing member 50d, and substantially the high-temperature air does not collide with the low-temperature-side communication pipe 34a. In this way, the low-temperature-side communication pipe 34a can be also prevented from being heated by the high-temperature air. Similarly, even in the case of the opposite direction of the air flowing direction shown in FIG. 13 (the bracket is disposed at the downstream side), air stagnates in a region surrounded by the cabinet side plate, the bracket and the interpolation bracket 50e, and substantially the high-temperature air does not collide with the low-temperature-side communication pipe 34a. In this way, the low-temperature-side communication pipe 34a can be also prevented from being heated by the high-temperature air.

A third embodiment of the present invention will be described.

Figure 14:
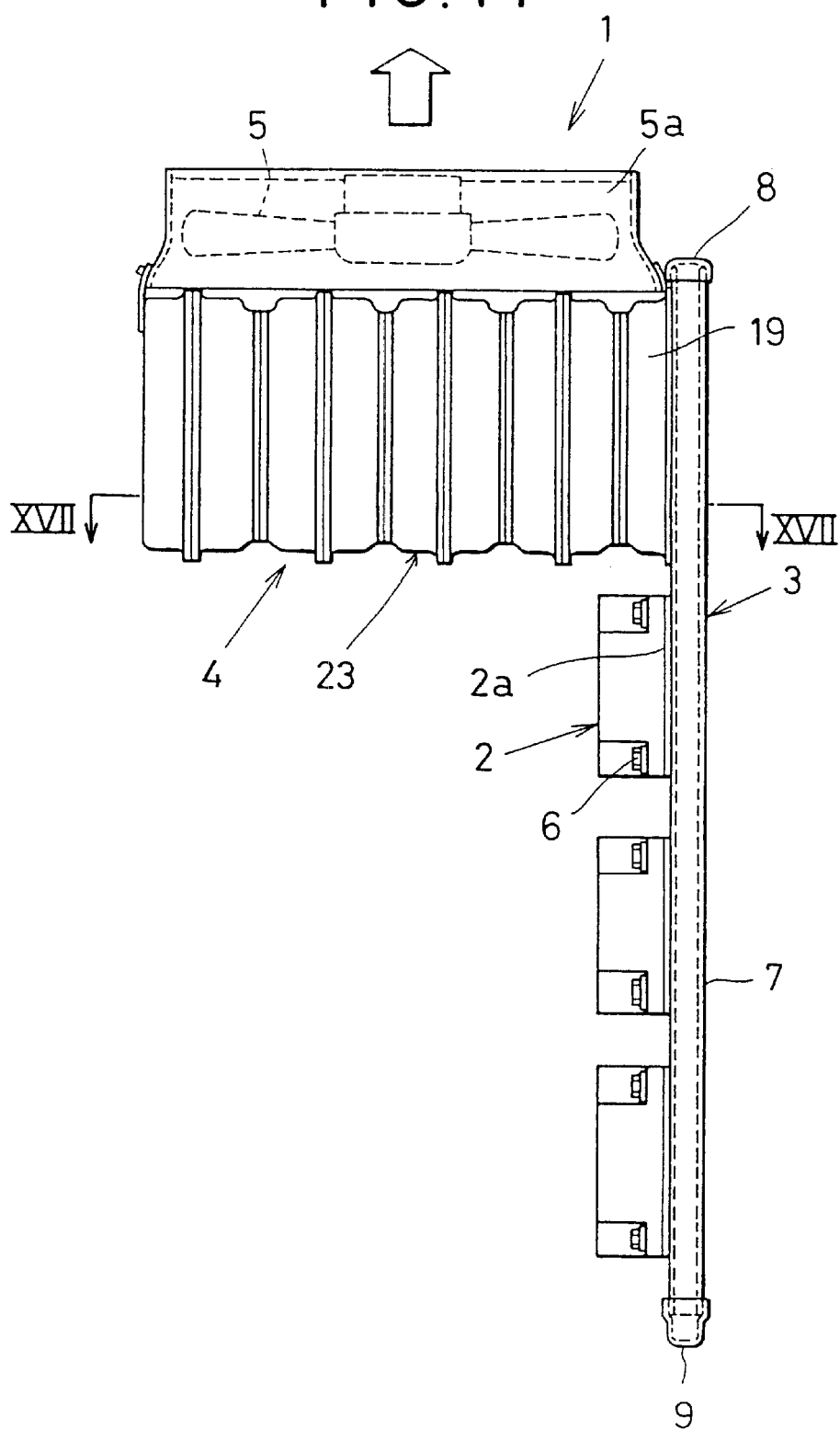
FIG. 14 is a side view showing the whole of a cooling system according to a third embodiment.

FIG. 14 is a side view showing an entire structure of a cooling apparatus using boiling and condensing refrigerant according to a third embodiment of the present invention.

The cooling apparatus 1 is for cooling an IGBT module 2 (heat generating element) which constitutes an inverter circuit of an electric vehicle or a general electric power control equipment or the like. The cooling apparatus 1 includes a refrigerant tank 3 containing a fluorocarbon-type refrigerant, a radiator 4 for cooling and liquefying vaporized refrigerant which has been boiled and vaporized in the refrigerant tank 3, and cooling fan 5 for blowing air to the radiator 4.

As shown in FIG. 14, the IGBT module 2 has a radiating plate 2a for radiating heat generated from a semiconductor element (not shown) incorporated in the module. The IGBT module 2 is fixed to the refrigerant tank 3 by tightening plural bolts 6 while the radiating plate 2a is in a state as to be closely contacted with an outer wall surface of the refrigerant tank 3. In this embodiment, six IGBT modules 2 (two in the transverse direction of the tank 3 and in three stages vertically) are mounted on one outer wall surface of the refrigerant tank 3.

The refrigerant tank 3 includes an extrusion member 7 formed by extruding from an aluminum block for example and a pair of end caps 8 and 9 for closing both upper and lower end openings of the extrusion member 7.

Figure 15:
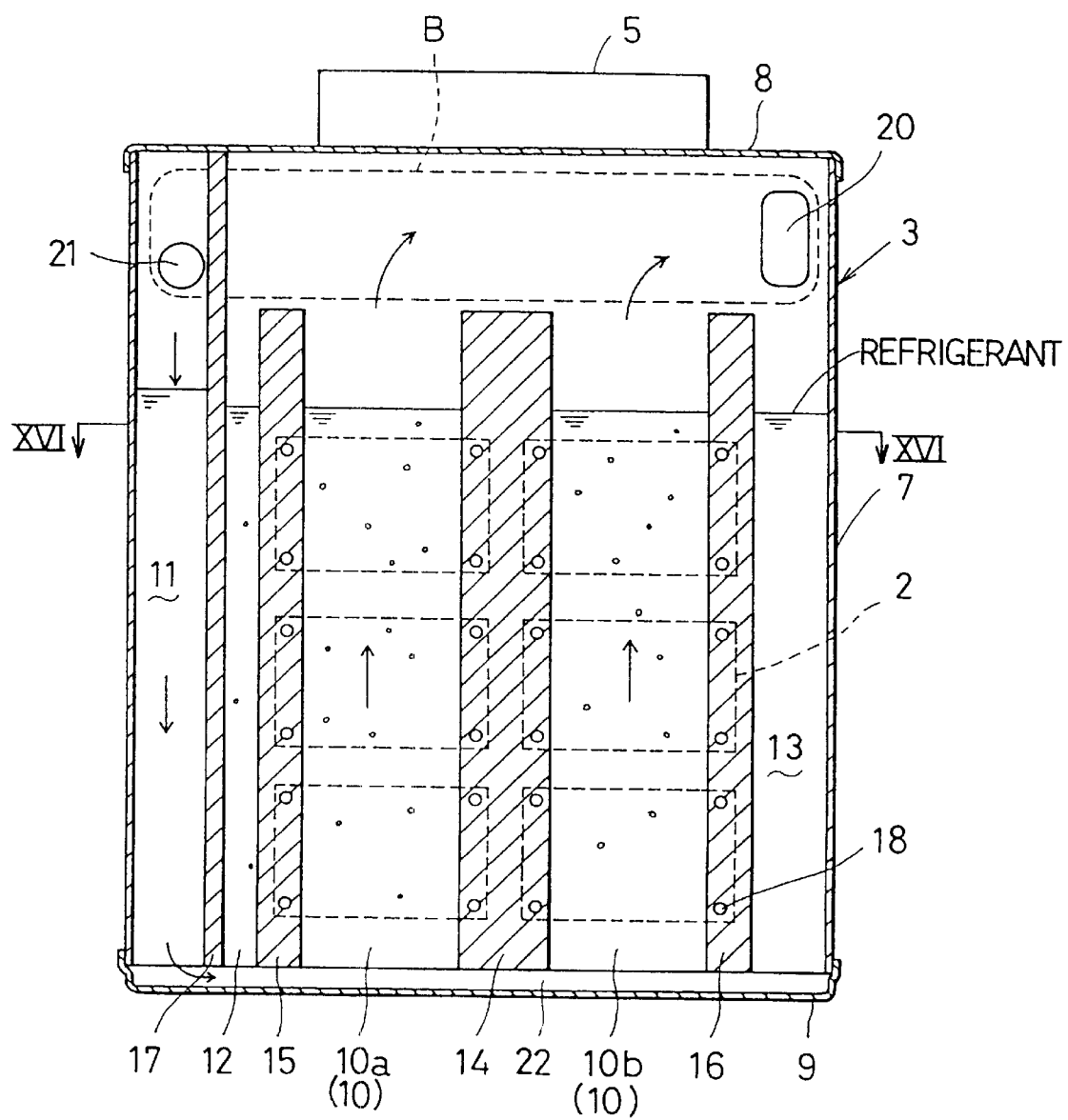
FIG. 15 is a vertical cross sectional view of a refrigerant tank.
Figure 16:
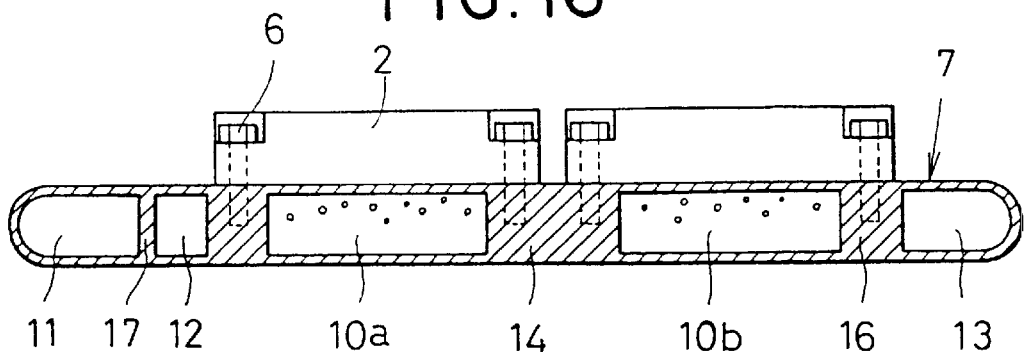
FIG. 16 is a transverse cross sectional view of the refrigerant tank taken along the line XVI—XVI of FIG. 15.

The extrusion member 7 is of a vertically long and flat shape having a small thickness relative to the width. As shown in FIGS. 15 and 16 (a cross sectional view taken along the line XVI—XVI of FIG. 15), a vapor passage 10, a condensed liquid passage 11, a heat insulating passage 12 and an inoperative passage 13 are formed longitudinally (vertically in FIG. 15) through the interior of the extrusion member 7 while remaining support rod portions 14, 15, 16 and 17 between adjacent passages.

The vapor passages 10a and 10b are regions where vaporized refrigerant which has been boiled and vaporized by the heat from the IGBT modules 2 ascends within the refrigerant tank 3. Two vapor passages are formed side by side in correspondence to the mounted positions of the IGBT modules 2. The condensed liquid passage 11 is a region into which a condensed liquid which has been cooled and liquefied in the radiator 4 flows and is formed on one side in the transverse direction. The heat insulating passage 12 functions to decrease the amount of heat transferred from the vapor passage 10 side to the condensed liquid passage 11 side and is formed between the vapor passages 10 and the condensed liquid passage 11. The inoperative passage 13 is for taking balance with respect to the condensed liquid passage 11 while the extrusion member 7 is being extruded, and is formed on the side opposite to the condensed liquid passage 11 in the transverse direction of the refrigerant tank 3. Thus, the inoperative passage 13 is not used as the condensed liquid passage 11.

Each of a support wall portion 14 for partitioning between the two vapor passages 10a and 10b, a support wall portion 15 for partitioning between one vapor passage 10a and the heat insulating passage 12, and a support wall portion 16 for partitioning between the other vapor passage 10b and the inoperative passage 13, is formed with plural screw holes 18 into which bolts 6 for mounting the IGBT modules 2 are threaded, as shown in FIG. 15.

In one outer wall (the wall on the side where the IGBT modules 2 are mounted in this embodiment) of the extrusion member 7 and in an area (the area indicated with a broken line B) to which the radiator 4 is connected through a connecting plate 19, as shown in FIG. 14, there are formed a refrigerant vapor outlet port 20 and a condensed liquid inlet port 21. The outlet port 20 is open above the inoperative passage 13. Since the upper portions of the support wall portions 15, 14 and 16 are removed by post-machining such as milling for example, the outlet port 20 is in communication with the vapor passages 10 and the heat insulating passage 12. There is a slight difference in height between the inlet port 21 and the outlet port 20 so that the lower end of the inlet port 21 is a little lower than the lower end of the outlet port 20.

The end caps 8 and 9 covers both open ends of the extrusion member 7 and integrally connected thereto by soldering. In this case, the top end cap 8 is attached while closing the upper end opening of the extrusion member 7, whereas the bottom end cap 9 is attached to the lower end opening of the extrusion member 7 while defining a communication path 22 between the lower end of the extrusion member 7 and the bottom end cap to provide communication among the vapor passages 10, condensed liquid passage 11, heat insulating passage 12 and inoperative passage 13.

The radiator 4 is a so-called drawn-cup type heat exchanger and, as shown in FIG. 14, it is constituted by laminating a plurality of hollow radiating tubes 23 of the same shape and is attached to the refrigerant tank 3 through the connecting plate 19.

Figure 17:
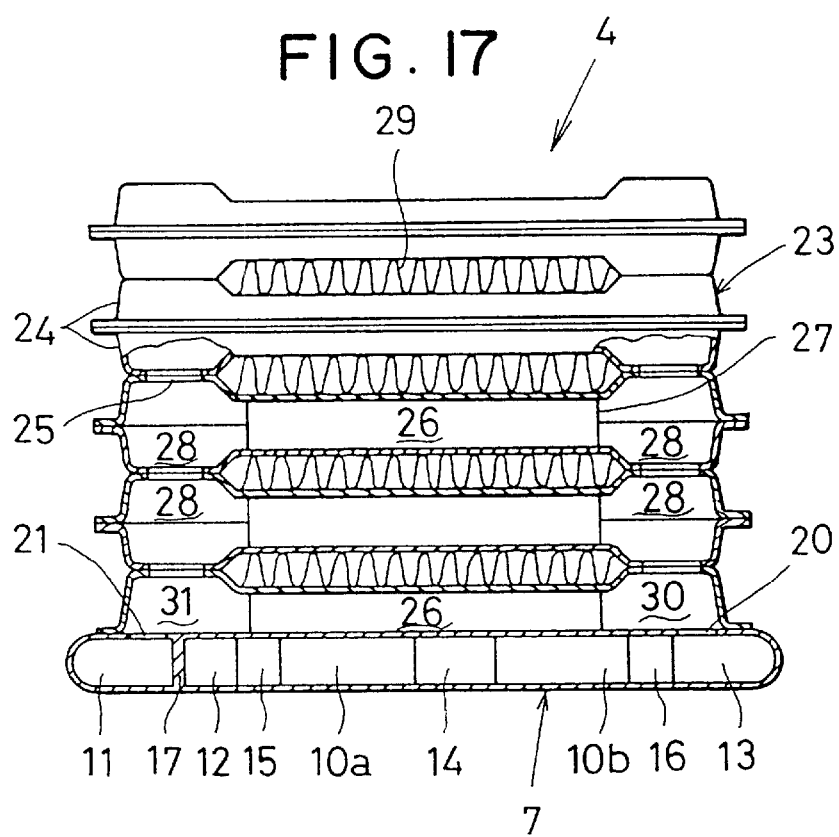
FIG. 17 is a cross sectional view of a heat radiator taken along the line XVII—XVII in FIG. 14.

As shown in FIG. 17 (a cross sectional view taken along the line XVII—XVII of FIG. 14), the radiating tubes 23 each include two pressed plates 24 of a generally rectangular shape in plan. Outer peripheral edges of the pressed plates 24 are jointed together to form a hollow body. The two pressed plates 24 are formed in the same shape by pressing a metallic material (e.g. aluminum) superior in heat conductivity, with communication openings being formed in both ends of each mold plate 24. The whole of the central portion of each radiating tube 23 constitutes a flat refrigerant passage 26, into which are inserted inner fins 27 obtained by corrugating a thin aluminum plate. At both ends of the refrigerant passage 26 are provided communicating portions 28 having the communication openings 25. The communicating portions 28 are connected to the communicating portions 28 of other radiating tubes 23 through the communication openings 25, thereby constituting a tank portion of the radiator 4 as a whole.

As shown in FIG. 17, the radiating tubes 23 are laminated so that the respective communicating portions 28 face each other. Mutual communication of the radiating tubes 23 is ensured through the communication openings 25 formed in the communicating portions 28, with radiating fins 29 being inter-posed between adjacent radiating tubes 23 which are in a laminated state. Provided, however, that the outside pressed plate 24 of the radiating tube 23 located at the outermost position does not have the communication openings 25. Alternatively, there may be used a pressed plate 24 having the communication openings 25, but in this case the communication openings 25 are closed hermetically with an end plate (not shown) or the like from the outside.

The connecting plate 19 is connected hermetically to an outer wall surface of the extrusion member 7 so as to cover the inlet port 21 and the outlet port 20 both formed in the extrusion member. One communication chamber 30 communicating with the outlet port 20 and the other communication chamber 31 communicating with the inlet port 21 are formed between the connecting plate 19 and the outer wall surface of the extrusion member 7. Both communication chamber 30 and 31 are in communication with each other through the refrigerant passage 26 in which the inner fins 27 are disposed. The connecting plate 19 has the same communication openings as those formed in the pressed plates 24, through which there is provided communication between the communication chambers 30, 31 and the radiating tubes 23.

As shown in FIG. 14, the cooling fan 5 is an axial flow fan, which is disposed above the radiator 4, with a fan shroud 5a being fixed with bolts (not shown) to a side face of the radiator 4.

An operation of this embodiment will be described below.

Refrigerant in the vapor passages 10 with IGBT modules 2 attached to the outer wall surfaces of the same passages boils and vaporizes while receiving heat from the IGBT modules 2. The resulting air bubbles rise within the vapor passages 10, pass through the outlet port 20 and flow mainly into one communication chamber 30. Then, the air bubbles flow from the one communication chamber 30 into one tank portion (the right-hand communicating portions 28 in FIG. 17) of the radiator 4, and are distributed to the refrigerant passages 26 formed in the radiating tubes 23. The vaporized refrigerant flowing through each refrigerant passage 26 condenses on the inner wall surface of the refrigerant passage and the surfaces of the inner fins 27, which are maintained at a low temperature by receiving air blown from the cooling fan 51, to radiate a latent heat of condensation. The resulting droplets flow along the bottom of each refrigerant passage 26 and into the other tank portion (the left-hand communicating portions 28 in FIG. 17) of the radiator 4. The droplets further flow out of the other tank portion into the other communication chamber 31 and stay mainly therein. The condensed liquid in the communication chamber 31 then flows into the condensed liquid passage 11 through the inlet port 21 which is open in a lower position than the outlet port 20, then flows down through the condensed liquid passage 11 and is returned again to the vapor passage 10 through the communication path 22 formed inside the end cap 9. On the other hand, the latent heat of condensation radiated at the time of condensation of the vaporized refrigerant is transferred from the wall surfaces of the refrigerant passages 26 to the radiating fins 29 and is radiated to the blown air passing between adjacent radiating tubes 23.

An effect of this embodiment will be described.

According to the cooling apparatus 1 of this embodiment, in the heat transfer path through which the heat generated from the IGBT modules 2 is transferred through the extrusion member 7 up to the refrigerant in the condensed liquid passage 11, the heat insulating passage 12 formed between one vapor passage 10a and the condensed liquid passage 11 functions as a thermal resistance. Further, a large proportion of the heat moving through the said heat transfer path is absorbed by the refrigerant in the heat insulating passage 12 and contributes to the rise in temperature of the refrigerant in the passage 12. As a result, the amount of heat passing through the aforementioned heat transfer path and transferred from the vapor passage 10 side to the condensed liquid passage 11 side is decreased and thus it is possible to prevent the refrigerant in the condensed liquid passage 11 from boiling. Consequently, the refrigerant circulates between the refrigerant tank 3 and the radiator 4 favorably, and the deterioration of the radiating performance due to the boiling of the refrigerant in the condensed liquid passage 11 can be prevented.

A fourth embodiment of the present invention will be described.

Figure 18:
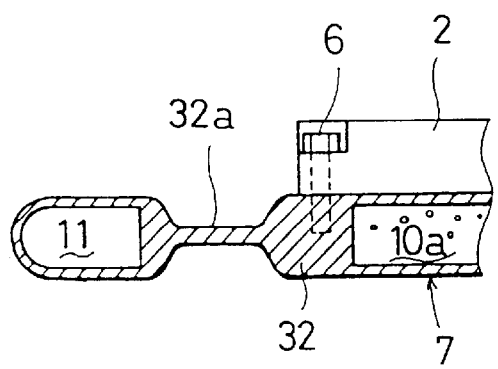
FIG. 18 is a partial cross sectional view of a refrigerant tank, showing a heat transfer decreasing structure according to a fourth embodiment.

FIG. 18 is a partial cross sectional view of a refrigerant tank 3, showing a heat transfer decreasing structure.

In this embodiment, as the heat transfer decreasing structure of the refrigerant tank 3, a support wall portion 32 for partitioning between the condensed liquid passage 11 and one vapor passage 10a is provided with a constricted part 32a having a reduced cross sectional area. In this case, because the amount of heat transferred from the vapor passage 10 side to the condensed liquid passage 11 decreases, it is possible to prevent the refrigerant in the condensed liquid passage 11 from boiling.

A fifth embodiment of the present invention will be described.

Figure 19:
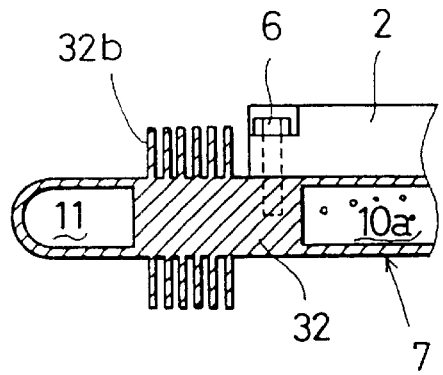
FIG. 19 is a partial cross sectional view of a refrigerant tank, showing a heat transfer decreasing structure according to a fifth embodiment.

FIG. 19 is a partial cross sectional view of a refrigerant tank 3, showing a heat transfer decreasing structure.

In this embodiment, as the heat transfer decreasing structure of the refrigerant tank 3, air-cooling fins 32b are formed outside a support wall portion 32 which spaces between the condensed liquid passage 11 and one vapor passage 10a.

According to this embodiment, part of the heat transferred through the support wall portion 32 is released to the atmosphere through the air-cooling fins 32b, so that the amount of heat transferred from the vapor passage 10 side to the condensed liquid passage 11 decreases. Therefore, the refrigerant in the condensed liquid passage 11 can be prevented from boiling.

A sixth embodiment of the present invention will be described.

Figure 20:
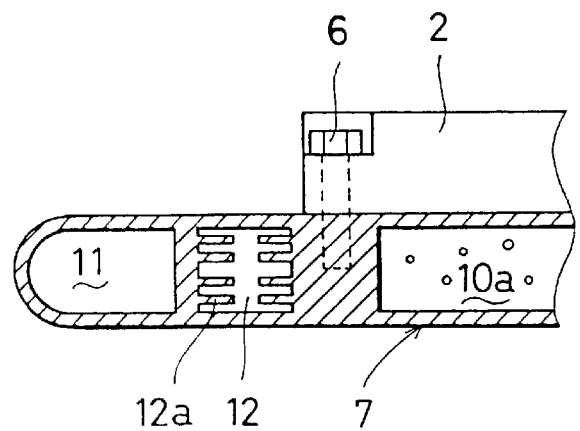
FIG. 20 is a partial cross sectional view of a refrigerant tank, showing a heat transfer decreasing structure according to a sixth embodiment.

FIG. 20 is a partial cross sectional view of a refrigerant tank 3, showing a heat transfer decreasing structure.

In this embodiment, inner fins 12a are projected on the inside of the heat insulating passage 12. According to this embodiment, the radiation area in the heat insulating passage 12 increases by the inner fins 12a, so that the radiating performance by boiling the refrigerant in the heat insulating passage 12 is improved and hence the amount of heat transferred from the vapor passage 10 side to the condensed liquid passage 11 side decreases, and therefore, the refrigerant in the condensed liquid passage 11 can be prevented from boiling.

A seventh embodiment of the present invention will be described.

Figure 21:
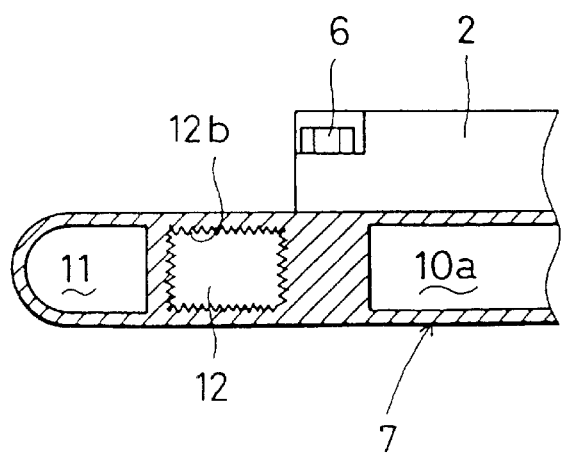
FIG. 21 is a partial cross sectional view of a refrigerant tank, showing a heat transfer decreasing structure according to a seventh embodiment.

FIG. 21 is a partial cross sectional view of a refrigerant tank 3, showing a heat transfer decreasing structure.

In this embodiment, the heat insulating passage 12 has an inner wall surface 12b of a concavo-convex shape. According to this embodiment, as compared with the case where the inner wall surface of the heat insulating passage 12 is a plane surface, the boiling of refrigerant in the heat insulating passage 12 is accelerated, so that the amount of heat transferred from the vapor passage 10 side to the condensed liquid passage 11 side becomes smaller, and therefore the refrigerant in the condensed liquid passage. 11 can be prevented from boiling.

An eighth embodiment of the present invention will be to described.

Figure 22:
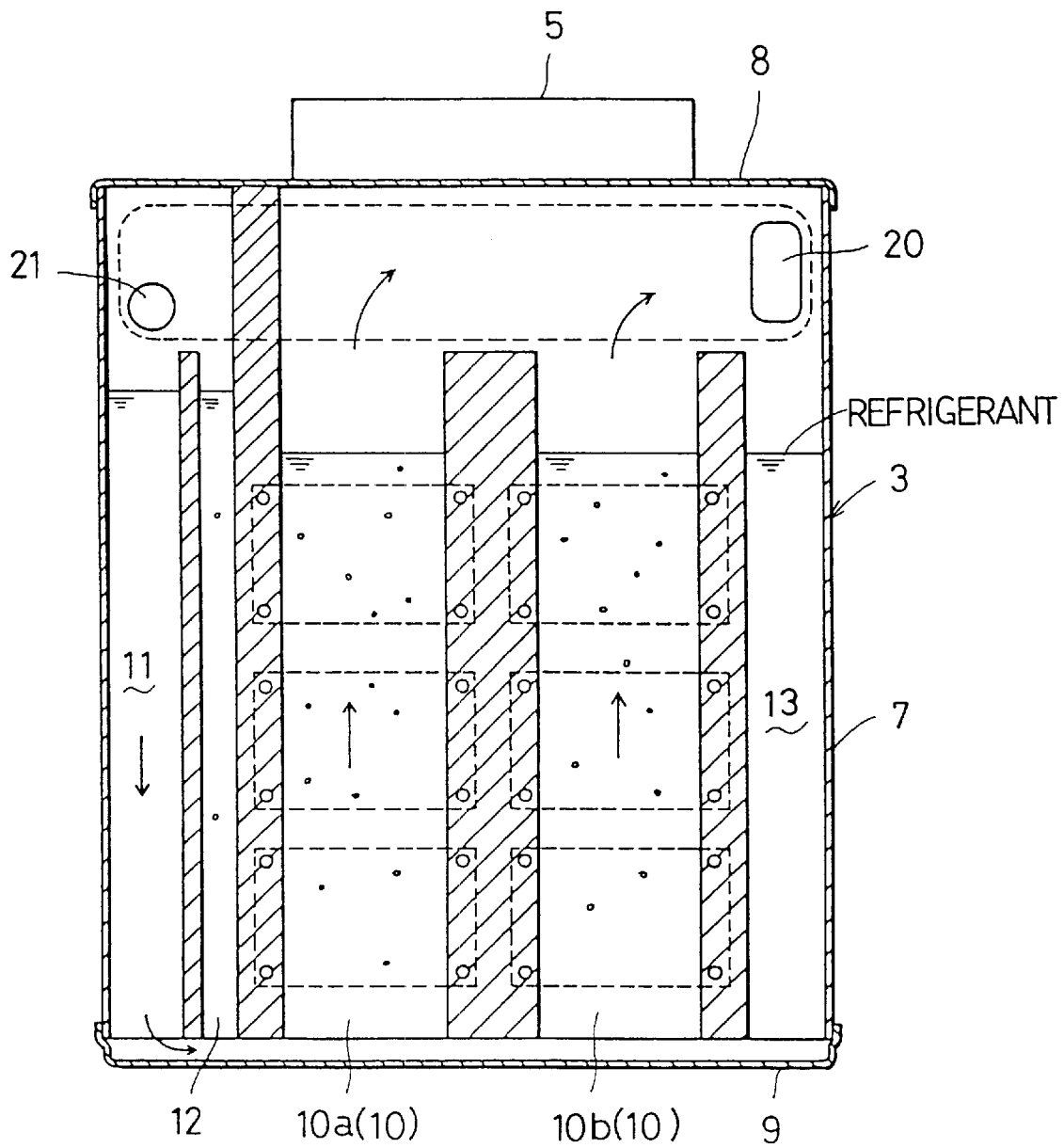
FIG. 22 is a vertical cross sectional view of a refrigerant tank according to an eighth embodiment.

FIG. 22 is a vertical sectional view of a refrigerant tank 3.

In this embodiment, the upper portion of the heat insulating passage 12 is brought into communication with the condensed liquid passage 11. Also in this case the heat insulating passage 12 functions as a thermal resistance and part of the heat transferred through the extrusion member 7 is absorbed by the refrigerant in the passage 12, so that the amount of heat transferred from the vapor passage 10 side to the condensed liquid passage 11 side is decreased to an extent sufficient to prevent the refrigerant in the condensed liquid passage 11 from boiling. In proportion to an increase in internal pressure of the boiling portion due to the air bubbles, there occurs a difference in liquid level between the boiling portion and the condensed liquid passage 11 during the operation of the cooling apparatus so that the liquid level of the condensed liquid passage 11 becomes higher. As a result of communicating between the condensed liquid passage 11 and the heat insulating passage 12, the liquid level in the passage 12 becomes higher than in communication with the boiling portion, so that the radiation area in the heat insulating passage 12 increases and the cooling effect is improved, and the refrigerant in the condensed liquid passage 11 can be prevented from boiling.

A ninth embodiment of the present invention will be described.

Figure 23:
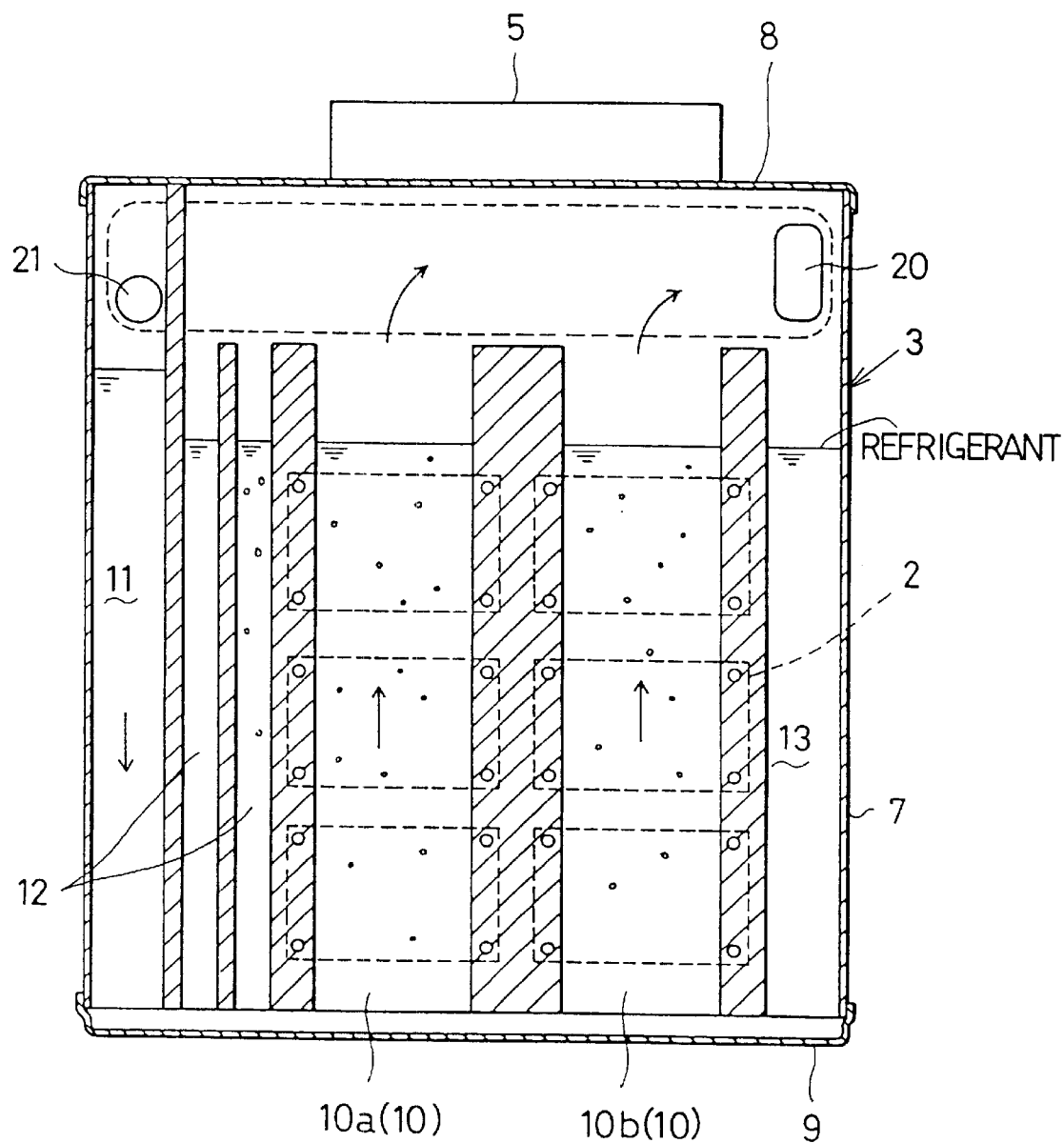
FIG. 23 is a vertical cross sectional view of a refrigerant tank according to a ninth embodiment.
Figure 24:
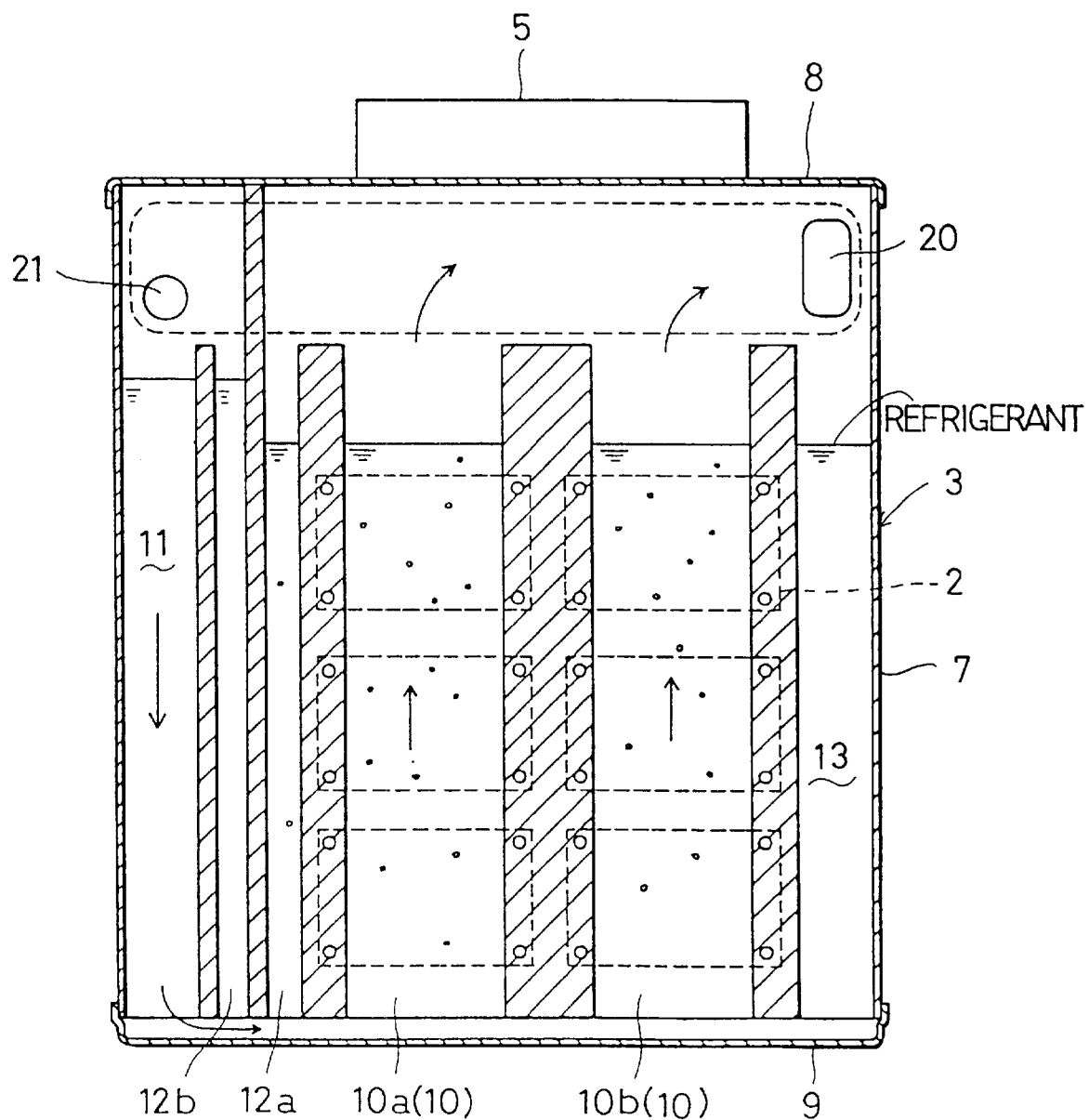
FIG. 24 is a vertical cross sectional view of a refrigerant tank according to the ninth embodiment.
Figure 25:
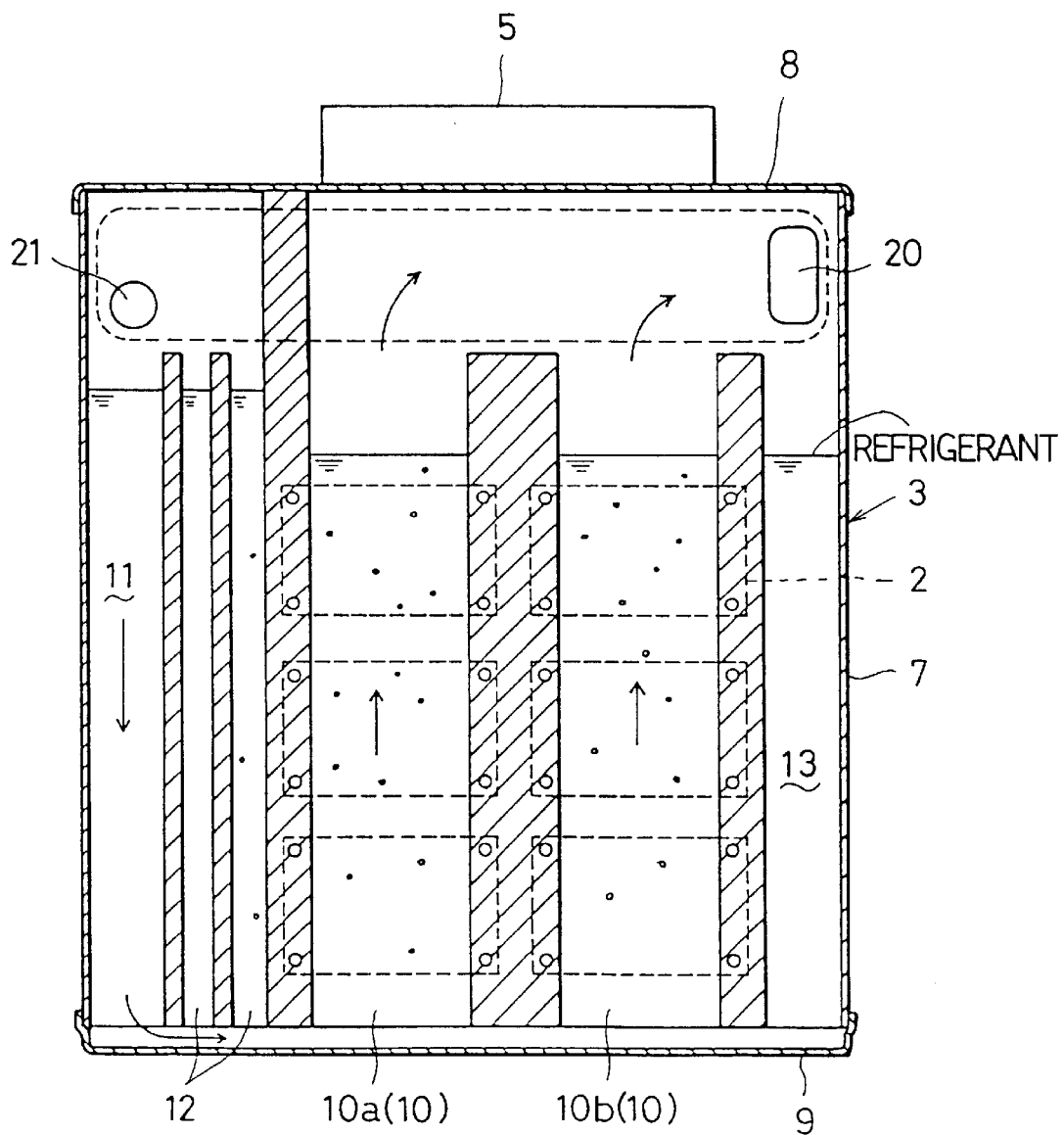
FIG. 25 is a vertical cross sectional view of a refrigerant tank according to the ninth embodiment.

FIGS. 23 to 25 are vertical cross sectional views of refrigerant tanks 3.

In this embodiment, a plurality (two in each of FIGS. 23 to 25) of heat insulating passages 12 are formed. FIG. 23 shows an example where the upper portions of two heat insulating passages 12 are in communication with the vapor passages 10. FIG. 24 shows an example where the upper portion of one heat insulating passage 12a is in communication with the vapor passages 10 and the upper portion of the other heat insulating passage 12b communicates with the condensed liquid passage 11. FIG. 25 shows an example in which the upper portions of two heat insulating passages 12 are in communication with the condensed liquid passage 11. In each of these examples, since plural heat insulating passages 12 are provided, the amount of heat transferred from the vapor passage 10 side to the condensed liquid passage 11 side becomes smaller and hence the refrigerant in the condensed liquid passage 11 can be further prevented from boiling.

A tenth embodiment of the present invention will be described with reference to FIGS. 26 to 31.

Figure 26A:
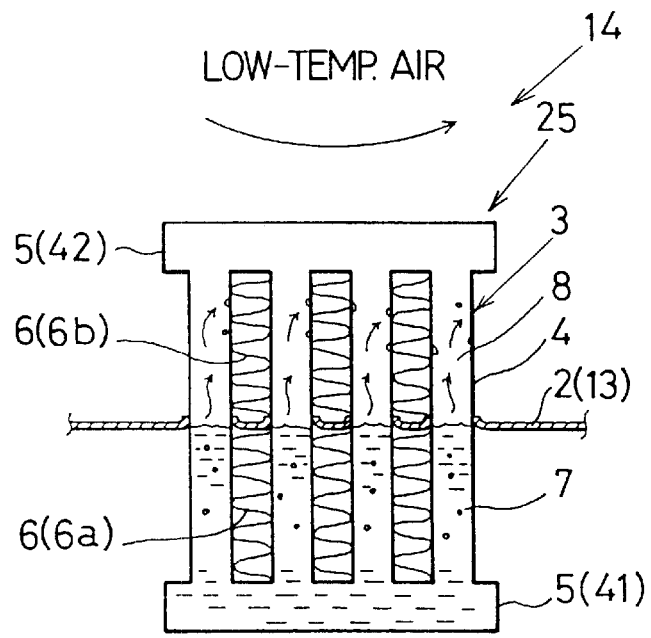
FIG. 26A is a cross sectional view showing schematically a structure of a heat exchanger used in a cooling apparatus.
Figure 26B:
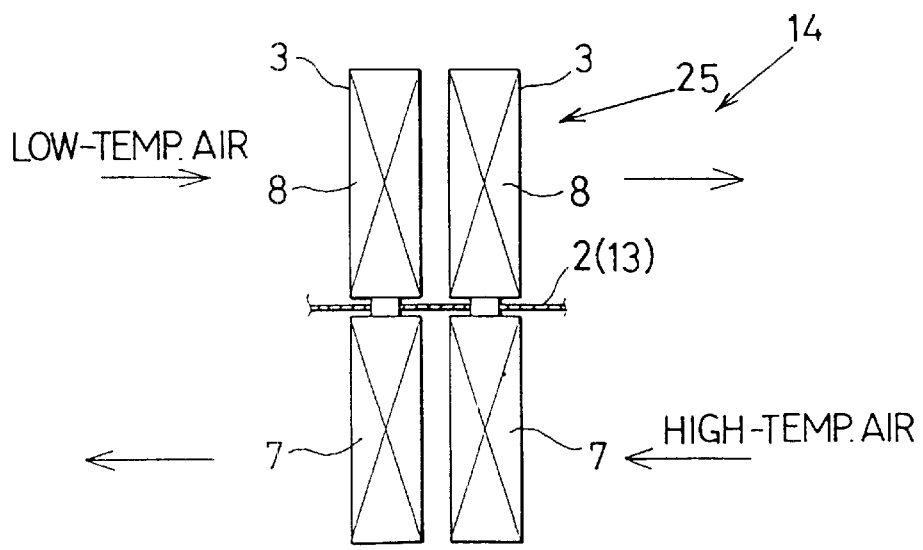
FIG. 26B is a schematic diagram- showing a schematic structure of the heat exchanger, according to a tenth embodiment.
Figure 27:
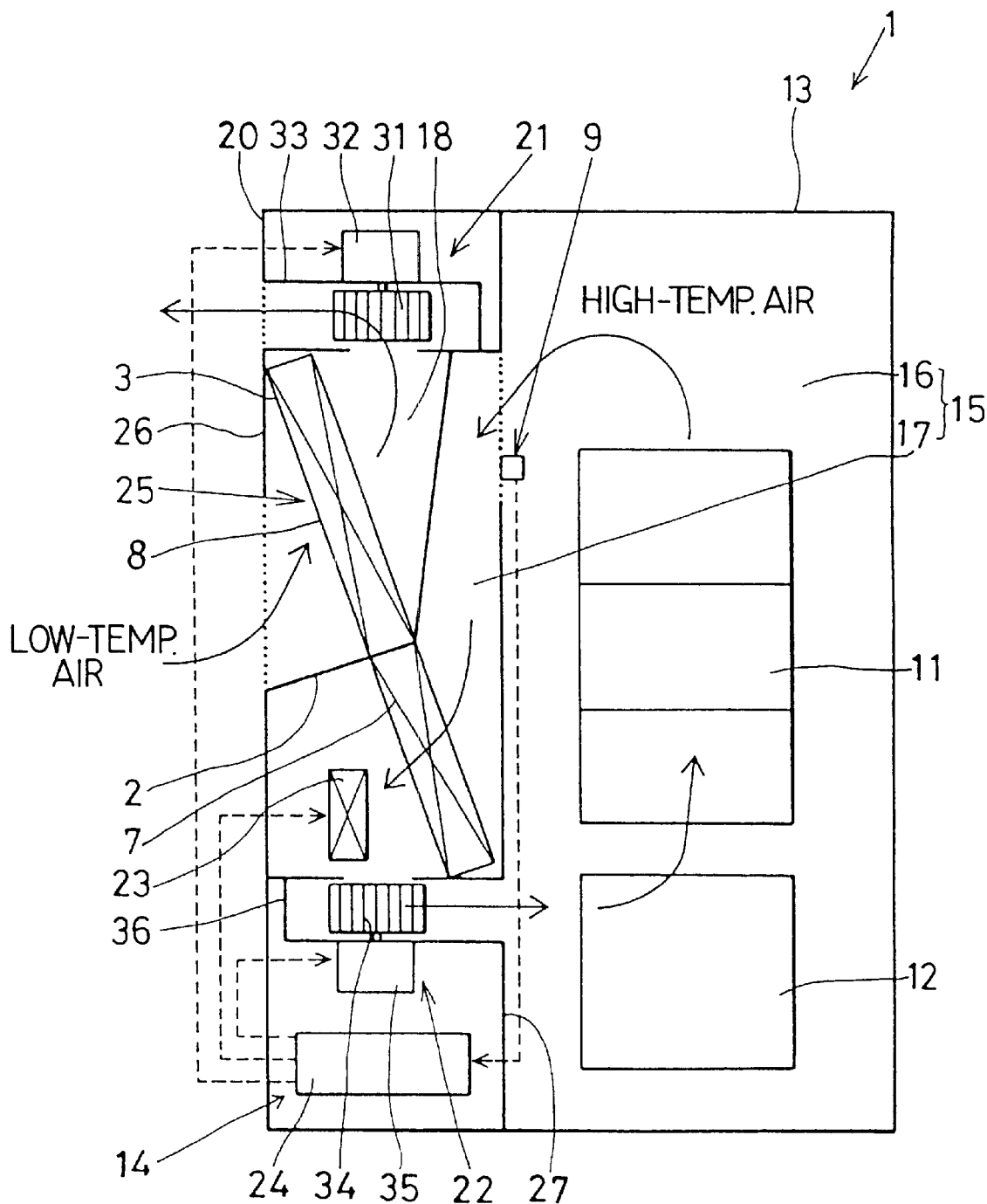
FIG. 27 is a schematic diagram showing the entire structure of an electronic apparatus according to the tenth embodiment.

FIG. 26A is a diagram showing a schematic structure of a cooling unit using boiling and condensing refrigerant, FIG. 26B is a diagram showing a heat exchanger including cooling units arranged in plural stages, and FIG. 27 is a diagram showing an entire structure of an electronic apparatus.

The electronic apparatus 1, for example, is an apparatus installed in a radio base station of a portable radio telephone such as a cordless telephone or a car telephone. The electronic apparatus 1 includes a housing 13 for housing therein electronic parts 11 and 12 in a hermetically sealed state, and a cooling apparatus (cooler) 14 mounted within the housing 13 to cool the electronic parts 11 and 12.

The electronic part 11 is a heat generating element which performs a predetermined operation when an electric current is supplied thereto and which generates heat (for example, a semiconductor switching element constituting a high-frequency switching circuit incorporated in a trans-receiver). The electronic part 12 is a heat generating element which also performs a predetermined operation when an electric current is supplied thereto and which generates heat (for example, a semiconductor amplifier element such as a power transistor incorporated in a power amplifier).

The housing 13, which is for sealing the interior from the exterior hermetically, defines a sealed space 15 in the interior. In order to prevent deterioration in performance of the electronic parts 11 and 12 by deposition thereon of foreign material such as dust and moisture, the sealed space 15 is hermetically sealed completely from the exterior by means of, for example, a fluid separating plate used in a cooling apparatus 14 which will be described later.

By means of both a fluid separating plate used in the cooling apparatus 14 and a casing of the cooling apparatus 14, the sealed space 15 is partitioned into an electronic part accommodating space 16 for accommodating the electronic parts 11 and 12 and a high-temperature-side heat transfer space 17 serving as a passage inside a closed body. In order to minimize the depth size of the cooling apparatus 14, the flow path area of the high- temperature-side heat transfer space 17 is narrow on the upwind side, while the flow path area of the same space on the downwind side is wider. Further, the housing 13 defines a low-temperature-side heat transfer space 18 as a passage outside the closed body, which is hermetically sealed from the high-temperature-side heat transfer space 17 by the fluid separating plate.

The cooling apparatus 14 includes a casing 20 integral with the housing 13; two upper centrifugal blowers 21 for generating a flow of a low-temperature air (external fluid, low-temperature-fluid); two lower centrifugal blowers 22 for generating a flow of a high-temperature air (internal fluid, high-temperature fluid); an electric heater 23 for maintaining the air temperature in the sealed space 15 at a level not lower than a lower-limit temperature (e.g., 0°); a controller 24 for controlling the supply of electricity for the electric devices used in the cooling apparatus 14; and a heat exchanger 25 for maintaining the air temperature in the sealed space 15 at a level not higher than an upper-limit temperature (e.g., 65°).

The casing 20 includes an outer wall plate 26 disposed on the outermost side of the electronic apparatus 1 and a rear-side partition plate 27 which surrounds the high temperature-side heat transfer space 17. The outer wall plate 26 and the rear-side partition plate 27 are fixed to the housing 13 by bonding, e.g., spot welding, or by using fastening means such as screws or bolts.

The two upper centrifugal blowers 21 are each provided with a centrifugal fan 31 for generating a flow of air in the low temperature-side heat transfer space 18, an electric motor 32 for rotating the centrifugal fan 31, and a scroll casing 33 which receives therein the centrifugal fan 31 rotatably.

The two lower centrifugal blowers 22 are each provided with a centrifugal fan 34 for generating a flow of air in the high temperature-side heat transfer space 17, an electric motor 35 for rotating the centrifugal fan 34, and a scroll casing 36 which receives therein the centrifugal fan 34 rotatably.

The electric heater 23 is for heating air flowing through the high-temperature-side heat transfer space 17 so that the internal temperature of the sealed space 15 is maintained not lower than the lower-limit temperature (e.g., 0°) because the electric parts (e.g., semiconductor elements) 11 and 12 deteriorated in performance thereof when the internal temperature of the sealed space 15 is lower than the lower-limit temperature. The electric heater 23 used in this embodiment has a calorific value of, for example, 1.2 kW.

The controller 24 is for controlling electric devices 5 such as the electric motors 32 of the two upper centrifugal blowers 21, the electric motors 35 of the two lower centrifugal blowers 22 and the electric heater 23 in accordance with the internal temperature of the sealed space 15 detected by a temperature sensor 9 constituted by a temperature-sensitive element such as a thermistor.

When the internal temperature of the sealed space 15 is not lower than the lower-limit temperature (e.g., 0°), the controller 24 controls such that the two upper centrifugal blowers 21 and the two lower centrifugal blowers 22 are operated in Hi (strong air volume) or Lo (low air volume) mode and the electric heater 23 is turned OFF on the other hand, when the internal temperature of the sealed space 15 is lower than the lower-limit temperature (e.g., 0°), the controller 24 controls such that the electric motors 32 of the two upper centrifugal blowers 21 are turned OFF, the electric motors 35 of the two lower centrifugal blowers 22 are operated in Hi (high air volume) or Lo (low air volume) mode, and the electric heater 23 is turned ON.

Figure 28:
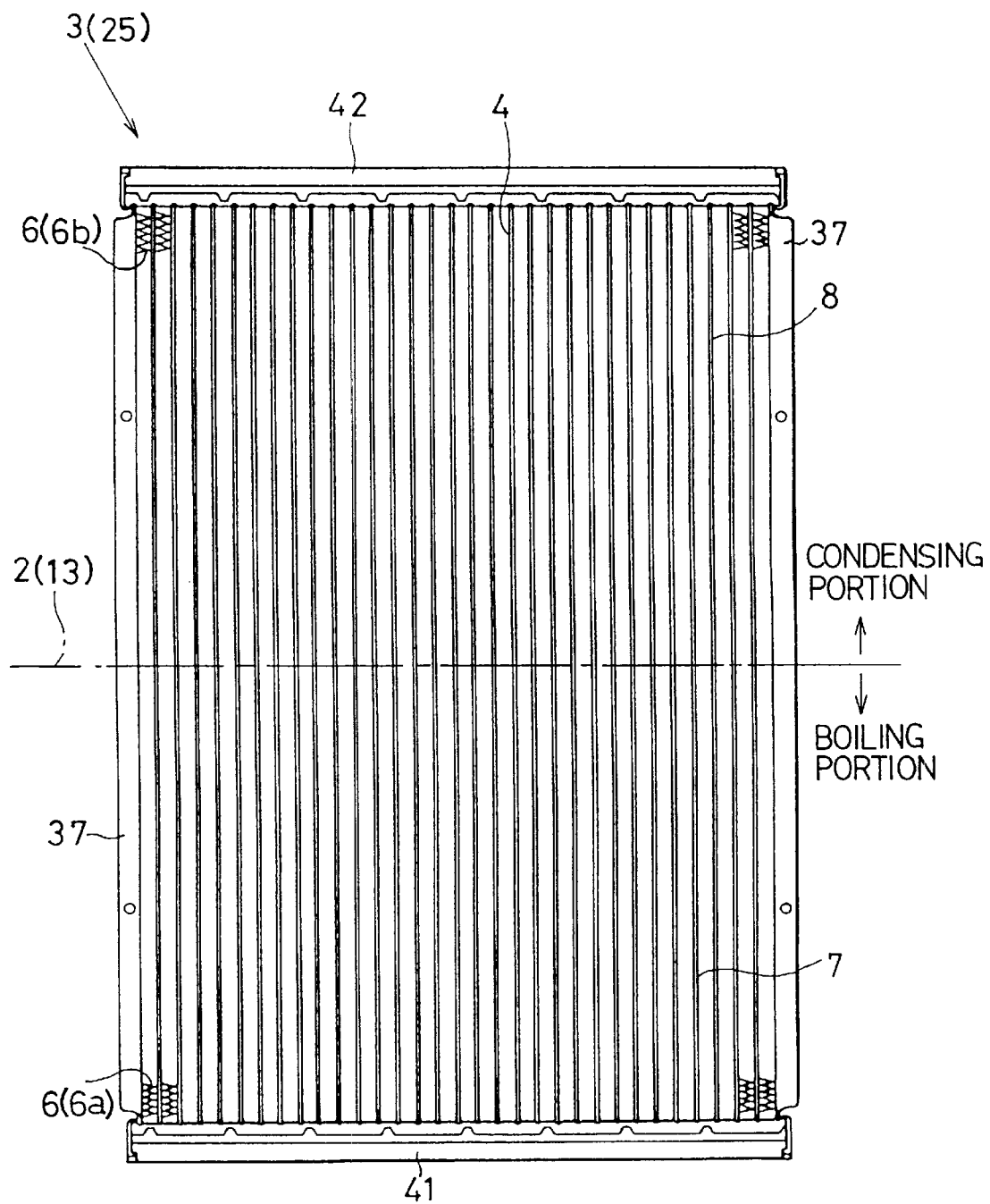
FIG. 28 is a front view showing a structure of a cooling unit according to the tenth embodiment.

Next, the heat exchanger 25, which is provided with cooling units, will be described in detail with reference to FIGS. 26 to 31. FIG. 28 is a diagram showing a structure of a cooling unit specifically, and FIGS. 29 and 30 are diagrams each showing a fluid separating plate which divides the cooling unit into two portions.

The heat exchanger 25 includes a fluid separating plate 2 and cooling units 3 mounted in plural (two) stages to the fluid separating plate 2 while extending through the plate 2. The fluid separating plate 2 separates a high-temperature air which is the internal air (so-called inside air) circulating through the interior of the housing 13 and a low-temperature air which is the external air (so-called outside air) circulating outside the housing 13 from each other in a hermetically sealed state.

The fluid separating plate 2 constitutes a wall surface (a part) of the housing 13 including both a wall surface of the sealed space 15, an interior of which becomes high in temperature, and a wall surface of the low temperature-side heat transfer space 18, an interior of which becomes low in temperature. For example, the fluid separating plate 2 is constituted by a thin plate of a metallic material superior in heat conductivity such as aluminum. The fluid separating plate 2 is soldered together with the cooling units 3 and the casing 20 so as to provide a hermetic partition between the sealed space 15 including the high temperature-side heat transfer space 17 and the exterior including the low temperature-side heat transfer space 18.

Figure 29:
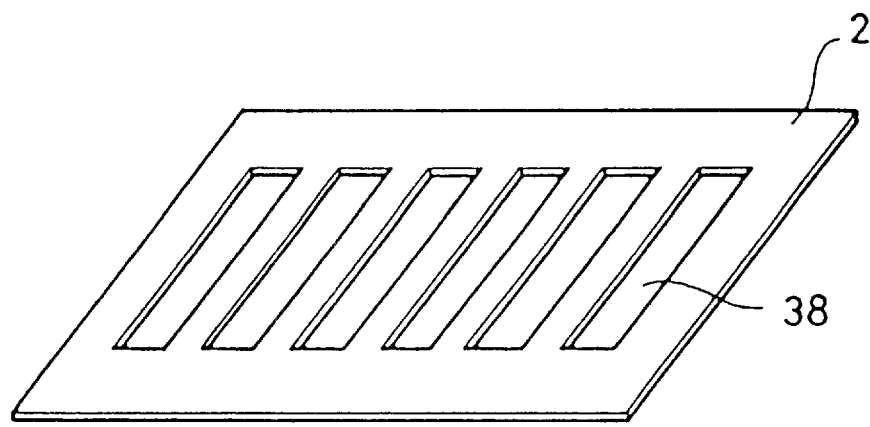
FIG. 29 is a perspective view showing a fluid separating plate which divides the cooling unit into two portions according to the tenth embodiment.
Figure 30:
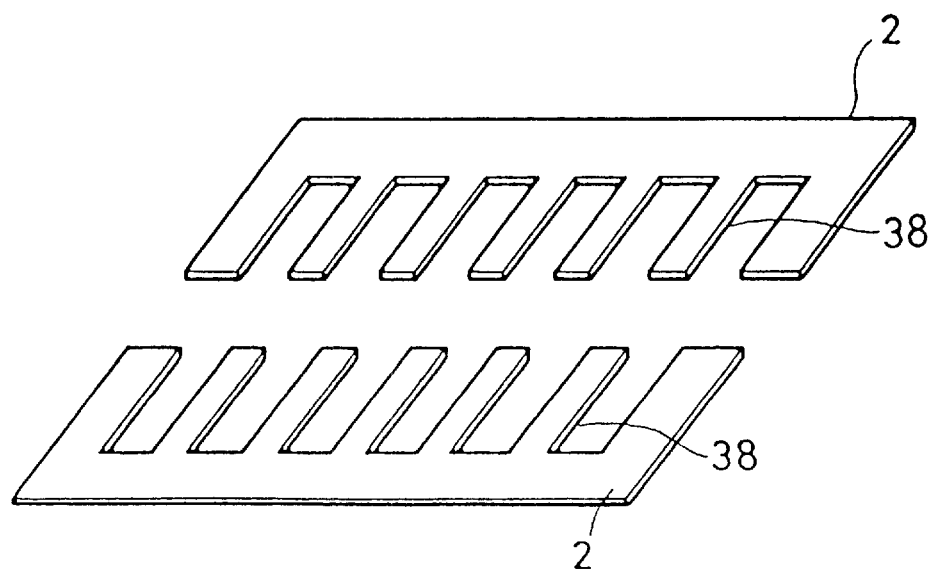
FIG. 30 is a perspective view of a fluid separating plate which divides the cooling unit into two portions according to the tenth embodiment.
Figure 31:
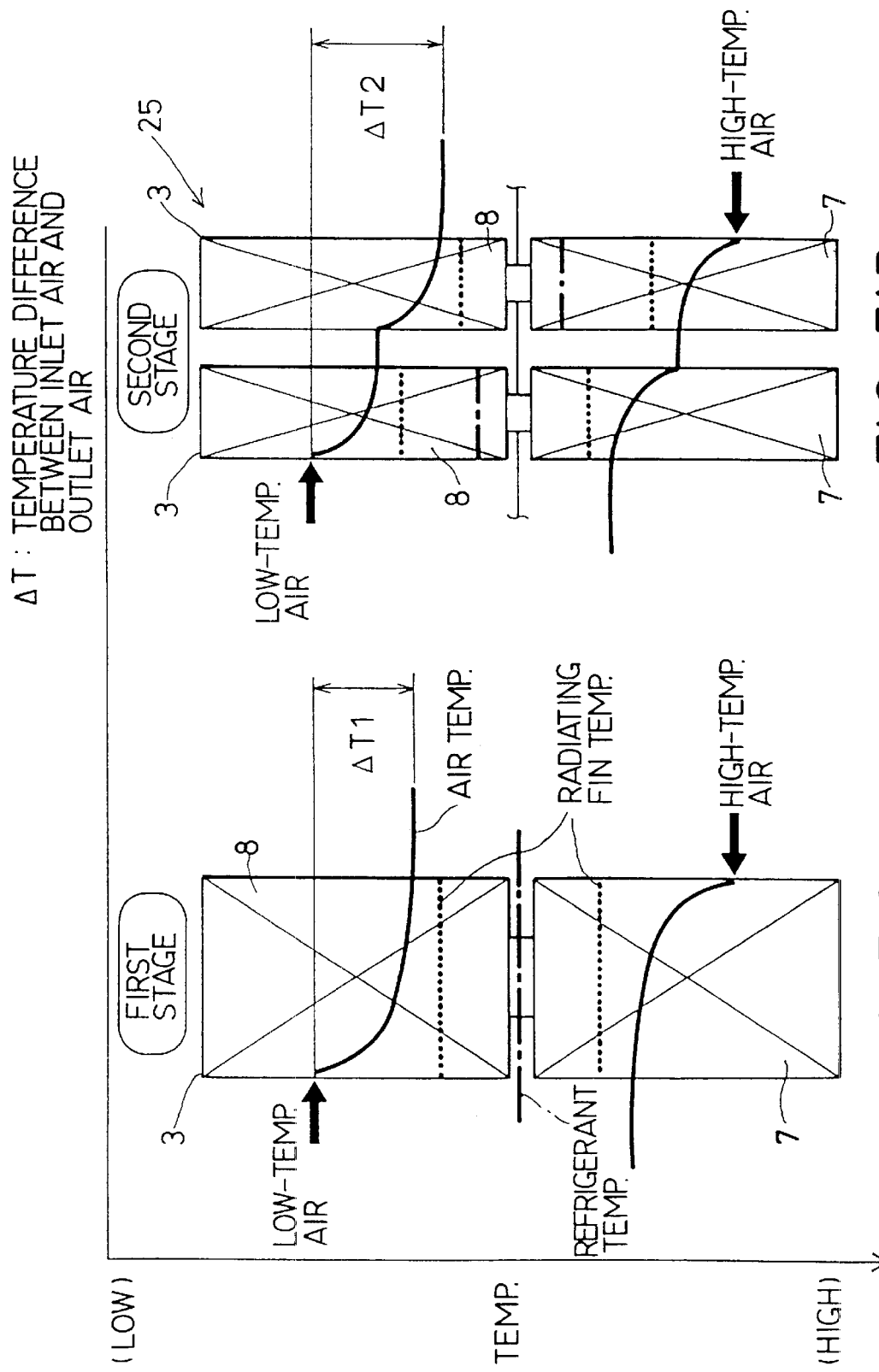
FIG. 31A is a schematic diagram showing a temperature distribution in flowing directions of air and a refrigerant according to prior art.
FIG. 31B is a schematic diagram showing a temperature distribution in flowing directions of air and a refrigerant in the tenth embodiment.

As shown in FIG. 29, the fluid separating plate 2 has a plurality of elongated, rectangular or oblong through holes 38 (for example, 1.7 mm wide, 16.0 mm long) for passing there-through of cooling tubes of each cooling unit which will be described later. The through holes 38 are formed at predetermined intervals. The fluid separating plate 2 may be a split plate, as shown in FIG. 30.

The cooling units 3 are mounted in plural (two) stages inclinedly by a predetermined angle within the casing 20. The cooling units 3 are multiflow pass type heat exchanger units each including a plurality of cooling tubes 4 with a fluorocarbon- or freon-type refrigerant sealed therein, a pair of communication pipes 5 for communicating among the cooling tubes 4, and a plurality of heat transfer fins 6 attached to the exterior of each cooling tube 4. To both sides of each cooling unit 3 are connected side plates 37 which function to secure the cooling unit 3 to the fluid separating plate 2 and the casing 20 by means of fastening means and which also function to reinforce the plural cooling tubes 4 and plural heat transfer fins 6. The cooling units 3 are disposed in plural stages (for example, two stages) in flowing directions of both high-temperature air and low-temperature air.

The plural cooling tubes 4 are each formed in the shape of a flat tube (for example, 1.7 mm wide, 16.0 mm long) having an elongated, rectangular or oblong cross sectional shape, using a metallic material superior in heat conductivity such as, for example, aluminum or copper. The cooling tubes 4 are disposed so as to extend through the through holes 38 formed in the fluid separating plate 2. One side (the lower side in FIG. 28) of each cooling unit 3 including the cooling tubes 4, which side is the high-temperature air side with respect to the fluid separating plate 2, is constituted as a liquid refrigerant tank (boiling portion) 7, while the other side (the upper side in FIG. 28), which side is the low-temperature air side with respect to the fluid separating plate 2, is constituted as a vaporized refrigerant tank (condensing portion) 8. In this embodiment, the boiling portion 7 and the condensing portion 8 are 360 mm wide (transverse size), 430 mm high and 16 mm thick.

The communication pipes 5 are constituted by a high temperature-side tank 41 connected to the lower ends of the plural cooling tubes 4 (boiling portion 7) and a low temperature-side tank 42 connected to the upper ends of the plural cooling tubes 4, thus providing communication among the tubes 4. The high and low temperature-side tanks 41, 42 are each composed of a core plate disposed on the side of the cooling tubes 4 and a generally inverted U-shaped tank plate affixed to the core plate. A single refrigerant sealing port (not shown) for sealing a refrigerant into the cooling unit 3 is formed in either the high temperature-side tank 41 or the low temperature-side tank 42. The refrigerant is sealed into each cooling tube 4 of the cooling unit 3 up to a height where the liquid level is substantially flush with the fluid separating plate, that is, up to the top of the boiling portion 7. The sealing of the refrigerant is performed after the heat transfer fins 6 have been soldered to the cooling tubes 4. The high temperature-side tank 41 may be omitted.

The heat transfer fins 6 are constituted by heat receiving fins 6*a* interposed between adjacent cooling tubes 4 on the high temperature side (boiling portion 7) of the cooling unit 3 and heat radiating fins 6*b* interposed between adjacent cooling tubes 4 on the low temperature side (condensing portion 8) of the cooling unit 3. For example, the heat transfer fins 6 are corrugated fins (a fin pitch of say 3.75 mm) formed in a wavy shape by alternately pressing and bending a thin plate (a thickness of, for example, 0.02 to 0.50 mm) of a metallic material superior in heat conductivity, e.g., aluminum. The fins 6 are soldered to flat outer wall surfaces of the cooling tubes 4. Thus, the outer wall surfaces of the tubes 4 and the heat transfer fins 6 are fused together.

In the heat exchanger 25, as shown in FIGS. 26A, 26B, and 27, the cooling units 3 are disposed in plural stages in flowing directions of both high-temperature air and low-temperature air in such a manner that the high-temperature air (clean air in the housing 13) circulating in the high temperature-side heat transfer space 17 of the sealed space 15 and the low-temperature air (foul air in the housing 13) circulating in the low temperature-side space 18 flow as counter flows.

In the heat exchanger 25 including plural stages of cooling units 3, the right-hand side in the figures of the lower end portion (boiling portion 7) of the cooling tubes 4 in the cooling unit of the second stage serves as an inlet of the high-temperature air, while the left-hand side in the figures of the lower end portion (boiling portion 7) of the cooling tubes 4 in the cooling unit 3 of the first stage serves as an outlet of the high-temperature air. Further, the left-hand side in the figures of the upper end portion (condensing portion 8) of the cooling tubes 4 in the cooling unit of the first stage serves as an inlet of the low-temperature air, while the right-hand side in the figures of the upper end portion (condensing portion 8) of the cooling tubes 4 in the cooling unit 3 of the second stage serves as an outlet of the low-temperature air.

Now, with reference to FIGS. 26A, 26B, and 27, the following will be briefly described an operation of the cooling apparatus 14 equipped with the heat exchanger 25 wherein the cooling unit 3 of this embodiment is disposed in plural stages so that the high-temperature air and the low-temperature air flow as counter flows.

When the internal temperature of the sealed space 15 in the housing 13 is not lower than the lower-limit temperature (e.g., 0°), the supply of electric power to the electric motors 32 of the two upper centrifugal blowers 21 and to the electric motors 35 of the two lower centrifugal blowers 22 is started, so that the centrifugal fans 31 and 34 start to operate. As a result, a flow of a high-temperature air (clean inside air not containing any foreign material such as dust or moisture; internal fluid) circulates within the sealed space 15 in the housing 13. Also, outside the housing 13, a flow of a low-temperature air (outside air containing a foreign material such as dust or moisture; external fluid) circulates within the low temperature-side heat transfer space 18.

The refrigerant sealed in the cooling tubes 4 of each of the cooling units mounted in plural stages through the fluid separating plate 2 of the housing 13 receives heat transferred from the high-temperature air through the heat receiving fins 6 and then is boiled and vaporized, as shown in FIG. 26A. The refrigerant is condensed on the inner wall surfaces, of the condensing portion 8 located on the upper end side of each cooling unit 3 which side is exposed to a low-temperature air and is low in temperature, with transfer of the resulting latent heat to the low-temperature air through the heat radiating fins 6.

The refrigerant thus condensed in the condensing portion 8, as shown in FIG. 26A, drops along the inner wall surfaces of the cooling tubes 4 to the boiling portion 7 located on the lower end side of the cooling unit 3, due to its own weight. Thus, the refrigerant sealed in the cooling tubes 4 of the cooling unit 3 repeats boiling and condensation alternately, so that the heat of the high-temperature air is transferred to the low-temperature air. In this way, the heat generated in the electronic parts 11 and 12 can be radiated in the cooling unit 3 which is disposed in plural stages.

Accordingly, the electronic parts 11 and 12 can be cooled without mixing of the high-temperature air (clean air in the housing 13) circulating in the high temperature-side heat transfer space 17 of the sealed space 15 and the low-temperature air (foul air outside the housing 13) circulating in the low temperature-side heat transfer space 18.

An effect of this embodiment will be described.

With reference to FIGS. 6A and 6B, the feature of the heat exchanger wherein the cooling unit 3 is disposed in plural stages in the flowing directions of the high-temperature air and the low-temperature air will be described.

FIGS. 6A and 6B are schematic diagrams showing temperature distributions in air and refrigerant flowing directions in the case of using a single stage of cooling unit 3 and in the case of using plural (two) stages of cooling units 3, respectively. In each of these diagrams, the axis of ordinate represents temperature (the lower the position, the higher the temperature), while the axis of abscissa represents the direction of fluid (air) flow.

In the heat exchanger (prior art) using a single stage of cooling unit 3, as shown in FIG. 31A, the high-temperature air enters the lower portion (boiling portion 7) of the cooling unit 3 from the right-hand side in the figure. With radiation of heat to the upper portion (condensing portion 8) of the cooling unit, the temperature of the high-temperature air drops and the thus heat-radiated (cooled) air flows out to the left-hand side in the figure. On the other hand, as shown also in FIG. 31A, the low-temperature air enters the upper portion (condensing portion 8) of the cooling unit 3 from the left-hand side in the figure and receives heat from the cooling unit, so that the temperature of the air rises and the air which has thus become hot flows out to the right-hand side of the cooling unit 3 in the figure.

Assuming that the difference in temperature between the inlet air and the outlet air in the condensing portion 8 of the cooling unit 3 is $\Delta T1$, since the heat exchange medium for heat exchange with the refrigerant sealed in the cooling unit 3 is air, the low-temperature air is rapidly heated by the heat radiating fins 6 in the cooling unit and its temperature rises rapidly at the inlet, but this is followed by saturation, so that the temperature difference $\Delta T1$ (cooling performance) does not become so significant.

On the other hand, in the heat exchanger 25 including plural stages of cooling units 3 according to the tenth embodiment of the invention, as shown in FIG. 31B, heat exchange between the refrigerant sealed in each cooling unit 3 and air can be performed at least in two stages in the air flowing directions. In this case, as indicated with broken lines in the figure, there is a temperature difference (a heat radiating fin temperature difference, and a heat receiving fin temperature difference) between the refrigerant sealed in the cooling unit 3 of the first stage and the refrigerant sealed in the cooling unit 3 of the second stage. Therefore, as shown in FIG. 31B, the low-temperature air reaches its saturation temperature halfway of the condensing portion 8 in the first stage of cooling unit 3 and thereafter its temperature further rises near the inlet of the cooling unit 3 of the second stage. At the same time the high-temperature air reaches its saturation temperature at the halfway of the boiling portion 7 in the second stage of cooling unit 3 and thereafter its temperature drops near the inlet of the cooling unit 3 of the first stage.

Thus, as shown in FIGS. 31A and 31B, the temperature difference ΔT2, obtained in this embodiment (the heat exchanger 25 using plural stages of cooling units 3) can be made larger than the temperature difference ΔT1 obtained in the prior art (a heat exchanger using a single stage of cooling unit 3). Therefore, by radiating the heat of the high-temperate air to the low-temperature air, it is possible to improve the high-temperature air cooling performance. In this way, the cooling effect for the electronic parts 11 and 12 can be improved, and as a result the electronic parts 11 and 12 can operate stably. Further, in this embodiment, when compared with the prior art having the equal radiating performance (cooling performance), the effective heat exchange area (radiating effective area) of the each cooling unit 3 can be decreased. Consequently, the whole of the cooling apparatus 14 equipped with such a compact heat exchanger 25 can be downsized.

Further, since the cooling units 3 used in the heat exchanger 25 are disposed in plural stages so that the high-temperature air and the low-temperature air flow as counter flows, it is possible to provide a temperature difference effectively between the temperature (heat radiating fin temperature and heat receiving fin temperature) of the refrigerant sealed in the cooling unit 3 of the first stage and that of the refrigerant sealed in the cooling unit 3 of the second stage. Thus, by using refrigerants different in temperature, it is possible to raise and lower the low-temperature air and the high-temperature air in turn efficiently. Accordingly, it becomes possible to further improve the cooling performance and to downsize the whole of cooling apparatus 14.

Although this embodiment has been described with reference to the case where two stages of cooling units 3 are used, there may be used three or more stages of cooling units 3 to obtain a larger temperature difference between the air inlet and the air outlet of each of the boiling portion 7 and the condensing portion 8 in the heat exchanger 25. The function and effect thereof are the same as those described above, so will not be described here.

Figure 32:
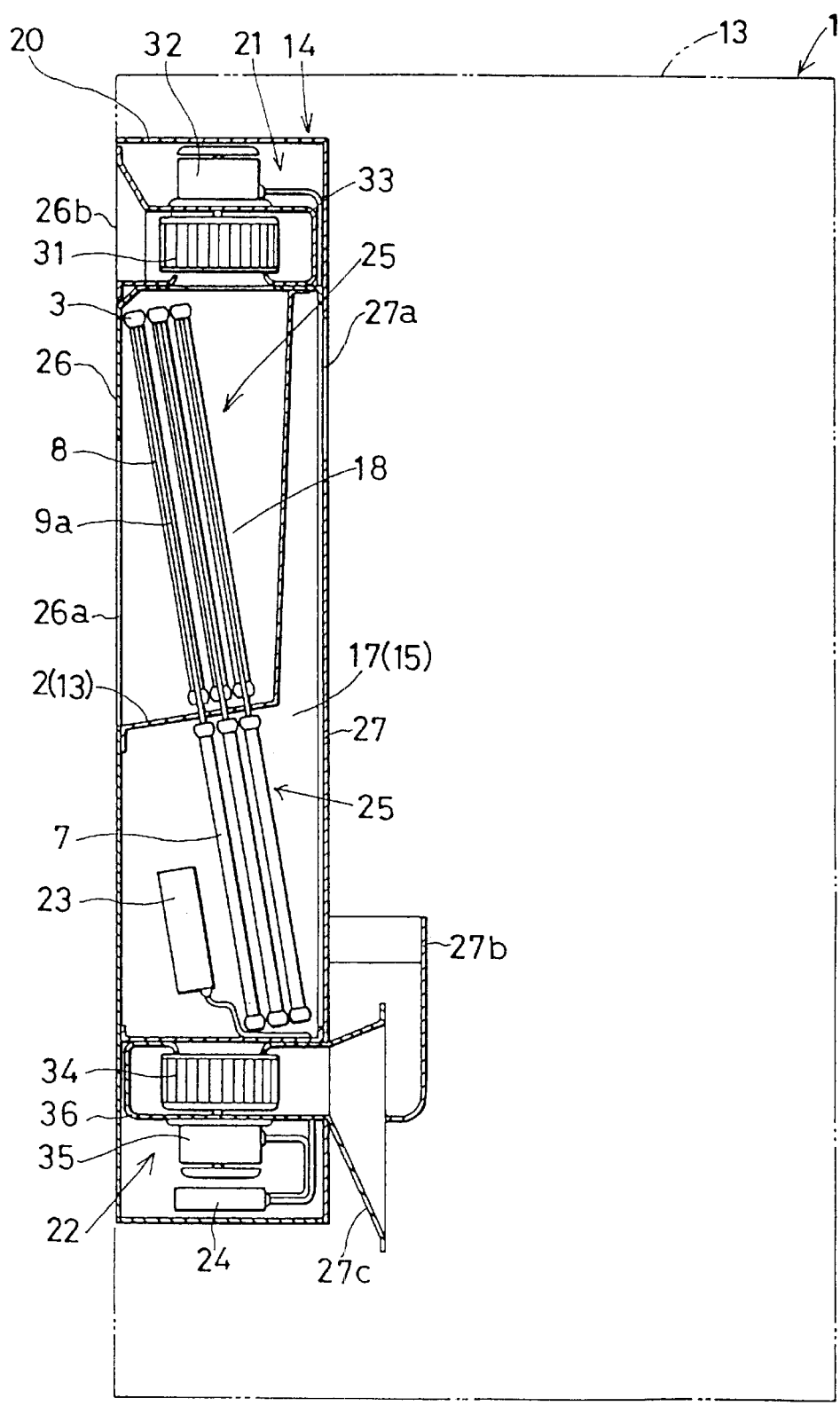
FIG. 32 is a cross sectional view showing a concrete structure of a cooling apparatus according to an eleventh embodiment.
Figure 35:
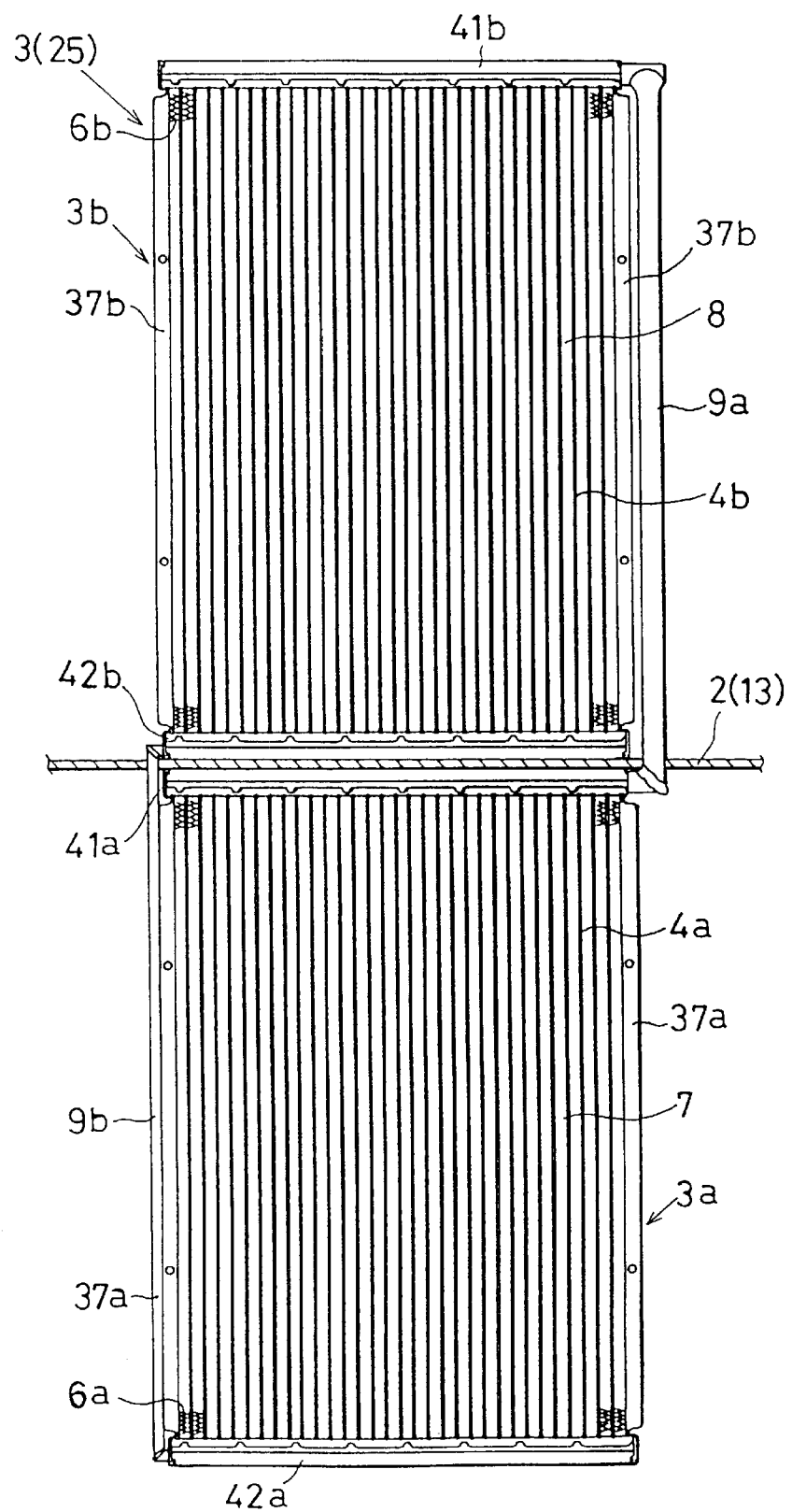
FIG. 35 is a front view showing a structure of a cooling unit according to the eleventh embodiment.
Figure 36:
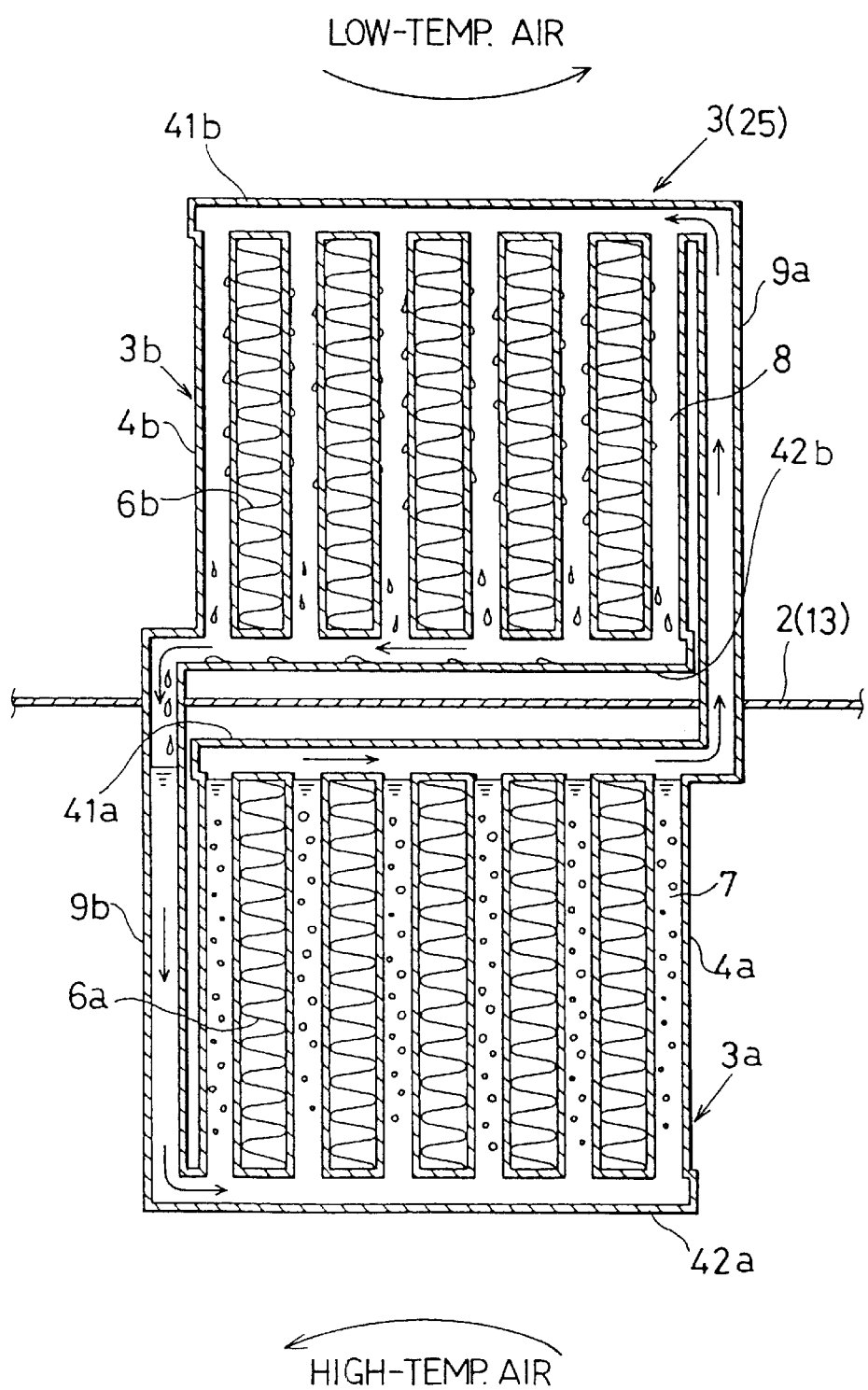
FIG. 36 is a cross sectional view showing a schematic structure of the cooling unit according to the eleventh embodiment.

An eleventh embodiment of the present invention will be described with reference to FIGS. 32 to 36. FIGS. 32 to 34 show a concrete structure of a cooling apparatus incorporated in an electronic apparatus, FIG. 35 shows a concrete structure of a cooling unit, and FIG. 36 shows a schematic structure of a heat exchanger including cooling units disposed in plural stages.

Cooling units 3 which constitute a heat exchanger 25 according to this embodiment are mounted in plural (three) stages inclinedly by a predetermined angle within a casing.

The cooling units 3 are each divided into a high-temperature-side heat exchanger portion (inside-air-side heat exchanger portion) 3a in which a plurality of cooling tubes 4a constitute a boiling portion 7 and a low-temperature-side heat exchanger portion (outside-air-side heat exchanger portion) 3b in which a plurality of cooling tubes 4b constitute a condensing portion 8. The high and low temperature-side heat exchanger portions 3a and 3b are interconnected through two first and second connection pipes 9a and 9b for refrigerant circulation.

A casing 20 includes an outer wall plate 26 and a rear partition plate 27, as in the tenth embodiment. The outer wall plate 26 is centrally formed with a single square low temperature-side suction port 26a for sucking a low-temperature air (foul outside air containing a foreign material such as dust or moisture) into a low temperature-side heat transfer space 18. On the upper side of the outer wall plate 26 are formed two square low temperature-side discharge ports 26b for discharging the low-temperature air to the exterior through upper centrifugal blowers 21.

On the upper side of the rear partition plate 27 is formed a single square high temperature-side suction port 27a for sucking a high-temperature air (clean inside air not containing any foreign material such as dust or moisture) into a high temperature-side heat transfer space 17. On the lower side of the rear partition plate 27, a duct 27b for introducing the high-temperature air after being cooled to electronic parts 11 through one lower centrifugal blower 22, and a duct 27c for introducing the high-temperature air after being cooled to the electronic parts 22 through the other lower centrifugal blower 22, are connected by spot welding or any other suitable means to the lower side of the rear partition plate 27. The ducts 27b and 27c are respectively connected integrally to scroll casings 36 of the two lower centrifugal blowers 22.

The high temperature-side heat exchanger portion 3a is a multiflow path type heat exchanger portion (an inside heat exchanger portion) which comprises a plurality of cooling tubes 4a, a high temperature-side upper-end tank 41a, a high temperature-side lower-end tank 42a, heat receiving fins 6a interposed between adjacent cooling tubes 4a, and a side plate 37a. Since the high temperature-side heat exchanger portion 3a is disposed within the high temperature-side heat transfer space 17 which is hermetically sealed from the exterior by the housing 13, there is no fear of the portion 3a being exposed to the outside air containing a foreign material such as dust or moisture.

The low temperature-side heat exchanger portion 3b is a multiflow path heat exchanger portion (an outside heat exchanger portion) which includes a plurality of cooling tubes 4b, a lower temperature-side upper-end tank 41b, a low temperature-side lower-end tank 42b, heat radiating fins 6b interposed between adjacent cooling tubes 4b, and a side plate 37b. The heat exchanger portion 3b is disposed so as to be positioned substantially on the same plane as the high temperature-side heat exchanger portion 3a within the low temperature-side heat transfer space 18 which is exposed to the outside air containing a foreign material such as dust or moisture. The low temperature-side lower-end tank 42b may be inclined so that second connection pipe 9b side is positioned lower.

The first connection pipe 9a is a metallic pipe made of the same metallic material as that of the cooling tubes 4 and having a circular cross section. The connection pipe 9a communicates between the high temperature-side upper-end tank 41a disposed at the upper end of the boiling portion 7 and the low temperature-side upper-end tank 41b disposed at the upper end of the condensing portion 8. The connection pipe 9a is a high-to-low temperature guide means for introducing the vaporized refrigerant in the boiling portion 7 into the condensing portion 8.

The second connection pipe 9b is a metallic pipe made of the same metallic material as that of the first connection pipe 9a and having a circular cross section. The connection pipe 9b communicates between the low temperature-side lower-end tank 42b located at the lower end of the condensing portion 8 and the high temperature-side lower-end tank 42a located at the lower end of the boiling portion 7. The connection pipe 9b is a low-to-high temperature guide means for introducing the liquid refrigerant which has been condensed in the condensing portion 8 into the boiling portion 7.

An effect of this embodiment will be described.

A cooling apparatus 14 according to the second embodiment is equipped with the heat exchanger 25 wherein the cooling units 3 each including the boiling portion 7 and the condensing portion 8 interconnected annularly through the first and second connection pipes 9a and 9b are disposed in plural stages in the flowing directions of air. With this construction, there is formed a circulating flow of refrigerant within each cooling unit 3, and the collision between vaporized refrigerant (boiled vapor) and liquid refrigerant (condensed liquid) can be prevented. Consequently, the radiating performance (cooling performance) of each cooling unit 3 can be improved to a greater extent than in the tenth embodiment. By disposing the cooling unit 3 in plural stages, it becomes possible to further improve the radiating performance (cooling performance) of the heat exchanger 25 as compared with the tenth embodiment.

Figure 37:
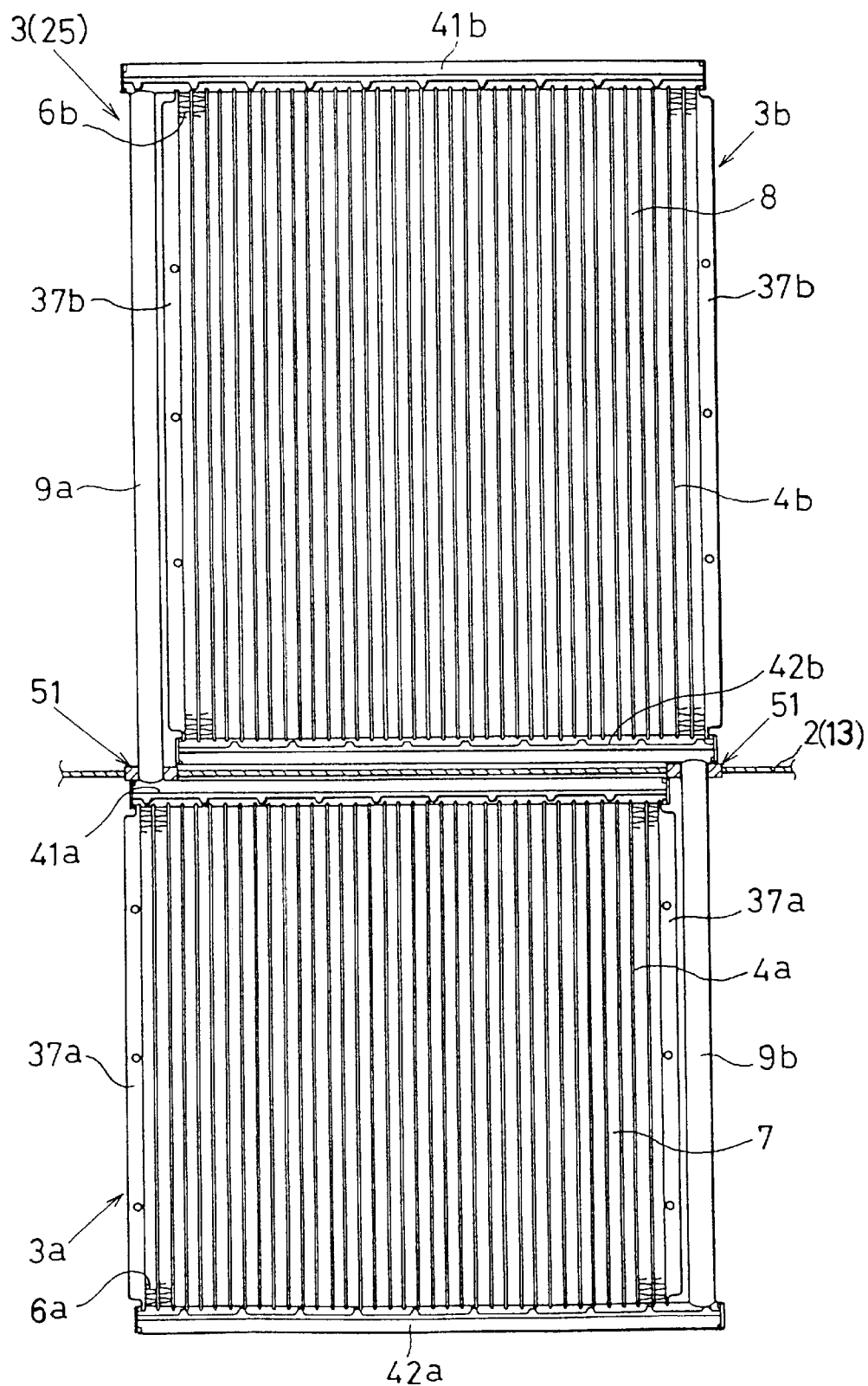
FIG. 37 is a front view showing a structure of a cooling unit according to a twelfth embodiment.
Figure 38:
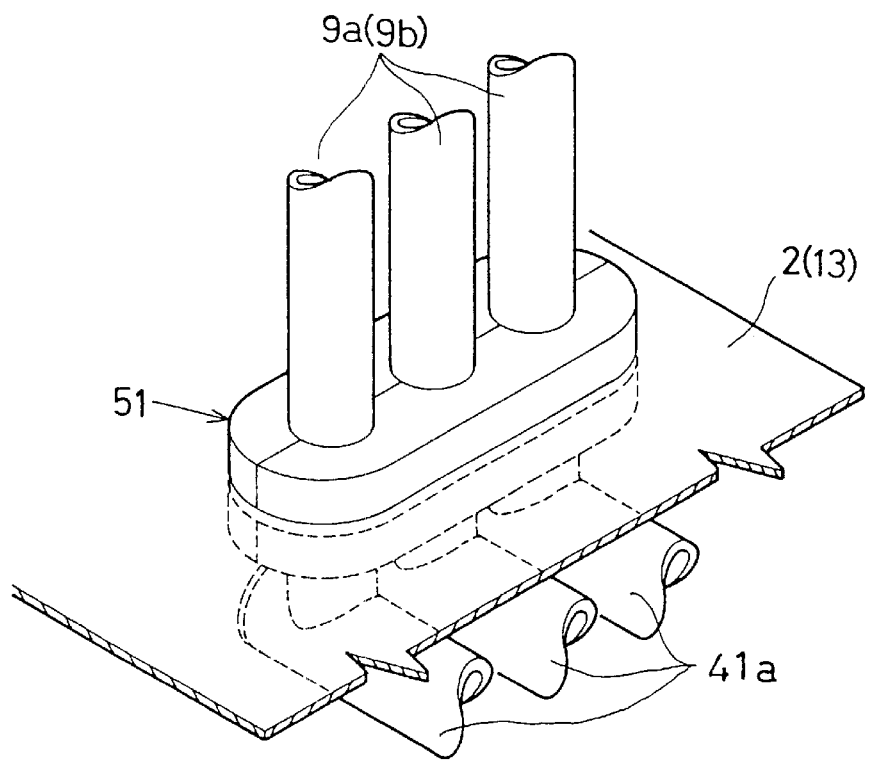
FIG. 38 is a perspective view showing a sealing structure in a heat exchanger according to the twelfth embodiment.
Figure 39:
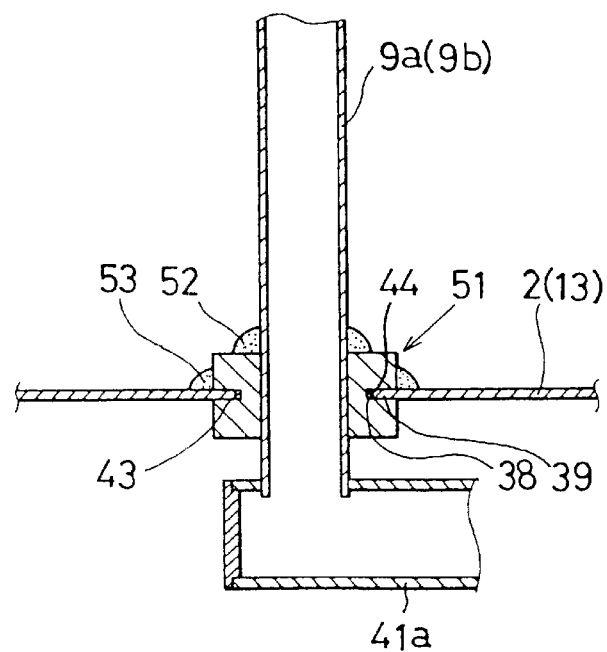
FIG. 39 is a cross sectional view showing the sealing structure in the heat exchanger of the twelfth embodiment.

An twelfth embodiment of the present invention will be described with reference to FIGS. 37 to 39. FIG. 37 shows a heat exchanger to be incorporated in a cooling apparatus, and FIGS. 38 and 39 show a sealing structure for the heat exchanger.

In this embodiment, the heat exchanger 25 includes cooling units 3 disposed in plural (three) stages in flowing directions of air. The cooling units 3 each include the boiling portion 7 and condensing portion 8 described above in the eleventh embodiment, both portions 7 and 8 being interconnected annularly through two connection pipes 9a and 9b which extend through a fluid separating plate 2. The fluid separating plate 2 has rectangular or oblong through holes 38 formed in two positions for passing therethrough of three connection pipes 9a and three connection pipes 9b respectively of the heat exchanger 25.

In each cooling unit 3 of this embodiment, as compared with the eleventh embodiment, a high temperature-side heat exchanger portion 3a and a low temperature-side heat exchanger portion 3b are displaced from each other on both transverse sides (right and left sides in the figures) substantially on the same plane. Further, at those alternately shifted portions (displaced portions) there are disposed the first and second connection pipes 9a and 9b for refrigerant circulation to connect the high and low temperature-side heat exchanger portions 3a and 3b annularly with each other.

A sealing structure for the fluid separating plate 2 and the six connection pipes 9a and 9b in this embodiment. Between the fluid separating plate 2 and the six connection pipes 9a and 9b are mounted split packings 51 and sealing materials 52 and 53 to seal between the fluid separating plate 2 and the six connection pipes 9a and 9b.

The split packings 51 are each constituted by split halves formed by an elastic material such as synthetic rubber for example. Each split packing 51 extends through the associated through hole 38 formed in the fluid separating plate 2 and is held by an edge 39 of the through hole 38. The split halves are held so as to fixedly and hermetically sandwich three connection pipes 9a (9b). In the opposed surfaces of the split halves are formed semicircular, connection pipe inserting recesses 43 for receiving therein the three connection pipes 9a (9b), while in the outer peripheral surface of each split half is formed a fluid separating plate inserting slot 44 for receiving therein the edge 39 of the associated through hole 38 formed in the fluid separating plate 2.

The sealing material 52 is an elastic material such as silicone type rubber and seals the clearance between three connection pipes 9a(9b) and the associated split packing 51. The sealing material 53 is the same elastic material as the sealing material 52 and seals the clearance between the fluid separating plate 2 and the three connection pipes 9a(9b).

An effect of this embodiment will be described.

In the third embodiment, three connection pipes 9a(9b) are hermetically sealed by the associated split packing 51. With edge 39 of the through hole 38 of the fluid separating plate 2 fitted in the separating plate inserting slot 44 of the split packing 51, the fluid separating plate 2 and the three connection pipes 9a(9b) are sealed positively by the sealing materials 52 and 53 applied around the connection pipes and also around the split packing 51.

In the heat exchanger 25 including three stages of cooling units 3, since the connection pipes 9a(9b) are close to one another, the sealing work is difficult. However, by adopting such a sealing structure as in this twelfth embodiment, the working efficiency in the process for sealing between the connection pipes 9a (9b) and the fluid separating plate 2 can be improved and it is possible to secure the sealing favorably.

In this embodiment, moreover, the high and low temperature-side heat exchanger portions 3a and 3b are displaced from each other on both transverse sides in substantially the same plane, and the first and second connection pipes 9a and 9b for connecting both heat exchanger portions 3a and 3b are disposed at those alternately shifted positions. Consequently, as compared with the eleventh embodiment where the first and second connection pipes 9a and 9b are disposed projectingly on both transverse sides (right and left sides in the figures) of each cooling unit 3, the pipe projecting portions are no longer required and the transverse size of the cooling unit 3 can be shortened by an amount corresponding to the projecting space of the first connection pipe 9a which is a dead space. Thus, the whole of the cooling apparatus 14 equipped with such compact cooling units 3 can be further downsized.

Figure 40:
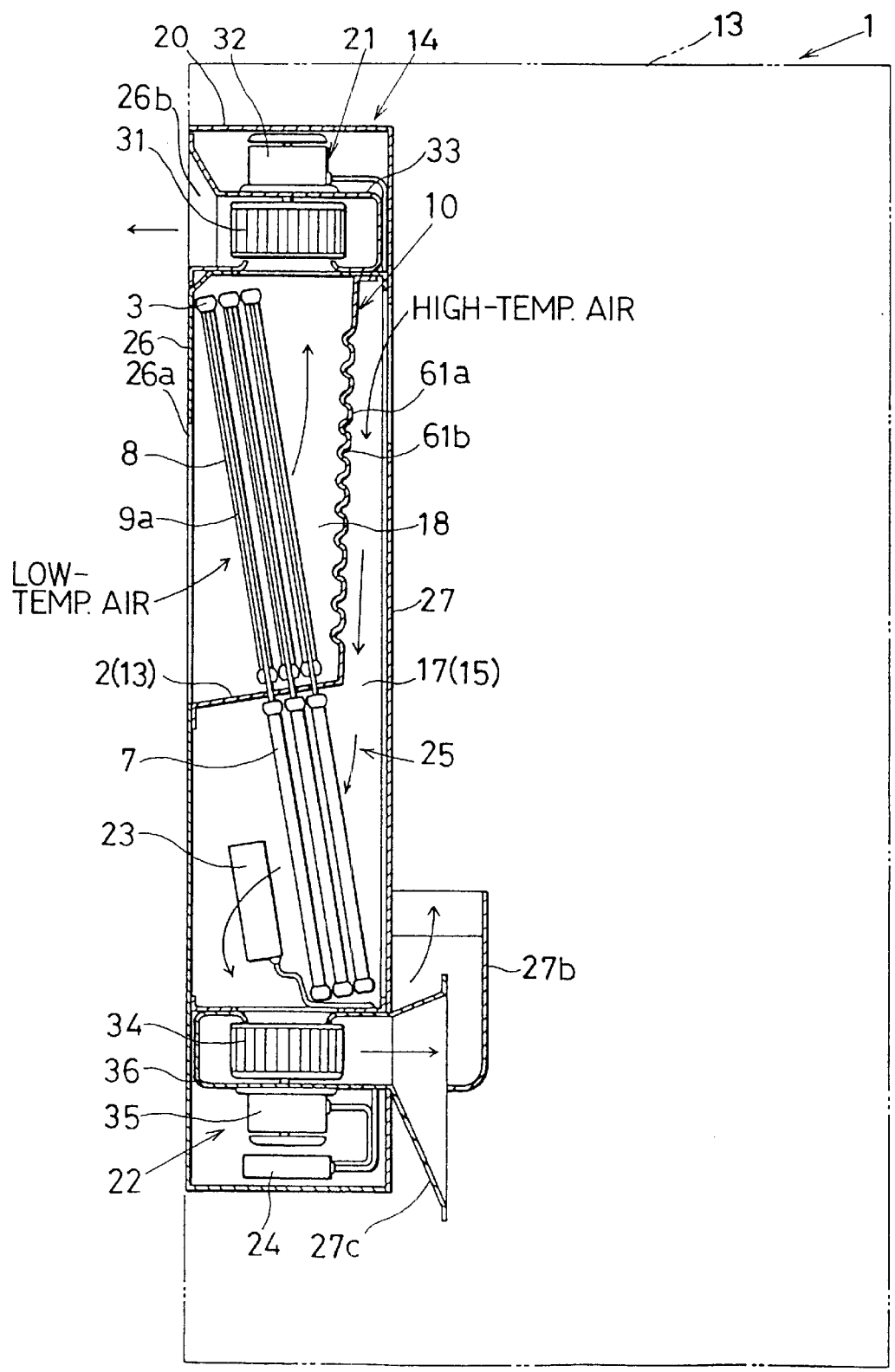
FIG. 40 is a sectional view showing a concrete structure of a cooling system according to a thirteenth embodiment.
Figure 41:
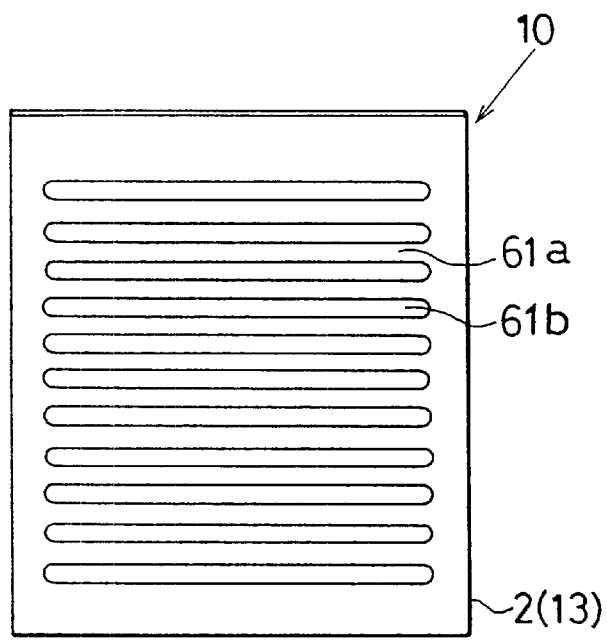
FIG. 41 is a front view showing a main structure of a fluid separating plate used in a heat exchanger according to the thirteenth embodiment.

A thirteenth embodiment of the present invention will be described with reference to FIGS. 40 and 41. FIG. 40 shows structure of a cooling apparatus incorporated in an electronic apparatus specifically, and FIG. 41 shows a main structure of a fluid separating plate in a heat exchanger.

In a cooling apparatus 14 of this fourth embodiment, a fluid separating plate 2 of a heat exchanger 25 equipped with plural stages of cooling units 3 includes a heat transfer accelerating portion 10 for accelerating the heat exchange of high-temperature air and low-temperature air. The heat transfer accelerating portion 10 is disposed in an separating position for separating between a low-temperature air on a downstream (rear stream) side of the heat exchanger 25 and a high-temperature air on an upstream (front stream) side of the heat exchanger. The heat transfer accelerating portion 10 includes a large number of concaves and convexes which are formed in rows vertically in the figures by pressing a flat metallic plate. The concaves and convexes are in an alternately repeated shape of elongated ridges 61a and elongated recesses 61b in the direction orthogonal to the air flowing directions.

An effect of this embodiment will be described.

In this embodiment, since the heat transfer accelerating portion 10 including alternate concaves and convexes is disposed in the separating position for separating between the low-temperature air downstream (rear stream) side of the heat exchanger 25 and the high-temperature air upstream (front stream) side of the heat exchanger, the fluid separating plate 2 can be provided with the heat exchange function for both high-temperature air and low-temperature air. Thus, the fluid separating plate 2 can also function to transfer the heat of the high-temperature air to the low-temperature air, and therefore it is possible to improve the heat conductivity of the whole heat exchanger 25. Further, since the- cooling performance for the high-temperature air can be improved, the whole of cooling apparatus 14 equipped with the heat exchanger 25 can be downsized.

Figure 43:
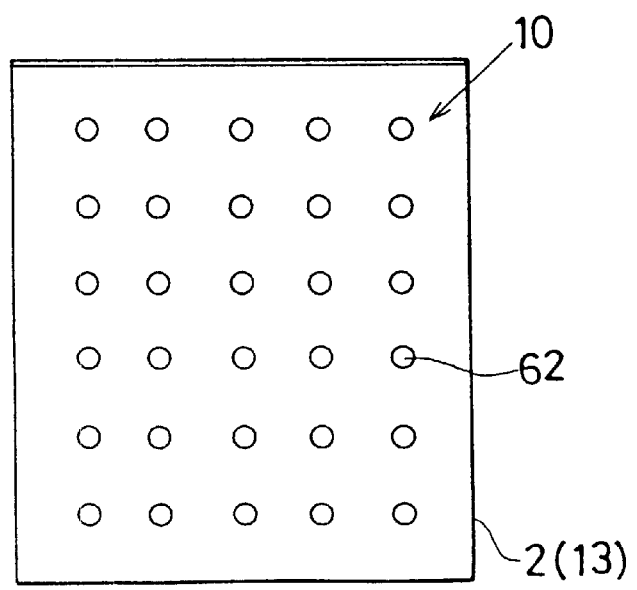
FIG. 43 is a front view showing a main structure of a fluid separating plate used in a heat exchanger according to a fourteenth embodiment.
Figure 42:
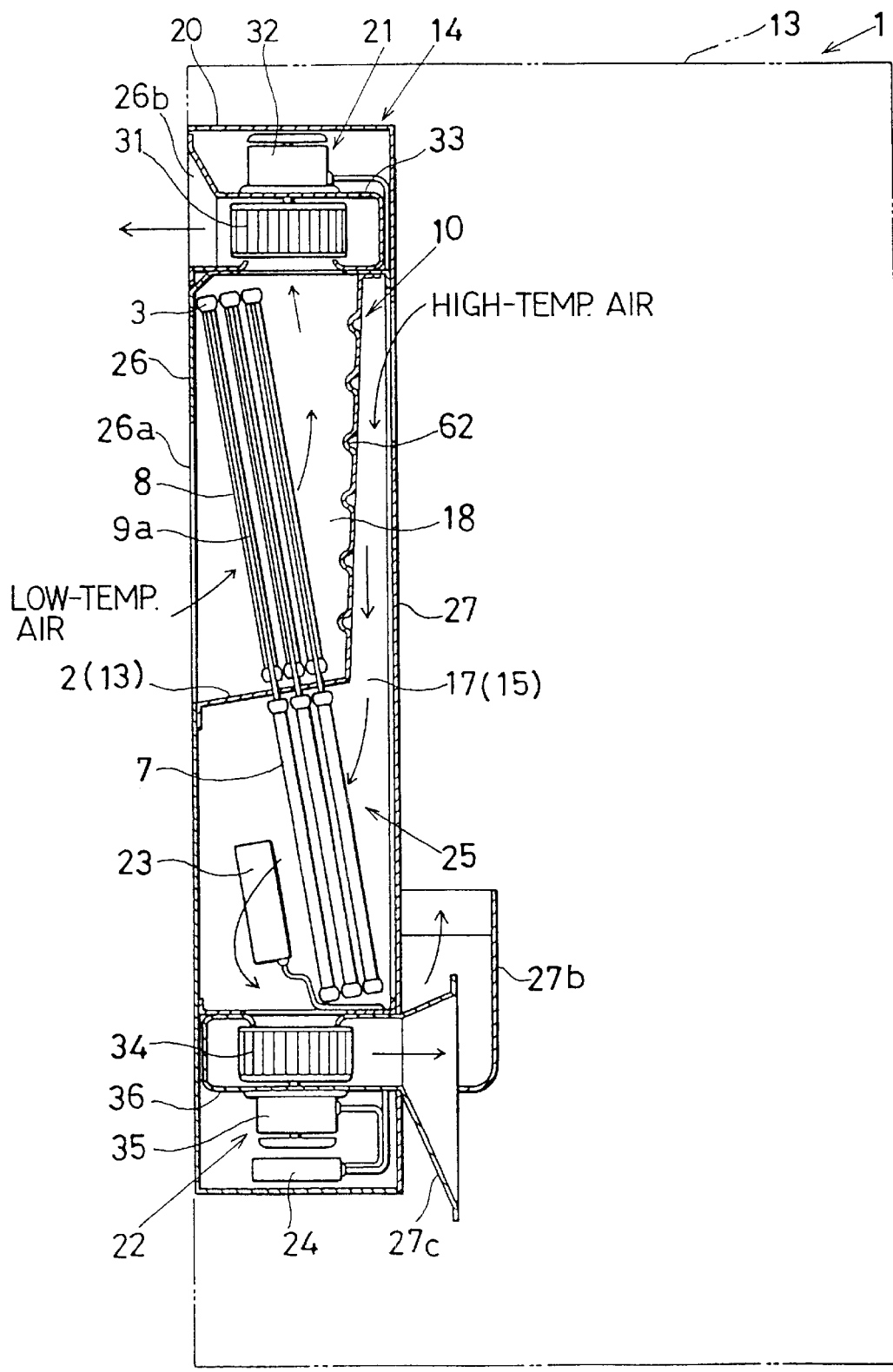
FIG. 42 is a cross sectional view showing a structure of a cooling system according to a fourteenth embodiment.

A fourteenth embodiment of the present invention will be described with reference to FIGS. 42 and 43. FIG. 42 shows a structure of a cooling apparatus incorporated in an electronic apparatus specifically, and FIG. 43 shows a main structure of a fluid separating plate in a heat exchanger.

In a cooling apparatus 14 according to this embodiment, a heat transfer accelerating portion 10 is provided at the same position as in the thirteenth embodiment, that is, at the separating position of a fluid separating plate 2 of a heat exchanger 25. The heat transfer accelerating portion 10 includes a large number of circular recesses 62 which are formed in rows by pressing a flat metallic plate. Also in this fourteenth embodiment, as in the thirteenth embodiment, the transfer of heat between high-temperature air and low-temperature air is accelerated. In this way, the radiating performance (cooling performance) for the high-temperature air can be improved, and it is possible to obtain the same function and effect as in the thirteenth embodiment.

Figure 44:
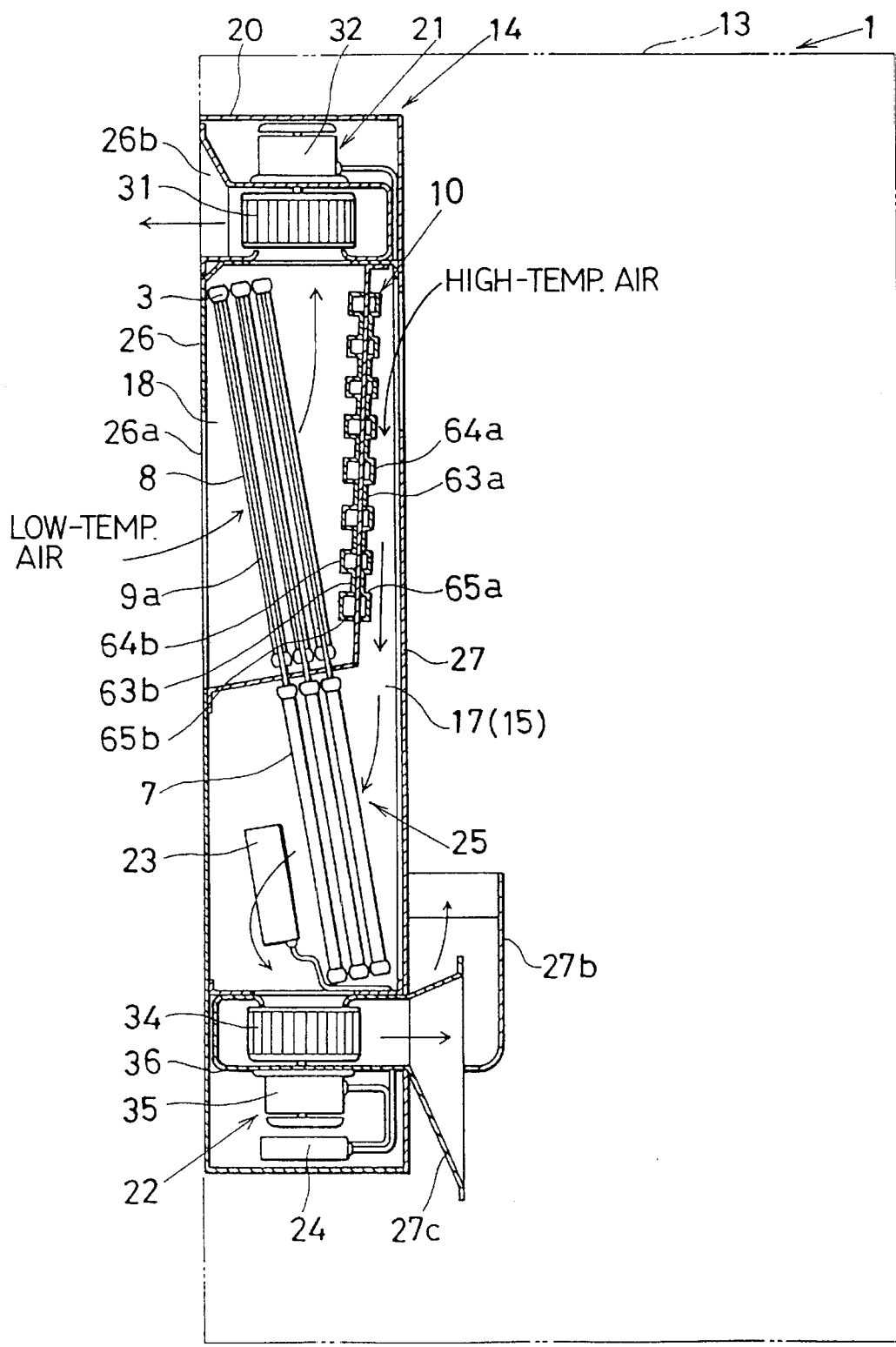
FIG. 44 is a cross sectional view showing a structure of a cooling apparatus of a fifteenth embodiment.
Figure 45:
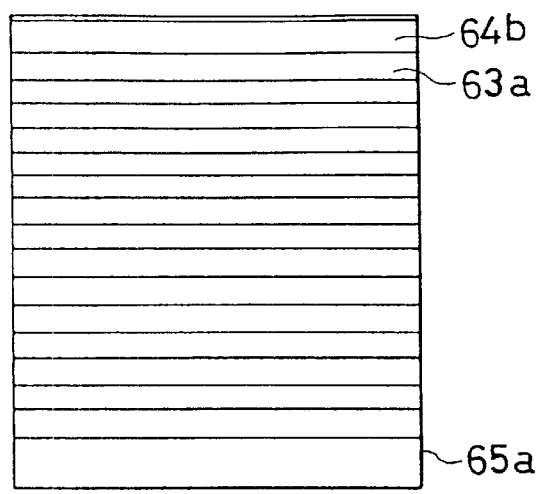
FIG. 45 is a front view showing a main structure of a fluid separating plate used in a heat exchanger according to a fifteenth embodiment.

A fifteenth embodiment of the present invention will be described with reference to FIGS. 44 and 45. FIG. 44 shows a structure of a cooling apparatus incorporated in an electronic apparatus specifically, and FIG. 45 shows a main structure of a fluid separating plate in a heat exchanger.

In a cooling apparatus 14 according to this embodiment, a heat transfer accelerating portion 10 is provided at the same position as in the thirteenth embodiment, that is, at the separating position of a fluid separating plate 2 of a heat exchanger 25. In the heat transfer accelerating portion 10, a concave-convex metal plate 65a having alternately repeated concaves 63a and convexes 64b is connected to the high-temperature air side of the fluid separating plate 2 by spot welding or any other suitable means, and a concave-convex metal plate 65b having alternately repeated concaves 63b and convexes 64a, is connected to the low-temperature air side of the fluid separating plate 2 by spot welding for example. Also in this fifteenth embodiment, as in the thirteenth embodiment, the transfer of heat between both high-temperature air and low-temperature air is accelerated. In this way, the radiating performance (cooling performance) for the high-temperature air can be improved.

Modifications of the above tenth to fifteenth embodiments will be described. The cooling apparatus 14 equipped with the heat exchanger according to each of the above tenth to fifteenth embodiments is used in the case where heat generating elements such as, for example, electronic parts 11 and 12 are required to be accommodated within a sealed space. The case where heat generating elements are required to be accommodated within a sealed space includes the case where heat generating elements are used under a severe environmental condition containing oil, moisture, iron powder, corrosive gas, or the like, or the case where an inert gas (e.g., helium gas or argon gas) is used to prevent arcing or oxidation of contacts at the time of electrical intermittence, or the case where it is required to prevent a gas (e.g., hydrogen fluoride obtained by decomposition from fluorocarbon) harmful to the human body from leaking to the exterior.

Although in the above embodiment a corrugated fin-tube type multiflow path type heat exchanger is used as each of the cooling unit 3, high temperature-side heat exchanger portion 3a and low temperature-side heat exchanger portion 3b, there may be used, for the same purpose, a plate fin-tube type heat exchanger, a fine pin fin-tube type heat exchanger, a serpentine type heat exchanger constituted by a meanderingly bent flat tube, or a drawn-cup type heat exchanger including a large number of laminated cooling tubes each constituted by laminating two pressed plates. As the heat receiving fins 6a and radiating fins 6b there may be used slit fins or louver fins.

Although in the above embodiments a high-temperature air heated by heat generating elements such as the electronic parts 11 and 12 is used as the high-temperature fluid (inside fluid) within the housing 13, there may be used, as the high-temperature fluid, a high-temperature liquid such as, for example, cooling water or oil (including hydraulic oil and lubricating oil) for cooling the heat generating elements. In the same manner, as the outside fluid (outside air) outside the housing 13 there may be used not only a gas such as air of a low temperature but also a liquid such as water or oil of a low temperature. In these case, pumps are used as inside fluid circulating means and low-temperature fluid generating means. As means for actuating pumps and centrifugal fans 31 and 34, there may be used not only such electric motors 32 and 35 as in the above embodiments but also an internal combustion engine, water mill, or windmill.

Figure 46:
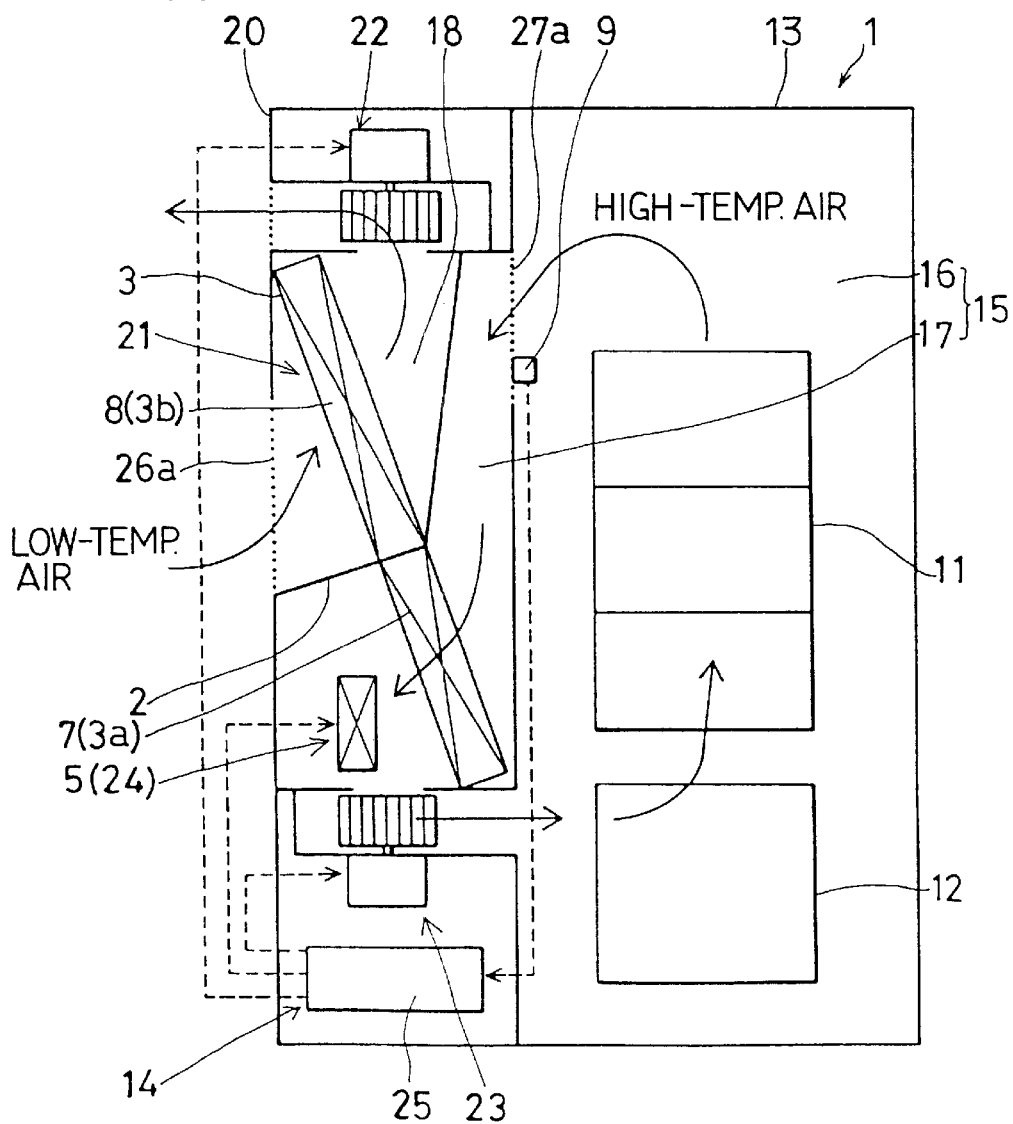
FIG. 46 is a schematic view showing the entire structure of an electronics apparatus according to sixteenth embodiment.

A sixteenth embodiment having an apparatus for controlling a temperature within a closed body of the present invention incorporated into an electronics apparatus will be described hereinafter with reference to the drawings. FIG. 46 shows the entire construction of an electronics apparatus.

An electronics apparatus 1 is, for example, a radio base station apparatus of a mobile radio telephone such as a cordless telephone, a car telephone, or the like, which includes a housing 13 for hermetically housing electronic parts 11 and 12 therein, and a cooling apparatus (a cooler) 14 incorporated into the housing 13 to cool the electronic parts 11 and 12, and the like.

The electronic part 11 is a heating element which performs a predetermined operation when an electricity is supplied thereto and generates heat (for example, a semiconductor switching element constituting a high frequency switching circuit incorporated in a trans-receiver). The electronic part 12 is a heating element which performs a predetermined operation when an electricity is supplied thereto and generates heat (for example, a semiconductor amplifying element such as a power transistor incorporated in a power amplifier).

The housing 13 is a closed body for hermetically sealing the interior from the exterior and is formed therein with a sealed space 15. The sealed space 15 is completely hermetically separated from the outside by means of a fluid separating plate or the like of the cooling apparatus 14 described later in order to prevent the performance of the electronic parts 11 and 12 from being deteriorated due to the deposition of foreign material such as dust and water to the electronic parts 11 and 12.

The sealed space 15 is partitioned into an electronic part accommodating space 16 for accommodating the electronic parts 11 and 12 therein and a high-temperature-side heat transfer space 17 as a inside passage, by means of the fluid separating plate of the cooling apparatus 14 and the casing of the cooling apparatus 14. The flow path area of the high-temperature-side heat transfer space 17 is narrow on the upwind side in order to minimize the depth size of the cooling apparatus 14, while the flow path area of the same space on the downward side is wider. Further, the housing 13 is formed with a low-temperature-side heat transfer space 18 as an outside passage hermetically sealed from the high-temperature-side heat transfer space 17 by the fluid separating plate.

Figure 47:
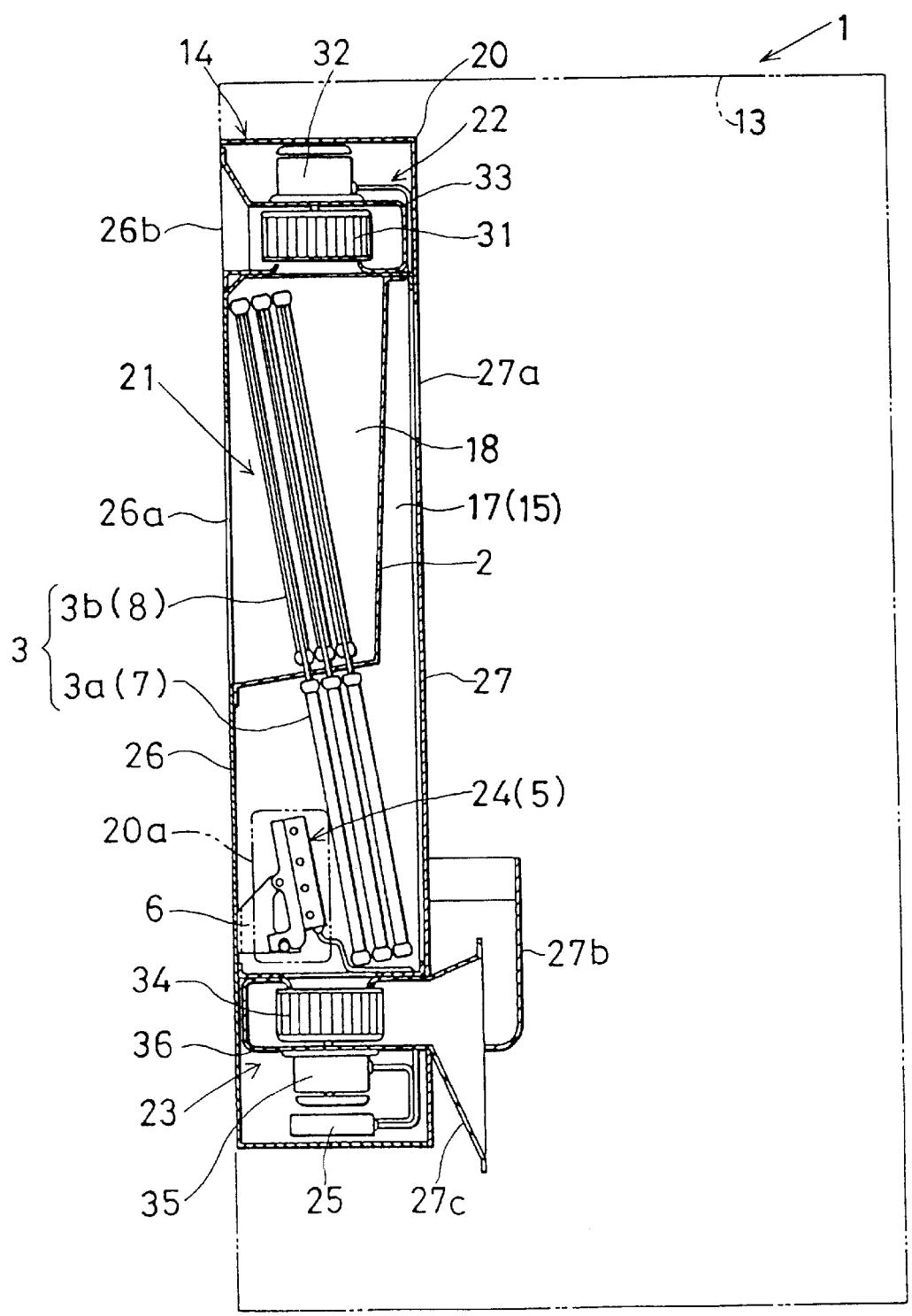
FIG. 47 is a cross sectional view showing a detailed structure of a cooling apparatus.
Figure 48:
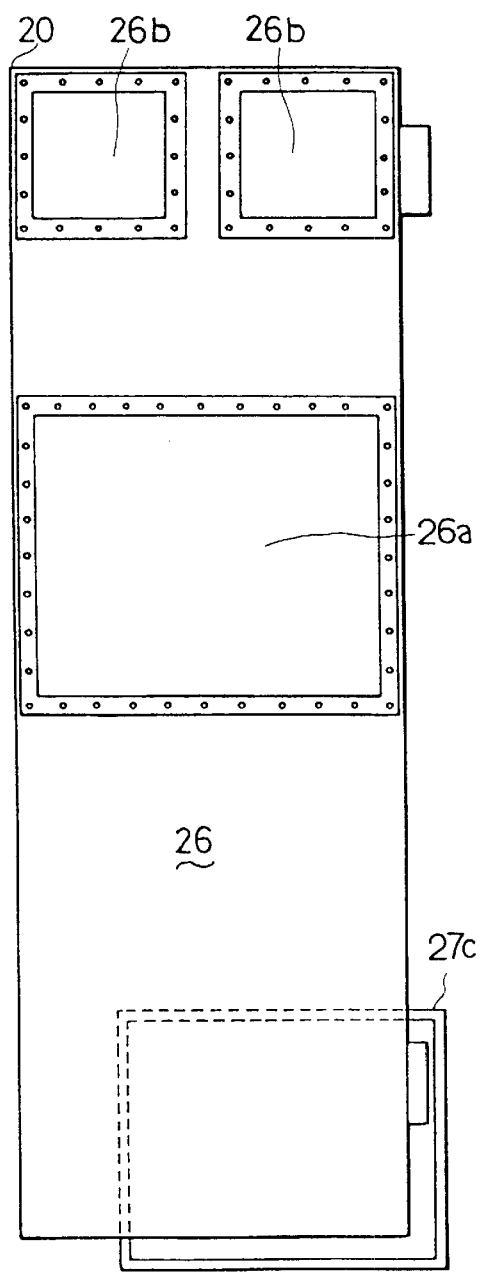
FIG. 48 is a front view showing a detailed structure of the cooling apparatus.
Figure 49:
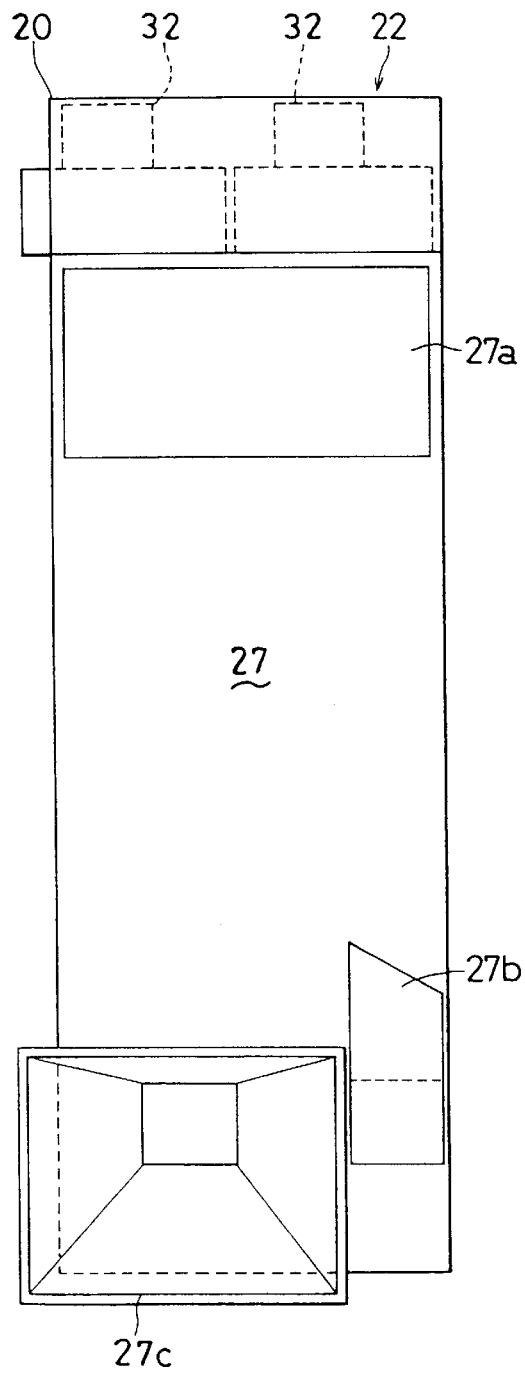
FIG. 49 is a rear view showing a detailed structure of the cooling apparatus.

The cooling apparatus 14 will be described below with reference to FIGS. 46 to 49. FIGS. 47 to 49 show the detailed construction of the cooling apparatus 14.

The cooling apparatus 14 includes a casing 20 provided integral with the housing 13, a heat exchanger 21 for setting an air temperature within the closed space 15 to a level not higher than an upper limit temperature (e.g., 65° C.), two upper-side centrifugal type blowers 22 for generating an air flow of a low-temperature air (a low temperature fluid), two lower-side centrifugal type blowers 23 for generating an air flow of a high-temperature air (a high temperature fluid), an electric device 24 for maintaining the air temperature in the closed space 15 at a level not lower than a lower-limit temperature (e.g., 0° C.), a controller 25 for controlling the supply of electricity for the electric devices of the cooling apparatus 14, and the like.

The casing 20 includes an outer wall plate 26 disposed on the outermost side of the electronics apparatus 1, a rear partition plate 27 surrounding the high-temperature-side heat transfer space 17, and the like. These outer wall plate 26 and rear partition plate 27 are secured to the housing 13 by the bonding, e.g., a spot welding or by using the fastening means such as screws or bolts.

To the central portion of the outer wall plate 26 is opened a single square low-temperature-side suction port 26a for sucking low-temperature air (foul outside air containing foreign material such as dust or water) into the low-temperature-side heat transfer space 18 from the outside. Further, to the upper side of the outer wall plate 26 is opened two square low-temperature-side discharge ports 26b for discharging low- temperature air to the outside from the upper side centrifugal type blower 22.

To the upper side of the rear partition plate 27 is opened a single square high-temperature-side suction port 27a sucking high-temperature air (clean air not containing foreign material such as dust or water) into the high-temperature-side heat transfer space 17 from the electronic part accommodating space 16. Further, to the lower side of the rear-side partition plate 27 are joined a duct 27b for introducing cooled high temperature air from one lower-side centrifugal type blower 23 to the electronic part 11, and a duct 27c for introducing cooled high temperature air from the other lower-side centrifugal type blower 23 to the electronic part 12 by means such as a spot welding. The ducts 27b and 27c are respectively integrally connected to a scroll casing 36 of to lower side centrifugal type blowers 23.

Figure 50:
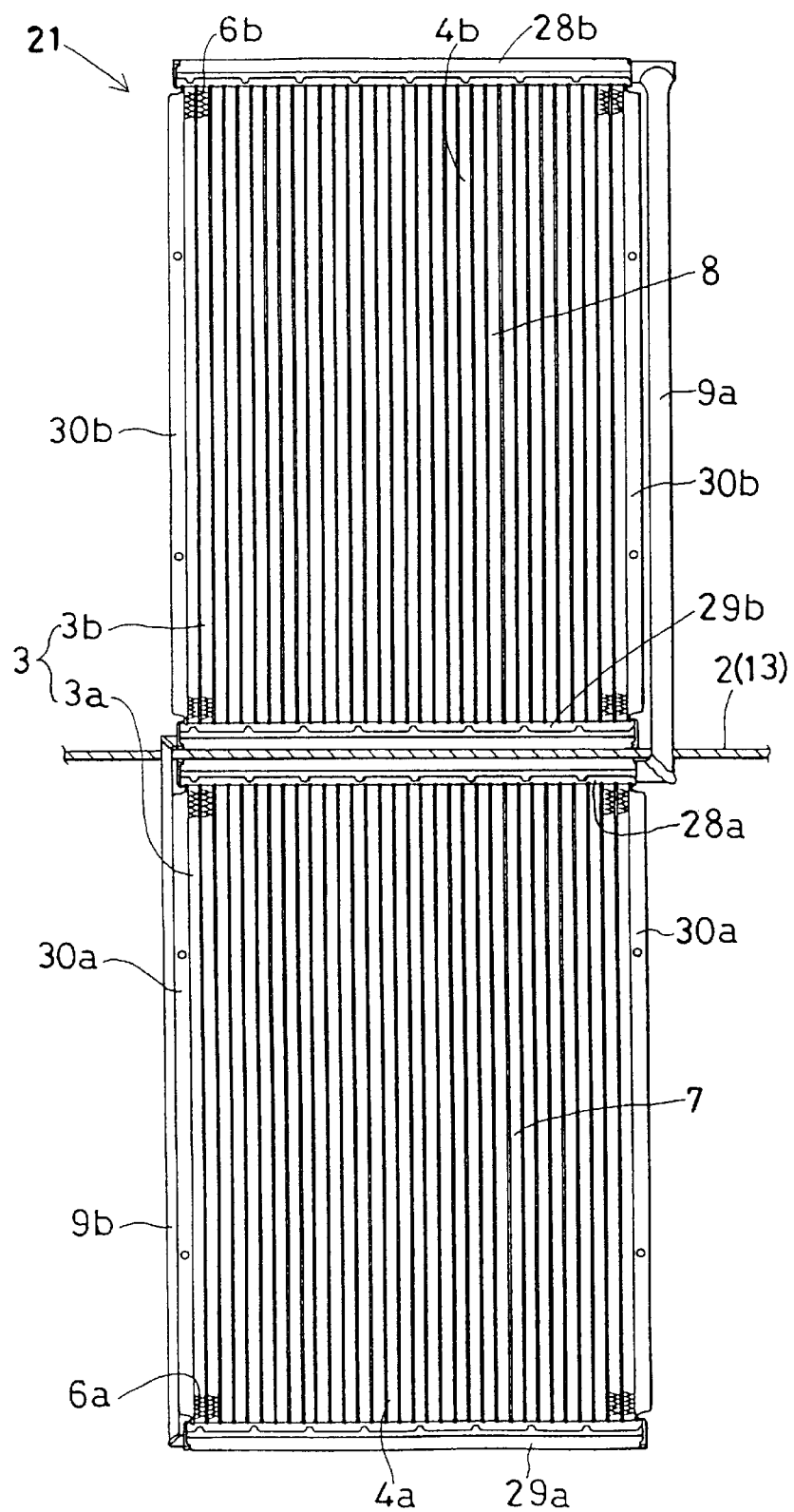
FIG. 50 is a front view showing a detailed structure of the cooling unit.
Figure 51:
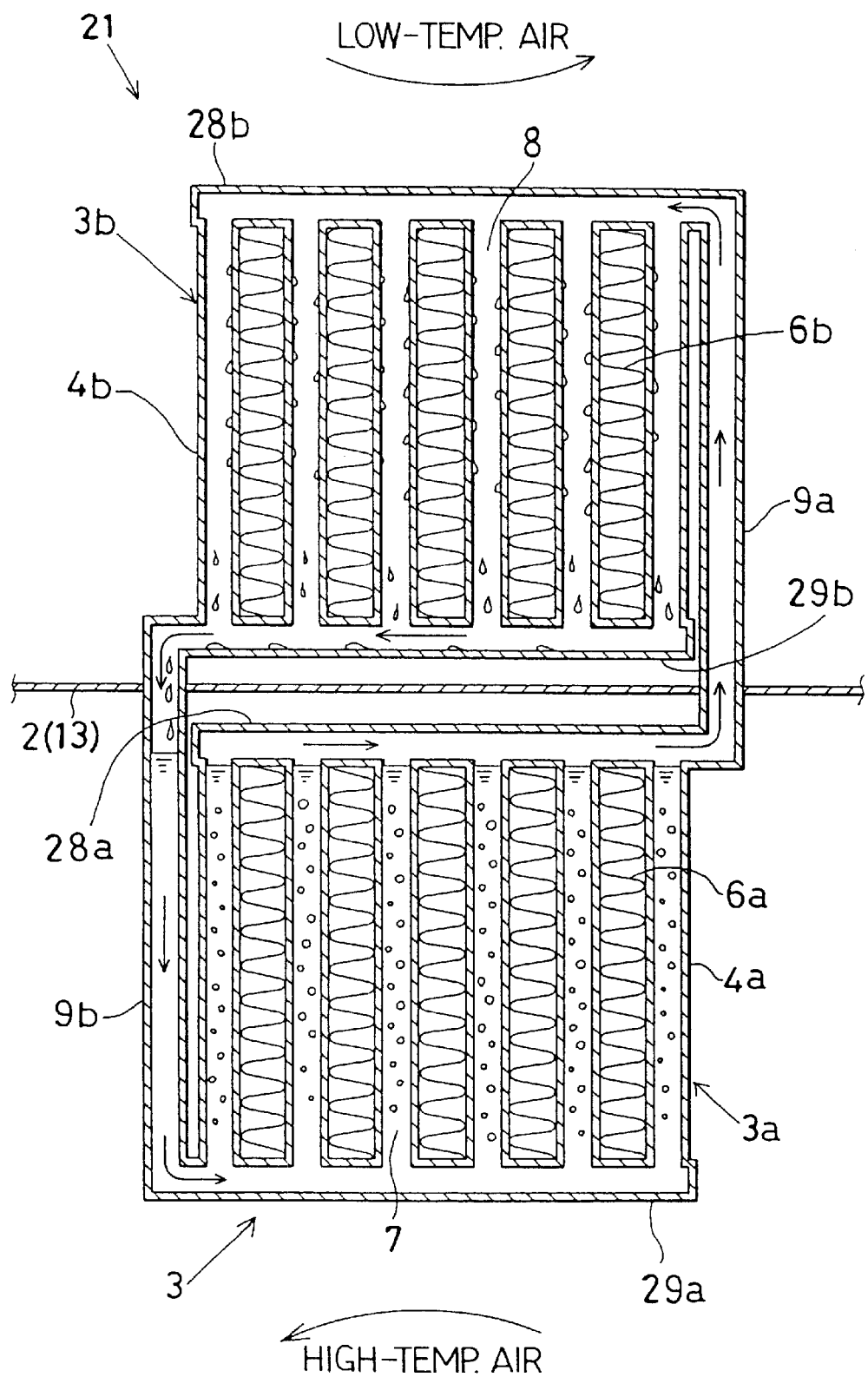
FIG. 51 is a cross sectional view showing a detailed structure of the cooling unit.

Next, the heat exchanger 21 will be described in detail with reference to FIGS. 46 to 51. FIG. 50 shows the detailed construction of the cooling unit, and FIG. 51 shows the schematic construction of the cooling unit.

The heat exchanger 21 includes a fluid separating plate 2 for hermetically separating high temperature air as internal air (inside air) which circulates within the housing 13 from low temperature air as external air (outside air) which circulates outside the housing 13, and a multi-stage (three-stage) type cooling unit 3 incorporated in the fluid separating plate 2 in the state extending through the fluid separating plate 2.

The fluid separating plate 2 includes one wall surface (a part of the casing) of the housing 13 which constitutes one wall surface of the closed space 15 interior of which is at a high temperature and one wall surface of the low temperature-side heat transfer space 18 interior of which is at a low temperature. The fluid separating plate 2 is made of a metal material which is superior in heat conductivity, such as aluminum, and is integrally brazed with the cooling unit 3 and the casing 20 so as to hermetically divide between the closed space 15 including the high temperature-side heat transfer space 17 and the outside including the low temperature-side heat transfer space 18. The fluid separating plate 2 is bored with a plurality of elongated rectangular or oblong through-holes through which connection pipes of the cooling unit 2 extend (described later) at predetermined intervals. The fluid separating plate 2 may be a separate elements (for example, split plates).

The cooling units 3 are incorporated within the casing 20 in plural stages (three stages) in a state inclined at a predetermined angle and is divided into two portions, a high temperature-side heat exchanger (inside-air-side heat exchanger) 3a and a low temperature-side heat exchanger (outside-air-side heat exchanger) 3b into which is sealed a fluorocarbon type or freon type refrigerant, the high-temperature-side and low- temperature-side heat exchangers 3a and 3b being connected by two refrigerant circulating first and second connection pipes 9a and 9b.

The high temperature-side heat exchanger 3a is an inside heat exchanger which is a multi-flow pass type heat exchanger including a plurality of cooling tubes 4a, a high-temperature-side upper end tank 28a, a high-temperature-side lower end tank 29a, and a heat receiving fin 6a interposed between the cooling tubes 4a adjacent to each other. To the opposite sides of the high-temperature-side heat exchanger 3a rejoined side plates 30a which function to fasten to the fluid separating plate 2 and the casing 20 by fastening means and which also function to reinforce a plurality of cooling tubes 4a and a plurality of heat receiving fins 6a. Since the high-temperature-side heat exchanger 3a is disposed within the high-temperature-side heat transfer space 17 sealed from the outside by the housing 13, there is no possibility that the high-temperature-side heat exchanger 3a is not exposed to the outside air containing foreign material such as dust or water.

The plurality of cooling tubes 4a are made of metal material which is superior in heat conductivity, such as aluminum or copper, which are formed into flat tubes (for example, width is 1.7 mm and length is 16.0 mm) having an elongated rectangular shape or oblong cross section. The high-temperature-side heat exchanger 3a formed from these cooling tubes 4a is constituted as a refrigerant tank (a boiling portion) 7 in which a refrigerant sealed therein is boiled and vaporized by receiving heat from high-temperature air.

The high-temperature-side upper end tank 28a and the high-temperature-side lower end tank 29a include a core plate provided on the cooling tube 4a side and a substantially inverted-U shape tank plate joined to the core plate. Either the high temperature-side upper end tank 28a or the high temperature-side lower end tank 29a is provided with only one refrigerant sealing port (not shown) for sealing a refrigerant into the cooling unit 3. The refrigerant is sealed into each cooling tube 4 of the high temperature-side heat exchanger 3a up to a height at which a liquid level thereof corresponds to a position of the upper end of the cooling tube 4a, that is, a height of the boiling portion 7. The refrigerant is sealed after the heat receiving fin 6a has been brazed to the cooling tube 4a.

The heat receiving fin 6a is a corrugating fin in which thin sheets (for example, sheet thickness is about 0.02 to 0.50 mm) formed of metal material which is superior in heat conductivity, such as aluminum are alternately pressed and bent into a wavy shape, the fin 6a being brazed to a flat outer wall surface of the cooling tube 4a. That is, the brazing is performed in the state where the outer wall surface of the cooling tube 4a and the heat receiving fin 6a are fused.

The low-temperature-side heat exchanger 3b is an outside heat exchanger which is a multi-flow pass type heat exchanger including a plurality of cooling tubes 4b, a low-temperature-side upper end tank 28b, a low-temperature-side lower end tank 29b, a heat receiving fin 6b interposed between the cooling tubes 4b adjacent to each other, and a side plate 30b. The low- temperature-side heat exchanger 3b is disposed so as to be positioned on substantially the same plane as the high-temperature-side heat exchanger 3a in the low-temperature-side heat transfer space 18 exposed to foreign. material such as dust or water.

The plurality of cooling tubes 4b are formed to have the same shape as the cooling tubes 4a. The low-temperature-side heat exchanger 3b including these cooling tubes 4b is constituted as a vaporized refrigerant tank (a condensing portion) 8 in which the vaporized refrigerant boiled in the boiling portion 7 is condensed and liquefied by releasing the heat of the vaporized refrigerant boiled in the boiling portion 7 to the low-temperature air.

The low-temperature-side upper end tank 28b and the low-temperature-side lower end tank 29b include a core plate and a substantially inverted-U shape tank plate similar to the high-temperature-side upper end tank 28a and the high-temperature-side lower end tank 29a.

The radiating fin 6b is a corrugating fin formed in the shape similar to that of the heat receiving fin 6a, and is brazed to a flat outer wall surface of the cooling tube 4b. That is, the brazing is performed in the state where the outer wall surface of the cooling tube 4b and the heat receiving fin 6b are fused.

The first connection pipe 9a is a metallic pipe which is formed to have a circular cross section by the same metal material as the cooling tube 4b, and is communicated with the high-temperature-side upper end tank 28a provided on the upper end of the boiling portion 7 and the low-temperature-side upper end tank 28b provided on the upper end of the condensing portion 8. This connection pipe 9a is a high-to-low temperature guide means for introducing the vaporized refrigerant boiled and vaporized in the boiling portion 7 to the condensation portion 8.

The second connection pipe 9b is a metallic pipe which is formed to have a circular cross section by the same metal material as the first connection pipe 9a, and is communicated with the low-temperature-side lower end tank 29b provided on the lower end of the condensing portion 8 and the high-temperature-side lower end tank 29a provided on the lower end of the boiling portion 7. This connection pipe 9b is a low-to-high temperature guide means for introducing the vaporized refrigerant condensed and liquefied in the condensation portion 8 to the boiling portion 7.

Two upper-side centrifugal type blowers 22 each include a centrifugal type fan 31 for generating an air flow in the low-temperature-side heat transfer space 18, an electric motor 32 for rotating the centrifugal type fan 31, and a scroll casing 33 for rotatably receiving the centrifugal type fan 31.

Two lower-side centrifugal type blowers 23 each include a centrifugal type fan 34 for generating an air flow in the high-temperature-side heat transfer space 17, an electric motor 35 for rotating the centrifugal type fan 34, and a scroll casing 36 for rotatably receiving the centrifugal type fan 34.

Figure 52:
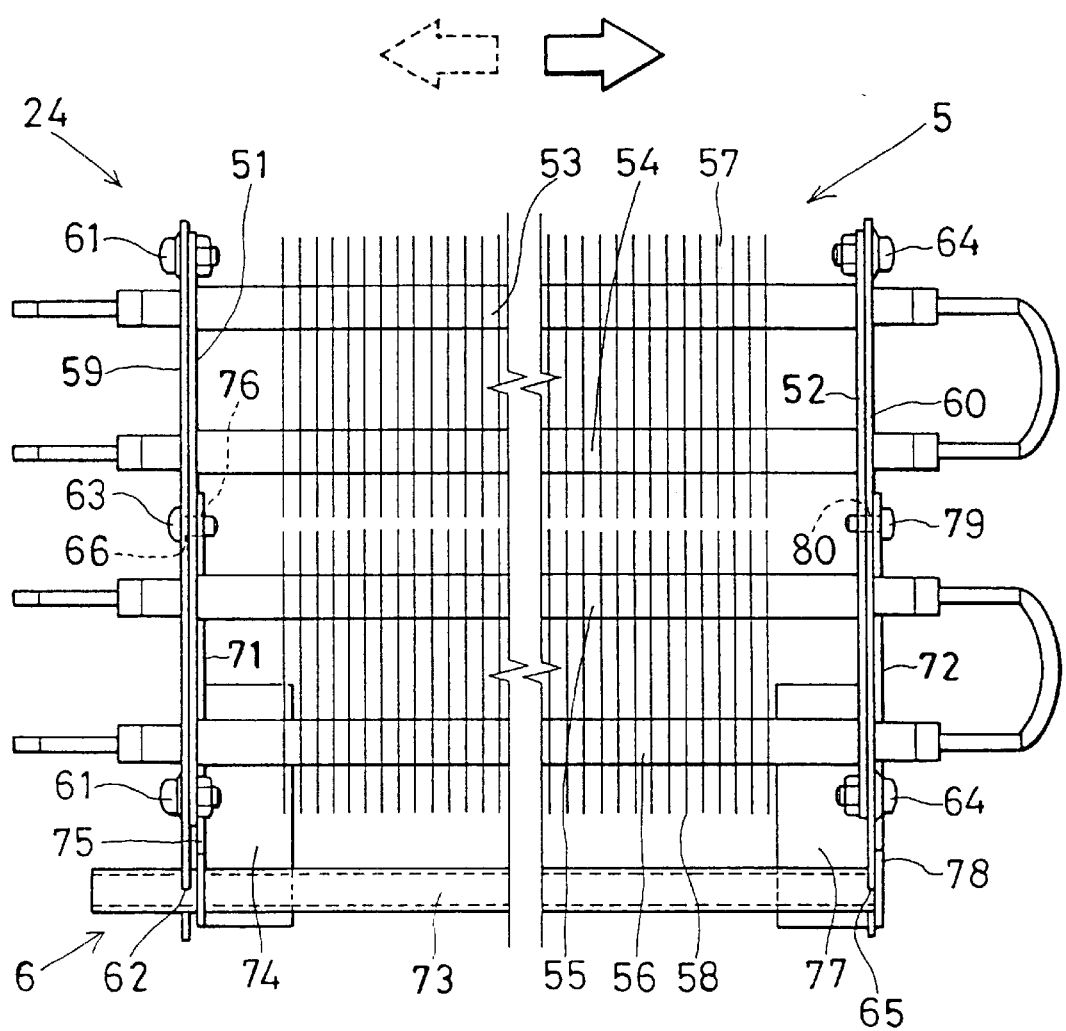
FIG. 52 is a front view showing a detailed structure of an electric heater mounting apparatus.
Figure 53:
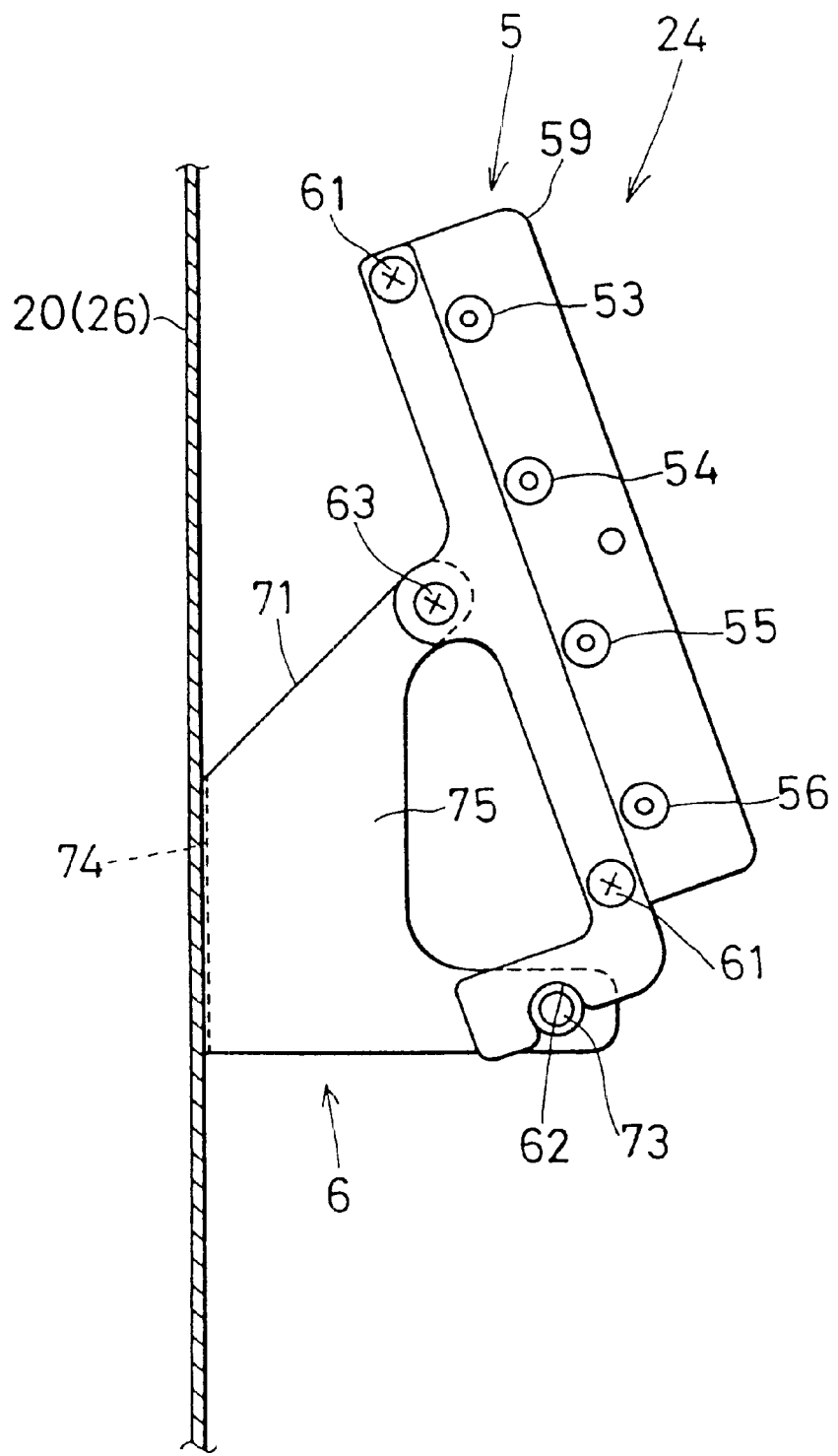
FIG. 53 is a side view showing a detailed structure of the electric heater mounting apparatus.

The electric heater device 24 will be described in detail hereinafter with reference to FIG. 46, FIG. 47, and FIGS. 52 to 55. FIGS. 52 and 53 show the detailed construction of the electric heating device 24.

The electric heating device 24 includes an electric heater 5 to be attached or detached through an opening (not shown) provided on the side surface at one side of the casing 20, and a heater mounting device 6 for fixing the electric heater 5. The opening is opened and closed by a hatch 20a as indicated by the two-dot chain line in FIG. 47.

The electric heater 5 is disposed at a downstream side of the high temperature-side heat exchanger 3a of the cooling unit 3 in the high temperature-side heat transfer space 17 of the housing 13 in a flowing direction of high-temperature air. The electric heater 5 is for heating air flowing through the high temperature-side heat transfer space 17 so that the temperature in the closed space 15 is higher than a lower limit temperature. This is because, when the temperature in the closed space 15 of the housing 13 is lower than the lower limit temperature (e.g., 0° C.), the performance of the electronic parts (e.g., semiconductor elements) 11 and 12 deteriorates. The electric heater 5 in this embodiment has the heating value of, for example, 1.2 kW.

Figure 54A:
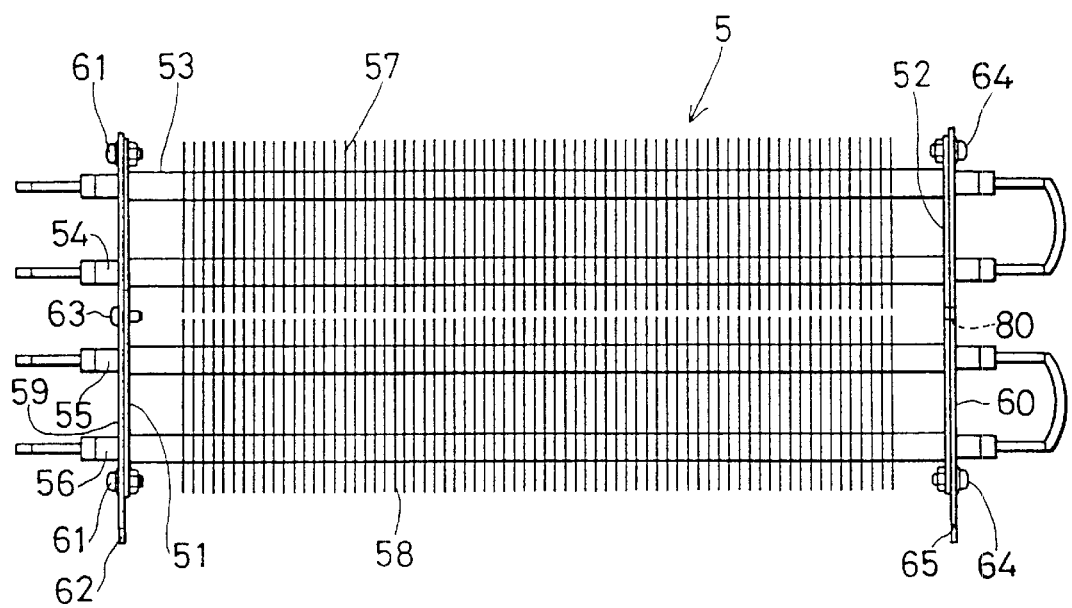
FIG. 54A is a front view showing a detailed structure of an electric heater.

The electric heater 5 includes, as shown in FIG. 54A, four heater bodies 53 to 56 hung between a pair of support plates 51 and 52 opposed to each other, a plurality of plate fins (radiating fins) 57 provided on the two heater bodies 53 and 54, a plurality of radiating fins (radiating fins) 58 provided on the two heater bodies 55 and 56, a front-side flange 59 secured to one support plate 51, and a back-side flange 60 secured to the other support plate 51.

For the two heater bodies 53 and 54, for example, sheath heaters are used. A heater terminal at one side is connected to a controller 25 by a conductor, and a heater terminal on the other side connects the both.

For the two heater bodies 55 and 56, for example, sheath heaters are used similar to the two heater bodies 53 and 54. A heater terminal at one side is connected to a controller by a conductor, and a heater terminal on the other side connects the both.

A plurality of plate fins 57 and 58 function as radiating fins. A number of thin sheets (for example, thickness is about 0.02 to 0.50 mm) formed of metal material which is superior in heat conductivity, such as aluminum are disposed at intervals of fine fin pitch (for example 5 mm) to release heat generated in the four heater bodies 53 to 56 to air circulating in the closed space 15.

The front-side flange 59 is formed into a substantially flat-shape configuration from metal material having a high strength and is provided on the opening side of the casing 20 to hold and fix one ends (opening-side ends) of the four heater bodies 53 to 56. The flange 5 functions as a front-side mounting stay for being connected to the heat mounting device 6.

Figure 54B:
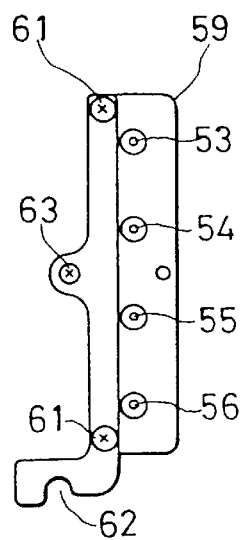
FIG. 54B is a side view thereof.

The front-side flange 59 is fastened while being in a state as to closely contact with one support plate 51 using a fastening means 61 such as two screws, nuts or the like. Externally of the portion projected from the support plate 51 of the front-side flange 59 is formed a semi-circular front-side recess portion 62 as a recess portion on the opening side fitted in the heater mounting device 6. The front-side flange 59 is further provided with an internal thread hole 66 engaged with fastening means 63 such as a screw as fixing means at a substantially semi-circular portion projected downward as shown in FIG. 54B.

The back-side flange 60 is formed so as to have the same shape from the same material as the front-side flange 59, and is disposed oppositely of the front-side flange 59 on the reversed side (deep side) with respect to the opening side of the casing 20. The back-side flange 60 holds and fixes the other ends (back-side ends) of the four heater bodies 53 to 56. The flange 60 functions as a back-side mounting stay for being connected to the heater mounting device 6.

The back-side flange 60 is fastened and fixed while being in a state as to closely contact with the other support plate 52 using fastening means 64 such as two screws. Externally of the portion projected from the support plate 51 of the back-side flange 60 is formed a semi- circular back-side recess portion 65 fitted in the heater mounting device 6. The back-side flange 60 has a round hole portion (an engaged portion) corresponding to the internal thread hole portion of the front-side flange 59.

The heater mounting device 6 has a guide shaft 73 provided integral with the casing 20 and hung between a pair of front-sides of the electric heater 5, a pair of front-sides for holding and fixing the back-side flanges 59 and 60, back-side brackets 71 and 72, front-sides thereof, and the back-side brackets 71 and 72 so as to axially slidably fit the pair of front-sides of the electric heater 5 and the back-side flanges 59 and 60.

The front-side bracket 71 is formed so as to have a substantially L-shape from metal material having high strength, and has a connection plate 74 in the form of a flat plate connected to the inner surface of the outer wall plate 26 of the casing 20 by means of a spot welding or the like, and a binding plate 75 bent perpendicular to the connection plate 74.

The binding plate 75 is formed with an internal thread hole portion 76 into which is inserted fastening means 63 such as a screw. In this way, the binding plate 75 fastens the front-side flange 59 using the fastening means 63 such as a screw to serve as restricting means for restraining (restricting) the movement of the front-side flange 59 (the electric heater 5) in the horizontal direction parallel to the axial direction of the guide shaft 73 and in the vertical direction to the aforesaid horizontal direction. Further, the binding plate 75 supports the guide shaft 73 by connecting the guide shaft 73 by means such as a spot welding in the state where the end of the guide shaft 73 passes through.

The back-side bracket 72 is formed so as to have the same shape from the same material as the front-side bracket 71, and has a connection plate 77 in the form of a flat plate, and a binding plate 78 bent in the direction perpendicular to the connection plate 77.

The binding plate 78 is firmly fixed in a state where a single pin (a projecting portion, an engaging portion) 79 is projected inward. In this way, the binding plate 78 functions as restricting means in which the pin 79 is fitted in a round hole portion 80 of the back-side flange 60 to restrain (restrict) the movement of the back-side flange 6 (electric heater 5) in the horizontal direction parallel to the axial direction of the guide shaft 73 and in the vertical direction with respect to the aforesaid horizontal direction. The end of the guide shaft 73 is connected to the binding plate 78 by means such as a spot welding to support the guide shaft 73.

Figure 55A:
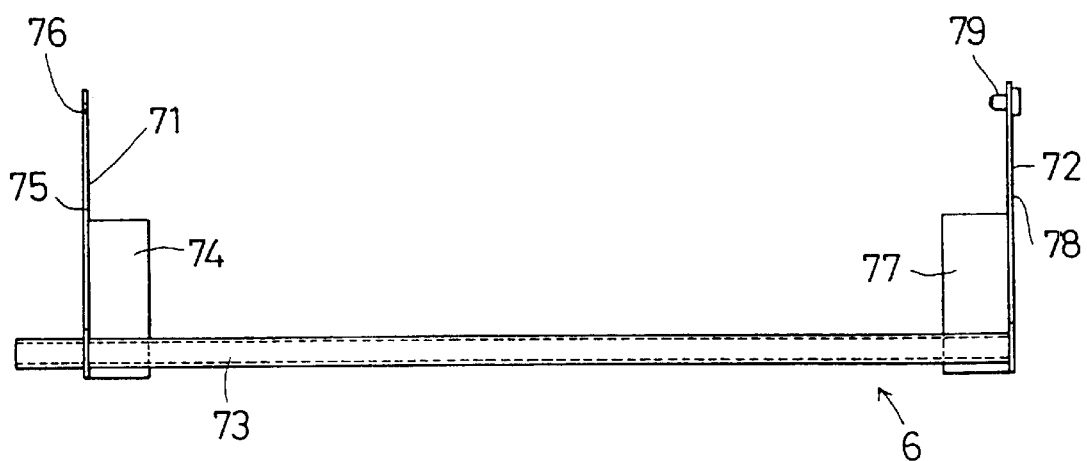
FIG. 55A is a front view showing a detailed structure of a bracket and a guide shaft.
Figure 55B:
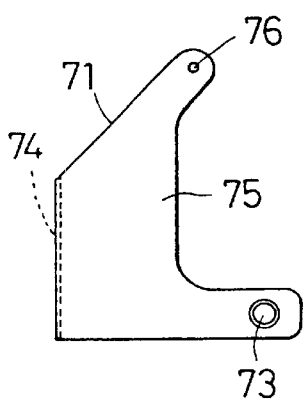
FIG. 55B is a side view thereof.

The guide shaft 73 is a metal shaft formed so as to have a circular or cylindrical cross section as shown in FIG. 55A. The guide shaft 73 is for guiding the electric heater 5 between the mounting location and the opening when the electric heater 5 is attached or detached.

In the guide shaft 73 is fitted axially slidably the front-side recess portion 62 formed in the front-side flange 59 and axially slidably the back-side recess portion 65 formed in the back-side flange 60. In this way, when the electric heater 5 is mounted on the heater mounting device 6, the guide shaft 73 functions as restricting means for restraining (restricting) the movement of the front-side and back-side flanges.59 and 60 (electric heater 5) in the vertical direction with respect to the horizonal direction parallel to the axial direction of the guide shaft 73.

The controller 25 is for controlling electric devices of the cooling apparatus 14 such as an electric motor 32 for two upper-side centrifugal type blowers 22, an electric motor 35 for two lower-side centrifugal type blowers 23 and an electric heater 5 (four heater bodies 53 to 56) on the basis of a detected temperature in the closed space 15, detected by a temperature sensor 9 formed from a heat sensing element such as a thermistor.

When the temperature in the closed space 15 is higher than the lower limit temperature (e.g., 0° C.), the controller operates two upper-side centrifugal type blowers 22 and two lower-side centrifugal blowers 23 in a Hi (large air amount) or Lo (small air amount) mode to turn OFF the electric motor 5. Further, when the temperature in the closed space 15 is lower than the lower limit temperature (e.g., 0° C.), the controller 25 turns OFF the electric motor 32 for two upper-side centrifugal type blowers 22, operates the electric motor 35 for two lower-side centrifugal type blowers 23 in Hi (large air amount) or Lo (small air amount) mode, and turns ON the electric motor 5.

In the following, the method for mounting the electric heater 5 to the heater mounting device 6 according to this embodiment will be briefly described with reference to FIG. 47 and FIGS. 52 to 55.

When the electric heater 5 is mounted on the heater mounting device 6, firstly, the hatch 20a is opened so that the opening provided in the side on one side of the casing 20 opens. In the heater mounting device 6, the connection plates 74 and 77 of the pair of front-side and back-side brackets 71 and 72 having the guide shaft 73 held and fixed are secured to the inner side of the outer wall plate 26 of the casing 20 using means such as a spot welding.

Next, as shown in FIG. 54A, the electric heater 5 having parts incorporated therein is inserted in the direction as indicated by the solid line shown in FIG. 52 from the opening. At this time, the front-side and back-side recess portions 62 and 65 of the pair of front-side and back-side flanges 59 and 60 of the electric heater 5 are fitted in the guide shaft 73, and in this state, the electric heater 5 is inserted in the direction as indicated by the solid line shown in FIG. 52 along the guide shaft 73. In this way, even if the weight of the electric heater 5 is heavy, an operator can inserts the electric heater 5 by one hand.

Next, when the back-side flange 60 comes in contact with the back-side bracket 72, the inserting work for the electric heater 5 is completed. Then, the round hole portion 80 of the back-side flange 60 is fitted in the pin 79 secured to the back-side bracket 72, and the back-side flange 60 is restrained in the back-side bracket 72 in the horizontal plane parallel- to the axial direction of the guide shaft 72 and restrained in the vertical plane with respect to the horizontal direction.

Next, the internal thread hole portion 76 of the front-side bracket 71 is fit into the internal thread hole portion 66 of the front-side flange 59, the operator puts one hand into the opening of the hatch 20a to insert and tighten the fastening means 63 such as a screw into both the internal thread hole portions 76. In this way, the front-side flange 59 is restrained in the front-side bracket 71 in the horizontal plane parallel to the axial direction of the guide shaft 73 and fixed in the vertical plane with respect to the horizontal direction. From the foregoing, the mounting operation of the electric heater 5 to the heater mounting device provided integral with the housing 13 (casing 20) is completed.

In the following, the method for detaching the electric heater 5 from the heater mounting device 6 will be described with reference to FIG. 47 and FIGS. 52 to 55.

When the electric heater 5 is detached from the heater mounting device 6, the operation is performed in the procedure reversed to that of the mounting operation. That is, the operator puts one hand into the opening of the hatch 20a to remove the fastening means 63 such as a screw so that the fixing of the front-side flange 59 by the front-side bracket 71 is released,:and the binding between the pin 79 and the round hole portion 80 is released to remove the back-side flange 60 from the back-side bracket 72.

Next, the electric heater 5 is detached along the guide shaft 73 in the direction reversed to the mounting operation of the electric heater 5. At this time, the front-side and backside recess portions 62 and 65 of the pair of front-side and back-side flanges 59 and 60 can be pulled out in the state as to be fitted in the guide shaft 73, and therefore, the operator can pull out the electric heater 5 by one hand even if the weight of the electric heater 5 is heavy. From the foregoing, the detaching operation of the electric heater 5 from the heater mounting device 6 is completed.

An operation (function) of the cooling apparatus 14 according to this embodiment will be briefly described with reference to FIGS. 46 to 51.

When the temperature in the closed space 15 of the housing 13 is higher than the lower limit temperature (e.g., 0° C.), the supply of the electricity to the electric motor 32 for two upper-side centrifugal blowers 22 and the electric motor 35 for two lower-side centrifugal type blowers 23 is started, and the centrifugal type fans 31 and 34 start to operate. In this way, a flow of high-temperature air (clean inside air not containing foreign material such as dust or water, internal fluid) circulates in the closed space 15 (high-temperature-side heat transfer space 17) in the housing 13. Further, a flow of low-temperature air (foul outside air containing foreign material such as dust or water, external fluid) circulates in the low- temperature-side heat transfer space 18 outside the housing 13.

In the cooling unit 3 mounted while being in the state as to pass through the fluid separating plate 2 of the housing 13, the refrigerant sealed into each cooling tube 4a of the high-temperature-side heat exchanger 3a receives heat transmitted by the high temperature air through the heat receiving fin 6a and becomes boiled and vaporized, as shown in FIG. 51. The vaporized refrigerant passes through the high-temperature-side upper end tank 28a and the first connection pipe 9a and becomes condensed and liquefied on the inner wall surface at the condensing portion 8 provided on the low temperature-side heat exchanger 3b which is exposed to the low temperature air to be a low temperature, and the condensed latent heat is transmitted to the low temperature air through the radiating fin 6b.

The refrigerant condensed and liquefied at the condensing portion 8 is transmitted to the inner wall surface of each cooling tube 4b due to its own weight and transmitted to the low temperature-side lower tank 29b and the second connection pipe 9b and drops on the boiling portion 7 provided on the high temperature-side heat exchanger 3a. As described above, the refrigerants sealed into the cooling tubes 4a and 4b alternately repeat the boiling and vaporization, and condensation and liquefaction. In this way, the heat of high temperature air is moved to the low temperature air, and it is possible to radiate the heat generated in the electronic parts 11 and 12 at the multi-stage cooling unit 3.

Accordingly, the electronic parts 11, 12 can be cooled without the mixture of the high-temperature air (clean air in the housing 13) which circulates in the high temperature-side heat transfer space 17 of the closed space 15 and the low-temperature air (foul air outside the housing 13) which circulates in the low-temperature-side heat transfer space 18.

In the case where the temperature in the closed space 15 of the housing 13 is lower than the lower limit temperature (e.g., 0° C.), the electricity is supplied to the electric heater 5 and heats air flowing through the high-temperature-side heat transfer space 17 in order to prevent the defective operation of the electronic parts 11 and 12. At this time, the two upper-side centrifugal blowers 22 remain stopped.

On the other hand, the high temperature air in the closed space 15 of the housing 13 flows into the cooling apparatus 14 from the electronic part accommodating space 16 for accommodating the electronic parts 11 and 12 therein and from the high temperature suction port 27a formed in the back-side partition plate 27 of the casing 20. The high temperature air having flowed into the cooling apparatus 14 passes through the narrow passage surrounded by the fluid separating plate 2 and the back-side partition plate 27 and thereafter passes through the high-temperature-side heat exchanger 3a. That is, the high- temperature air passes between the plurality of cooling tubes 4a, and the heat is received by the heat receiving fin 6a.

When the high-temperature air passes through the narrow flow passage, the flow velocity of the high-temperature air increases. When the electric heater 5 provided with a plurality of plate fins 57 and 58 of fine fin pitch is installed in the narrow flow passage, the pressure loss increases so as to lower the circulating air amount of the high-temperature air, and the a radiating performance of the electric heater 5 lowers.

In order to overcome such inconveniences as noted above, in this embodiment, the electric heater 5 (the electric heating device 24) is installed at the downstream side of the high temperature-side heat exchanger 3a of the cooling unit 3 through which high temperature air circulates, as shown in FIG. 47. In this way, the pressure loss in the closed space 15 (particularly, the high-temperature-side heat transfer space 17) in the housing 13 can be greatly reduced.

An effect of this embodiment will be described.

As described above, in this embodiment, a plurality of plate fins 57 and 58 formed from thin sheet members are disposed on the electric heater 5 to secure a heat transfer area; however, since the fin pitch is extremely dense (fine), when the flow velocity of the air is high, the pressure loss increases so that the circulating air amount of the ventilation system reduces, and the radiating performance of the electric heater 5 deteriorates.

On the other hand, since an effective heat-exchange area of the high-temperature-side heat exchanger 3a is large, the flow velocity of the high-temperature air lowers at the downstream side of the high-temperature-side heat exchanger 3a. Therefore, in this embodiment, the electric heater 5 is installed at the downstream side of the high-temperature-side heat exchanger 3a of the cooling unit 3 through which high-temperature air circulates. In this way, the pressure loss in the housing 13 (the high temperature-side heat transfer space 17) can be greatly reduced to prevent the radiating performance of the electric heater 5 from being deteriorated. In this way, the temperature in the closed space 15 in the housing 13 can be maintained at an optimum value.

Further, in this embodiment, the mounting operation for mounting the electric heater 5 to the heater mounting device 6 and the detaching operation for detaching the electric heater 5 from the heater mounting device 6 can be performed extremely simply. The pin 79 of the back-side bracket 72 of the heater mounting device 6 is inserted into the round hole portion 80 of the back-side flange 60 of the electric heater 5 so as to restrain in the direction vertical to the axial direction of the guide shaft 73, thus providing a construction which is superior in anti-vibration.

In this embodiment, the cooling apparatus 14 is provided with the heat exchanger device 21 having the cooling units 3 disposed in plural stages in a flow direction of air in which the high-temperature-side heat exchanger 3a forming the boiling portion 7 and the low-temperature-side heat exchanger 3b forming the condensing portion 8 are annularly connected by two first and second connection pipes 9a and 9b. With this construction, the circulating flow of refrigerant is formed in each cooling unit 3 to prevent the collision between the vaporized refrigerant (boiled vapor) and the liquid refrigerant (condensed liquid), thus further improving the radiating performance (cooling performance) of a single cooling unit 3. Since such cooling units 3 are disposed in plural stages, the radiating performance (cooling performance) of the cooling units 3 of the heat exchange device 21 can be further improved.

Modifications of the sixteenth embodiment will be described.

The cooling apparatus 14 provided with the heat exchanger device 21 according to this embodiment is utilized in the case where the heating elements such as the electronic parts 11 and 12 need be accommodated in the closed space. The case where the heating elements need be accommodated in the closed space includes the case where heating elements are used under the severe environmental condition containing, for example, oil, water, iron powder, corrosive gases, etc., the case where inactive gases (helium gas, argon gas, etc.) are used to prevent arcing or oxidation of contacts at the time of electric intermittence, or the case where gases harmful to the human body (for example, such as hydrogen fluoride decomposed from fluorocarbon) are prevented from leaking outside.

In this embodiment, a multiflow pass type heat exchanger having corrugating fin tubs is used as the cooling unit 3, the high temperature-side heat exchanger 3a and the low temperature-side heat exchanger 3b; however, a heat exchanger having plate fin tubes, a heat exchanger having fine pin-fin tubes, a heat exchanger of a serpentine type having flat tubes bent in a zigzag manner, and a heat exchanger of a drawn-cup type having a plurality of laminated cooling tubes in which two pressed plates are connected to each other, may be used as the cooling unit 3, the high-temperature-side heat exchanger 3a and the low temperature-side heat exchanger 3b. Slit fins or louver fins may be used as the heat receiving fin 6a or the radiating fin 6b.

In this embodiment, high-temperature gas such as high-temperature air, heated by heating elements such as the electronic parts 11 and 12 is used as air in the housing 13 and high-temperature fluid as fluid in the casing (inside air); however, cooling water for cooling the heating elements such as the electronic parts 11 and 12 and high-temperature liquid such as oil (including working oil and lubricating oil) may be used as a high-temperature fluid. In the same manner, not only low-temperature gas such as low temperature air but also low-temperature liquid such as water and oil may be used as air outside the housing and low temperature fluid (outside air) which is fluid outside the casing. In these cases, pumps are used as the inside fluid circulating means and the outside fluid circulating means. As means for actuating the pump, and the centrifugal fans 31 and 34, not only the electric motors 32 and 33 as in this embodiment but also the internal combustion engine, water mill, or windmill may be used.

In this embodiment, the electric heater 5 is used as the inside heater; however, there may be employed a fluid type heater core, in which waste heat of the internal combustion engine and heating parts is transmitted to the fluid such as cooling water, and the fluid is heat-exchanged with the high-temperature fluid (internal fluid) to heat the high-temperature fluid. A plurality of plate fins 57 and 58 are used as radiating fins; however, as the radiating fin, a corrugating fin, a fine pin fin, a slit fin or a louver fin may be used.

A seventeenth embodiment in which a cooling apparatus provided with a heat exchanger is incorporated into an electronic equipment apparatus will be described with reference to FIGS. 56 to 61.

Figure 56:
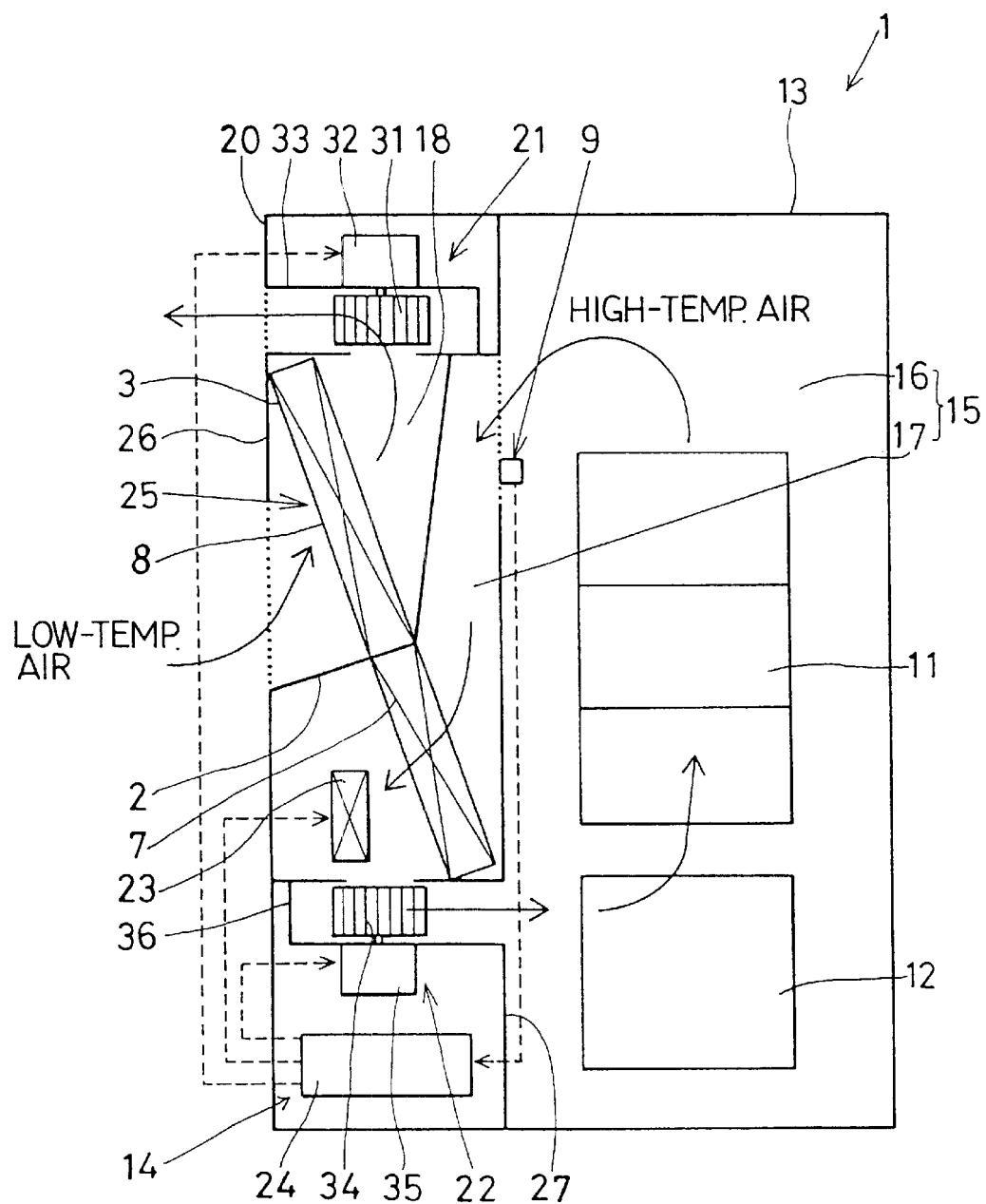
FIG. 56 is a schematic view showing the entire structure of an electronic equipment apparatus according to a seventeenth embodiment.

FIG. 56 is a view showing the entire construction of the electronic apparatus.

An electronic apparatus 1 is a radio base station of a mobile radio telephone, such as a cordless telephone, a car telephone and the like, and includes a housing 13 for hermetically housing electronic parts 11 and 12 therein, and a cooling apparatus (a cooler) 14 incorporated into the housing 13 to cool the electronic parts 11 and 12, and the like.

The electronic part 11 is a heating element which performs a predetermined operation when electricity is supplied thereto and generates heat (for example, a semiconductor switching element constituting a high frequency switching circuit incorporated into a trans-receiver). The electronic part 12 is a heating element which performs a predetermined operation when electricity is supplied thereto and generates heat (for example, a semiconductor amplifying element such as a power transistor incorporated into a power amplifier).

The housing 13 for sealing the interior from the exterior hermetically, defines a closed space 15 therein. This closed space 15 is separated from outside completely hermetically by means of a fluid separating plate or the like of a cooling apparatus 14 described later in order to prevent the performance of the electric parts 11 and 12 from being deteriorated due to the deposition of dust or water to the electronic parts 11 and 12.

The closed space 15 is partitioned into an electronic part accommodating space 16 for accommodating the electronic parts 11 and 12 therein and a high-temperature-side heat transfer space 17 as an inside passage inside the casing by the fluid separating plate of the cooling apparatus 14 and the casing of the cooling apparatus 14. The flow path of the high-temperature-side heat transfer space 17 is narrow on the upwind side, in order to minimize the depth size of the cooling apparatus 14, while the flow path area of the same space on the downwind side is wider. Further, the housing 13 forms a low-temperature-side heat transfer space 18 as an outside passage outside the casing hermetically sealed from the high-temperature-side heat transfer space 17 by the fluid separating plate.

The cooling apparatus 14 includes a casing 20 provided integral with the housing 13, two upper centrifugal blowers 21 for generating an air flow of low-temperature air (external fluid, low-temperature fluid), two lower centrifugal blowers 22 for generating an air flow of high-temperature air (external fluid, high temperature fluid), an electric heater. 23 for maintaining an air temperature in the closed space 15 at a level not lower than a lower limit temperature (e.g., 0° C.), a controller 24 for controlling the supply of electricity for the electric devices of the cooling apparatus 14, and a heat exchanger 25 for maintaining the air temperature in the closed space 15 at a level not higher than an upper limit temperature (e.g., 65° C.), etc.

The casing 20 includes an outer wall plate 26 disposed at the outermost side of the electronic apparatus 1, and a rear partitioning plate 27 for surrounding the high-temperature-side heat transfer space 17. These outer wall plate 26 an the rear partitioning plate 27 are secured to the housing 13 by bonding, e.g., a spot welding, or by using fastening means such as screws or bolts.

The two upper centrifugal blowers 21 include a centrifugal fan 31 for generating an air flow in the low-temperature-side heat transfer space 18, an electric motor 32 for rotating the centrifugal fan 31, and a scroll casing 33 for rotatably housing the centrifugal fan 31 therein.

The two lower centrifugal blowers 22 include a centrifugal fan 34 for generating an air flow in the high temperature-side heat transfer space 17, an electric motor 35 for rotating the centrifugal fan 34, and a scroll casing 36 for rotatable housing the centrifugal fan 34 therein.

The electric heater 23 is internal fluid heating means for heating air flowing through the high temperature-side heat transfer means 17 so that the temperature in the closed space 15 is higher than the lower limit temperature since the performance of the electronic parts (e.g., semiconductors) 11 and 12 when the temperature in the closed space 15 is lower than the lower limit temperature (0° C.).

The controller 24 is for controlling the electric devices such as the electric motor 32, two lower centrifugal blowers 21, the electric motor 35 of two lower centrifugal blowers 22, and the electric motor 23.

The controller 24 controls such that two upper centrifugal blowers 21 and two lower centrifugal blowers 22 operate in a Hi mode (large air amount) and a Lo mode (small air amount) when the temperature in the closed space 15 is higher than the lower limit temperature (e.g., 0° C.) to turn OFF the electric heater 23. When the temperature in the closed space 15 is lower than the lower limit (e.g., 0° C.), the controller 24 turns OFF the electric motor 32 of two upper centrifugal blowers 21, the electric motor 35 of two lower centrifugal blowers 22 operates in Hi mode (large air amount) or the electric motor 35 of two lower centrifugal blowers 22 operates in Lo mode (small air amount) to turn OFF the electric heater 23.

Figure 57A:
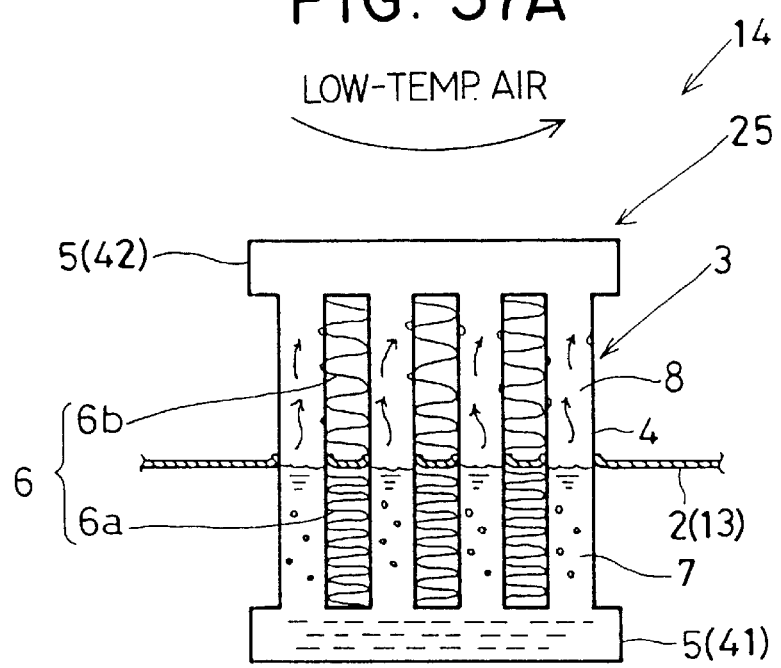
FIG. 57A is a sectional view showing a schematic structure of a heat exchanger of a cooling apparatus.
Figure 57B:
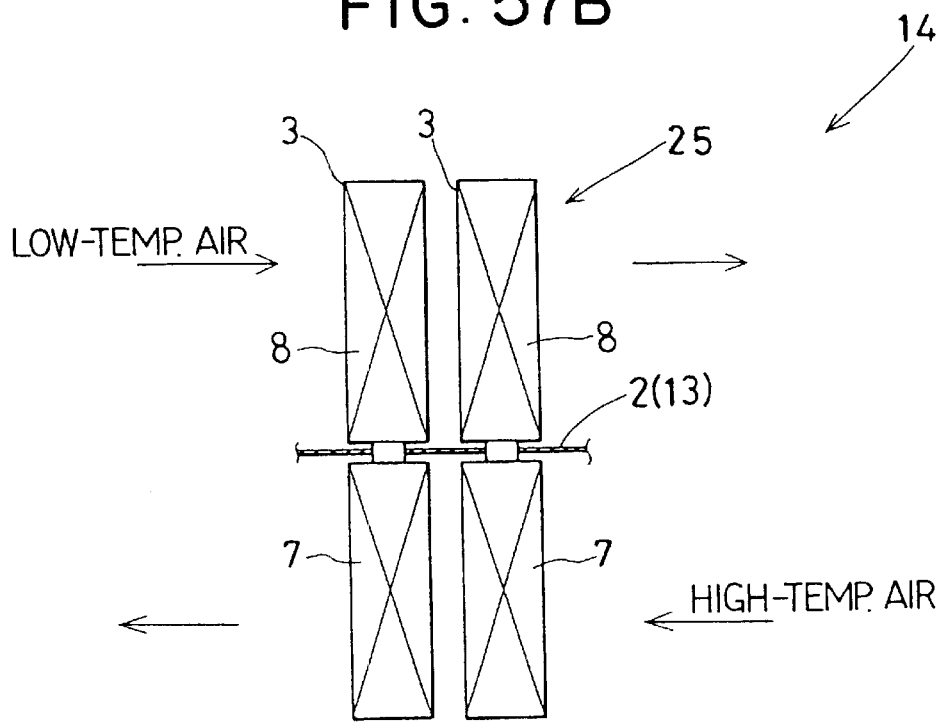
FIG. 57B is a schematic view showing a schematic structure-of a heat exchanger of a cooling apparatus according to the seventeenth embodiment.
Figure 58:
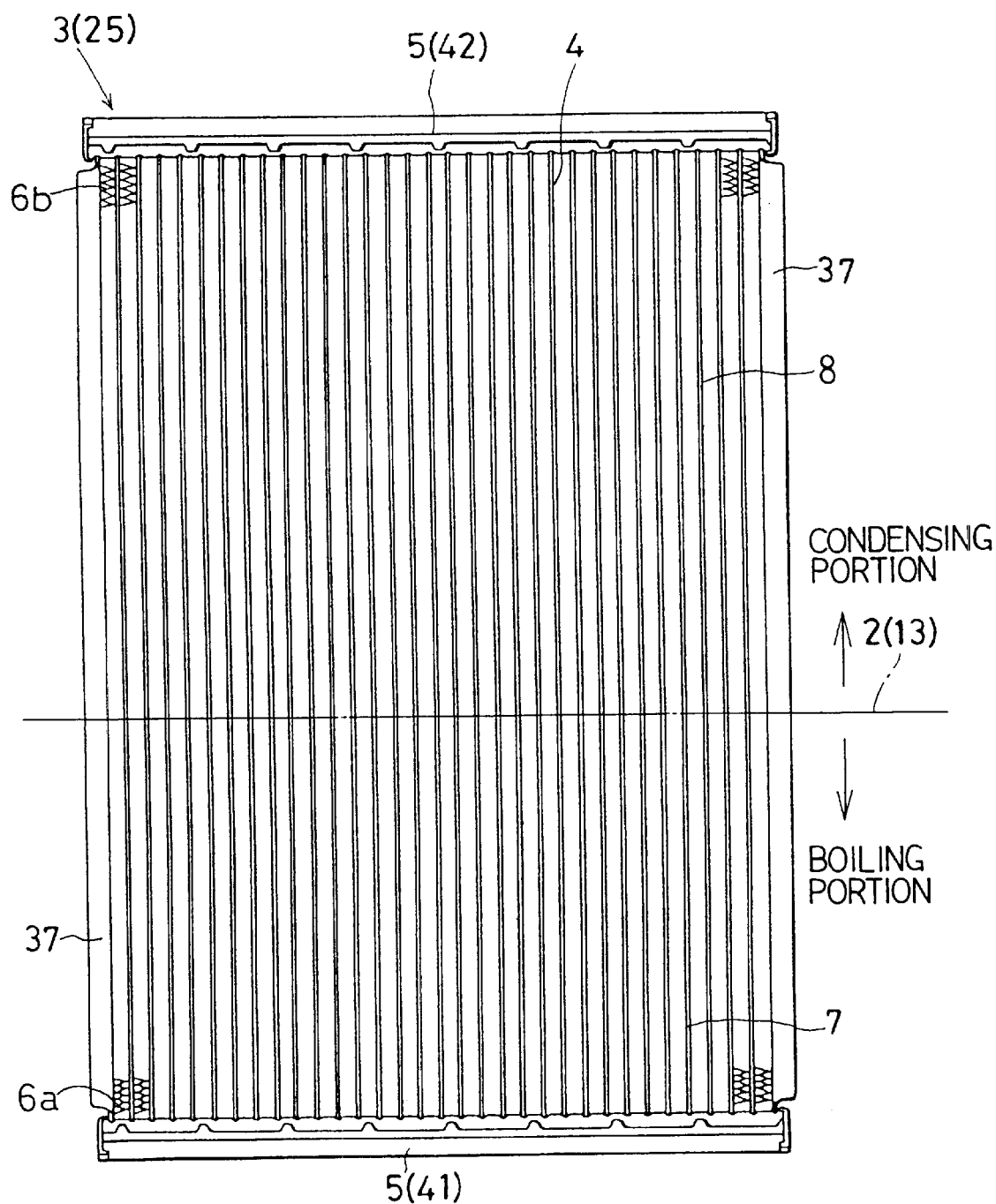
FIG. 58 is a front view showing a detailed structure of a cooler according to the seventeenth embodiment.

The heat exchanger 25 provided with the cooling unit will be described in detail with reference to FIGS. 56 to 60. FIG. 57A is a view showing the schematic construction of the cooling apparatus, FIG. 57B is a view showing the heat exchanger with cooling units disposed in plural stages, FIG. 58 is a view showing the detailed construction of the cooling unit, and FIGS. 59 and 60 are views showing the fluid separating plate for dividing the cooling unit into two portions.

The heat exchanger 25 includes a fluid separating plate 2 for hermetically separating high temperature air which is internal air (inside air) circulating in the housing 13 from low-temperature air which is external air (outside air) circulating outside the housing 13, and cooling units 3 mounted on the fluid separating plate 2 in plural (two) stages while being in the state as to pass through the fluid separating plate 2.

The fluid separating plate 2 forms one wall surface (a part of the casing) of the housing 13 constituting one wall surface of the closed space 15, an interior of which is at high temperature, and one wall surface of the low temperature heat transfer 18, an interior of which is at low temperature. The plate 2 is formed from a sheet made of a metal material which is superior in heat conductivity, such as aluminum, and brazed integral with the cooling unit 3 and the casing 20 so as to hermetically define the closed space 15 including the high-temperature-side heat transfer space 17 from the exterior including the low-temperature-side heat transfer space.

Figure 59:
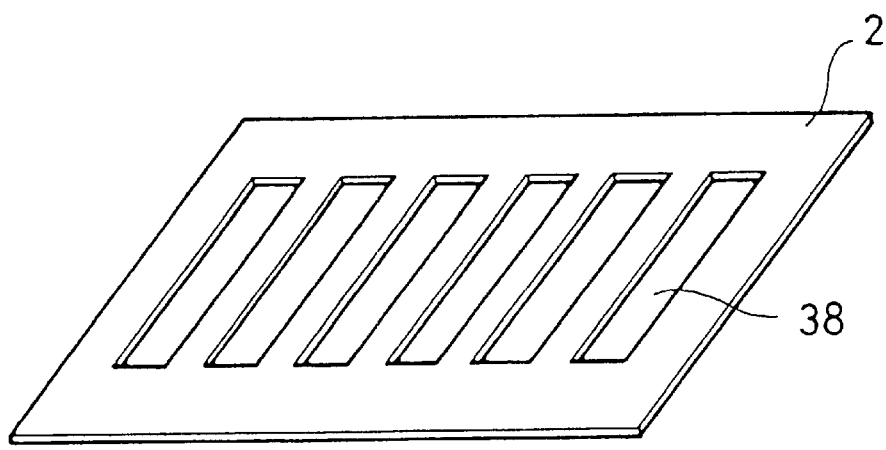
FIG. 59 is a perspective view showing a fluid separating plate for dividing the cooler into two portions according to the seventeenth embodiment.
Figure 60:
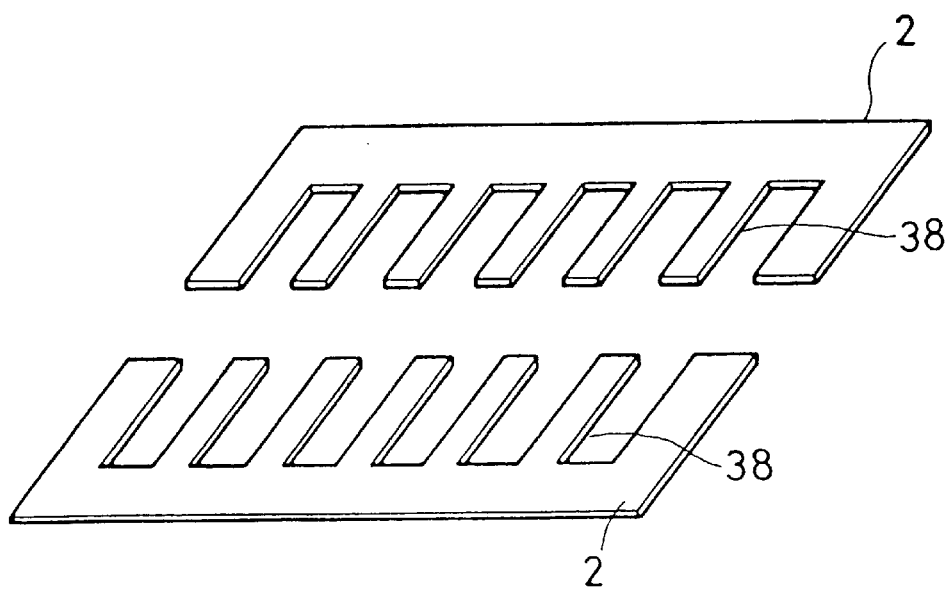
FIG. 60 is a perspective view showing a fluid separating plate for dividing the cooler into two portions according to the seventeenth embodiment.

The fluid separating plate 2 is bored with a plurality of elongated rectangular or oblong through-holes 38 (for example, width is 1.7 mm and length is 16.0 mm) through which cooling tubes of the cooling unit 3 pass at predetermined intervals, as shown in FIG. 59. The fluid separating plate 2 may be a split plate (in this embodiment, divided into two pieces), as shown in FIG. 60.

The cooling unit 3 is a multiflow path type heat exchanger assembled in plural stages while being in a state as to be inclined at a predetermined angle within the casing 20, and includes a plurality of cooling pipes 4 in which a fluorocarbon type or freon type refrigerant is sealed, a pair of connection pipes 5 in communication with the cooling tubes 4, and a plurality of heat transfer fins 6 mounted externally of the cooling tubes 4. To both sides of the cooling unit 3 are connected the fluid separating plate 2 and a side plate 37 which function to fasten the fluid separating plate 2 and the casing 20 by fastening means and also function to reinforce the plurality of cooling tubes and the plurality of heat transfer fins 6. The cooling units 3 are disposed in plural stages (e.g., two stages) in a flowing direction of high-temperature air and low-temperature air.

The plurality of cooling tubes 4 are formed from flat pipes having an elongated rectangular or oblong cross section (for example, width: 1.7 mm, and length: 16.0 mm), which is superior in heat conductivity, such as aluminum, copper or the like, which pass through through-holes 38 of the fluid separating plate 2. The cooling unit 3 composed of these cooling tubes 4 comprises a refrigerant tank (a boiling portion) 7 on one side (lower side in FIG. 58) disposed on the high-temperature-air side from the fluid separating plate 2, and a vaporized refrigerant tank (a condensing portion) on the other side (upper side in FIG. 58) disposed on the low-temperature-air side from the fluid separating plate 2. In this embodiment, the boiling portion 7 and the condensing portion 8 have 360 mm in width (dimension in the width direction), 4.30 mm in height, and 16 mm in thickness.

The connection pipe 5 includes a high-temperature-side tank 41 connected to the lower end of the plurality of cooling tubes 4 (boiling portion 7) and a low-temperature-side tank 42 connected to the upper end of the plurality of cooling tubes 4 (condensing portion 8.), communicating the cooling tubes 4. These high-temperature-side and low-temperature-side tanks 41 and 42 include a core plate provided on the side of the cooling tubes 4 and a substantially U-shaped tank plate connected to the core plate. Either high-temperature-side tank 41 or the low-temperature-side tank 42 is provided with a single refrigerant sealing port (not shown) for sealing a refrigerant into the cooling unit 3. The refrigerant is sealed into the cooling tubes 4 of the cooling unit 3 up to a height at which a liquid level in correspondence with a position of the fluid separating plate 2, that is, to a height of the boiling portion 7. The refrigerant is sealed after the heat transfer fins 6 have been brazed to the cooling tubes 4. The high temperature-side tank 41 need not be provided.

The heat transfer fin 6 includes a heat receiving fin 6a interposed between the cooling tubes 4 adjacent to each other on the high-temperature side (boiling portion 7) of the cooling unit 3, and a radiating fin 6b interposed between the cooling tubes 4 adjacent to each other on the low temperature side (condensing portion 8) of the cooling unit 3. The radiating fin 6 is a corrugated fin formed into a wavy shape by alternately pressing and bending a thin plate (for example, thickness is approximately 0.02 to 0.50 mm) formed of metal material which is superior in heat conductivity, such as aluminum. That is, the outer wall surface of the cooling tube 4 and the radiating fin 6 are connected in a fused state.

The heat receiving fins 6a are disposed below the fluid separating plate 2. The fin pitch P1 is, for example, 2.4 mm, and the fin width B1 is, for example, 16 mm. The fin pitch P1 is preferably, for example, in the range of 1.50 mm to 2.90 mm, more preferably, in the range of 2.00 mm to 2.50 mm. The radiating fins 6b are disposed above the fluid separating plate 2. The fin pitch P2 is, for example, 3.75 mm, and the fin width B2 is, for example, 16 mm. The fin pitch P2 is preferably, for example, in the range of 3.00 mm to 4.50 mm, more preferably, in the range of 3,50 mm to 4.00 mm. That is, the cooling unit 3 has the fin pitch P1 of the heat receiving fin 6a smaller than the fin pitch P2 of the radiating fin 6b by, for example, approximately 50% to 65%.

In the heat exchanger 25, the cooling units 3 are disposed in plural stages in a flowing direction of high-temperature air and low-temperature air so that high-temperature air (clean air in the housing 13) which circulates within the high-temperature-side heat transfer space 17 of the closed space 15 and low-temperature air (foul air outside the housing 13) which circulates within the low-temperature-side heat transfer space 18 flow in opposite direction with each other.

That is, in the heat exchanger 25 including the cooling units 3 in plural stages, the right side portion of the lower end portion (boiling portion 7) of the cooling tubes 4 of the second-stage cooling unit 3 is an inlet of the high-temperature air, and the left side portion of the lower end portion (boiling portion 7) of the cooling tubes 4 of the first-stage cooling unit 3 is an outlet of the high-temperature air. Further, in the heat exchanger 25, the left side portion of the upper end portion (condensing portion 8) of the cooling tubes 4 of the first-stage cooling unit 3 is an inlet of the high-temperature air, and the right side portion of the upper end portion (condensing portion 8) of the cooling tubes 4 of the second-stage cooling unit 3 is an outlet of high-temperature air.

An operation of the cooling apparatus 14 provided with the heat exchanger 25 in which the cooling units 3 of this embodiment are disposed in plural stages so that the high-temperature air and low-temperature air flow in opposite directions will be described hereinafter briefly with reference to FIGS. 57 and 58.

When the temperature in the closed space 15 in the housing 13 is higher than the lower limit temperature (e.g., 0° C.), the electricity is supplied to the electric motor 32 of two upper centrifugal blowers 21 and the electric motor 35 of two lower centrifugal blowers 22, and the centrifugal fans 31 and 34 start to be operated. In this way, a flow of high-temperature air (clean inside air not containing foreign material such as dust or water) circulates in the closed space 15 in the housing 13. Further, a flow of low-temperature air (outside air containing foreign material such as dust or water) circulates in the low-temperature-side heat transfer space 18 outside the housing 13.

In the cooling unit 3 mounted while being in a sate as to pass through the fluid separating plate 2 of the housing 13, the refrigerant sealed into the cooling tubes 4 of the cooling units 3 in plural stages receives heat transmitted from the high-temperature air through the heat receiving fins 6a and is boiled and vaporized as shown in FIG. 57A. The vaporized refrigerant becomes condensed and liquefied on the inner wall surface at the condensing portion 3 provided on the upper end of the cooling unit 3 exposed to the low temperature air and being at a low temperature, and the condensed latent heat is transmitted to the low temperature air through the radiating fins 6b.

The refrigerant condensed and liquefied at the condensing portion 8 drops, due to its own weight, on the boiling portion 7 provided on the lower end side of the cooling unit 3 along the inner wall surface of the cooling unit 4, as shown in FIG. 57A. As described above, by repeating vaporization, condensation and liquefaction of the refrigerant sealed into the cooling tubes 4 of the cooling unit 3 alternately, heat of the high-temperature air moves to the low-temperature air. In this way, heat generated in the electronic parts 11 and 12 is radiated at the cooling units 3 in plural stages.

Thus, the electronic parts 11 and 12 can be cooled without the mixture of the high-temperature air (clean air within the housing 13) which circulates within the high-temperature-side heat transfer space 17 of the closed space 15 and the low-temperature air (foul air outside the housing 13) which circulates within the low-temperature-side heat transfer space 18.

In the cooling unit 3 of this embodiment, since the fin pitch P1 of the heat receiving fins 6a is smaller than the fin pitch P2 of the radiating fins 6b, the heat exchanging effective area of the boiling portion 7 projecting downward from the fluid separating plate 2 (projecting into the housing 13) is smaller than that of the condensing portion 8 projecting upward from the fluid separating plate 2 (projecting outside the housing 13), out of the plurality of the cooling tubes 4; however, the boiling portion 7 can improve the heat exchanging performance as much as a small amount of the fin pitch, and the heat exchanging performance is not lowered even if the heat exchanging effective area of the boiling portion 7 is small.

An effect of this embodiment will be described.

Since the high-temperature side in the cooling unit 3 of this embodiment is hermetically sealed by the housing 13 (fluid separating plate 2), the fin pitch P1 of the heat receiving fins 6a provided on the cooling tubes 4 constituting the boiling portion 7 where no clogging occurs is set smaller than the fin pitch P2 of the radiating fins 6b provided on the cooling tubes 4 constituting the condensing portion 8 exposed to outside air containing foreign material such as dust or water.

In this way, as compared with the case where the fin pitch on the high-temperature side (inside air side) of the fluid separating plate 2 is the same as that on the low-temperature side (outside air side), the fin pitch P1 of the boiling portion 7 is set smaller than the fin pitch P2 of the condensing portion 8 to improve the cooling performance of high-temperature air. Further, the vertical dimension of the heat receiving fins 6a can be reduced to be shorter than that of the radiating fins 6b by the amount in which the fin pitch P1 is reduced. In this way, the vertical dimension (radiating effective area) of the boiling portion 7 of the plurality of cooling tubes 4 can be reduced, and the whole of the cooling unit 3 and cooling apparatus 14 can be downsized.

The features of the heat exchangers in which the cooling units 3 are disposed in plural stages in a flowing direction of high-temperature air and low-temperature air will be described hereinafter with reference to FIGS. 61A and 61B.

Figures 61A, 61B:
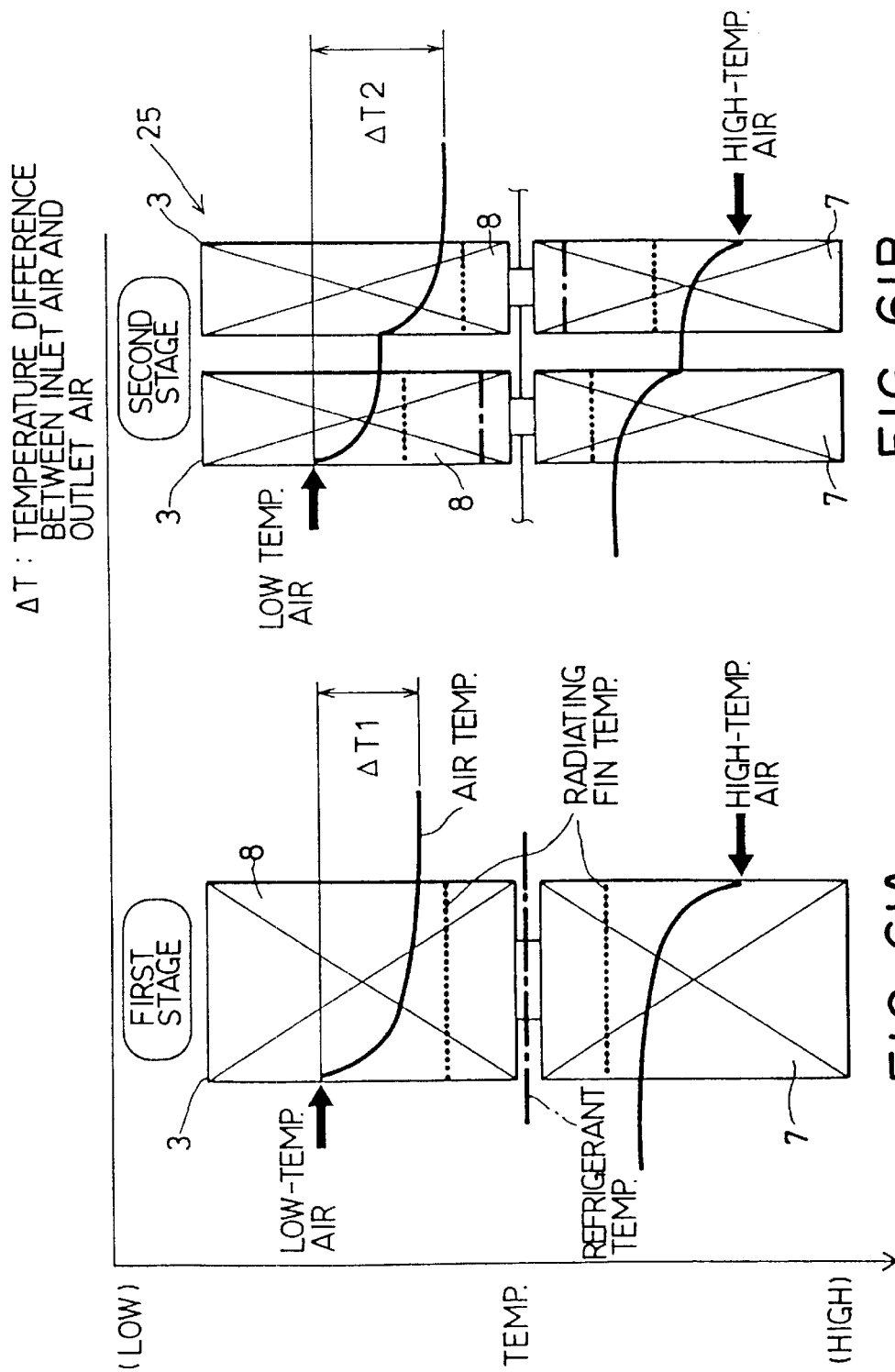
FIG. 61A is a schematic view showing the temperature distribution in flowing directions of air and refrigerant according to prior art.
FIG. 61B is a schematic view showing the temperature distribution in flowing directions of air and refrigerant according to the seventeenth embodiment.

FIGS. 61A and 61B are respectively schematic views showing the temperature distribution in the direction of flow passage of air and the temperature distribution in the direction of flow passage of refrigerant in the case where the cooling unit(s) 3 are of a single stage (one stage) and plural stages (two stages). In the schematic views, the axis of ordinates indicates the temperature (the lower, the higher temperature) and the axis of abscissae indicates the flow direction of the fluid (air).

In the case of the heat exchanger in which the cooling unit 3 is of the single stage (one stage), as shown in FIG. 51A, the high-temperature air flows from the right side (shown) of the lower stage cooling unit (boiling portion 7). After the temperature of the high-temperature air lowers as the heat is radiated to the upper stage cooling unit (condensing portion 8), the high-temperature air (cooled high-temperature air) flows out left side (shown) of the cooling unit 3. Further, in the case of the heat exchanger in which the cooling unit 3 is of the single stage (one stage), as shown in FIG. 61A, the low-temperature air flows in from the left side (shown) of the upper stage cooling unit (condensing portion 8), and the temperature of the high-temperature air rises as the heat is received from the cooling unit, and the high-temperature air flows out right side (shown) of the cooling unit 3.

Assuming that a temperature difference between inlet air and outlet air of the condensing portion 8 of the cooling unit 3 is ΔT1, since a heat exchanging medium heat-exchanged with the refrigerant sealed into the cooling unit 3 is air, the low-temperature air is rapidly heated by the radiating fins 6b of the cooling unit 3, and the temperature of the low-temperature air rapidly rises at the inlet; however the low-temperature air becomes in a saturated state, so that the temperature difference ΔT (cooling performance) does not become so large.

On the other hand, in the case of the heat exchanger 25 in which the cooling units 3 are disposed in plural stages (as in the seventeenth embodiment), as shown in FIG. 61B, heat exchanging between the refrigerant sealed into the cooling unit 3 and air can be performed at least in two stages in the flowing direction of the air. At this time, since there is a temperature difference (a temperature difference between radiating fins, a temperature difference between heat receiving fins) as indicated by broken lines between the refrigerant sealed into the first stage cooling unit 3 and the refrigerant sealed into the second stage cooling unit 3, the temperature further rises in the vicinity of the inlet of the second stage cooling unit 3 after the low-temperature air has been a saturated temperature in the middle of the condensing portion 8 of the first stage cooling unit 3, whereas the temperature further lowers in the vicinity of the inlet of the first stage cooling unit 3 after the high-temperature has been a saturated temperature in the middle of the boiling portion 7 of the second stage cooling unit 3, as shown in FIG. 61B.

Accordingly, since a temperature difference ΔT2 in the case of this embodiment (the heat exchanger 25 with the cooling units 3 disposed multistage) can be set larger than the temperature difference Δ1 in the case of the heat exchanger with a single stage cooling unit 3, as shown in FIGS. 61A and 61B, the heat of the high-temperature air can be radiated to low-temperature air so that the cooling performance of the high-temperature air can be improved. In this way, since the cooling effect of the electronic parts 11 and 12 can be improved, the electronic parts 11 and 12 can operate stably. Further, in this embodiment, as compared with the radiating performance (cooling performance) equal to that of prior art, the heat exchanging effective area (radiating 27 effective area) of the cooling unit 3 can be reduced, and therefore; the whole of the cooling apparatus 14 provided with the compact heat exchanger 25 can be downsized.

The heat exchanger 25 with the cooling units 3 in plural stages is disposed so that the high-temperature air and the low-temperature air flow in opposite directions with each other. Accordingly, since there can be effectively provided a temperature difference between the temperature (radiating fin temperature, heat receiving fin temperature) of the refrigerant sealed into the first cooling unit 3 and the temperature (radiating fin temperature, heat receiving fin temperature) of the refrigerant sealed into the second cooling unit 3, it is possible to sequentially efficiently increase and decrease the temperature of the low-temperature air and the high-temperature air by using the refrigerant having a temperature difference. In this way, it is possible to further improve the cooling performance and to downsize the whole of the cooling apparatus 14.

In this embodiment, the cooling units 3 in two stages are described; however, if a temperature difference between the air inlet and air outlet of the boiling portion 7 and the condensing portion 8 of the heat exchanger 25 needs to be larger, plural stages being equal to or more than three stages can be employed, an operation and effect of which is similar, and a description thereof will be omitted.

Figure 62:
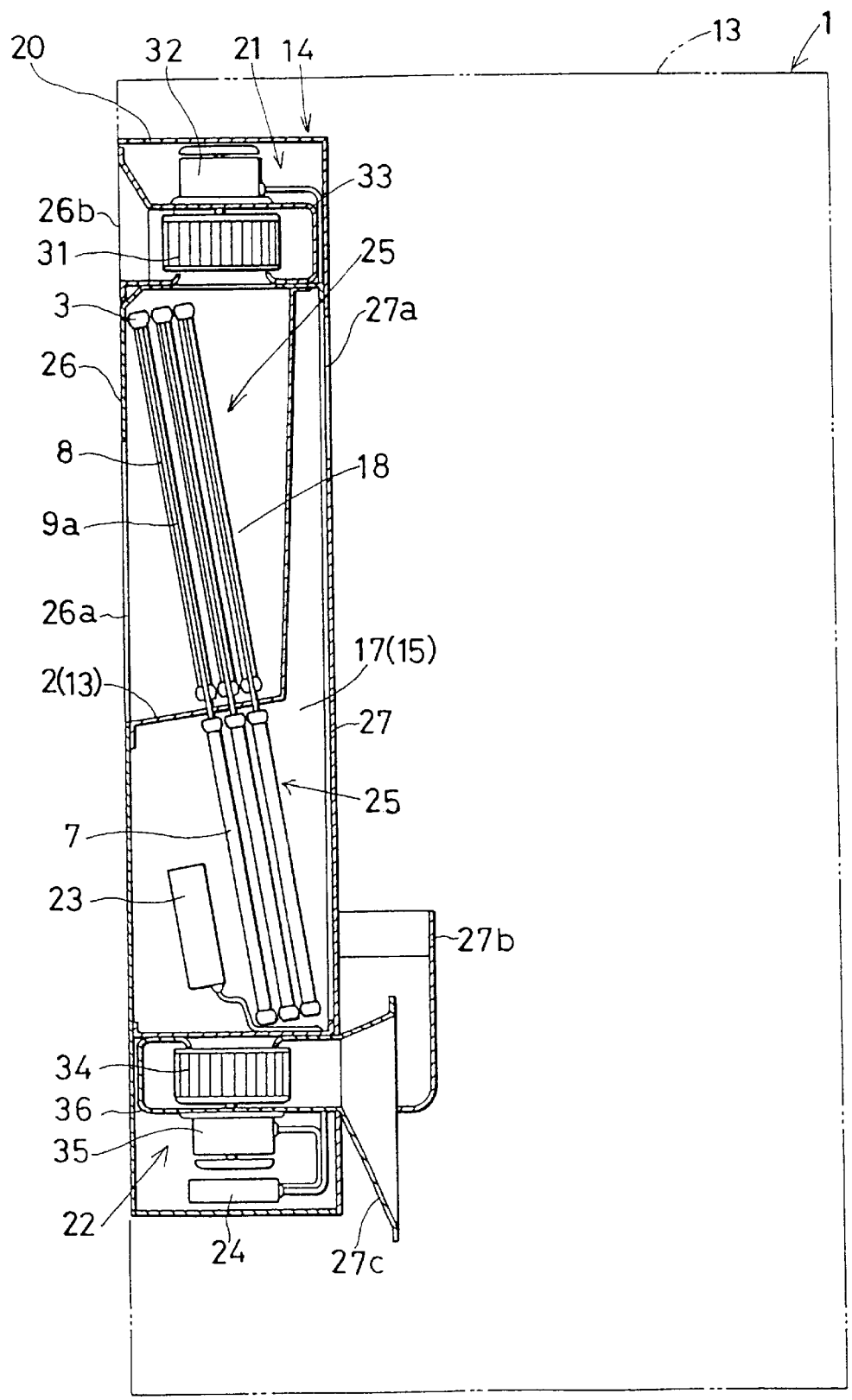
FIG. 62 is a cross sectional view showing a detailed structure of a cooling apparatus according to an eighteenth embodiment.
Figure 65:
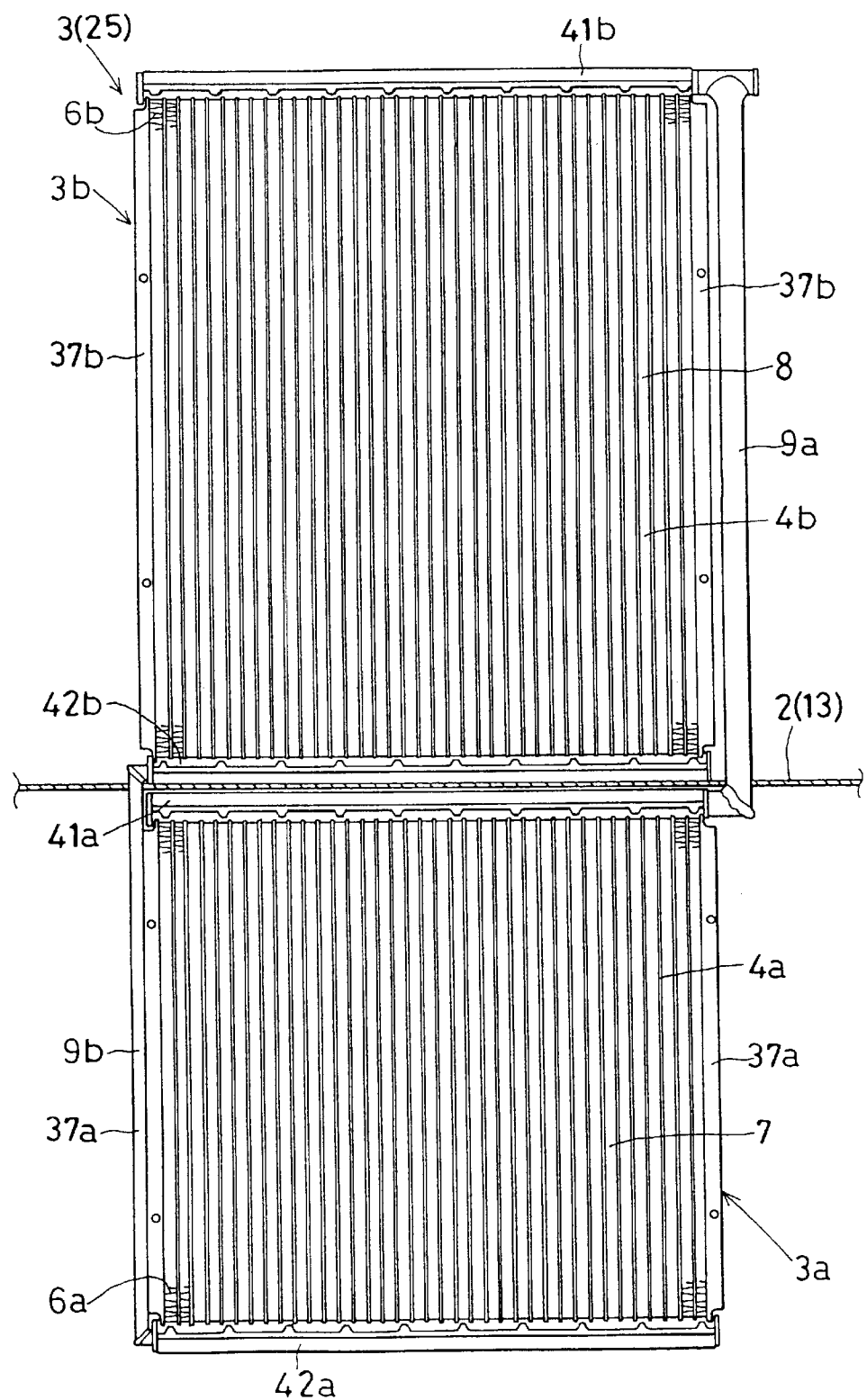
FIG. 65 is a front view showing a detailed structure of a cooler according to the eighteenth embodiment.
Figure 66:
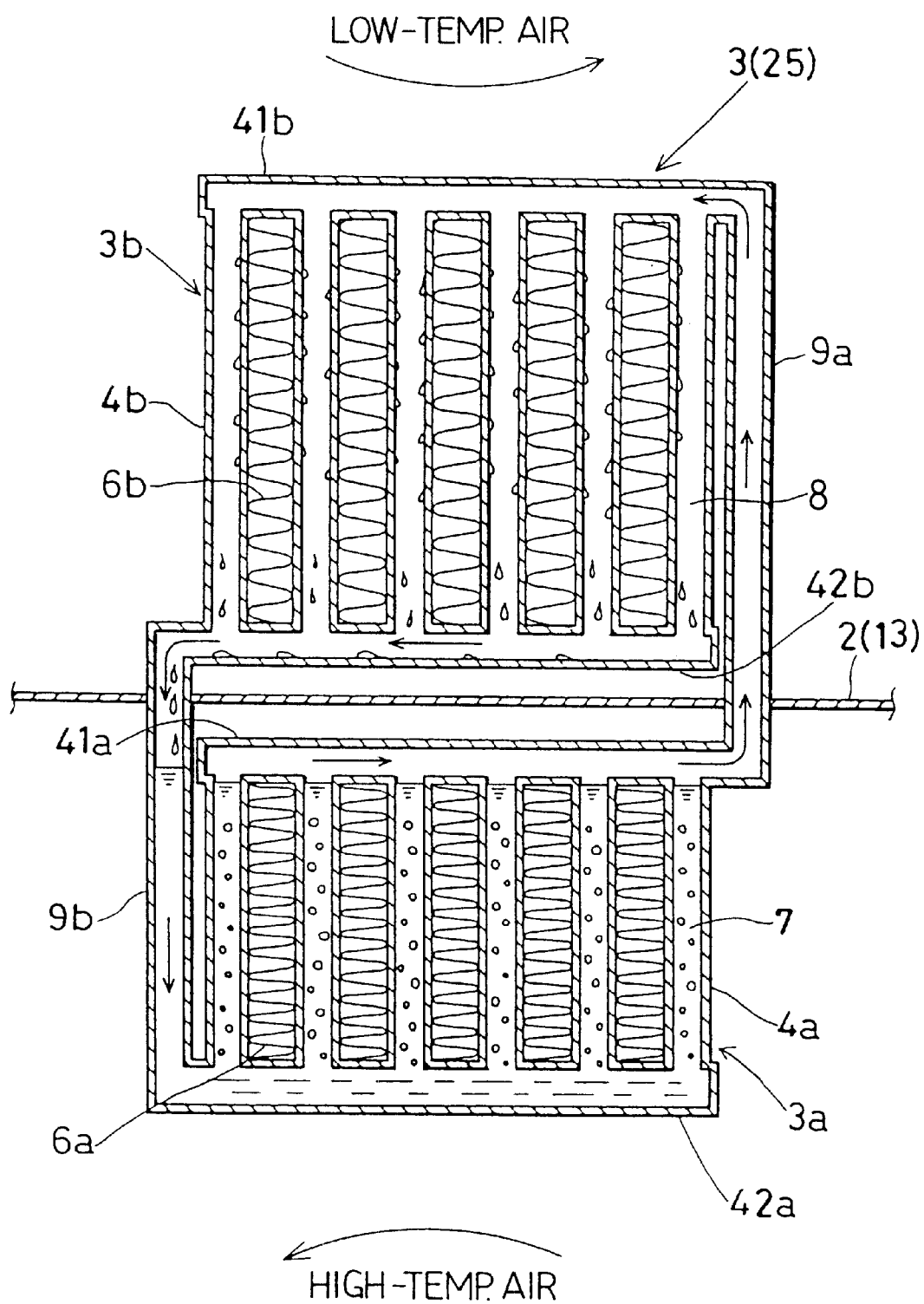
FIG. 66 is a cross sectional view showing a detailed structure of a cooler according to the eighteenth embodiment.

An eighteenth embodiment of the present invention will be described with reference to FIGS. 62 to 66. FIGS. 62 to 64 are views showing the detailed construction of the cooling apparatus incorporated into the electronic apparatus, FIG. 65 is a view showing the detailed construction of the cooling unit, and FIG. 66 is a view showing a schematic construction of the heat exchanger in which cooling units are disposed in plural stages.

The cooling units 3 constituting the heat exchanger 25 according to this embodiment are mounted in plural stages (three stages) while being in a state inclined at a predetermined angle within the casing, which is divided into two pieces, i.e., a high-temperature-side heat exchanger (inside air-side heat exchanger) 3a in which a plurality of cooling tubes 4a constitute a boiling portion 7 and a low-temperature-side heat exchanger (outside air-side heat exchanger) 3b in which a plurality of cooling tubes 4b constitute a condensing portion 8. These high-temperature-side and low-temperature-side heat exchangers 3a and 3b are connected by two refrigerant circulating first and second connection pipes 9a and 9b.

A casing 20 includes an outer wall plate 26 and a rear-side dividing plate 27, similar to the seventeenth embodiment. In the central portion of the outer wall plate 26 is opened a single square low-temperature-side suction port 26a for sucking the low-temperature air (foul outside air containing foreign material such as dust or water) into a low-temperature-side heat transfer space 18 from outside. On the upper side of the outer wall plate 26 are opened two square low-temperature-side discharge port 26b for discharging low-temperature-air to outside from an upper centrifugal blower 21.

On the upper side of the rear side dividing plate 27 is opened a single square high-temperature-side suction port 27a for sucking high-temperature-air (clean inside air not containing foreign material such as dust or water) into a high-temperature-side heat transfer space 17 from an electronic part accommodating space 16. To the lower side of the rear side partition plate 27 are joined, by means of a spot welding or the like, a duct 27b for introducing cooled high-temperature air to an electronic part 11 from one lower side centrifugal blower 22 and a duct 27c for introducing cooled high-temperature air to an electronic part 12 from the other lower side centrifugal blower 22. The ducts 27b and 27c are connected integral with a scroll casing 36 for two lower side centrifugal blowers 22.

The high-temperature-side heat exchanger 3a includes a plurality of cooling tubes 4a, a high-temperature-side upper end tank 41a, a high-temperature-side lower end tank 42a, a heat receiving fin 6a interposed between the cooling tubes 4a adjacent to each other, a side plate 37a, and the like. Since the high-temperature-side heat exchange 3a is disposed within the high-temperature-side heat transfer space 17 sealed from the outside by the housing 13, there is no possibility that the high- temperature-side heat exchanger 3a is exposed to outside air containing foreign material such as dust or water.

The low-temperature-side heat exchanger 3b includes a plurality of cooling tubes 4b, a low-temperature-side upper end tank 41b, a low-temperature-side lower end tank 42b, a radiating fin 6b interposed between the cooling tubes 4b adjacent to each other, a side plate 37b, and the like. The low- temperature-side heat exchanger 3b is disposed so as to be positioned on substantially the same plane as the-high temperature-side heat exchanger 3a within the low- temperature-side heat transfer space 18 exposed to outside air containing foreign material such as dust or water. The low-temperature-side lower end tank 42b may be inclined such that the second connection pipe 9b side is positioned downward.

In the cooling unit 3 according to this embodiment, the fin pitch P1 (for example, 1.50 mm to 2.90 mm, more preferably, 2.00 mm to 2.50 mm, and 2.40 mm in this embodiment) of the heat receiving fin 6a provided on the high-temperature-side heat exchanger 3a is made smaller than the fin pitch P2 (for example, 3.00 mm to 4.00 mm, more preferably, 3.50 mm to 4.00 mm, and 3.75 mm in this embodiment) of the fin pitch P2 of the radiating fin 6 of the low-temperature-side heat exchanger 3b. That is, the cooling unit 3 has the fin pitch P1 of the heat receiving fin 6a smaller than the fin pitch P2 of the radiating fin 6b by, for example, approximately 50% to 65%.

The first connection pipe 9a is a metallic pipe made of the same metal material as that of the cooling tube 4 and is formed to have a circular cross section. The first connection pipe 9a communicates a high-temperature-side upper end tank 41a provided on the upper end of the boiling portion 7 with a lower temperature-side upper end tank provided on the upper end of the condensing portion 8. The first connection pipe 9a is high-to-low temperature guide means for introducing a vaporized refrigerant boiled and vaporized by the boiling portion 7 to the condensing portion 8.

The second connection pipe 9b is a metallic pipe made of the same metal material as that of the first connection pipe 9a and is formed to have a circular cross section. The second connection pipe 9b communicates a low-temperature-side lower end tank 42b provided on the lower end of the condensing portion 8 with a high-temperature-side lower end tank provided on the lower end of the boiling portion 8. The second connection pipe 9b is low-to-high temperature guide means for introducing a liquid refrigerant condensed and liquefied by the condensing portion 8 to the boiling portion 7.

An effect of the eighteenth embodiment of the present invention will be described.

In this embodiment, as compared with the case where the fin pitch on the high-temperature side (inside air-side) of the fluid separating plate 2 is the same as that on the low temperature side (outside air side), the fin pitch P1 of the high-temperature-side heat exchanger 3a is set smaller than the fin pitch P2 of the low-temperature-side heat exchanger 3b to improve the cooling performance of high-temperature air, thus downsizing the whole of the cooling unit 3 and cooling apparatus 14.

This embodiment is provided with the cooling apparatus 14 provided with the heat exchanger 25 in which the cooling units 3 having the boiling portion 7 and the condensing portion 8 annularly connected by two first and second connection pipes 9a, 9b are disposed in plural stages in the flowing direction of the air. With this constitution, a circulating flow of the refrigerant is formed within the cooling unit 3 to prevent a collision between the vaporized refrigerant (boiled vapor) and the liquid refrigerant (condensed liquid). Thus, the radiating performance (cooling performance) of a single cooling unit 3 can be further improved as compared with the seventeenth embodiment. By disposing the cooling units 3 in plural stages as described, the radiating performance (cooling performance) of the heat exchanger 25 can be further improved as compared with the seventeenth embodiment.

A nineteenth embodiment of the present invention will be described with reference to FIG. 67.

Figure 67:
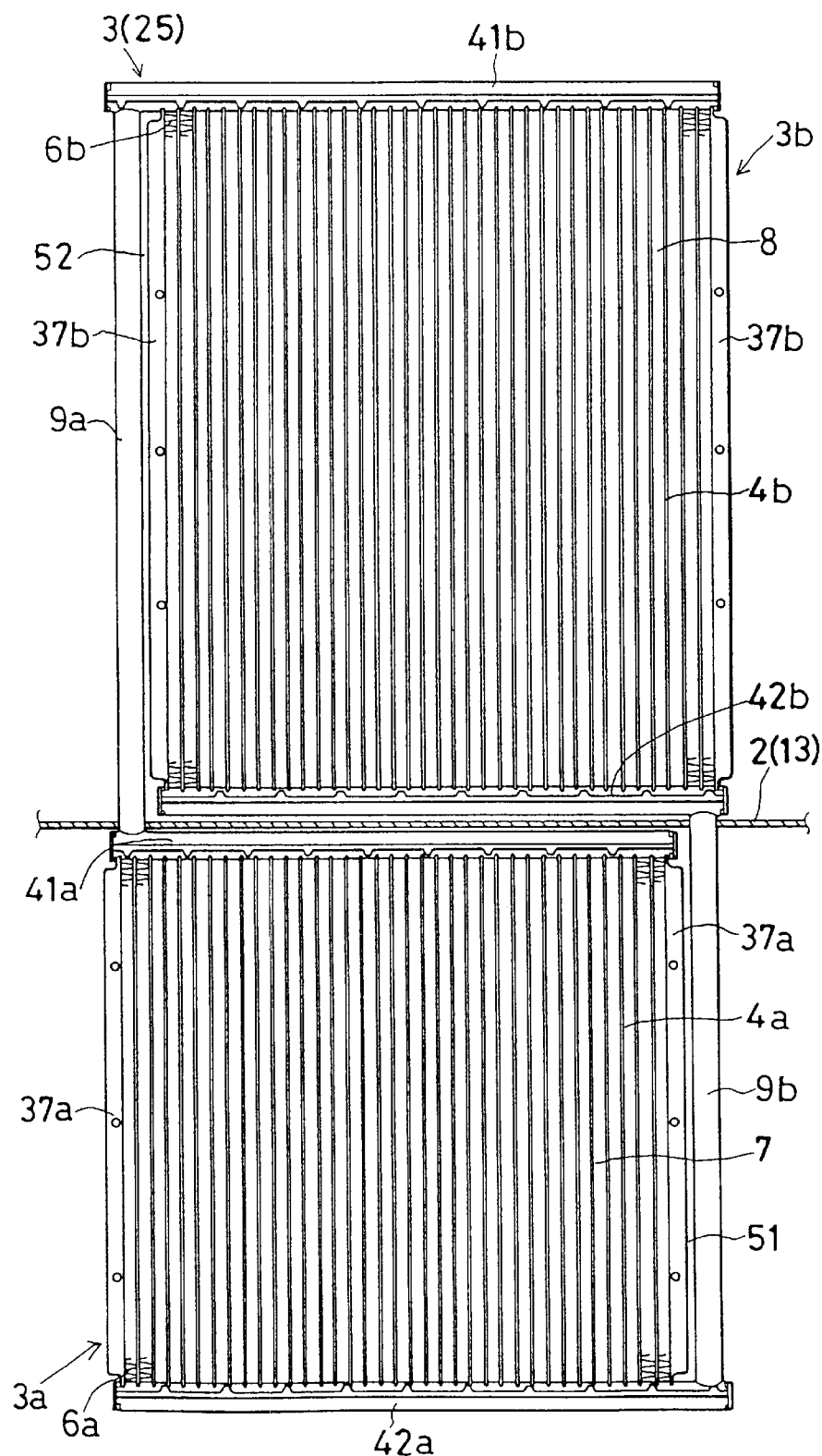
FIG. 67 is a front view showing a detailed structure of a cooler according to nineteenth embodiment.

FIG. 67 shows the detailed construction of the cooling unit.

The cooling units 3 constituting the heat exchanger 25 according to this embodiment are mounted multistage-wise (three stages) in a state inclined at a predetermined angle within the casing, which is divided into two, i.e., a high-temperature-side heat exchanger (inside air side heat exchanger) 3a constituting a boiling portion 7 and a low temperature-side heat exchanger (outside air side heat exchanger) 3b constituting a condensing portion 8, these high temperature-side and low temperature-side heat exchangers 3a, 3b being connected by first and second connection pipes 9a, 9b.

In the cooling unit 3 according to this embodiment, the high-temperature-side heat exchanger 3a and the low-temperature-side heat exchanger 3b are disposed to be deviated from each other on substantially the same plane and on both sides (left and right sides in the figure) in the width direction, as compared with the eighteenth embodiment. Further, refrigerant circulating first and second connection pipes 9a and 9b for annularly connecting the high-temperature-side heat exchanger 3a and the low-temperature-side heat exchanger 3b are disposed on the position-deviated portions 51 and 52.

The first connection pipe 9a is a metallic pipe and communicates a high-temperature-side upper end tank 41a provided on the upper end of the high-temperature-side heat exchanger 3a (boiling portion 7) with a low-temperature-side upper end tank 41b provided on the upper end of the low-temperature-side heat exchanger 3b (condensing portion 8) to introduce a vaporized refrigerant boiled and vaporized in the boiling portion 7 to the condensing portion 8. The second connection pipe 9b is a metallic pipe and communicates a low-temperature-side lower end tank 42b provided on the lower end of the low-temperature-side heat exchanger 3b with a high-temperature-side lower end tank 42a provided on the lower end of the high-temperature-side heat exchanger 3a to introduce a liquid refrigerant condensed and liquefied in the condensing portion 8 to the boiling portion 7.

An effect of the nineteenth embodiment will be described.

In this embodiment, the high-temperature-side heat exchanger 3a and the low-temperature-side heat exchanger 3b are disposed to be deviated from each other on substantially the same plane and on both sides in the width direction, and the refrigerant circulating first and second connection pipes 9a and 9b for connecting the high-temperature-side heat exchanger 3a and the low-temperature-side heat exchanger 3b are disposed on the position-deviated portions 51 and 52. In this way, as compared with the eighteenth embodiment in which the first and second connection pipes 9a and 9b are provided projectingly on both sides (left and right sides in the figure) in the width direction of the cooling unit 3, the side dimension can be reduced by a portion of the pipe projecting portion and the first connection pipe 9a which is a dead space, thus further downsizing the whole of the cooling apparatus 14 provided with a compact cooling unit 3.

Modifications of the seventeenth to nineteenth embodiment will be described.

The cooling apparatus 14 provided with the heat exchanger device 21 according to these embodiments is utilized in the case where the heating elements such as the electronic parts 11 and 12 need be accommodated in the closed space. The case where the heating elements need be accommodated in the closed space includes the case where heating elements are used under the severe environmental condition containing, for example, oil, water, iron powder, corrosive gases, etc., the case where inactive gases (helium gas, argon gas, etc.) are used to prevent arcing or oxidation of contacts at the time of electric intermittence, or the case where gases harmful to the human body (for example, such as hydrogen fluoride decomposed from fluorocarbon) are prevented from leaking outside.

In these embodiments, a multiflow pass type heat exchanger having corrugating fin tubs is used as the cooling unit 3, the high temperature-side heat exchanger 3a and the low temperature-side heat exchanger 3b; however, a heat exchanger having plate fin tubes, a heat exchanger having fine pin-fin tubes, a heat exchanger of a serpentine type having flat tubes bent in a zigzag manner, and a heat exchanger of a drawn-cup type having a plurality of laminated cooling tubes in which two pressed plates are connected to each other, may be used as the cooling unit 3, the high temperature-side heat exchanger 3a and the low temperature-side heat exchanger 3b. Slit fins or louver fins may be used as the heat receiving fin 6a or the radiating fin 6b.

In these embodiments, high-temperature gas such as high-temperature air, heated by heating elements such as the electronic parts 11 and 12 is used as air in the housing 13 and high-temperature fluid as fluid in the casing (inside air); however, cooling water for cooling the heating elements such as the electronic parts 11 and 12 and high-temperature liquid such as oil (including working oil and lubricating oil) may be used as a high-temperature fluid. In the same manner, not only low-temperature gas such as low temperature air but also low-temperature liquid such as water and oil may be used as air outside the housing and low temperature fluid (outside air) which is fluid outside the casing. In these cases, pumps are used as the inside fluid circulating means and the outside fluid circulating means. As means for actuating the pump, and the centrifugal fans 31 and 34, not only the electric motors 32 and 33 as in these embodiments but also the internal combustion engine, water mill, or windmill may be used.

A twentieth embodiment of the present invention will be described.

Figure 68:
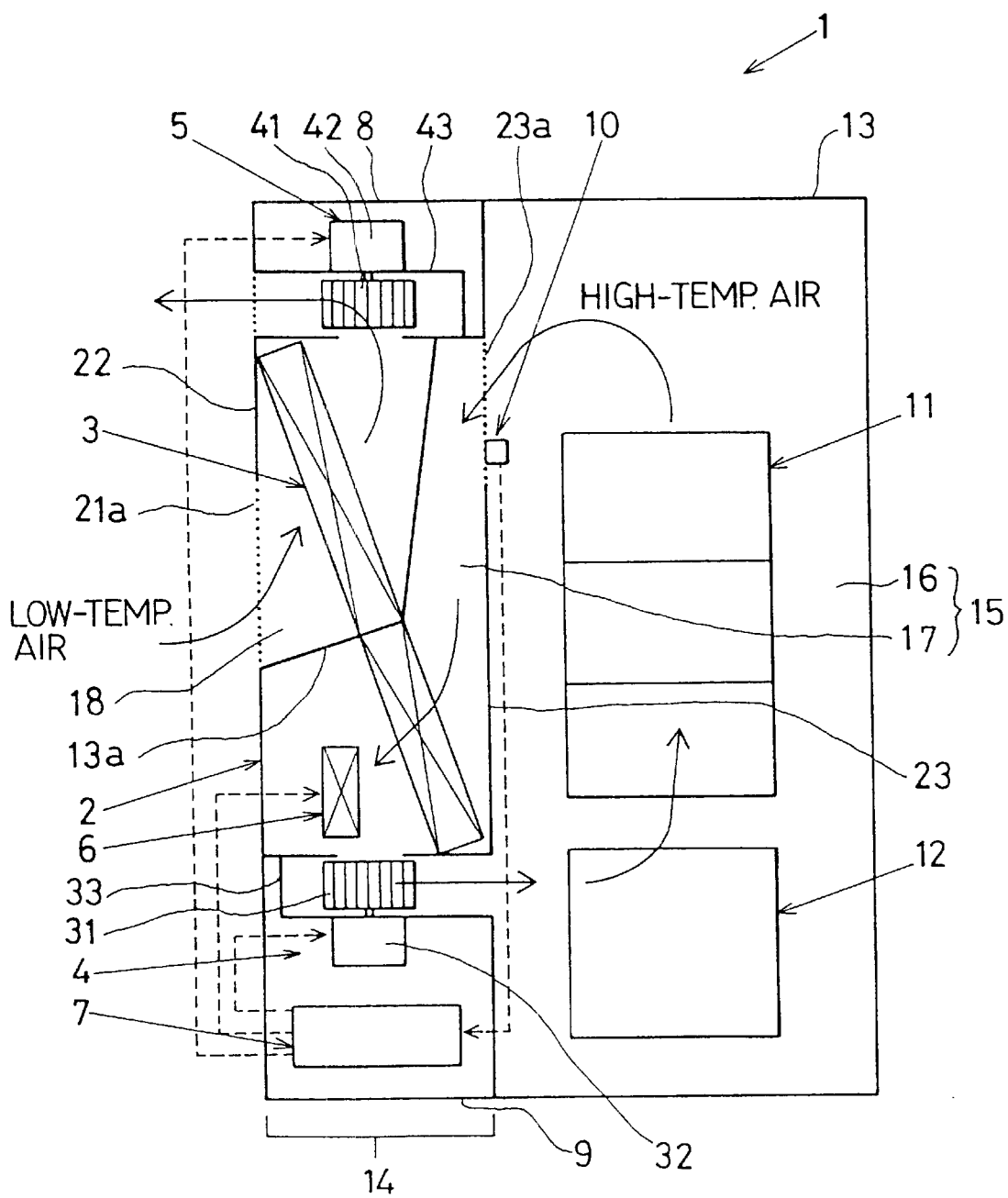
FIG. 68 is a schematic diagram showing the entire structure of an electronic apparatus according to a twentieth embodiment.
Figure 69:
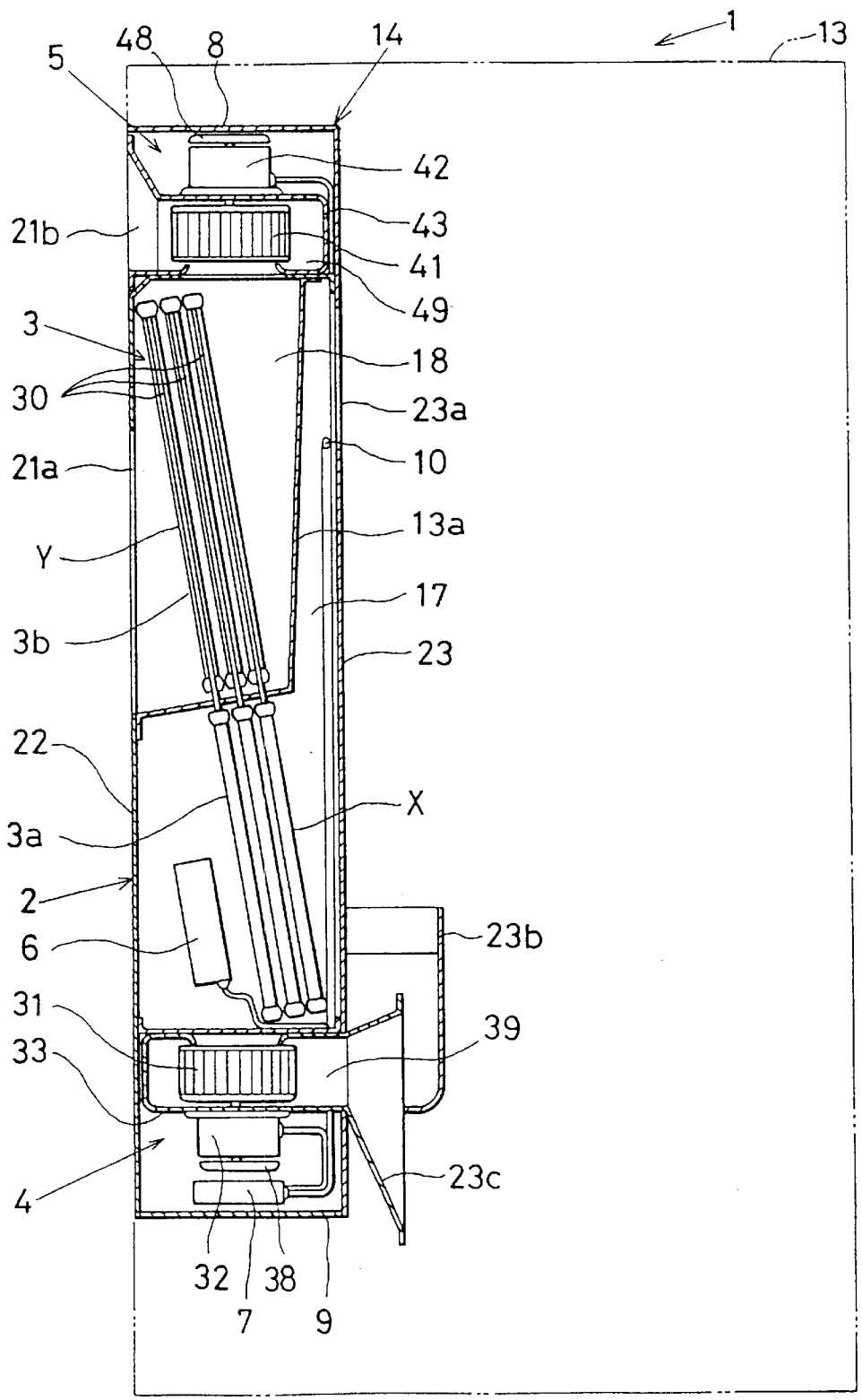
FIG. 69 is a cross sectional view showing a structure of a cooling apparatus according to the twentieth embodiment.
Figure 70:
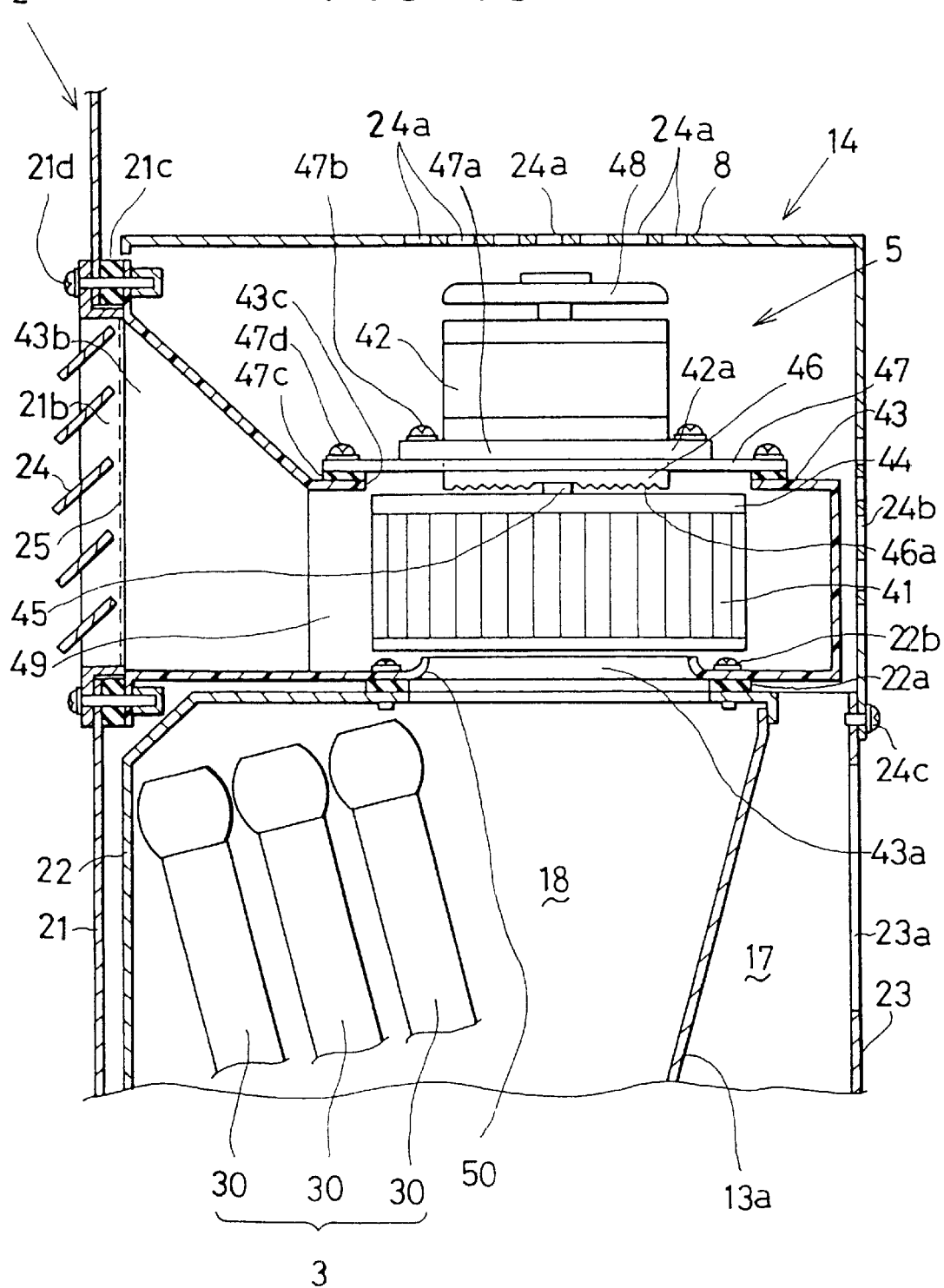
FIG. 70 is a cross sectional view showing an upper structure of the cooling apparatus according to the twentieth embodiment.
Figure 71:
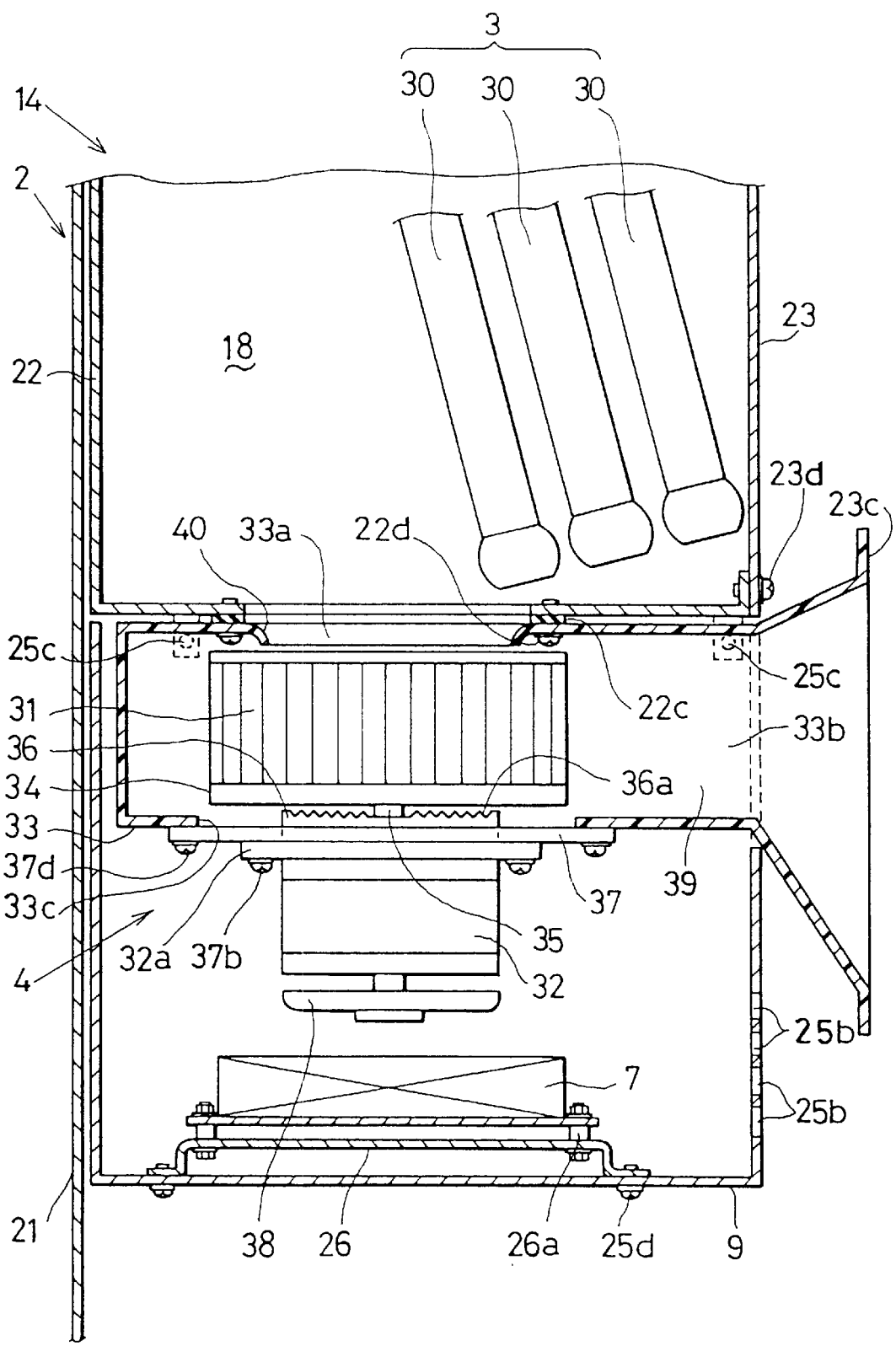
FIG. 71 is a cross sectional view showing a lower structure of the cooling apparatus according to the twentieth embodiment.

FIGS. 68 to 77 illustrate the twentieth embodiment of the present invention, of which FIG. 68 is a diagram showing the entire structure of an electronic apparatus, FIG. 69 is a diagram showing a structure of a cooling apparatus embodying the present invention specifically, FIG. 70 is a diagram showing an upper structure of the cooling apparatus, and FIG. 71 is a diagram showing a lower structure of the cooling apparatus.

An electronic apparatus 1 is an apparatus of a radio base station of a mobile radio telephone such as a cordless telephone or a car telephone. The electronic apparatus 1 includes a housing 13 which receives therein electronic parts 11 and 12 in a hermetically sealed state and a cooling apparatus (cooler) 14 mounted within the housing 13 to cool the electronic parts 11 and 12.

The electronic part 11 is a heat generating element, e.g., a semiconductor switching element constituting a high-frequency switching circuit incorporated in a trans-receiver, which performs a predetermined operation when an electric current is supplied thereto and which generates heat. The electronic part 12 is a heat generating element, e.g., a semiconductor amplifier element such as a power transistor incorporated in a power amplifier, which performs a predetermined operation when an electric current is supplied thereto and which generates heat.

The housing 13, an interior of which is hermetically sealed from the exterior, has a closed space 15 formed in the interior thereof. In order to prevent deterioration in performance of the electronic parts 11 and 12 due to deposition of a foreign material such as dust or water thereon, the closed space 15 is hermetically sealed completely from the exterior by means of a fluid separating plate provided in the cooling apparatus 14 which will be described later.

The sealed space 15 is partitioned, by both fluid separating plate and casing of the cooling apparatus 14, into an electronic parts accommodating space 16 for accommodating the electronic parts 11 and 12 and a high-temperature-side heat transfer space (first heat transfer space) 17 which serves as an inside passage. In the high-temperature-side heat transfer space 17, the flow path area on the upwind side is narrow to decrease the depth of the cooling apparatus 14, and the downward side is wider in flow path area than the upwind side. With the fluid separating plate, the housing 13 further forms a low-temperature-side heat transfer space, which is a second heat transfer space, one heat transfer space, as an outside passage partitioned hermetically from the high-temperature-side heat transfer space 17.

Figure 72:
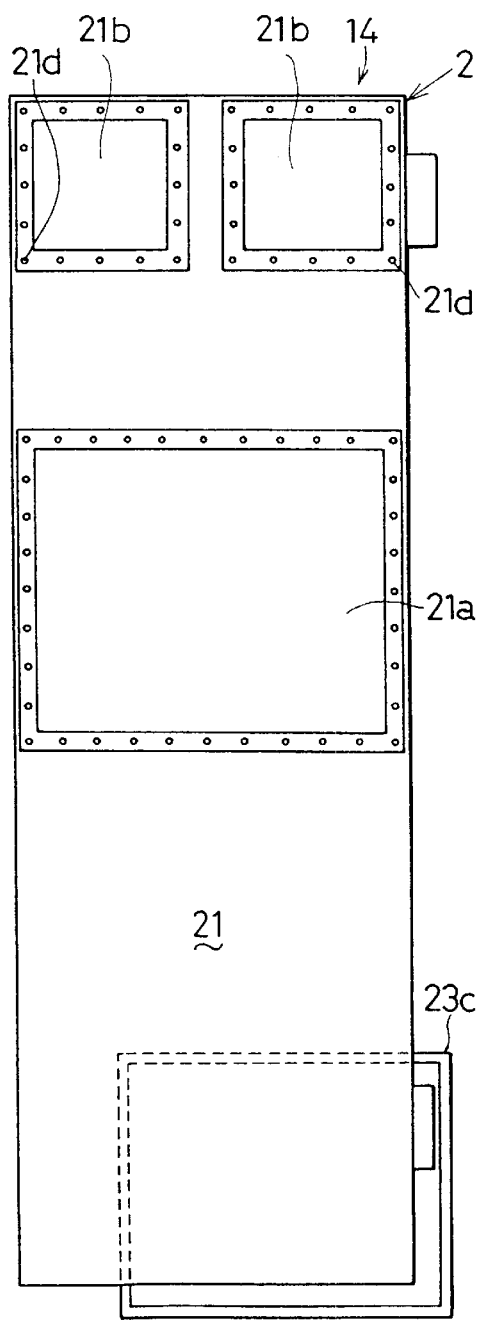
FIG. 72 is a front view showing a concrete structure of the cooling apparatus of the twentieth embodiment.
Figure 73:
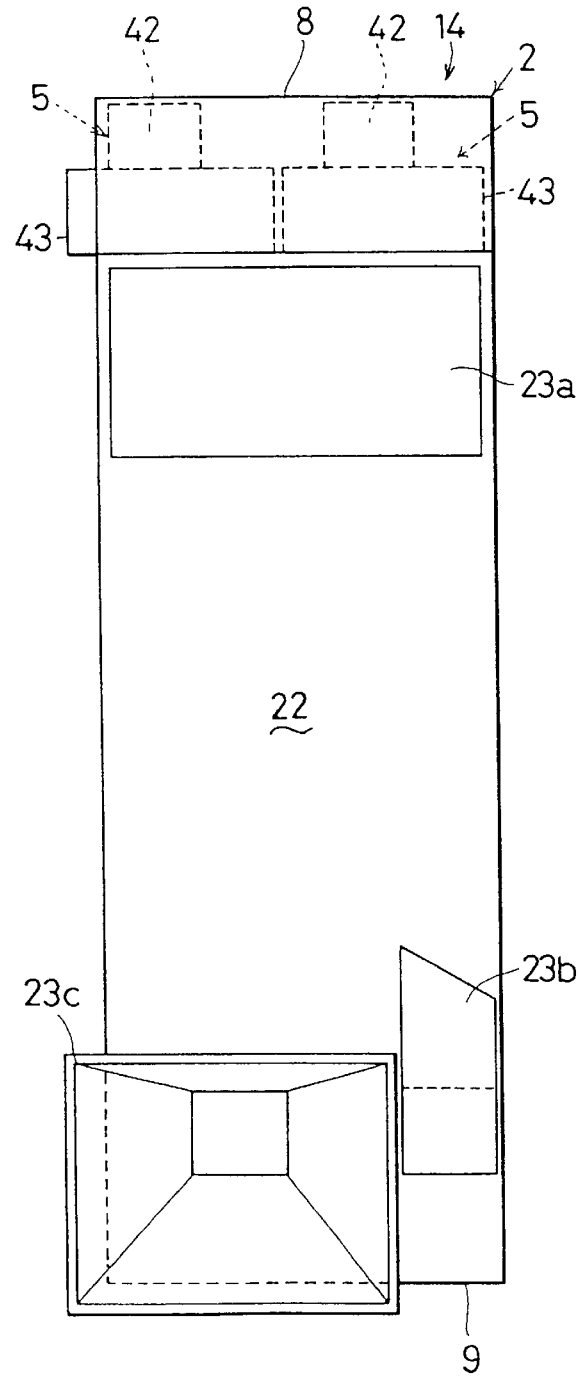
FIG. 73 is a rear view showing a structure of the cooling apparatus according to the twentieth embodiment.

Next, the cooling apparatus 14 will be described below with reference to FIGS. 68 to 74. FIGS. 72 and 73 are diagrams each illustrating a structure of the cooling apparatus 14 specifically.

The cooling apparatus 14 is a cooler for cooling the electronic parts 11 and 12 using semiconductors as heat generating elements.

The cooling apparatus 14 includes a cabinet 2 integral with the housing 13, a heat exchanger 3 for maintaining the air temperature in the closed space 15 at a level not higher than an upper-limit temperature (e.g., 65° C.), two high-temperature-side centrifugal blowers 4 for compulsorily circulating a high-temperature air (high-temperature fluid) which is the inside air, two low-temperature-side centrifugal blowers 5 for compulsorily circulating a low-temperature air (low-temperature fluid) which is outside air, an electric heater 6 for maintaining the air temperature in the closed space 15 at a level not lower than a lower-limit temperature (e.g., 0° C.), and a controller 7 for controlling the supply of electric power to the electric devices used in the cooling apparatus 14.

The cabinet 2 includes a door plate 21 disposed on the outermost side of the electronic apparatus 1, a front partition plate (front plate) 22 attached to the back of the door plate 21, and a rear partition plate (rear plate) 23 which surrounds the high-temperature-side heat transfer space 17. These parts are fixed to the housing 13 by bonding such as a spot welding or by using fastening means such as screws or bolts. On the upper end side of the cabinet 2 is detachably mounted a top fan cover 8 which covers the two low-temperature-side centrifugal blowers 5, while on the lower end side of the cabinet 2 is detachably mounted a bottom fan cover 9 which covers the two high-temperature-side centrifugal blowers 4.

Figure 74:
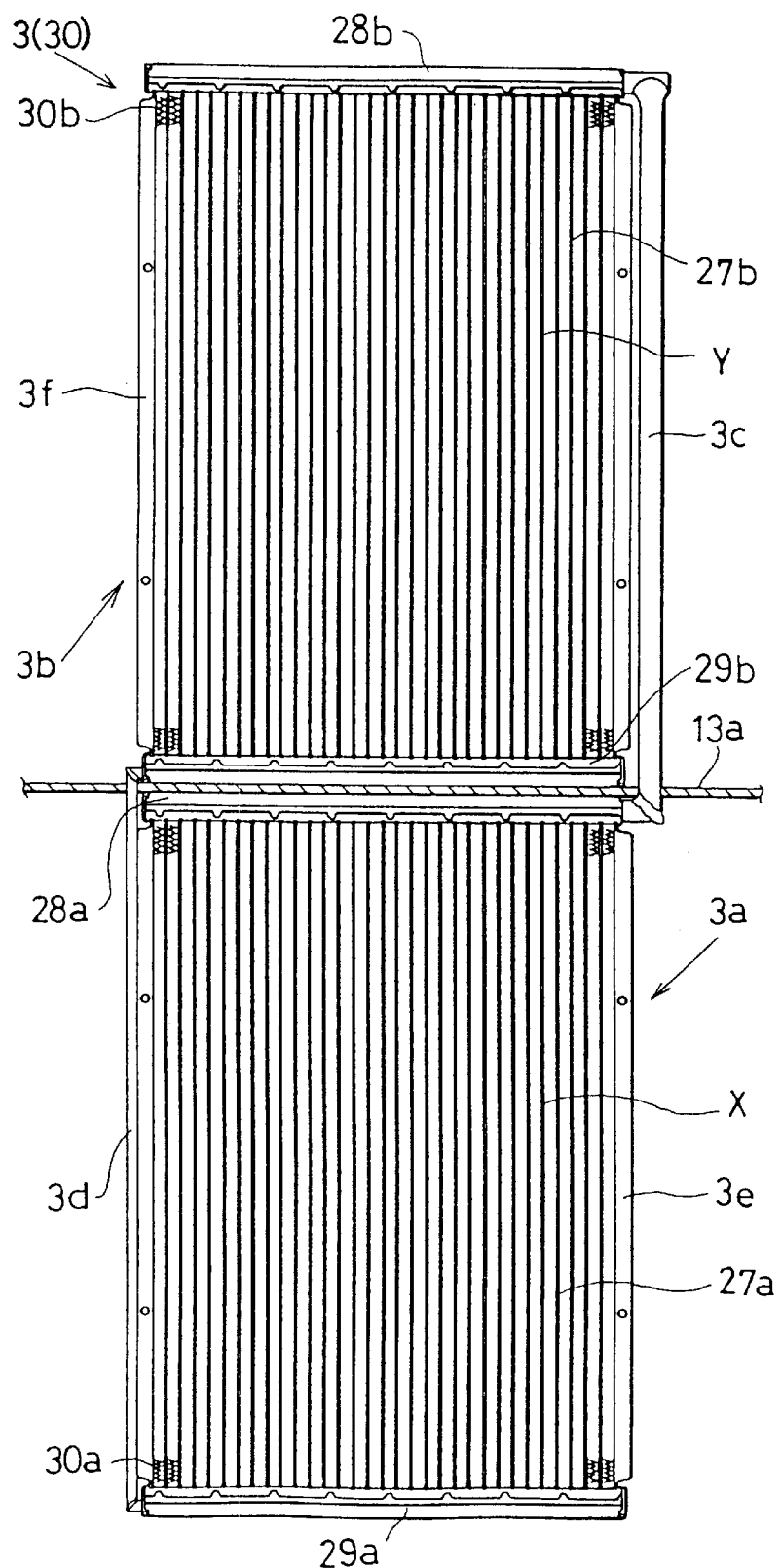
FIG. 74 is a front view showing a structure of the cooling apparatus according to the twentieth embodiment.

In the central portion of the door plate 21 and the front partition plate 22, as shown in FIGS. 69 and 72, there is formed a single rectangular low-temperature-side suction port 21a for sucking a low-temperature air (foul outside air containing a foreign material such as dust or moisture) into the low-temperature-side heat transfer space 18 from the exterior. In the door plate 21 and the top cover 8, as shown in FIGS. 69 and 74, there are formed two square low-temperature-side discharge ports 21b for discharging the low-temperature air to the exterior from the two low-temperature-side centrifugal blowers 5.

To the two square low-temperature-side discharge ports 21b are attached droplets entry preventing means such as plural louvers 24 or mesh 24 to make it difficult for droplets such as rain water to enter the two low-temperature-side centrifugal blowers 5 from the exterior. To the rear side of the upper end portion of the door plate 21 are fixed fan cases of the centrifugal blowers 5 through packing 21c by fastening means 21d such as screws and washers.

To the top plate portion of the front partition plate 2, as shown in FIG. 70, are fixed the fan cases of the centrifugal blowers 5 through packing 22a by fastening means 22b such as screws. To the bottom plate portion of the front partition plate 22, as shown in FIG. 71, are fixed fan cases of the two high-temperature-side centrifugal blowers 4 through a packing 22c by fastening means 22d such as screws.

Figure 75:
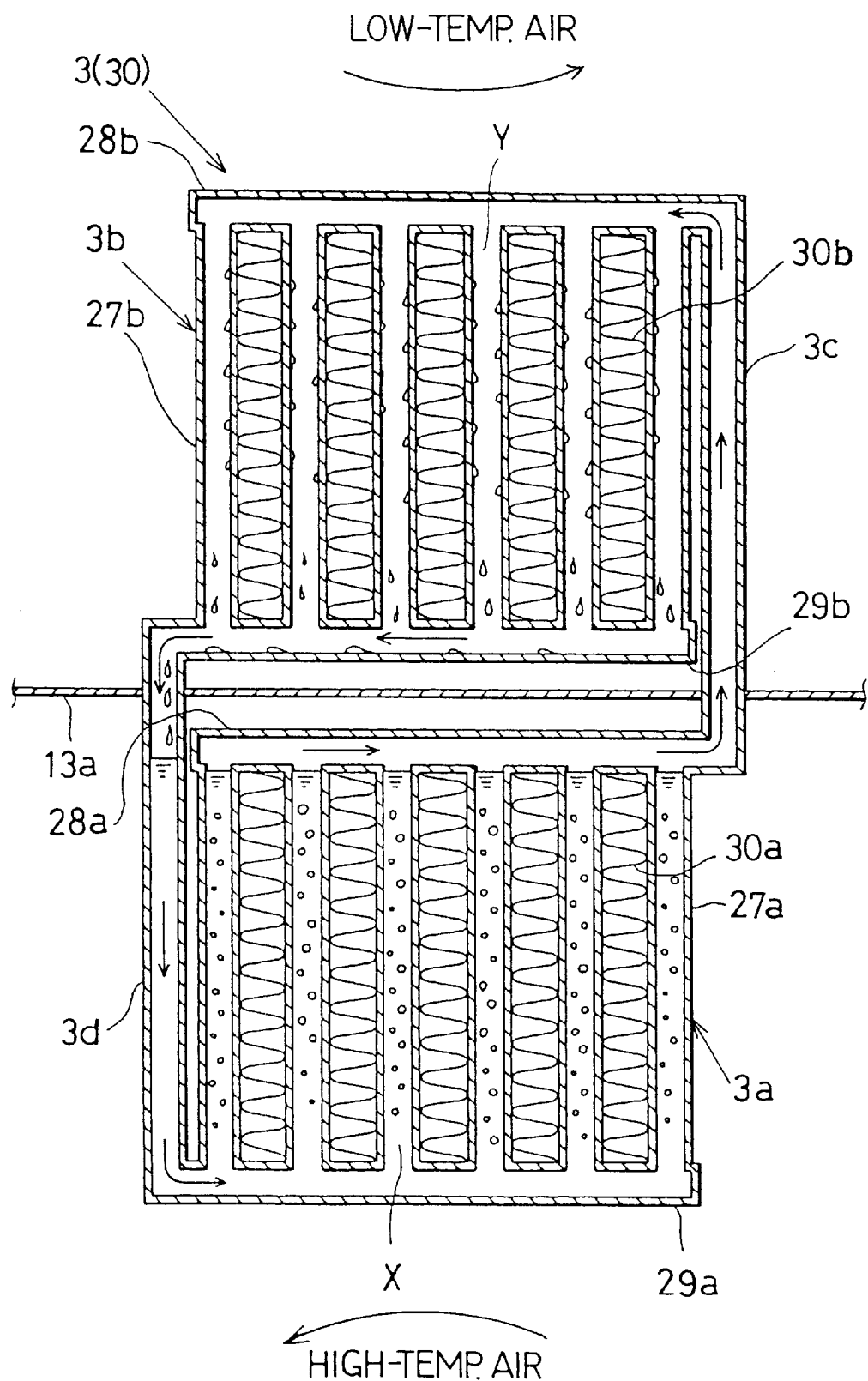
FIG. 75 is a cross sectional view showing schematically a structure of the cooling apparatus according to the twentieth embodiment.

On the upper portion side of the rear partition plate 23, as shown in FIGS. 69 and 75, there is formed a single rectangular high-temperature-side suction port 231 for sucking a high-temperature air (clean inside air not containing a foreign material such as dust or moisture) into the high-temperature-side heat transfer space 17 from the electronic parts accommodating space 16. To the lower portion side of the rear partition plate 23 is connected a duct 23b for introducing the inside air after cooled to the electronic part 11 from one high-temperature-side centrifugal blower 4 and is also connected a duct 23c for introducing the inside air after cooled to the electronic parts 12 from the other high-temperature-side centrifugal blower 4, by a spot welding or the like. The ducts 23b and 23c are respectively connected integrally to the two centrifugal blowers 4. As shown in FIG. 71, the rear partition plate 23 is fixed to the bottom of the front partition plate 22 by fastening means 23d such as screws.

As shown in FIGS. 68 to 70, the top fan cover 8 has, in its top plate portion, suction ports 24a for sucking cool air into the interior from the closed space 15 and also has, in its rear portion, discharge ports 24b for discharging cool air into the closed space 15 from the interior. The top fan cover 8 is fixed to the rear partition plate 23 by fastening means 24c such as screws and is mounted detachably to the body side (door plate 21, front partition plate 22, rear partition plate 23) of the cabinet 2.

As shown in FIGS. 68, 69 and 71, the bottom fan cover 9 has, in its bottom portion, suction ports (not shown) for sucking cool air into the interior from the closed space 15 and also has, in its rear portion, discharge ports 25b for discharging cool air into the closed space 15 from the interior. The bottom fan cover 9 is fixed to the front partition plate 22 by fastening means 25c such as screws and is mounted detachably to the body side (door plate 21, front partition plate 22, rear partition plate 23) of the cabinet 2. Further, the bottom fan cover 9 fixes a support stand 26 by fastening means 25d such as screws. The support stand 26 fixes the controller 7 by clamping means 26a such as bolts and nuts.

Next, the heat exchanger 3 will be described below in detail with reference to FIGS. 68, 69, 74 and 75. FIG. 74 is a diagram showing a structure of the cooling apparatus specifically, and FIG. 75 is a diagram showing a structure of the cooling apparatus schematically.

The heat exchanger 3 includes a fluid separating plate 13a for separating the high-temperature air as the inside air circulating inside the housing 13 and the low-temperature air as the outside air circulating outside the housing hermetically from each other, and plural (three) stages of cooling units 30 which are mounted to the fluid separating plate 13a while passing through the same plate.

The fluid separating plate 13a, which forms one wall surface (a portion) of the housing 13, constitutes one wall surface of the closed space 15, an interior of which is at high temperature, and one wall surface of the low-temperature-side heat transfer space 18, an interior of which is at low temperature. For example, the fluid separating plate 13a is constituted by a thin plate of a metallic material which is superior in heat conductivity such as aluminum and is soldered integrally with the cooling units 30 and the cabinet 2 so as to hermetically partition between the closed space 15 including the high-temperature-side heat transfer space 17 and the exterior including the low-temperature-side heat transfer space 18. In the fluid separating plate are formed at predetermined intervals a plurality of elongated, rectangular or oblong through-holes through which connection pipes in the cooling units pass, which will be described later. The fluid separating plate 13a may be a split plate (e.g., two-divided plate).

The cooling units 3 are mounted in plural (three) stages while being inclinedly by a predetermined angle within the cabinet 2 and are each divided into a high-temperature-side heat exchanger portion (inside air-side heat exchanger portion) 3a, an interior of which is filled with a fluorocarbon-type or freon-type refrigerant and a low-temperature-side heat exchanger portion (outside air-side heat exchanger portion) 3b. The high- and low-temperature-side heat exchanger portions 3a and 3b are interconnected through two first and second connection pipes 3c and 3d for refrigerant circulation.

The high-temperature-side heat exchanger portion 3a is a multiflow path type heat exchanger portion (inside heat exchanger portion) which includes a plurality of cooling tubes 27a, a high-temperature-side top tank 28a, a high-temperature-side bottom tank 29a, and heat receiving fins 30a interposed between adjacent cooling tubes 27a. To both sides of the high-temperature-side heat exchanger portion 3a are attached side plates 3e which function to fix the heat exchanger portion 3a to the fluid separating plate 13a and the cabinet 2 by fastening means and also function to reinforce the plural cooling tubes 27a and plural heat receiving fins 30a. Since the high-temperature-side heat exchanger portion 3a is disposed in the high-temperature-side heat transfer space 17 which is sealed hermetically from the exterior by the housing 13, there is no possibility that the heat exchanger portion 3a is exposed to the outside air containing a foreign material such as dust or moisture.

The plural cooling tubes 27a are formed into flat tubes having an elongated rectangular (e.g., 1.7 mm wide, 16.0 mm long) or oblong cross section and is made of a metal material which superior in heat conductivity such as, for example, aluminum or copper. The high-temperature-side heat exchanger portion 3a including the cooling tubes 27a is constituted as a liquid refrigerant tank (boiling portion) X wherein the sealed refrigerant is boiled and vaporized by receiving heat from the high-temperature air.

The high-temperature-side top tank 28a and bottom tank 29a are each composed of a core plate provided on the side of the cooling tubes 27a and a generally inverted U-shaped tank plate connected to the core plate. One of the high-temperature-side top tank 28a and bottom tank 29a is provided with only one refrigerant inlet (not shown) for sealing the refrigerant into the cooling tank 30. The refrigerant is sealed into each of the cooling tubes 27a of the high-temperature-side heat exchanger portion 3a up to a liquid level approximately corresponding to the upper end of the tubes 27a, that is, up to the top of the boiling portion X. The refrigerant is sealed into the tubes 27a after the heat receiving fins 30a are brazed to the tubes 27a.

The heat receiving fins 30a are corrugated fins formed by pressing and bending alternately into a wavy shape from a thin plate (e.g., approximately 0.02–0.50 mm thick) formed of a metallic material which is superior in heat conductivity such as aluminum for example. The fins 30a are soldered to the flat outer wall surfaces of the cooling tubes 27a. Thus, the outer wall surfaces of the tubes 27a and the heat receiving fins 30a are connected together in a fused state.

The low-temperature-side heat exchanger portion 3b is a multiflow path type heat exchanger portion (inside heat exchanger portion) including a plurality of cooling tubes 27b, a low-temperature-side top tank 28b, a low-temperature-side bottom tank 29b, heat radiating fins 30b interposed between adjacent cooling tubes 27b, and side plates 3f. The heat exchanger portion 3b is disposed so as to be positioned substantially on the same plane as the high-temperature-side heat exchanger portion 3a within the low-temperature-side heat transfer space 18 which is exposed to the outside air containing a foreign material such as dust or moisture.

The plural cooling tubes 27b are formed in the same shape as the cooling tubes 27a. The low-temperature-side heat exchanger portion 3b including the cooling tubes 27b is constituted as a vaporized refrigerant tank (condensing portion) Y wherein the heat of the refrigerant vapor which has been boiled in the boiling portion X is released to the low-temperature air to condense the vaporized refrigerant.

In the same manner as the high-temperature-side top and bottom tanks 28a and 29a, the low-temperature-side top and bottom tanks 28b,29b are each constituted by a core plate and a generally inverted U-shaped tank plate. The low-temperature-side bottom tank 29b may be inclined such that the second connection pipe 3d side is positioned downward.

The heat radiating fins 30 are corrugated fins formed in the same shape as the heat receiving fins 30a and are soldered to the flat outer wall surfaces of the cooling tubes 27b. Thus, the outer wall surfaces of the cooling tubes 27b and the heat radiating fins 30b are connected together in a fused state.

The first connection pipe 3c is a metallic pipe formed to have a circular cross section by using the same metallic material as that of the cooling tubes 27a and 27b. The first connection pipe 3c communicates between the high-temperature-side top tank 28a located at the upper end of the boiling portion X and the low-temperature-side top tank 28b located at the upper end of the condensing portion Y. The first connection pipe 3c functions as high-to-low temperature guide means for introducing the vaporized refrigerant which has been boiled in the boiling portion X to the condensing portion Y.

The second connection pipe 3d is a metallic pipe formed to have a circular cross section by using the same metallic material as that of the first connection pipe 3c. The second connection pipe 3d communicates between the low-temperature-side bottom tank 29b located at the lower end of the condensing portion Y and the high-temperature-side bottom tank 29a located at the lower end of the boiling portion X. The second connection pipe 3d functions as low-to-high temperature guide means for introducing the liquid refrigerant liquid which has been condensed in the condensing portion Y to the boiling portion X.

The high-temperature-side centrifugal blowers 4 will be described in detail with reference to FIGS. 68, 69 and 71.

The two high-temperature-side centrifugal blowers 4 are mounted below the heat exchanger 3 and are accommodated between the bottom fan cover 9 and the lower end portion of the cabinet 2. The centrifugal blowers 4 are each provided with a centrifugal fan 31 for compulsorily circulating the high-temperature air into the high-temperature-side heat transfer space 17, a drive motor 32 for rotating the centrifugal fan 31, and a fan case 33 which receives therein the centrifugal fan 31 rotatably.

The centrifugal fan 31 includes a plurality of blades and a disc-shaped support plate 34 for supporting the blades. The support plate 34 is fixed onto an output shaft 35 of the fan 31.

The drive motor 32 is fixed by fitting a heat transfer accelerating plate 37 on the outer periphery of a side plate 36 which is positioned closest to the centrifugal fan 31. At the lower end portion of the drive motor 32, a cooling fan 38 for blowing the atmospheric air (high-temperature air) to the drive motor 32 to cool the motor is mounted on the output shaft 35.

The fan case 33 forms a vertical compulsory circulation flow path 39 in the interior thereof. The fan case 33 is provided with a fluid suction port 33a for sucking the high-temperature air into the compulsory circulation flow path 39, a fluid discharge port 33b which is open toward the electronic parts accommodating space 16, and a fan mounting opening 33c formed in the bottom plate portion, the opening 33c having a diameter larger than the outside diameter of the centrifugal fan 31.

The fluid suction port 33a is formed in a bellmouth portion 40 of the top plate of the fan case 33. The fluid discharge port 33b is in communication with fluid passages formed in the ducts 23b and 23c projecting from the bottom fan cover 9. The top plate portion of the fan case 33 is fixed to a lower surface of the bottom plate portion of the front partition plate 22 of the cabinet 2 through packing 22c by fastening means 22d such as screws.

The side plate 36, which constitutes a front frame of the drive motor 32, has a fluid agitating portion 36a of a concave-convex, corrugated or sawtooth shape on its centrifugal fan side. The fluid agitating portion 36a is a portion for agitating the low-temperature fluid between the support plate 34 for the centrifugal fan 31 and the heat transfer accelerating plate 37 efficiently by the cooperation with the whirling flow from the fan 31.

The heat transfer accelerating plate 37 serves not only as motor mounting means for fixing a stay portion 32a of the drive motor 32 while passing through the side plate 36 by using fastening means 37b such as screws but also as heat transfer accelerating means for transferring the heat generated from the drive motor 32 efficiently to the fan case 33. The heat transfer accelerating plate 37 has a circular through-hole (not shown) through which the side plate 36 passes and is fixed to the bottom plate portion of the fan case 33 by fastening means 37d such as screws.

Figure 76:
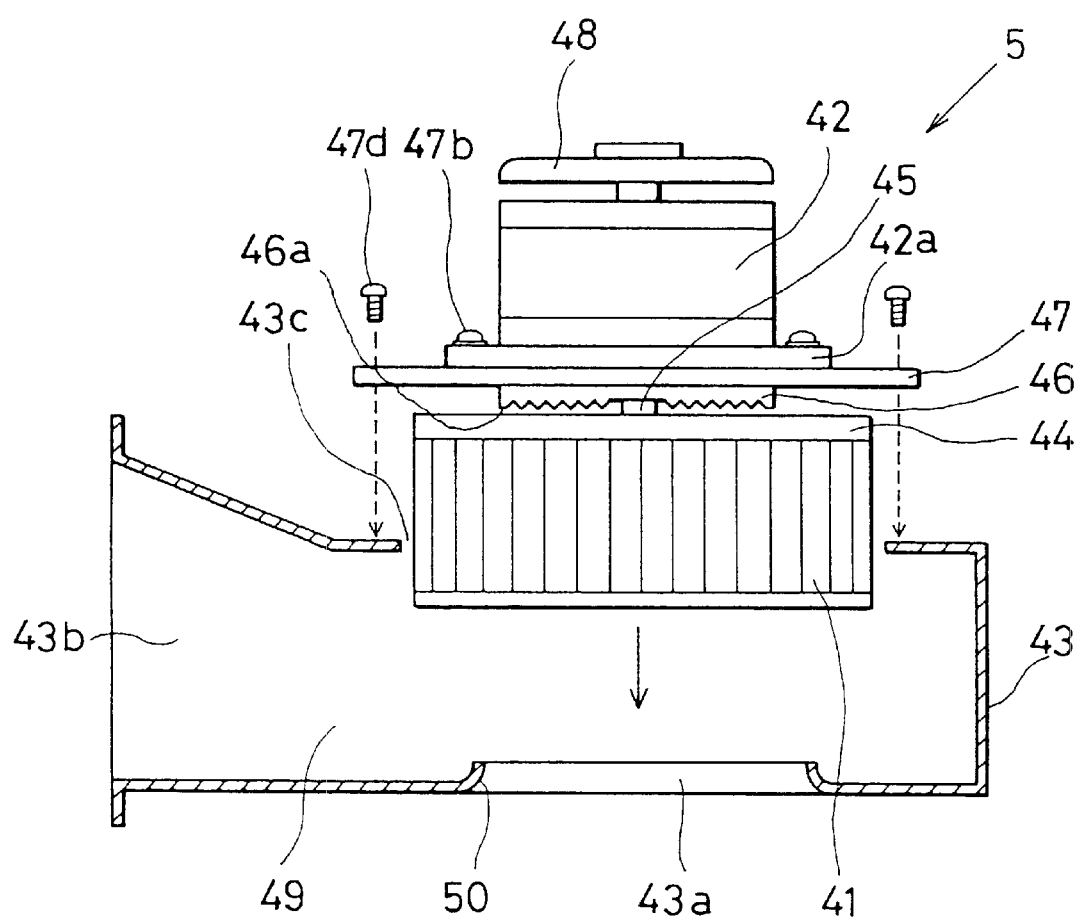
FIG. 76 is an exploded view showing a structure for mounting a low-temperature-side centrifugal blower according to the twentieth embodiment.
Figure 77:
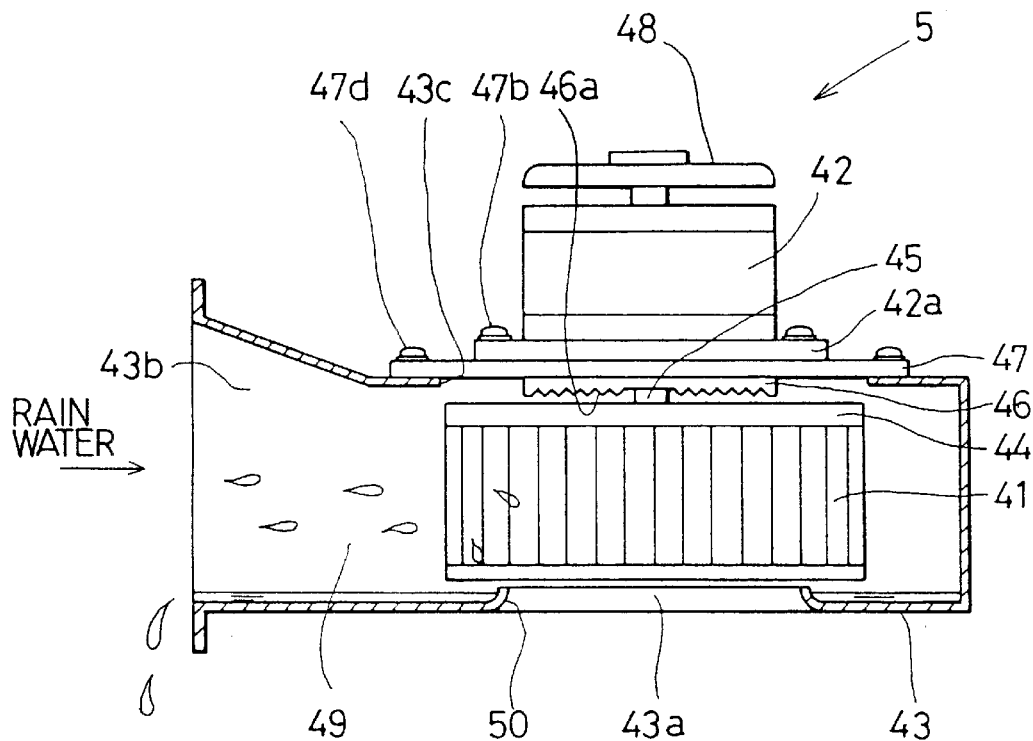
FIG. 77 is a cross sectional view showing schematically a structure of the low-temperature-side centrifugal blower according to the twentieth embodiment.

Next, the low-temperature-side centrifugal blowers 5 will be described below in detail with reference to FIGS. 70, 76 and 77. FIG. 76 is a diagram showing a structure for mounting each centrifugal blower 5, and FIG. 77 is a diagram showing a structure of the blower 5 schematically.

The two low-temperature-side centrifugal blowers 5b are mounted above the heat exchanger 3 and are accommodated between the top fan cover 8 and the upper end portion of the cabinet 2. The centrifugal blowers 5 are each provided with a centrifugal fan 41, a drive motor 42 for rotating the centrifugal fan 41, and a fan case 43 which accommodates the fan 41 rotatably.

The centrifugal fan 41 functions to circulate the low-temperature air compulsorily within the low-temperature-side heat transfer space 18. In the same manner as the centrifugal fan 31, the fan 41 includes a plurality of blades and a disc-shaped support plate 44 for supporting the blades. The support plate 44 is fixed onto an output shaft 45 of the centrifugal fan 41.

The drive motor 42 is fixed by fitting a heat transfer accelerating plate 47 onto the outer periphery of a side plate 46 which is positioned closest to the centrifugal fan 41. On top of the drive motor 42 a cooling fan 48 is mounted onto the output shaft 45 for blowing the atmospheric air (high-temperature air) to the drive motor 42 to cool the motor.

The fan case 43 receives the centrifugal fan 4.1 therein and separates the high- and low-temperature-side heat transfer spaces 17 and 18 from each other. In the interior of the fan case 43 is formed a vertical compulsory circulation flow path 49. As shown in FIGS. 70, 76 and 77, the fan case 43 has a fluid suction port 43a for sucking the low-temperature air to the compulsory circulation flow path 49, a fluid discharge port 43b which is in communication with the associated low-temperature-side discharge port 21b formed in the cabinet 2, and a fan mounting opening 43c formed in the top plate portion, the opening 43c having a diameter larger than the outside diameter of the centrifugal fan 41.

The fluid suction port 43a is formed in a bellmouth portion 50 of the bottom plate of the fan case 43. As shown in FIG. 77, the bellmouth portion 50 also functions as a weir portion for preventing droplets such as rain water entering through the fluid discharge port 43b from leaking into the cabinet 2 (the low-temperature-side space 18) through the bottom plate portion of the fan case 43. Further, as shown in FIG. 77, the fluid discharge port 43b also functions as a droplets discharge port for discharging droplets staying in the bottom of the fan case 43 to the exterior.

As shown in FIG. 70, the bottom plate portion of the fan case 43 is fixed to the to plate upper surface of the front partition plate 22 of the cabinet 2 through packing 22a by fastening means such as screws. The front portion of the fan case 43 is fixed to the door plate 21 of the cabinet 2 by fastening means 21d such as screws.

The side plate 46, in the same manner as the side plate 36, constitutes a front frame of the drive motor 42 and has, on its centrifugal fan side, a fluid agitating portion 46a of a concavo-convex, corrugated or sawtooth shape. The fluid agitating portion 46a is a portion for agitating the low-temperature fluid between the support plate 44 for the centrifugal fan 41 and the heat transfer accelerating plate 47 efficiently by the cooperation with the whirling flow from the fan 41.

The heat transfer accelerating plate 47 functions not only as motor mounting means for fixing the a stay portion 42a of the drive motor 42 while passing through the side plate 46 but also as heat transfer accelerating means for transferring the heat generated from the drive motor 42 efficiently to the fan case 43. The heat transfer accelerating plate 47 has a circular through-hole (not shown) through which the side plate 46 passes, and is fixed to the top plate portion of the fan case 43 through packing 47c by fastening means 47d such as screws. The heat transfer accelerating plate 47 and the stay portion 42a of the drive motor 42 constitute a separating portion which forms part of the fan case 43, and also constitute a water entry preventing wall for preventing the entry of water or the like from the low-temperature-side heat transfer space 18 to the high-temperature-side heat transfer space 17.

In the high-temperature-side heat transfer space 17 of the housing 13, the electric heater 6 is disposed at the downstream side of the high-temperature-side heat exchanger portion 3a of each cooling unit 3 in the high-temperature air flowing direction. The electric heater 6 is for heating the air flowing through the high-temperature-side heat transfer space 17 so that the internal temperature of the closed space 15 is maintained at a level not lower than the lower-limit temperature, (e.g., 0° C.), because the performance of the electronic parts (e.g., semiconductor elements) 11 and 12 will be deteriorated if the internal temperature of the closed space 15 in the housing 13 is lower than the lower-limit temperature. The electric heater 6 used in this embodiment has a calorific value of, for example, 1.7 kW.

The controller 7 is for controlling the electric devices used in the cooling apparatus 14 such as the electric heater 6, drive motors 32 of the two high-temperature-side centrifugal blowers 4 and drive motors 42 of the two low-temperature-side centrifugal blowers 5, in accordance with the internal temperature of the closed space 15, detected by a temperature sensor 10 constituted by a thermo-sensitive element such as a thermistor.

When the internal temperature of the closed space 15 is not lower than the lower-limit temperature (e.g., 0° C.), the controller 7 controls such that the two high-temperature-side centrifugal blowers 4 and the two low-temperature-side centrifugal blowers 5 operate in Hi (large air amount) or Lo (small air amount) mode, and turns OFF the electric motor 6. Further, when the internal temperature of the closed space 15 is not higher than the lower-limit temperature (e.g., 0° C.), the controller 7 turns OFF the drive motors 32 of the two low-temperature-side centrifugal blowers 5, controls such that the drive motors 42 of the two high-temperature-side centrifugal blowers 4 operate in Hi (large air amount) or Lo (small air amount) mode, and turns ON the electric heater 6. A method of changing the drive motor 42 of each low-temperature-side centrifugal blower 5 in this embodiment will be described below briefly with reference to FIG. 70.

Firstly, the fastening means 24c such as screws are taken off, and the top fan cover 8 is detached from the upper end of the cabinet 2. Next, the fastening means 47d such as screws are taken off, and the fan case 43 is detached from the heat transfer accelerating plate 47. In this case, the drive motor 42 can be taken out easily from the fan case 43 to the upper side of the heat exchanger 3, while the heat transfer accelerating plate 47 is mounted to the stay portion 42a of the drive motor 42 and the centrifugal fan 41 is mounted on the output shaft 45 of the drive motor 42, because the diameter of the fan mounting opening 43c is larger than the outer diameter of the fan 41.

Thus, the drive motor 42 can be detached easily from the fan case 43 without the complicated work of taking out the centrifugal fan 41 from the output shaft 45 of he drive motor 42 within the fan case. When mounting a new drive motor 42, firstly, the support plate 44 for the centrifugal fan 41 and the output shaft 45 of the drive motor 42 are fastened together by fastening means such as bolts, and the drive motor is mounted to the fan case 43 in the sequence reverse to the above.

Next, a method of changing the drive motor 32 of each high-temperature-side centrifugal blower 4 in this embodiment will be described below briefly with reference to FIG. 71.

In the same way as above, firstly, the fastening means 25c such as screws are taken out, and the bottom fan cover 9 is detached from the lower end of the cabinet 2. Next, the fastening means 37d such as screws are taken out, and the heat transfer accelerating plate 37 is detached from the fan case 33. At this time, the drive motor 32 can be taken out easily from the fan case 33 to the lower side of the heat exchanger 3, while the heat transfer accelerating plate 37 is mounted to the stay portion 32a of the drive motor 32 and the centrifugal fan 31 is mounted on the output shaft 35 of the drive motor 32, because the diameter of the fan mounting opening 33c is larger than the outer diameter of the fan 31.

Thus, the drive motor 32 can be removed easily from the fan case 33 without the complicated work of taking out the centrifugal fan 31 from the output shaft 35 of the drive motor 32. When mounting a new drive motor 32, firstly, the support plate 34 for the centrifugal fan 31 and the output shaft 35 of the drive motor 32 are fastened together by fastening means such as bolts, and the drive motor 32 is mounted to the fan case 33 in the sequence reverse to the above (see FIG. 76).

An operation of the cooling apparatus 14 of this embodiment will be described below briefly with reference to FIGS. 68 to 77.

By starting the supply of an electric current to the drive motors 32 of the two high-temperature-side centrifugal blowers 4 and the drive motors 42 of the two low-temperature-side centrifugal blowers 5 when the internal temperature of the closed space 15 in the housing 13 is not lower than the lower-limit temperature (e.g., 0° C.), the centrifugal fans 31 and 41 start operating. As a result, a circulating flow of a high-temperature air (clean inside air not containing a foreign material such as dust or moisture; inside fluid) is formed in the closed space 15 (high-temperature-side heat transfer space 17) formed within the housing 13. On the other hand, a circulating flow of a low-temperature air (foul outside air containing a foreign material such as dust or moisture; outside fluid) is formed in the low-temperature-side heat transfer space 18 formed outside the housing 13.

In each of the cooling units 30 which are mounted while passing through the fluid separating plate 13a of the housing 13, the refrigerant sealed in each cooling tube 27a of the high-temperature-side heat exchanger portion 3a is boiled and vaporized by receiving the heat which has been transferred from the high-temperature air through the heat receiving fins 30a. The vaporized refrigerant passes through the high-temperature-side top tank 28a and the first connection pipe 3c and is condensed on the inner wall surfaces of the condensing portion Y of the low-temperature-side heat exchanger portion 3b which is exposed to the low-temperature air and is held low in temperature. The resulting latent heat is transferred to the low-temperature air through the heat radiating fins 30b.

The refrigerant thus condensed in the condensing portion. Y, as shown in FIG. 75, drops along the inner wall surfaces of the cooling tubes 27b due to its own weight, passes through the low-temperature-side bottom tank 29b and the second connection pipe 3d, and reaches the boiling portion X of the high-temperature-side heat exchanger portion 3a. In this way, the refrigerant sealed in the cooling tubes 27a and 27b repeats boiling and condensation alternately to transfer the heat of the high-temperature air to the low-temperature air so that the heat generated from the electronic parts 11 and 12 can be released in the plural stages of cooling units 30.

Thus, the electronic parts 11 and 12 can be cooled without a mixture of the high-temperature air (clean air present in the housing 13) which circulates within the high-temperature-side heat transfer space 17 of the closed space 15 and the low-temperature air (foul air present outside the housing 13) which circulates within the low-temperature-side heat transfer space 18.

When the internal temperature of the closed space 15 in the housing 13 is lower than the lower-limit temperature (e.g., 0° C.), an electric current is supplied to the electric heater 6 to heat the air flowing through the high-temperature-side heat transfer space 17. At this time, the two low-temperature-side blowers 5 are kept OFF.

On the other hand, by rotation of the two high-temperature-side centrifugal blowers 4, the high-temperature air circulating within the closed space 15 in the housing 13 flowing from the electronic parts accommodating space 16 which accommodates the electronic parts 11 and 12 therein, through the high-temperature-side suction port 23a formed in the rear partition plate 23 of the cabinet 2 and enters the cooling apparatus 14, as shown in FIGS. 68 and 69. The high-temperature which has thus entered the cooling apparatus 14 passes the narrow path surrounded by both fluid separating plate 13a and rear partition plate 23, and thereafter passes through the high-temperature-side heat exchanger portion 3a. That is, the high-temperature air passes between adjacent cooling tubes 27a while the heat is absorbed by the heat receiving fins 30a.

In each of the two high-temperature-side centrifugal blowers 4, as shown in FIG. 71, the cooling fan 38 also rotates together with the centrifugal fan 31. As a result, the high-temperature air is sucked to the inside of the bottom cover 9 through the suction ports of the bottom cover to cool the drive motor 32 and is discharged through the discharge ports 25b into the electronic parts accommodating space 16 in the closed space 15.

Further, by the cooperation of both fluid agitating portion 36a formed on the centrifugal fan of the side plate 36 and rotating current from the centrifugal fan 31, the low-temperature fluid between the support plate 34 and the heat transfer accelerating plate 37 is agitated efficiently to cool the drive motor 32. By transferring the heat generated from the drive motor 32 to the fan case 33 through the heat transfer accelerating plate 37 efficiently, the drive motor 32 is cooled efficiently.

On the other hand, by rotation of the centrifugal fans 41 of the two low-temperature-side centrifugal blowers 5, the low-temperature air circulating within the low-temperature-side heat transfer space 18 formed outside the housing 13 flows from the exterior into the cooling apparatus 14 through the low-temperature-side suction port 21a formed in both door plate 21 and front partition plate 22 of the cabinet 2, as shown in FIGS. 68 and 69. The low-temperature air which has thus entered the cooling apparatus 14 passes through the low-temperature-side heat exchanger portion 3b. That is, the low-temperature air passes between adjacent cooling tubes 27b and the heat of the vaporized refrigerant which has been boiled in the boiling portion X is absorbed by the heat radiating fins 30b.

In each of the two low-temperature-side centrifugal blowers 5, as shown in FIG. 70, the cooling fan 48 also rotates together with the centrifugal fan 41. As a result, the high-temperature air is sucked to the inside of the top fan cover 8 through the suction ports 24a of the top fan cover to cool the drive motor 42 and is discharged into the electronic parts accommodating space 16 in the closed spaced 15 through the discharge port 24b.

Further, by the cooperation of both fluid agitating portion 46 formed on the centrifugal fan side of the side plate 46 and rotating current from the centrifugal fan 41, the low-temperature fluid between the support 44 and the heat transfer accelerating-plate 47 is agitated efficiently to cool the drive motor 42. By transferring the heat generated from the drive motor 42 to the fan case 43 through the heat transfer accelerating plate 47 efficiently, the drive motor 42 is cooled efficiently.

An effect of this embodiment will be described.

According to this embodiment, as described above, the whole of the high-temperature-side centrifugal blowers 4 is disposed below the heat exchanger 3 and the drive motor 32 is detachably fixed below the heat exchanger 3, so that the drive motor 32 can be mounted to and detached from the cooling apparatus 14 without causing an interference with the heat exchanger 3. In the same manner, the whole of the low-temperature-side centrifugal blower 5 is disposed above the heat exchanger 3 and the drive motor 42 is detachably fixed above the heat exchanger, so that the drive motor 42 can be mounted to and detached from the cooling apparatus 14 without causing an interference with the heat exchanger 3. Consequently, it is possible to improve the maintaining performance of the drive motors 32 and 42.

According to this embodiment, moreover, the fan mounting openings 33c and 43c having a diameter larger than the outside diameter of the centrifugal fans 31 and 41 are formed in the fan cases 33 and 43, respectively, and the heat transfer accelerating plates 37 and 47 disposed respectively between the fan cases 33,43 and the drive motors 32 and 42 are fixed detachably to the fan cases 33 and 43, respectively. Consequently, the drive motors 32 and 42 can be mounted or detached without any complicated work such as removing the centrifugal fans 31 and 41 from the output shafts 35 and 45 of the drive motors 32 and 42 in the interior of the fan cases 33 and 43. In this way, the maintaining performance of the drive motors 32 and 42 can be further improved.

In this embodiment, since the heat transfer accelerating plates 37 and 47 are formed of a metallic material containing aluminum as a main component which is superior in heat conductivity, the heat generated from the drive motors 32 and 42 can be released efficiently to the fan cases 33 and 43 by means of such a superior heat conductivity. Consequently, the heat resistance of the drive motors 32 and 42 can be improved, or the size of both motors can be reduced due to the heat transfer accelerating effect.

According to this embodiment, as shown in FIGS. 70 and 77, the bellmouth portion 43a for receiving droplets contained in the low-temperature fluid (outside air) to prevent the droplets from leaking to the heat exchange 3 side through the bottom of the fan case 43 is formed in the fan case bottom, and the droplets discharge port for discharging the droplets staying in the bottom of the fan case 43 to the exterior of the cooling apparatus 14 is formed integrally with the fluid discharge port 43. Consequently, even without the use of any special parts or equipment, droplets such as rain water contained in the low-temperature fluid and entering the fan case 43 can be certainly received and drained, with simple structure. Accordingly, since such droplets can be prevented from entering the cooling apparatus 14, that is, the heat exchanger 3, the corrosion of the heat exchanger 3 can be prevented even when the heat exchanger 3 is formed of a material which may be corroded with the droplets, such as a metallic material of as aluminum or the like.

The cooling apparatus 14 of this embodiment is provided with the heat exchanger 3 including the cooling units 30 disposed in plural stages in the air flowing directions in each of which the high-temperature-side heat exchanger portion 3a as the boiling portion X and the low-temperature-side heat exchanger portion 3b as the condensing portion Y are connected annularly by the two first and second connection pipes 3c and 3d. With this construction, since a circulating flow of the refrigerant is formed in each cooling unit 30 and the collision between the vaporized refrigerant (boiled vapor) and the liquid refrigerant (condensed liquid) can be prevented, the heat radiating performance (cooling performance) of each cooling unit 30 can be improved. By disposing the cooling unit 30 in plural stages, it becomes possible to further improve the heat radiating performance (cooling performance) of each cooling unit 30 in the heat exchanger 3.

A twenty-first embodiment of the present invention will be described.

Figure 78:
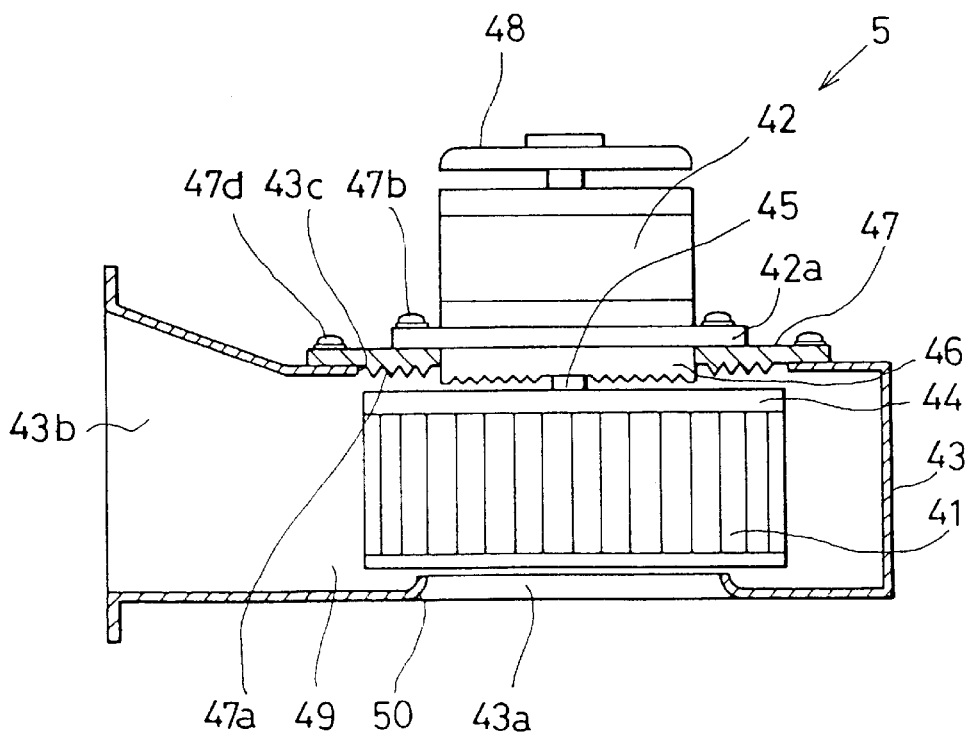
FIG. 78 is a cross sectional view showing schematically structure of a low-temperature-side centrifugal blower according to a twenty-first embodiment.
Figure 79:
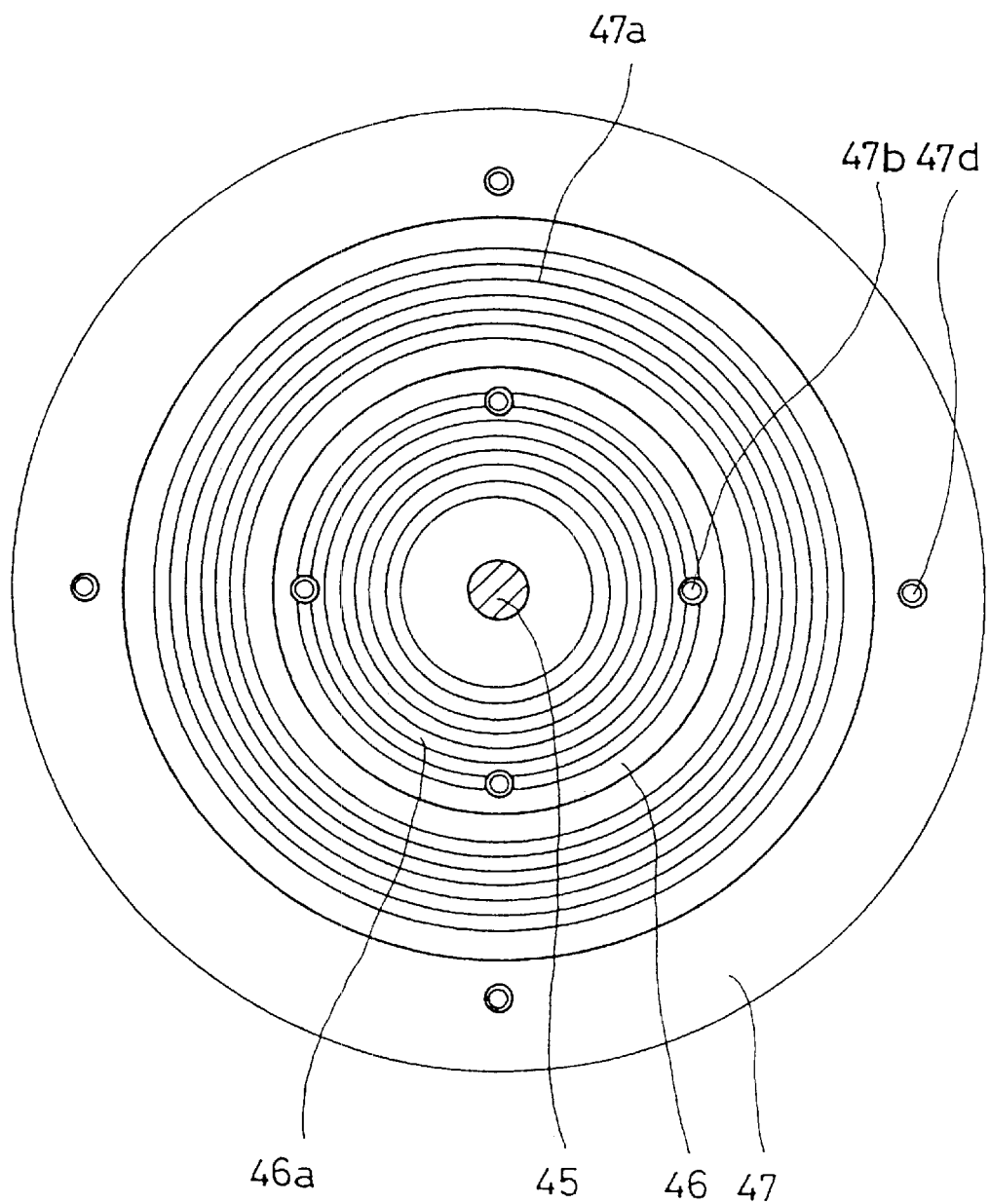
FIG. 79 is a diagram showing a side plate of a drive motor and a heat transfer accelerating plate according to the twenty-first embodiment.

FIGS. 78 and 79 are diagrams showing a side plate of a drive motor and a heat transfer accelerating plate.

As shown in FIG. 79, on the centrifugal fan side of a heat transfer accelerating plate 47 used in this embodiment there is formed a heat radiation accelerating portion 47a having a plurality of concentric grooves which are formed in the same direction as a fluid agitating portion 46a of a side plate 46, i.e., in the circumferential direction. With this construction, the heat radiating effect from a drive motor 42 to the atmospheric fluid (high-temperature air) through the heat transfer accelerating plate 47 is promoted, so that the heat resistance of the drive motor 42 can be improved or the motor can be further downsized as compared with the twentieth embodiment.

A twenty-second embodiment of the present invention will be described with reference to FIGS. 80 and 81.

Figure 80:
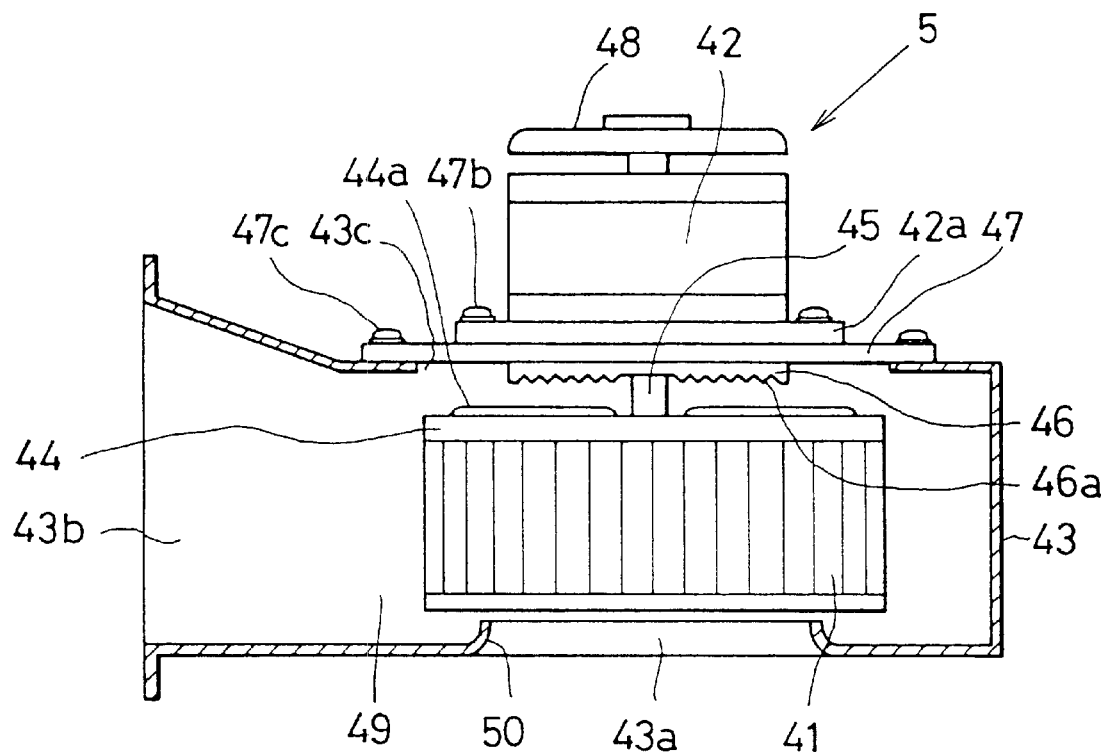
FIG. 80 is a cross sectional view showing schematically a structure of a low-temperature-side centrifugal blower according to a twenty-second embodiment.
Figure 81:
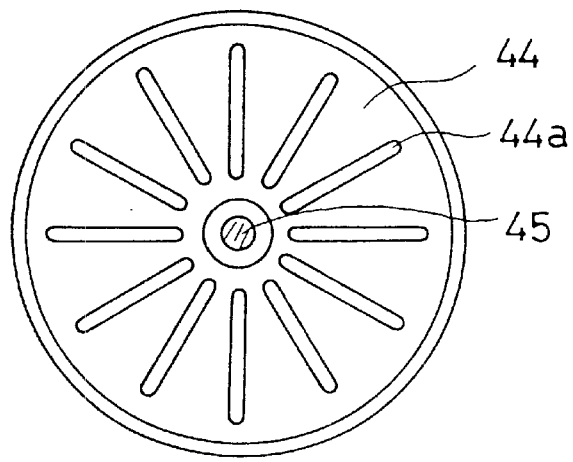
FIG. 81 is a plan view showing a centrifugal fan supporting plate according to the twenty-second embodiment.

FIG. 80 is a diagram showing a structure of a low-temperature-side centrifugal blower schematically, and FIG. 81 is a diagram showing a support plate for a centrifugal fan.

On the motor side of a support plate 44 for a centrifugal fan 41 in this embodiment there is formed a fluid agitating portion 44a which includes ridges or grooves extending radially, centered on an output shaft 45. By the cooperation of the fluid agitating portion 44a of the support plate 44, a fluid agitating portion 46a of a side plate 46 and a rotating current from the centrifugal fan 41, the low-temperature fluid between the support plate 44 and a heat transfer accelerating plate 47 is agitated efficiently, so that a drive motor 42 can be cooled efficiently. Further, since the support plate 44 is formed in a concave-convex shape, the fluid agitating portion 44a functions as a reinforcing rib, so that the strength of the centrifugal fan 31 can be also improved.

A twenty-third embodiment of the present invention will be described with reference to FIG. 82.

Figure 82:
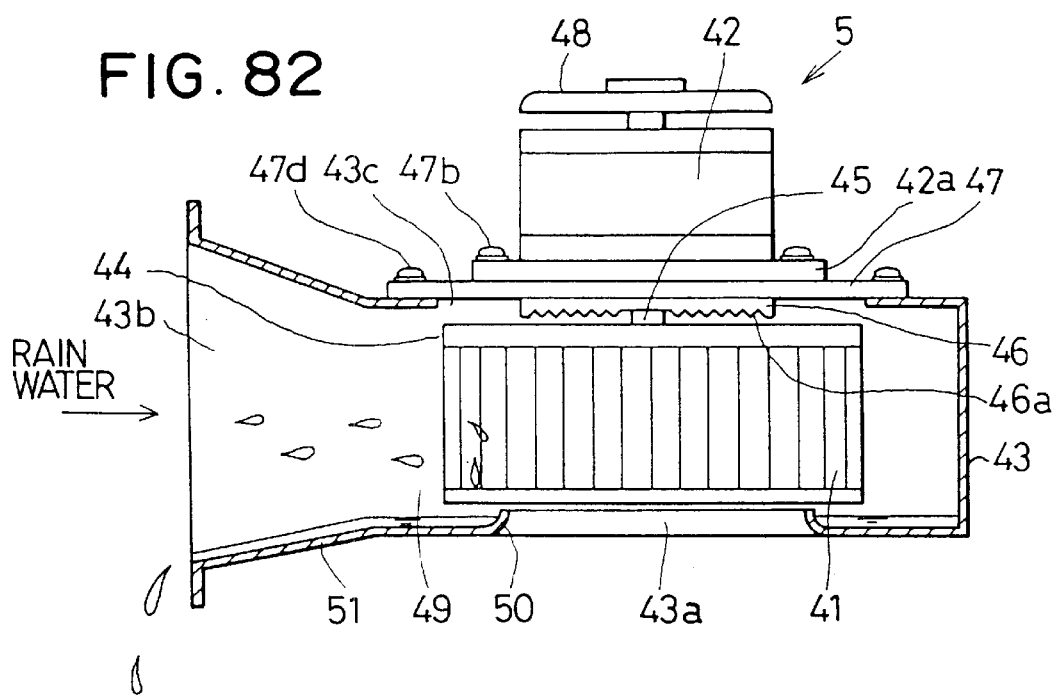
FIG. 82 is a cross sectional view showing schematically a structure of a low temperature-side centrifugal blower according to a twenty-third embodiment.

FIG. 82 is a diagram showing a structure of a low-temperature-side centrifugal blower schematically.

In this embodiment, a bottom plate portion 51 of a fan case 43 located near a fluid discharge port 43b is declined by a predetermined angle, e.g., 2°–3° toward the exterior with respect to the horizontal direction. According to this construction, droplets such as rain water can be certainly drained and prevented from leaking to the heat exchanger 3 side through the bottom of the fan case 43 even when the amount of the droplets is large, as compared with the twentieth embodiment in which the bellmouth portion 50 for weir of the droplets is formed in a small plate portion of the fan case 43 and the bottom of the fan case is positioned horizontal.

A twenty-fourth embodiment of the present invention will be described with reference to FIGS. 83 and 84.

Figure 83:
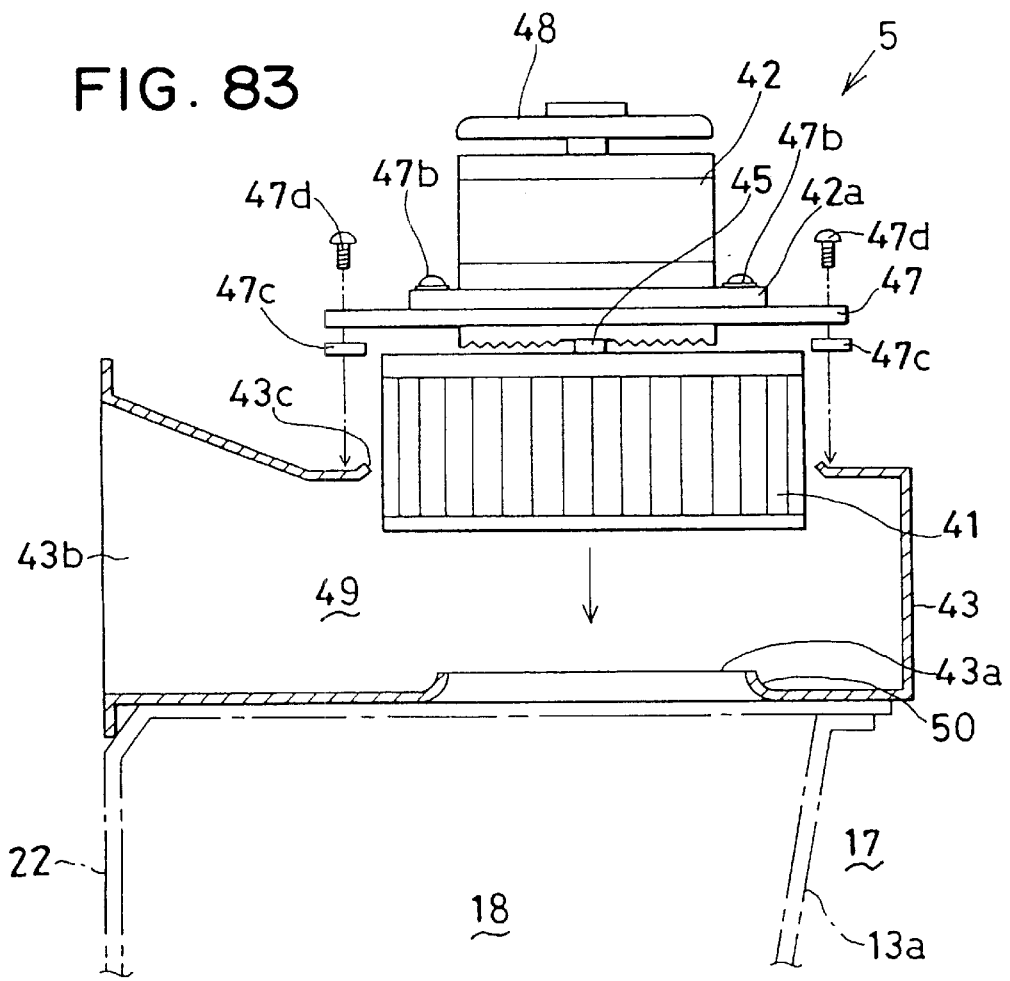
FIG. 83 is a cross sectional view showing schematically a structure of a low-temperature-side centrifugal blower according to a twenty-fourth embodiment.
Figure 84:
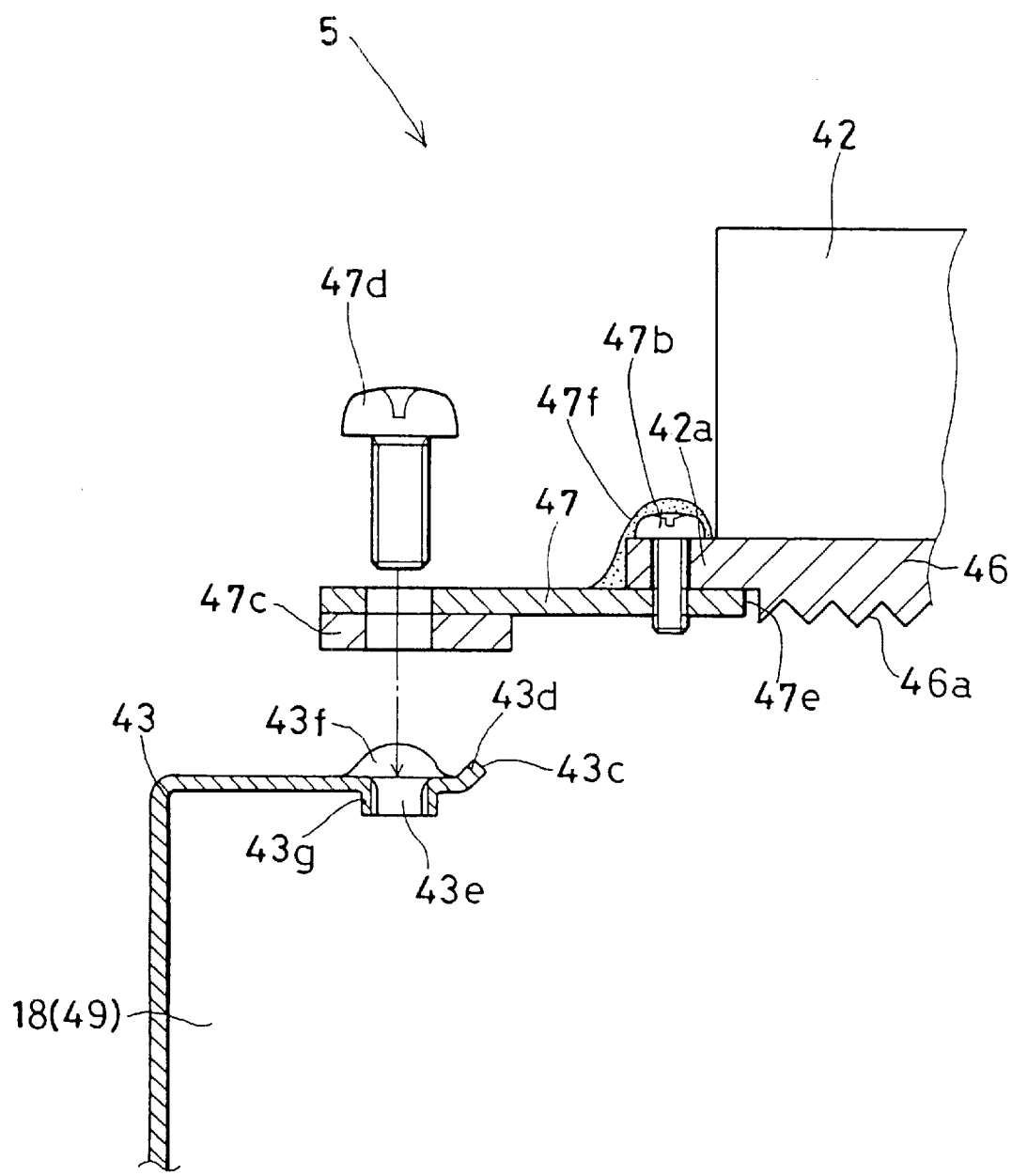
FIG. 84 is a mounting diagram showing a main structure of the low-temperature-side centrifugal blower according to the twenty-fourth embodiment.

FIG. 83 is a diagram showing a schematic structure of a low-temperature-side centrifugal blower, and FIG. 84 is a diagram showing a main structure of the low-temperature-side centrifugal blower.

A low-temperature-side centrifugal blower 5 according to this embodiment, as in the twentieth embodiment, is provided with a centrifugal fan 41 for circulating a low-temperature air compulsorily within the low-temperature-side heat transfer space 18 (a compulsory circulation flow path 49), a drive motor 42 for rotating the centrifugal fan 41, and a fan case 43 which receives therein the centrifugal fan 41 rotatably.

The centrifugal fan 41 includes a plurality of blades and a disc-shaped support plate 44. The support plate 44 is fixed to an output shaft 45 of the fan 41. The drive motor 42 is fixed by fitting a heat transfer accelerating plate 47 on the outer periphery of a side plate 46.

The heat transfer accelerating plate 47 has a circular through-hole 47e through which the side plate 46 passes. In a state where the side plate 46 passes through the through-hole 47e, a stay portion 42a of the drive motor 42 is fixed to the heat transfer accelerating plate 47 by fastening means 47b such as screws. A sealant 47f, e.g., silicone sealant, is attached to the outer periphery of the stay portion 42a and the fastening portion of the plate 47 to improve the airtightness between the low-temperature-side heat transfer space 18 (compulsory circulation flow path 49) and the high-temperature-side heat transfer space 17. The heat transfer accelerating plate 47 and the stay portion 42a of the drive motor 42 constitute a separating portion and a water entry preventing wall both forming part of the fan case 43.

The fan case 43 has a fan mounting opening 43c of a diameter larger than the outer diameter of the centrifugal fan 41. The peripheral edge of the fan mounting opening 43c is formed with an annular rib portion 43d for performing a linear seal with a rubber packing 47c. A tapped hole 43e for fastening means 47d such as screws is formed in the fan case 43, the fastening means 47d being for fastening and fixing the heat transfer accelerating plate 47 to the top plate portion of the fan case 43. In the vicinity of the tapped hole 43e is formed a plate stopper 43f for constantly maintaining a clearance between the rib portion 43d and the packing 47c to prevent a breakage of the packing. The top plate portion of the fan case 43 near the tapped hole 43e is formed as a ring-like convex portion 43g in which the burring process is performed toward the bottom plate portion.

In this embodiment, since the peripheral edge of the fan mounting opening 43c formed in the fan case 43 and the outer peripheral portion of the heat transfer accelerating plate 47 are sealed with the packing 47c which is in the shape of an annular plate, and the peripheral edge of the through hole 47e formed in the heat transfer accelerating plate 47 and the outer peripheral portion of the side plate 46 of the drive motor 42 are sealed with the sealant 47f, a foreign material such as dust or moisture which has entered the low-temperature-side heat transfer space 18 (compulsory circulation flow path 49) through a fluid suction port 43a of the fan case 43 does not enter the high-temperature-side heat transfer space 17 through the fan mounting opening 43c formed in the top plate portion of the fan case 43.

Accordingly, the heat transfer accelerating plate 47 and the stay portion 42a are disposed so as to close the fan mounting opening 43c of the fan case 43 which hermetically separates between the high and low-temperature-side heat transfer spaces 17 and 18 together with the fluid separating plate 13a. Consequently, there is no possibility that a foreign to material enters the high-temperature-side heat transfer space 17 through the fan mounting opening 43c from the compulsory circulation flow path 49 into which the outside air flows.

In this way, it is possible to prevent the occurrence of inconveniences such as breakdown of the internal parts or defective insulation caused by the entry of a foreign material into the drive motor 42. Besides, since it is possible to prevent a foreign material such as dust or moisture from entering the high-temperature-side heat transfer space 17 through the low-temperature-side heat transfer space 18, the foreign material is not deposited on the electronic parts 11 and 12 mounted within the closed space 15 and hence there is no possibility of the malfunction of the electronic parts 11 and 12.

Further, since the entry of a foreign material such as dust or mixture can be prevented without accommodating the whole of the drive motor 42 within the fan case 43, the work for mounting and changing each low-temperature-side centrifugal blowers 5 can be simplified and thus it is possible to improve the maintaining performance of the drive motor 42.

Modifications of the seventeenth to nineteenth embodiment will be described.

The cooling apparatus 14 provided with the heat exchanger device 21 according to these embodiments is utilized in the case where the heating elements such as the electronic parts 11 and 12 need be accommodated in the closed space. The case where the heating elements need be accommodated in the closed space includes the case where heating elements are used under the severe environmental condition containing, for example, oil, water, iron powder, corrosive gases, etc., the case where inactive gases (helium gas, argon gas, etc.) are used to prevent arcing or oxidation of contacts at the time of electric intermittence, or the case where gases harmful to the human body (for example, such as hydrogen fluoride decomposed from fluorocarbon) are prevented from leaking outside.

In these embodiments, a multiflow pass type heat exchanger having corrugating fin tubs is used as the cooling unit 3, the high temperature-side heat exchanger 3a and the low temperature-side heat exchanger 3b; however, a heat exchanger having plate fin tubes, a heat exchanger having fine pin-fin tubes, a heat exchanger of a serpentine type having flat tubes bent in a zigzag manner, and a heat exchanger of a drawn-cup type having a plurality of laminated cooling tubes in which two pressed plates are connected to each other, may be used as the cooling unit 3, the high temperature-side heat exchanger 3a and the low temperature-side heat exchanger 3b. Slit fins or louver fins may be used as the heat receiving fin 6a or the radiating fin 6b.

In these embodiments, high-temperature gas such as high-temperature air, heated by heating elements such as the electronic parts 11 and 12 is used as air in the housing 13 and high-temperature fluid as fluid in the casing. (inside air); however, cooling water for cooling the heating elements such as the electronic parts 11 and 12 and high-temperature liquid such as oil (including working oil and lubricating oil) may be used as a high-temperature fluid. In the same manner, not only low-temperature gas such as low temperature air but also low-temperature liquid such as water and oil may be used as air outside the housing and low temperature fluid (outside air) which is fluid outside the casing. In these cases, pumps are used as the inside fluid circulating means and the outside fluid circulating means. As means for actuating the pump, and the centrifugal fans 31 and 34, not only the electric motors 32 and 33 as in these embodiments but also the internal combustion engine, water mill, or windmill may be used.

A twenty-fifth embodiment of the present invention will be described with reference to FIG. 85.

Figure 85:
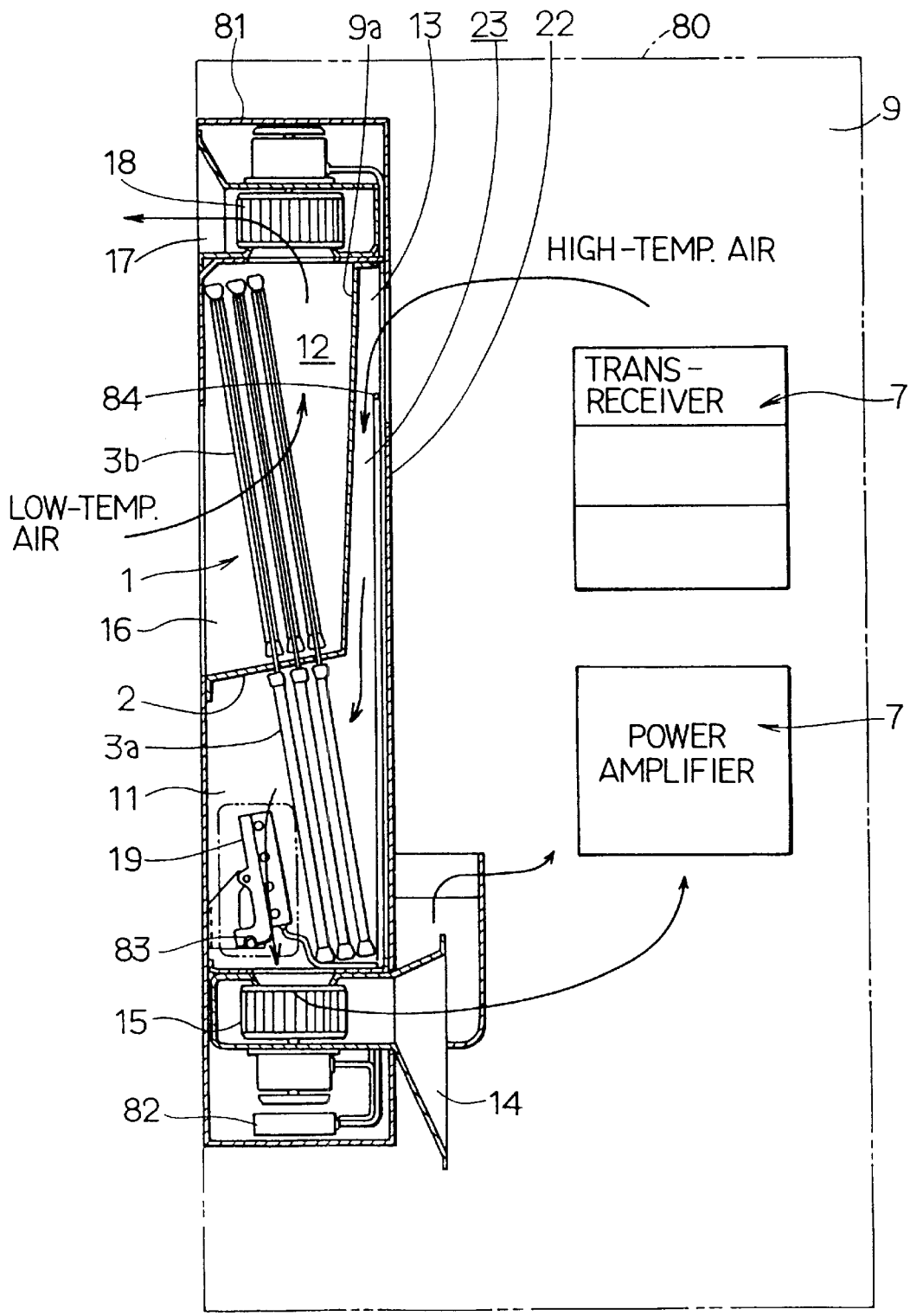
FIG. 85 is a cross sectional view of a housing equipped with a cooling apparatus according to the twenty-fifth embodiment.

FIG. 85 shows a cooling apparatus incorporated in an electronic apparatus according to this embodiment.

For example, the electronic apparatus is installed in a radio base station of a mobile radio telephone such as cordless telephone or car telephone. The electronic apparatus includes a housing 80 which hermetically houses therein electronic parts (heat generating elements) 7 such as a trans-receiver and a power amplifier in a hermetically sealed state, and a cooling apparatus 1 which is mounted within the housing 80 to cool the electronic parts 7.

The electronic parts 7 are heat generating elements which performs a predetermined operation when an electric current is supplied thereto and generate heat (for example, a semiconductor switching element constituting a high-frequency switching circuit incorporated in a trans-receiver, and a semiconductor amplifier element such as a power transistor incorporated in a power amplifier).

The housing 80 seals an interior thereof hermetically from the exterior and has a closed space 9 in the interior. The closed space 9 is hermetically separated completely from the exterior by means of a fluid separating plate (medium separating plate) of the cooling apparatus 1 in order to prevent the performance of the electronic parts from being deteriorated due to the deposition of a foreign material such as dust or moisture on the electronic parts 7.

By the fluid separating plate of the cooling apparatus 1 and a casing of the system 1, the closed space 9 is partitioned into an electronic parts accommodating space for accommodating the electronic parts 7 and a high-temperature-side heat transfer space 11 which serves as an inside passage. In the high-temperature-side heat transfer space 11, the flow path area on the upwind side is narrow to minimize the depth of the cooling apparatus 1, and the flow path area on the downwind side is wider. In the housing 80, moreover, there is formed a low-temperature-side heat transfer space 12 as an outside passage which is separated hermetically from the high-temperature-side heat transfer space 11 by means of the fluid separating plate.

The cooling apparatus 1 is further provided with a casing 81 integral with the housing 80, two upper centrifugal blowers 18 for generating a flow of a low-temperature air (outside fluid, low-temperature fluid), two lower centrifugal blowers 15 for generating a flow of a high-temperature air (inside fluid, high-temperature fluid), an electric heater 19 for maintaining the air temperature in the closed space 9 at a level not lower than a lower-limit temperature (e.g., 0° C.), and a controller 82 for controlling the supply of electric power to the electric devices of the cooling apparatus 1.

The casing 81 includes an outer wall plate 83 located on the outermost side of the housing 80 and a rear partition plate 22 which surrounds the high-temperature-side heat transfer space 11. The outer wall plate 83 and the rear partition plate 22 are fixed to the housing 80 by bonding such as spot welding or by fastening means such as screws or bolts.

The two upper centrifugal blowers 18 each have a centrifugal fan for generating an air flow in the low-temperature-side heat transfer space 12, an electric motor for rotating the centrifugal fan, and a scroll casing which houses therein the centrifugal fan rotatably.

The two lower centrifugal blowers 15 each have a centrifugal fan for generating an air flow in the high-temperature-side heat transfer space 11, an electric motor for rotating the centrifugal fan, and a scroll casing which houses therein the centrifugal fan rotatably.

The electric heater 19 is for heating the air flowing through the high-temperature-side heat transfer space 11 so that the internal temperature of the closed space 9 is maintained at a level not lower than the lower-limit temperature (e.g., 0° C.), because the performance of the electronic parts (e.g., semiconductor element) may deteriorate when the internal temperature of the closed space 9 is lower than the lower-limit temperature. The electric heater 19 in this embodiment has a calorific value of 1.7 kW, for example.

The controller 82 controls electric motors of the two upper centrifugal blowers, electric devices such as electric motors of the two lower centrifugal blowers 15 and the electric heater 19 in accordance with the internal temperature of the closed space 9, detected by a temperature sensor 84 constituted by a thermo-sensitive element, e.g., thermistor.

When the internal temperature of the closed space 9 is not lower than the lower-limit temperature (e.g., 0° C.), the controller 82 controls such that the two upper centrifugal blowers 18 and the two lower centrifugal blowers 15 operate in Hi (large air amount) or Lo (small air amount) mode, and turns OFF the electric motor 19. When the internal temperature of the close space 9 is lower than the lower-limit temperature (e.g., 0° C.), the controller 82 turns OFF the electric motors of the two upper centrifugal blowers 18, controls such that the electric motors of the two lower centrifugal blowers 15 operate in Hi (large air amount) or Lo (small air amount) mode, and turns ON the electric heater 19.

The cooling apparatus 1 will be described.

Figure 86:
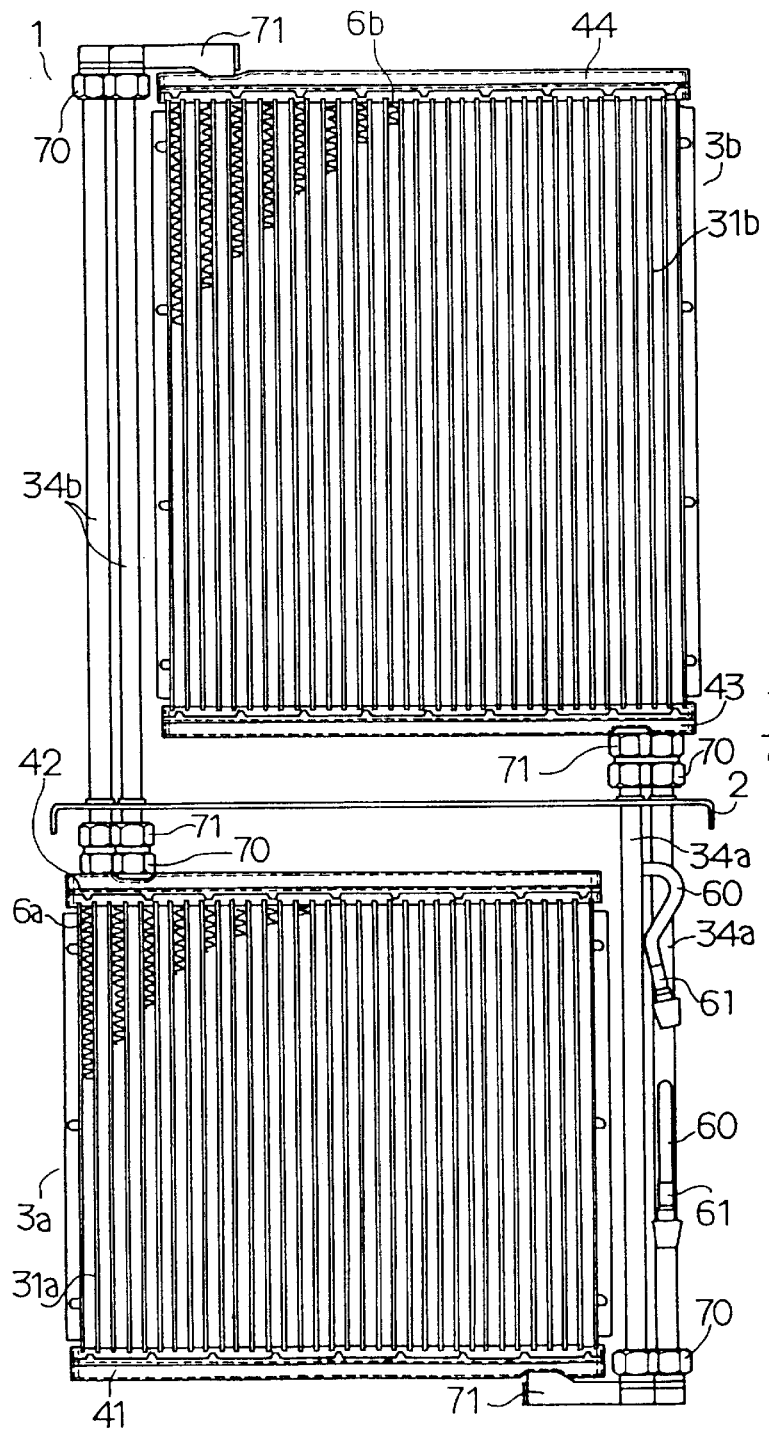
FIG. 86 is a front view of the cooling apparatus according to the twenty-fifth embodiment.
Figure 87:
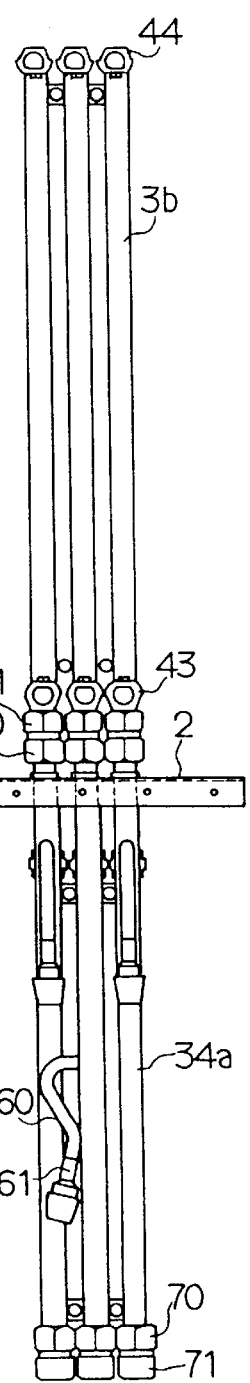
FIG. 87 is a side view of the cooling apparatus according to the twenty-fifth embodiment.
Figure 88:
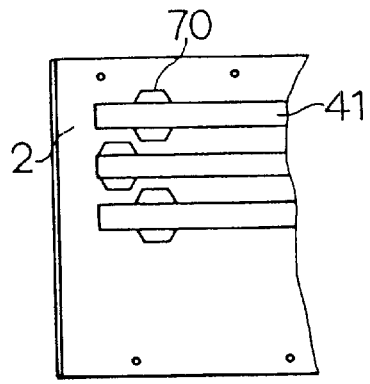
FIG. 88 is a view of the cooling apparatus as seen from below according to the twenty-fifth embodiment.

FIG. 86 is a front view of the cooling apparatus 1, FIG. 87 is a side view thereof, and FIG. 88 is a bottom view of the cooling apparatus 1 as seen from below. In the cooling apparatus 1 of this embodiment, heat is absorbed from a high-temperature fluid (corresponding to a high-temperature medium, e.g., high-temperature air) in the high-temperature-side heat transfer space 11 and the thus-absorbed heat is released to a low-temperature fluid (corresponding to a low-temperature medium, e.g., low-temperature air) in the low-temperature-side heat transfer space 12 and separated from the high-temperature fluid by a fluid separating plate 2.

As shown in FIG. 86, the cooling apparatus 1 includes a refrigerant tank 3a constituted by a plurality of heat absorbing tubes 31a disposed on the high-temperature fluid side with respect to the fluid separating plate 2, a fluorocarbon-type refrigerant 8 (not shown) which is sealed into each heat absorbing tube 31a and is boiled and vaporized by receiving the heat of the high-temperature fluid, a low-temperature-side communication pipe 34a and a high-temperature-side communication pipe 34b, one ends of which are hermetically communicated with the refrigerant tank 3 and the other ends of which extending to the low-temperature fluid side through the fluid separating plate 2, a condensing portion 3b which is hermetically communicated with the other ends of the low and high-temperature-side communication pipes 34a and 34b, the condensing portion 3b including a plurality of radiating tubes 31b and being located on the low-temperature fluid side with respect to the fluid separating plate 2, heat receiving fins 6a attached in a fused state (for example in a brazed state) between adjacent heat absorbing tubes 31a in the refrigerant tank 3, and radiating fins 6b attached in a fused state (for example in a brazed state) to between adjacent radiating tubes 31b in the condensing portion 3b.

In this embodiment, as shown in FIG. 87, a plurality of the cooling units are laminated (there are three units in this embodiment; however, two or four or more apparatuses may be employed) in the cooling apparatus 1.

The fluid separating plate 2 constitutes one wall surface of the closed space, an interior of which becomes at high temperature, and is formed of a metallic material such as aluminum for example and is integrally joined (for example, brazed) to both low and high-temperature-side communication pipes 34a and 34b. In the fluid separating plate 2 are formed a plurality of holes into which the pipes 34a and 34b are inserted. In this embodiment, as shown in FIG. 88, the low-temperature-side communication pipes 34a are shifted alternately. Though not shown, the high-temperature-side communication pipes 34b are also disposed in the same manner.

In FIG. 86, the refrigerant tank 3a includes a plurality of heat absorbing tubes 31a disposed substantially in parallel with each other, a heat absorption-side lower communicating portion 41 located below the heat absorbing tubes 31a to communicate lower ends of the tubes 31a with each other, and a heat absorption-side upper communicating portion 42 located above the heat absorbing tube 31a to communicate upper ends of the tubes 31a. The heat absorbing tubes 31a are each formed in the shape of a flat tube having an elongated rectangular (or oblong) cross section, and is formed of a metallic material (e.g. aluminum or copper) which is superior in heat conductivity.

The condensing portion 3b includes a plurality of radiating tubes 31b disposed substantially in parallel with each other, a radiation-side lower communicating portion 43 located below the radiating tubes 31b to communicate lower ends of the tubes 31b with each other, and a radiation-side upper communicating portion 44 located above the radiating tubes 31b to communicate upper ends of the tubes 31b. The radiating tubes 31b are also each formed in the shape of a flat tube having an elongated rectangular (or oblong) cross section, and is formed of a metallic material (e.g., aluminum or copper) which is superior in heat conductivity.

Figure 89:
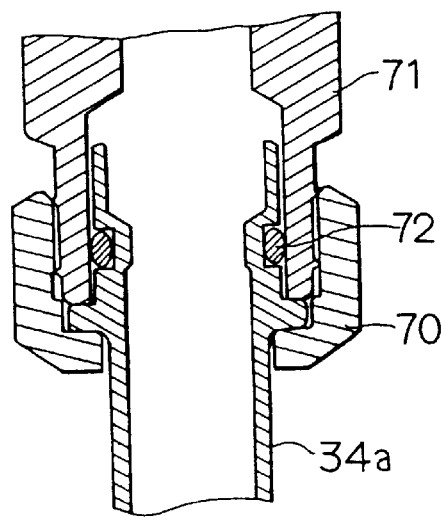
FIG. 89 is a detail view of a connection in the cooling apparatus according to the twenty-fifth embodiment.

One end of the low-temperature-side communication pipe 34a communicates with the heat absorption-side lower communicating portion 41 of the refrigerant tank 3a and the other end communicates with the radiation-side lower communicating portion 43 of the condensing portion 3b so that the refrigerant 8 flows back to the refrigerant tank 3a after being condensed in the condensing portion 3b. The connection between the low-temperature-side communication pipe 34a and the heat absorption-side lower communicating portion 41 is structured of a union 71 and a nut 70. More specifically, as shown in FIG. 89, the connection has a union 71 constituted by a tubular member which is integrally joined so as to communicate with the heat absorption-side lower communicating portion 41, and the low-temperature-side communication pipe 34a is fitted in the union 71. An O-ring 72 for improving the airtightness is inserted between the union 71 and the communication pipe 34a, and both union 71 and pipe 34a are hermetically brought into communication with each other by a nut 70 as fastening means. The connection between the low-temperature-side communication pipe 34a and the radiation-side lower communicating portion 43 is also structured of a union 71 and a nut 70. The explanation thereof is omitted, because this connection is the same as the connection between the pipe 34a and the heat absorption-side lower communicating portion 41.

Figure 90:
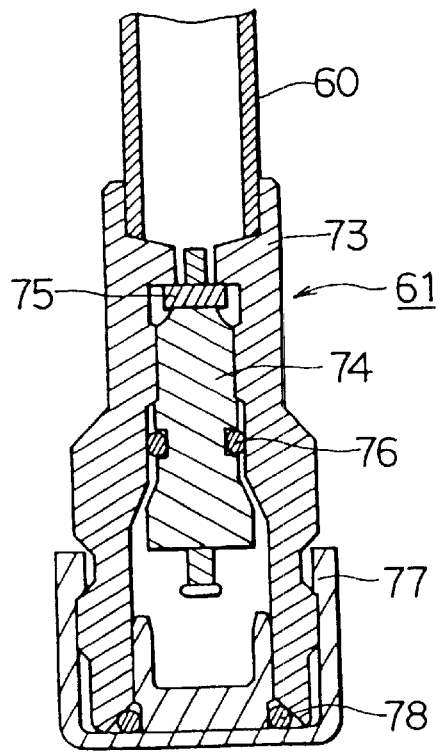
FIG. 90 is a detail view of a refrigerant inlet in the cooling apparatus according to the twenty-fifth embodiment.

The low-temperature-side communication pipe 34a has a refrigerant pipe 60 and a refrigerant inlet 61 (see FIG. 87), with the refrigerant 8 being sealed into the interior from the exterior through the refrigerant inlet 61. As shown in detail in FIG. 90, the refrigerant inlet 61 includes a union 73 constituted by a tubular member with the refrigerant pipe 60 fitted therein, a valve 74 disposed within the union 73, a packing 75 between the valve 74 and the refrigerant pipe 60, for improving airtightness therebetween, an O-ring 76 between the valve 74 and the side opposite to the refrigerant pipe, for improving airtightness therebetween, a cap 77 fitted on the valve 74, for hermetically sealing, and an O-ring 78 disposed inside the cap 77, for improving airtightness of the cap.

One end of the high-temperature-side communication pipe 34b communicates with the heat absorption-side upper communicating portion 42 of the refrigerant tank 3a and the other end communicates with the radiation-side upper communicating portion 44 of the condensing portion 3b so that the refrigerant 8 after being boiled and vaporized in the refrigerant tank 3 is transferred to the condensing portion 3b. The connection between the high-temperature-side communication pipe 34b and the heat absorption-side upper communicating portion 42, and the connection between the communication pipe 34b and the radiation-side upper communicating portion 44, are also structured of a union 71 and a nut 70. The explanation thereof is here omitted because these connections are the same as the connection between the low-temperature-side communication pipe 34a and the heat absorption-side lower communicating portion 41.

The refrigerant 8 is sealed into the refrigerant tank 3a up to the liquid level which is slightly lower than the heat absorption-side upper communicating portion 42 of the refrigerant tank 3a. The refrigerant 8 is sealed after the heat absorbing fins 6a and the radiating fins 6b have been brazed to the heat absorbing tubes 31a and the radiating tubes 31b, respectively.

The heat receiving fins 6a are disposed between adjacent heat absorbing tubes 31a, while the radiating fins 6b are disposed between adjacent radiating tubes 31b. Both fins 6a and 6b are corrugated fins formed by pressing and bending alternately a thin plate (having a plate thickness of approximately 0.02–0.5 mm) of a highly heat-conductive metal (e.g., aluminum) into a wavy shape. The fins 6a and 6b are brazed (that is, joined in a fused state) to the flat outer wall surfaces of the heat absorbing tubes 31a and the radiating tubes 31b, respectively. The heat receiving fins 6a facilitate the heat transfer from the high-temperature fluid side to the refrigerant 8. At the same time, the fins 6a also improve the strength of the heat absorbing tubes 31a. The radiating fins 6b facilitate the heat transfer of the refrigerant to the low-temperature fluid side. At the same time, the fins 6b improve the strength of the radiating tubes 31b.

A procedure for mounting the cooling apparatus 1 to the fluid separating plate 2 will be described.

Firstly, the refrigerant tank 3a and the condensing portion 3b are formed separately. Then, the high-temperature-side connection pipe 34b is connected to the union 71 which is communicated with the heat absorption-side upper communicating portion 42 of the refrigerant tank 3a, while the low-temperature-side communication pipe 34a is connected to the union 71 which is communicated with the heat absorption-side lower communicating portion 41. Next, both communication pipes 34b and 34a are inserted into holes formed in the fluid separating plate 2 and are then joined to the hole portions by brazing for example. Subsequently, the high-temperature-side communication pipe 34b is connected to the union 71 which is communicated with the radiation-side communicating portion 44 of the condensing portion 3b, while the low-temperature-side communication pipe 34a is connected to the union 71 which is communicated with the radiation-side lower communicating portion 43. Alternatively, the communication pipes 34b and 34a may be connected first to the condensing portion 3b side and thereafter may be inserted into the holes of the fluid separating plate 2 and connected to the refrigerant tank 3a. However, in the case where the refrigerant inlet is attached to the communication pipe 34a, it is difficult for the inlet to pass through the holes, so the former mounting procedure is simpler. The following procedure may be also adopted. Firstly, the condensing portion 3b and the high-temperature-side communication pipe 34b are connected together, and at the same time the; refrigerant tank 3a and the low-temperature-side communication pipe 34a are connected together. After each of these is inserted into the holes formed in the fluid separating plate 2, the condensing portion 3b and the low-temperature-side communication pipe 34a are connected together, and the refrigerant tank 3a and the high-temperature-side communication pipe 34b are connected together.

An operation of this embodiment will be described below.

By starting the supply of an electric current to the electric motors of the two upper centrifugal blowers 18 and to the electric motors of the two lower centrifugal blowers 15 when the internal temperature of the closed space 15 in the casing 81 is not lower than the lower-limit temperature (e.g., 0° C.), the centrifugal fans start operating. As a result, a circulating flow of a high-temperature air (clean inside air, or inside fluid, not containing any foreign material such as dust or moisture) is formed within the closed space 9 in the casing 81. Also, within the low-temperature-side heat transfer space 12 outside the casing 81 a circulating flow of a low-temperature air (outside air, or outside fluid, not containing any foreign material such as dust or moisture) is formed.

In each of the plural stages of cooling apparatus 1 mounted through the fluid separating plate 2 of the casing 81, the refrigerant sealed in the refrigerant tank 3a is boiled and vaporized by being exposed to heat which has been transferred from the high-temperature air through the heat receiving fins 6a. The vaporized refrigerant is condensed on the inner wall surfaces of the condensing portion 3b which is at a low temperature by being exposed to the low-temperature air. The resulting latent heat of condensation is transferred to the low-temperature air through the radiating fins 6b.

The refrigerant thus condensed in the condensing portion 3b drops along the inner wall surfaces of the low-temperature-side communication pipes 34a into the refrigerant tank 3a due to its own weight. Thus, the refrigerant 8 sealed in the heat absorbing tubes 31a of the refrigerant tank 3a repeats boiling and condensation alternately, that is, the heat of the high-temperature air is transferred to the low-temperature air, so that the heat generated from the electronic parts 7 can be released in the plural stages of cooling apparatus 1.

Consequently, the electronic parts 7 can be cooled without a mixture of the high-temperature air (clean air within the casing 81) which circulates within the high-temperature-side heat transfer space 11 in the closed space 9 and the low-temperature air (foul air outside the casing 81) which circulates within the low-temperature-side heat transfer space 12.

Next, an effects of this embodiment will be described.

In this embodiment, the refrigerant tank 3a, condensing portion 3b, low-temperature-side communication pipe 34a and high-temperature-side communication pipe 34b can be easily connected mechanically and hermetically by using the union 71 and nut 70. In other words, the number of mounting steps can be greatly decreased, and therefore it is possible to prevent deterioration of the mounting performance for the fluid separating plate 2.

Besides, since the refrigerant tank 3a, condensing portion 3b, low-temperature-side communication pipe 34a and high-temperature-side communication pipe 34b are simply and mechanically connected, even when one of the refrigerant tank 3a and the condensing portion 3b needs to be changed, it is possible to easily change one of these with a replacement part. That is, even in the case where a cooling apparatus not having a predetermined level of airtightness is included among a plurality of cooling apparatus in the checking of airtightness after being assembled, it is possible to change or repair such a cooling apparatus easily.

In this embodiment, the following additional effects can be also obtained.

(1) At the time of connecting the low- and high-temperature-side communication pipes 34a and 34b with the refrigerant tank 3a and the condensing portion 3b, it is possible to omit the heating step; and therefore, it is possible to prevent a change of the product size due to heat distortion (deformation) as well as deterioration of durability due by a residual stress.

(2) Since a plurality of holes through which the low-and high-temperature-side communication pipes 34a and 34b pass are formed in the fluid separating plate 2, it is possible to improve the airtightness and waterproofness between the fluid separating plate 2 and the low-temperature-side communication pipe 34b. In this embodiment, the cooling apparatus 1 in three-stages is used; and therefore it is necessary to use three low-temperature-side communication pipes 34a and three high-temperature-side communication pipes 34b. As shown in FIG. 88, the low-temperature-side communication pipes 34a are displaced from one another. Though not shown, the high-temperature-side communication pipes 34b are also displaced from one another. With this arrangement, even when nuts 70 (which will be described later) are formed, the nuts do not interfere with each other, and it is possible to minimize the size in the laminating direction, thereby downsizing the cooling apparatus 1.

(3) The refrigerant tank 3a includes the plural heat absorbing tubes 31a disposed substantially in parallel with each other, the heat absorption-side lower communicating portion 41 located below the heat absorbing tubes 31a communicates the tubes 31a with each other, and the heat absorption-side upper communicating portion 42 located above the heat absorbing tubes 31a communicates the tubes 31a with each other. A communication pipe is disposed substantially in parallel with the heat absorbing tubes 31a and is in communication with the heat absorption-side lower communicating portion. Therefore, it becomes possible to downsize the cooling apparatus 1.

(4) Since the heat receiving fins 6a and the radiating fins 6b are attached in a fused state to the refrigerant tank 3a and the condensing portion 3b, respectively, it is possible to diminish the thermal resistance between the fins and the cooling tubes as compared with the case where the fins 6a and 6b are attached mechanically to the refrigerant tank 3a and the condensing portion 3b, respectively. As a result, the whole of the cooling apparatus:can be further downsized as compared with such mechanical connection.

(5) Since the gas which has become at a high temperature due to the heat generated from the heat generating elements 7 is introduced smoothly into an air flow path through a vent port 13, it is possible to maintain uniform the internal temperature of the closed space 9. More particularly, since the gas which has become hot by receiving the heat from the heat generating elements 7 rises within the closed space 9 by the convection, preferably the vent port 13 should be formed in the upper portion of the closed space 9 to improve the cooling efficiency in the closed space 9. In other words, when the vent port 13 is formed in a position lower than the fluid separating plate 2, a relatively low-temperature of gas in the closed space 9 is introduced into the air flow path 23 through the vent port 13 and is led to the refrigerant tank 3a, the cooling efficiency in the closed space 9 is not sufficient.

(6) In this embodiment, moreover, the whole of each cooling apparatus 1 is disposed in a longitudinally (transversely in FIG. 90) while being inclined so that the gases passing through the refrigerant tank 3a and the condensing portion 3b in the high and low-temperature-side heat transfer spaces 11 and 12 flow smoothly from suction-side vent ports 13 and 16 toward exhaust-side vent ports 14 and 17, respectively. Therefore, the change in the flowing directions of the gas passing through the refrigerant tank 3a and the condensing portion 3b can be slackened and hence it is possible to decrease the loss of air flow path in the narrow spaces. As a result, the fans 15 disposed in the closed space 9 can be downsized, and further the calorific value of the fans 15 can be decreased. Therefore, the amount of heat generated from the heat generating elements 7 can be increased as much as the reduced calorific value (that is, the fans 15 is large-sized to increase the cooling capacity, the calorific value of the fans 15 increases; as a result, the amount of heat generated from the heat generating elements 7 cannot be increased).

A twenty-sixth embodiment of the present invention will be described below.

The construction of the cooling apparatus according to this embodiment is the same as that of the twenty-fifth embodiment except the connection between the low-temperature-side communication pipe 34a or the high-temperature-side communication pipe 34b and the refrigerant tank 3a or the condensing portion 3b. Therefore, the connection portion in this embodiment will be described.

In this embodiment, the connection between the low-temperature-side communication pipe 34a and the heat absorption-side lower communicating portion, the connection between the communication pipe 34a and the radiation-side lower communicating portion 43, the connection between the high-temperature-side communication pipe 34b and the heat absorption-side upper communicating portion 42, and the connection between the communication pipe 34b and the radiation-side upper communicating portion 44, are of substantially the same structure, only the connection between the low-temperature-side communication pipe 34a and the heat absorption-side lower communicating portion 41 will be described.

Figure 91:
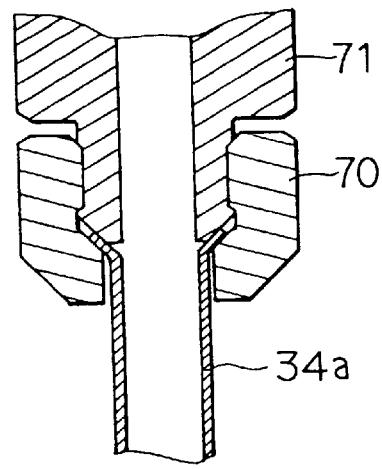
FIG. 91 is a detail view of a connection in a cooling apparatus according to a twenty-sixth embodiment.

FIG. 91 is a cross sectional view of a connection in this embodiment.

This connection between the low-temperature-side communication pipe 34a and the heat absorption-side lower communicating portion 41 is structured of a union 71 and a nut 70. More specifically, the union 71 is constituted by a tubular member joined integrally to the heat absorption-side lower communicating portion 41 in communication therewith. The portion of the union 71 on which the nut 70 is fitted is reduced in outer diameter and the front end of the union 71 is tapered. The contact portion of the low-temperature-side communication pipe 34a with the union 71 is widen and contacts with the tapered end of the union. The nut 70 is fitted on the reduced-diameter portion of the union 71 and biases the communication pipe 34a toward the front end side of the union 71 so as to hermetically connect therebetween.

Also in this embodiment, as in the twenty-fifth embodiment, the refrigerant tank 3a, condensing portion 3b, low-temperature-side communication pipe 34a and high-temperature-side communication pipe 34b can be easily connected mechanically and hermetically by using the union 71 and the nut 70. That is, the number of mounting steps can be greatly decreased and hence it is possible to prevent deterioration of the mounting performance for the fluid separating plate 2.

Since the refrigerant tank 3a, condensing portion 3b, and low and high-temperature-side communication pipes 34a and 34b are connected simply and mechanically, even when one of the refrigerant tank 3a and the condensing portion 3b needs to be changed, it is possible to easily change one of these with a replacement part. That is, even in the case where a cooling apparatus not having a predetermined level of airtightness is included among a plurality of cooling apparatus in the checking of airtightness after being assembled, it is possible to change or repair such a cooling apparatus easily.

Figure 92:
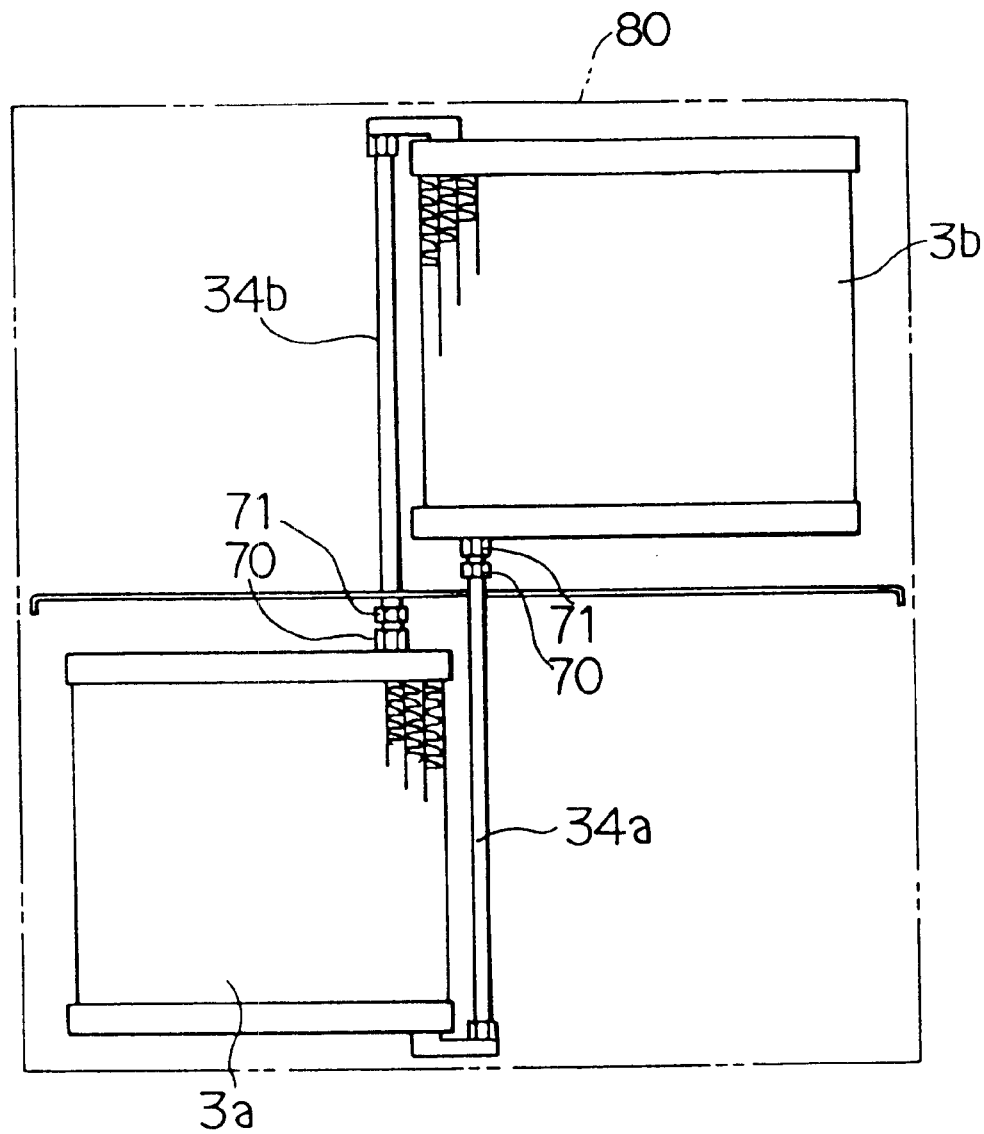
FIG. 92 is a front view of a modification of the cooling system.

Although in the above embodiments the condensing portion 3b is formed substantially just above the refrigerant tank 3a, both may be displaced from each other as in FIG. 92.

Moreover, it is not always necessary for the condensing portion 3b and the refrigerant tank 3a to be disposed on the same plane. For example, the condensing portion 3b formed above the refrigerant tank 3a may be inclined (for example, orthogonal) (not shown) relative to the refrigerant tank 3a, and the positional relation may be altered according to the shape of the housing used. In this embodiment, since the connection between the low-temperature-side communication pipe 34a or the high-temperature-side communication pipe 34b and the refrigerant tank 3a or the condensing portion 3b employs fastening members (union 71, nut 70, and the like), it is possible to modify the installation shape easily. Besides, as compared with the case where the refrigerant tank 3a or the condensing portion 3b and the communication pipes are integrally connected together beforehand, a storage space thereof can be reduced.

Further, it is not always necessary for both the connection between the low-temperature-side communication pipe 34a and the refrigerant tank 3a and the connection between the communication pipe 34a and the condensing portion 3b to be connected according this embodiment, at least one of the two connections may be connected according to this embodiment. In the same manner, at least one of the connection between the high-temperature-side communication pipe 34b and the refrigerant tank 3a and the connection between the communication pipe 34b and the condensing portion 3b may be connected according to this embodiment.

Although the present invention has been fully described in connection with the preferred embodiments thereof with reference to the accompanying drawings, it is to be noted that various changes and modifications will become apparent to those skilled in the art. Such changes and modifications are to be understood as being included within the scope of the present invention as defined in the appended claims.

What is claimed is:

1. A cooling apparatus using boiling and condensing refrigerant, for cooling a heating element, said cooling apparatus comprising:

a refrigerant tank for containing a refrigerant which is boiled and vaporized by receiving heat generated from said heating element; and a radiator for cooling and liquefying the refrigerant which has been vaporized in said refrigerant tank, said refrigerant tank including:

a vapor passage for containing the refrigerant which is vaporized by receiving heat from said heating element;

a condensed liquid passage into which the refrigerant having been condensed and liquefied in said radiator flows, said vapor passage and said condensed liquid passage being in communication with each other at a respective lower portion; and a heat insulating passage, provided between said vapor passage and said condensed liquid passage, for decreasing an amount of heat transferred from a side of said vapor passage to a side of said condensed liquid passage, said heat insulating passage being extended to said lower portion of said condensed liquid passage.

2. A cooling apparatus according to claim 1, wherein an interior of said heat insulating passage is filled with the refrigerant.

3. A cooling apparatus according to claim 2, wherein inner fins are provided in said heat insulating passage.

4. A cooling apparatus according to claim 2, wherein said heat insulating passage has an inner wall surface formed in an concave-convex shape.

5. A cooling apparatus according to claim 1, wherein said refrigerant tank is constituted by an extrusion member which is produced by extruding.

6. A cooling apparatus using boiling and condensing refrigerant, for cooling a heating element, said cooling apparatus comprising:

a refrigerant tank for containing a refrigerant which is boiled and vaporized by receiving heat generated from said heating element; and a radiator for cooling and liquefying the refrigerant which has been vaporized in said refrigerant rank, said refrigerant tank includes including:

a vapor passage for containing the refrigerant which is vaporized by receiving heat from said beating element;

a condensed liquid passage into which the refrigerant having been condensed and liquefied in said radiator flows, said vapor passage and said condensed liquid passage being in communication with each other at a respective lower portion; and a heat conduction suppressing passage provided between said vapor passage and said condensed liquid passage with being separated from said vapor passage and said condensed liquid passage, said heat conduction suppressing passage being extended to said lower portion of said condensed liquid passage and having a refrigerant inlet at a lower portion for introducing the refrigerant to said heat conduction suppressing passage.

7. A cooling apparatus according to claim 6, wherein:

said refrigerant tank has a partition member therein for partitioning said refrigerant tank to said vapor passage and said condensed liquid passage, and said heat conduction suppressing passage is arranged along said partition member in said refrigerant tank.

8. A cooling apparatus according to claim 7, wherein said condensed liquid passage and said heat conduction suppressing passage are arranged at one peripheral side in said refrigerant tank than a heat element mounting portion at which said heat element is to be mounted.

9. A cooling apparatus according to claim 6, wherein said heat conduction suppressing passage has a predetermined width equal to those of said vapor passage and said condensed liquid passage.

* * * * *

UNITED STATES PATENT AND TRADEMARK OFFICE
CERTIFICATE OF CORRECTION

PATENT NO.      : 6,575,230 B1
DATED           : June 10, 2003
INVENTOR(S)     : Shigeru Kadota et al.

It is certified that error appears in the above-identified patent and that said Letters Patent is hereby corrected as shown below:

<u>Title page,</u>
Item [75], Inventors, please delete "Tetsuya Takeuti, Takahide Ohara, Masahiko Suzuki, Hajime Sugito and Junichi Semura"

Signed and Sealed this

Second Day of March, 2004

JON W. DUDAS
*Acting Director of the United States Patent and Trademark Office*